US011527519B2

(12) United States Patent
Chae et al.

(10) Patent No.: US 11,527,519 B2
(45) Date of Patent: Dec. 13, 2022

(54) LED UNIT FOR DISPLAY AND DISPLAY APPARATUS HAVING THE SAME

(71) Applicant: Seoul Viosys Co., Ltd., Ansan-si (KR)

(72) Inventors: Jong Hyeon Chae, Ansan-si (KR); Chung Hoon Lee, Ansan-si (KR); Chang Yeon Kim, Ansan-si (KR); Seong Gyu Jang, Ansan-si (KR); Ho Joon Lee, Ansan-si (KR); Jong Min Jang, Ansan-si (KR)

(73) Assignee: Seoul Viosys Co., Ltd., Ansan-si (KR)

( * ) Notice: Subject to any disclaimer, the term of this patent is extended or adjusted under 35 U.S.C. 154(b) by 0 days.

(21) Appl. No.: 16/198,873

(22) Filed: Nov. 22, 2018

(65) Prior Publication Data

US 2019/0164944 A1 May 30, 2019

Related U.S. Application Data

(60) Provisional application No. 62/683,564, filed on Jun. 11, 2018, provisional application No. 62/657,589, (Continued)

(51) Int. Cl.
*H01L 25/13* (2006.01)
*H01L 25/075* (2006.01)
(Continued)

(52) U.S. Cl.
CPC .......... *H01L 25/13* (2013.01); *H01L 25/0756* (2013.01); *H01L 33/0093* (2020.05); (Continued)

(58) Field of Classification Search
CPC ....... H01L 25/0756; H01L 2224/24145; H01L 2224/32145; H01L 33/382
See application file for complete search history.

(56) References Cited

U.S. PATENT DOCUMENTS 5,583,349 A * 12/1996 Norman .............. H01L 25/0753 257/103
5,583,350 A 12/1996 Norman et al.
(Continued)

FOREIGN PATENT DOCUMENTS

CN 1423345 6/2003
CN 102593290 7/2012
(Continued)

OTHER PUBLICATIONS

International Search Report dated Feb. 26, 2019, issued in International Application No. PCT/KR2018/014671.
(Continued)

*Primary Examiner* — Samuel A Gebremariam
*Assistant Examiner* — Jonas T Beardsley
(74) *Attorney, Agent, or Firm* — H.C. Park & Associates, PLC

(57) ABSTRACT

A light emitting device for a display including a first substrate, a first LED sub-unit disposed on the first substrate, a second LED sub-unit disposed on the first LED sub-unit, a third LED sub-unit disposed on the second LED sub-unit, a second substrate disposed on the third LED sub-unit, a first electrode pad, a second electrode pad, a third electrode pad, and a fourth electrode pad disposed on the second substrate, and through-hole vias electrically connecting the second, third, and fourth electrode pads to the first, second, and third LED sub-units, respectively, in which the first electrode pad is electrically connected to the first LED sub-unit without overlapping any through-hole vias.

19 Claims, 133 Drawing Sheets

Related U.S. Application Data filed on Apr. 13, 2018, provisional application No. 62/657,607, filed on Apr. 13, 2018, provisional application No. 62/643,563, filed on Mar. 15, 2018, provisional application No. 62/635,284, filed on Feb. 26, 2018, provisional application No. 62/614,900, filed on Jan. 8, 2018, provisional application No. 62/608,297, filed on Dec. 20, 2017, provisional application No. 62/590,870, filed on Nov. 27, 2017, provisional application No. 62/590,854, filed on Nov. 27, 2017.

(51) Int. Cl.
*H01L 33/00* (2010.01)
*H01L 33/62* (2010.01)
*H01L 33/38* (2010.01)

(52) U.S. Cl.
CPC .......... *H01L 33/62* (2013.01); *H01L 25/0753* (2013.01); *H01L 33/38* (2013.01)

(56) References Cited

U.S. PATENT DOCUMENTS 5,696,389 A 12/1997 Ishikawa et al.
5,703,436 A 12/1997 Forrest et al.
5,707,745 A 1/1998 Forrest et al.
5,739,552 A 4/1998 Kimura et al.
6,046,543 A 4/2000 Bulovic et al.
6,100,103 A 8/2000 Shim et al.
6,365,270 B2 4/2002 Forrest et al.
6,717,358 B1 4/2004 Liao et al.
6,888,305 B2 5/2005 Weaver
6,934,309 B2 8/2005 Nishikawa et al.
7,282,741 B2 10/2007 Kim et al.
7,514,720 B2 4/2009 Kim et al.
7,570,310 B2 8/2009 Harada et al.
7,732,803 B2 6/2010 Shum et al.
7,745,986 B2 6/2010 Ito et al.
7,982,228 B2 7/2011 Choi et al.
8,017,955 B2 9/2011 Wang et al.
8,022,421 B2 9/2011 Hsueh et al.
8,035,115 B2 10/2011 Ogihara et al.
8,058,663 B2 11/2011 Fan et al.
8,089,074 B2 1/2012 Kim et al.
8,283,191 B2 10/2012 Rode et al.
8,324,803 B2 12/2012 Forrest et al.
8,390,020 B2 3/2013 Tanaka et al.
8,436,346 B2 5/2013 Ushikubo et al.
8,466,542 B2 6/2013 Kriman et al.
8,546,836 B2 10/2013 Kamiya et al.
8,563,144 B2 10/2013 Kim et al.
8,618,551 B2 12/2013 Nishikawa et al.
8,624,274 B2 1/2014 Hsueh et al.
8,766,295 B2 7/2014 Kim
8,835,948 B2 9/2014 Chang et al.
8,884,316 B2 11/2014 Weaver et al.
8,941,566 B2 1/2015 Haase
9,006,752 B2 4/2015 So et al.
9,018,834 B2 4/2015 Ide et al.
9,052,096 B2 6/2015 Nishimura et al.
9,076,929 B2 7/2015 Katsuno et al.
9,099,631 B2 8/2015 Yang et al.
9,136,498 B2 9/2015 Skipor
9,142,748 B2 9/2015 Ohmae et al.
9,153,750 B2 10/2015 Seo et al.
9,202,994 B2 12/2015 Hashimoto et al.
9,252,380 B2 2/2016 Seo et al.
9,281,446 B2 3/2016 Suh et al.
9,312,249 B2 4/2016 Choi et al.
9,337,400 B2 5/2016 Hashimoto et al.
9,362,335 B2 6/2016 Von Malm
9,406,908 B2 8/2016 Kim et al.
9,419,031 B1 8/2016 Or-Bach et al.
9,443,833 B2 9/2016 Oraw
9,515,278 B2 12/2016 Suzuki et al.
9,559,263 B2 1/2017 Matsui et al.
9,577,012 B2 2/2017 Ooki et al.
9,748,313 B2 8/2017 Tsuji et al.
9,786,817 B2 10/2017 Kim et al.
9,786,859 B2 10/2017 Yamae et al.
9,847,051 B2 12/2017 Choi et al.
9,853,187 B2 12/2017 Kim
9,893,233 B2 2/2018 Kong et al.
9,905,725 B2 2/2018 Lee
9,960,212 B2 5/2018 Gee et al.
9,960,390 B2 5/2018 Höfle et al.
9,966,369 B2 5/2018 Kim et al.
10,056,535 B2 8/2018 Chang et al.
10,069,036 B2 9/2018 Atanackovic
10,079,265 B1 9/2018 Wu et al.
10,134,813 B2 11/2018 Choi
10,170,666 B2 1/2019 Cha et al.
10,205,058 B2 2/2019 Lee
10,304,811 B2 5/2019 Zhang et al.
10,326,056 B2 6/2019 Jung et al.
10,381,519 B2 8/2019 Seo et al.
10,388,978 B2 8/2019 Morris-Cohen et al.
10,418,577 B2 9/2019 Yoo et al.
10,475,957 B2 11/2019 Cha et al.
10,515,580 B2 12/2019 Henry et al.
10,559,557 B2 2/2020 Chang et al.
10,686,099 B2 6/2020 Huppmann et al.
10,686,149 B2 6/2020 Park et al.
10,811,475 B2 10/2020 Zhang et al.
2002/0154259 A1 10/2002 Freidhoff et al.
2003/0047742 A1 3/2003 Hen
2003/0168989 A1 9/2003 Hen
2003/0213967 A1 11/2003 Forrest et al.
2004/0232433 A1 11/2004 Doverspike et al.
2005/0062049 A1 3/2005 Lin et al.
2005/0067627 A1 3/2005 Shen et al.
2005/0140278 A1 6/2005 Kato
2005/0264550 A1 12/2005 Ohshima et al.
2006/0027820 A1 2/2006 Cao
2006/0231852 A1 10/2006 Kususe et al.
2006/0258026 A1 11/2006 Miyachi et al.
2007/0069220 A1 3/2007 Ogihara
2007/0170444 A1 7/2007 Cao
2007/0222922 A1 9/2007 Jin et al.
2008/0068315 A1 3/2008 Kurosaki et al.
2008/0099770 A1 5/2008 Mendendorp et al.
2008/0128728 A1 6/2008 Nemchuk et al.
2008/0130278 A1 6/2008 Ushikubo et al.
2008/0251799 A1* 10/2008 Ikezawa .............. H01L 25/0756 257/89
2008/0308819 A1 12/2008 Louwsma et al.
2009/0009101 A1 1/2009 Kang et al.
2009/0078955 A1 3/2009 Fan et al.
2009/0114931 A1 5/2009 Hsueh et al.
2009/0272989 A1 11/2009 Shum et al.
2010/0032691 A1 2/2010 Kim
2010/0045175 A1 2/2010 Mathai et al.
2010/0051975 A1 3/2010 Suzuki et al.
2010/0065867 A1 3/2010 Unno
2010/0066239 A1 3/2010 Spindler et al.
2010/0076527 A1 3/2010 Hammond et al.
2010/0084668 A1 4/2010 Choi et al.
2010/0144073 A1 6/2010 Louwsma et al.
2010/0159792 A1 6/2010 Visser et al.
2010/0224860 A1 9/2010 Ibbetson et al.
2010/0276706 A1 11/2010 Herrmann
2011/0057211 A1 3/2011 Lee et al.
2011/0086486 A1 4/2011 Lee et al.
2011/0156114 A1 6/2011 Park et al.
2011/0204376 A1 8/2011 Su et al.
2011/0215714 A1 9/2011 Seo et al.
2012/0034714 A1 2/2012 Tsai et al.
2012/0094414 A1* 4/2012 Or-Bach ............. H01L 31/0735 438/33
2012/0124903 A1 5/2012 Takeuchi
2012/0223875 A1 9/2012 Lau et al.
2012/0231572 A1 9/2012 Or-Bach et al.

(56) References Cited

U.S. PATENT DOCUMENTS

| | | | |
|---|---|---|---|
| 2012/0236532 A1 | 9/2012 | Koo et al. | |
| 2012/0305959 A1 | 12/2012 | Yu et al. | |
| 2013/0009543 A1 | 1/2013 | Kadoma et al. | |
| 2013/0056717 A1 | 3/2013 | Ishihara et al. | |
| 2013/0056785 A1 | 3/2013 | Hwang | |
| 2013/0069191 A1 | 3/2013 | Or-Bach et al. | |
| 2013/0264587 A1 | 10/2013 | Chang | |
| 2013/0285076 A1 | 10/2013 | Liu et al. | |
| 2013/0292711 A1 | 11/2013 | Ogihara et al. | |
| 2014/0184062 A1 | 7/2014 | Kolodin | |
| 2014/0191243 A1 | 7/2014 | Singh et al. | |
| 2014/0252382 A1 | 9/2014 | Hashimoto et al. | |
| 2014/0284633 A1 | 9/2014 | Tsay et al. | |
| 2015/0001572 A1 | 1/2015 | Katsuno et al. | |
| 2015/0099728 A1 | 4/2015 | Frank et al. | |
| 2015/0221627 A1 | 8/2015 | Nielson et al. | |
| 2015/0325555 A1 | 11/2015 | Hashimoto et al. | |
| 2015/0340348 A1 | 11/2015 | Katsuno et al. | |
| 2015/0362165 A1 | 12/2015 | Chu et al. | |
| 2016/0005375 A1* | 1/2016 | Naijo | G09G 3/38 345/690 |
| 2016/0043290 A1 | 2/2016 | Sogo et al. | |
| 2016/0064439 A1 | 3/2016 | Or-Bach et al. | |
| 2016/0099384 A1 | 4/2016 | Kim et al. | |
| 2016/0155378 A1 | 6/2016 | Hack et al. | |
| 2016/0155892 A1 | 6/2016 | Li et al. | |
| 2016/0163940 A1 | 6/2016 | Huang et al. | |
| 2016/0315068 A1 | 10/2016 | Lee et al. | |
| 2016/0322293 A1 | 11/2016 | Kimura et al. | |
| 2016/0336482 A1 | 11/2016 | Lu et al. | |
| 2016/0359143 A1 | 12/2016 | Osawa et al. | |
| 2017/0012173 A1 | 1/2017 | Lee et al. | |
| 2017/0025593 A1 | 1/2017 | Bower et al. | |
| 2017/0062680 A1 | 3/2017 | Yoo et al. | |
| 2017/0064785 A1 | 3/2017 | Kim et al. | |
| 2017/0069612 A1 | 3/2017 | Zhang et al. | |
| 2017/0084876 A1 | 3/2017 | Suzuki | |
| 2017/0104035 A1 | 4/2017 | Lee et al. | |
| 2017/0117259 A1 | 4/2017 | Xu | |
| 2017/0133357 A1 | 5/2017 | Kuo et al. | |
| 2017/0162746 A1 | 6/2017 | Cha et al. | |
| 2017/0194298 A1 | 7/2017 | Negley et al. | |
| 2017/0194535 A1 | 7/2017 | Park et al. | |
| 2017/0213502 A1 | 7/2017 | Henry et al. | |
| 2017/0236866 A1 | 8/2017 | Lee et al. | |
| 2017/0250329 A1 | 8/2017 | Takeya et al. | |
| 2017/0286044 A1 | 10/2017 | Kim et al. | |
| 2017/0288088 A1 | 10/2017 | Won Cheol | |
| 2017/0288093 A1* | 10/2017 | Cha | H01L 33/08 |
| 2017/0331009 A1 | 11/2017 | Shioji | |
| 2017/0331021 A1 | 11/2017 | Chae et al. | |
| 2017/0338275 A1 | 11/2017 | Banna et al. | |
| 2017/0345801 A1 | 11/2017 | Lin et al. | |
| 2018/0083170 A1 | 3/2018 | Shepherd | |
| 2018/0151548 A1 | 5/2018 | Pfeuffer et al. | |
| 2018/0156965 A1 | 6/2018 | El-Ghoroury et al. | |
| 2018/0158808 A1 | 6/2018 | Zhang et al. | |
| 2018/0166499 A1 | 6/2018 | Pfeuffer et al. | |
| 2018/0233492 A1 | 8/2018 | Liu et al. | |
| 2018/0240952 A1 | 8/2018 | Moon et al. | |
| 2018/0283642 A1 | 10/2018 | Liao et al. | |
| 2019/0053347 A1 | 2/2019 | Lee et al. | |
| 2019/0074324 A1 | 3/2019 | Kim et al. | |
| 2019/0097088 A1 | 3/2019 | Huppmann et al. | |
| 2019/0148612 A1 | 5/2019 | Lee et al. | |
| 2019/0165207 A1 | 5/2019 | Kim et al. | |
| 2019/0181181 A1 | 6/2019 | Yeon et al. | |
| 2019/0229149 A1 | 7/2019 | Yoo | |
| 2019/0267436 A1 | 8/2019 | Zhang et al. | |
| 2019/0333964 A1 | 10/2019 | Lee et al. | |
| 2020/0063920 A1 | 2/2020 | Vampola | |
| 2020/0212017 A1 | 7/2020 | Oh et al. | |
| 2020/0212262 A1 | 7/2020 | Jang et al. | |
| 2020/0219858 A1 | 7/2020 | Chang | |

FOREIGN PATENT DOCUMENTS

| | | |
|---|---|---|
| CN | 102593303 | 7/2012 |
| CN | 105789237 | 7/2016 |
| CN | 106848043 | 6/2017 |
| EP | 1482566 | 12/2004 |
| EP | 3122158 | 1/2017 |
| FR | 2964498 | 3/2012 |
| JP | 01-231380 | 9/1989 |
| JP | H0613655 | 1/1994 |
| JP | 07-254732 | 10/1995 |
| JP | 08-088407 | 4/1996 |
| JP | 08-213657 | 8/1996 |
| JP | 08-274376 | 10/1996 |
| JP | 9-148628 | 6/1997 |
| JP | 2001-273979 | 10/2001 |
| JP | 2003-197968 | 7/2003 |
| JP | 2005-019874 | 1/2005 |
| JP | 2005072323 | 3/2005 |
| JP | 2006-245524 | 9/2006 |
| JP | 2006-319099 | 11/2006 |
| JP | 2006-339551 | 12/2006 |
| JP | 2006-339646 | 12/2006 |
| JP | 2007-057667 | 3/2007 |
| JP | 2008-263127 | 10/2008 |
| JP | 2009-302201 | 12/2009 |
| JP | 2010-525555 | 7/2010 |
| JP | 2011-151346 | 8/2011 |
| JP | 2011-159671 | 8/2011 |
| JP | 2012-504856 | 2/2012 |
| JP | 2012-195529 | 10/2012 |
| JP | 2012-209264 | 10/2012 |
| JP | 2012-253046 | 12/2012 |
| JP | 2013-229218 | 11/2013 |
| JP | 2014-175427 | 9/2014 |
| JP | 2014-187366 | 10/2014 |
| JP | 2015-012244 | 1/2015 |
| JP | 2015-501085 | 1/2015 |
| JP | 2016-039361 | 3/2016 |
| JP | 2017-011202 | 1/2017 |
| JP | 2017-513234 | 5/2017 |
| JP | 2017-529557 | 10/2017 |
| JP | 2019-509636 | 4/2019 |
| KR | 10-2006-0095690 | 9/2006 |
| KR | 10-2007-0089172 | 8/2007 |
| KR | 10-2008-0054626 | 6/2008 |
| KR | 10-2009-0119209 | 11/2009 |
| KR | 10-2010-0016901 | 2/2010 |
| KR | 10-2011-0118187 | 10/2011 |
| KR | 10-2012-0040011 | 4/2012 |
| KR | 10-1452801 | 10/2014 |
| KR | 10-2017-0050334 | 5/2017 |
| KR | 10-2017-0115142 | 10/2017 |
| WO | 2015073286 | 5/2015 |
| WO | 2017153123 | 9/2017 |

OTHER PUBLICATIONS

Written Opinion of the International Searching Authority dated Feb. 26, 2019, issued in International Application No. PCT/KR2018/014671.

International Search Report dated Feb. 26, 2019, issued in International Application No. PCT/KR2018/014674.

Written Opinion of the International Searching Authority dated Feb. 26, 2019, issued in International Application No. PCT/KR2018/014674.

International Search Report dated Mar. 6, 2019, issued in International Application No. PCT/KR2018/014728.

Written Opinion of the International Searching Authority dated Mar. 6, 2019, issued in International Application No. PCT/KR2018/014728.

International Searching Report dated Mar. 6, 2019, issued in International Application No. PCT/KR2018/014734.

Written Opinion of the International Searching Authority dated Mar. 6, 2019, issued in International Application No. PCT/KR2018/014734.

(56) References Cited

OTHER PUBLICATIONS

International Search Report dated Mar. 6, 2019, issued in International Application No. PCT/KR2018/014672.
Written Opinion of the International Searching Authority dated Mar. 6, 2019, issued in International Application No. PCT/KR2018/014672.
International Search Report dated Apr. 3, 2019, issued in International Application No. PCT/KR2018/015268.
Written Opinion of the International Searching Authority dated Apr. 3, 2019, issued in International Application No. PCT/KR2018/015268.
Takatoshi Tsujimura et al. Development of a color-tunable polychromatic organic-light-emitting-diode device for roll-to-roll manufacturing. Journal of the Society For Information Display, vol. 24, issue 4, Apr. 14, 2016, pp. 262-269.
Jaeyi Chun et al. Vertically Stacked Color Tunable Light-Emitting Diodes Fabricated Using Wafer Bonding and Transfer Printing. ACS Applied Materials & Interfaces 2014, vol. 6, issue 22, Nov. 3, 2014, pp. 19482-19487.
International Search Report dated Apr. 3, 2019, issued in International Application No. PCT/KR2018/015888.
Written Opinion of the International Searching Authority dated Apr. 3, 2019, issued in International Application No. PCT/KR2018/015888.
International Search Report dated Apr. 3, 2019, issued in International Application No. PCT/KR2018/016482.
Written Opinion of the International Searching Authority dated Apr. 3, 2019, issued in International Application No. PCT/KR2018/016482.
International Search Report dated Apr. 4, 2019, issued in International Application No. PCT/KR2019/000014.
Written Opinion of the International Searching Authority dated Apr. 4, 2019, issued in International Application No. PCT/KR2019/000014.
International Search Report dated Apr. 18, 2019, issued in International Application No. PCT/KR2019/000062.
Written opinion of the International Searching Authority dated Apr. 18, 2019, issued in International Application No. PCT/KR2019/000062.
International Search Report dated Apr. 9, 2019, issued in International Application No. PCT/KR2018/016474.
Written opinion of the International Searching Authority dated Apr. 9, 2019, issued in International Application No. PCT/KR2018/016474.
International Search Report dated Apr. 11, 2019, issued in International Application No. PCT/KR2018/016170.
Written opinion of the International Searching Authority dated Apr. 11, 2019, issued in International Application No. PCT/KR2018/016170.
Notice of Allowance dated Nov. 7, 2019, in U.S. Appl. No. 16/207,881.
Non-Final Office Action dated Oct. 24, 2019, in U.S. Appl. No. 16/228,621.
Non-Final Office Action dated Nov. 4, 2019, in U.S. Appl. No. 16/198,784.
Non-Final Office Action dated Nov. 19, 2019, in U.S. Appl. No. 16/198,792.
Ex Parte Quayle Action issued on Nov. 19, 2019, in U.S. Appl. No. 16/198,796.
Non-Final Office Action dated Oct. 31, 2019, in U.S. Appl. No. 16/198,850.
Non-Final Office Action dated Jan. 9, 2020, in U.S. Appl. No. 16/673,184.
Notice of Allowance dated Feb. 10, 2020, in U.S. Appl. No. 16/198,796.
Non-Final Office Action dated Mar. 5, 2020, in U.S. Appl. No. 16/228,601.
Final Office Action dated May 29, 2020, in U.S. Appl. No. 16/198,850.
Notice of Allowance dated Mar. 31, 2020, in U.S. Appl. No. 16/234,541.
Notice of Allowance dated Apr. 9, 2020, in U.S. Appl. No. 16/198,792.
Final Office Action dated Apr. 20, 2020, in U.S. Appl. No. 16/228,621.
Notice of Allowance dated Mar. 12, 2020, in U.S. Appl. No. 16/198,784.
Non-Final Office Action dated Mar. 23, 2020, in U.S. Appl. No. 16/219,716.
Non-Final Office Action dated Jun. 24, 2020, in U.S. Appl. No. 16/236,737.
Final Office Action dated Jun. 25, 2020, in U.S. Appl. No. 16/228,601.
Non-Final Office Action dated Feb. 19, 2021, in U.S. Appl. No. 16/198,850.
Final Office Action dated Feb. 23, 2021, in U.S. Appl. No. 16/228,621.
Non-Final Office Action dated Mar. 1, 2021, in U.S. Appl. No. 16/899,522.
Final Office Action dated Mar. 4, 2021, in U.S. Appl. No. 16/673,114.
Non-Final Office Action dated Mar. 18, 2021 in U.S. Appl. No. 16/228,601.
Final Office Action dated Apr. 21, 2021, in U.S. Appl. No. 16/198,784.
Non-Final Office Action dated Apr. 7, 2021, in U.S. Appl. No. 16/915,384.
Non-Final Office Action dated Apr. 15, 2021, in U.S. Appl. No. 16/673,184.
Final Office Action dated Mar. 25, 2021 in U.S. Appl. No. 16/200,036.
Final Office Action for U.S. Appl. No. 16/673,184 dated Jul. 23, 2020.
Notice of Allowance for U.S. Appl. No. 16/198,796 dated Aug. 26, 2020.
Notice of Allowance for U.S. Appl. No. 16/219,716 dated Sep. 3, 2020.
Non-Final Office Action for U.S. Appl. No. 16/673,114 dated Sep. 3, 2020.
Non-Final Office Action for U.S. Appl. No. 16/200,036 dated Sep. 24, 2020.
Non-Final Office Action for U.S. Appl. No. 16/228,621 dated Sep. 29, 2020.
Notice of Allowance dated Sep. 14, 2021, in U.S. Appl. No. 16/899,522.
Final Office Action dated Sep. 30, 2021, in U.S. Appl. No. 16/198,850.
Notice of Allowance dated Sep. 22, 2021, in U.S. Appl. No. 16/200,036.
Final Office Action dated Sep. 27, 2021, in U.S. Appl. No. 16/915,384.
Final Office Action dated Sep. 30, 2021, in U.S. Appl. No. 16/228,601.
Extended European Search Report dated Aug. 9, 2021, in European Patent Application No. 18890359.5.
Extended European Search Report dated Sep. 6, 2021, in European Patent Application No. 19736098.5.
Extended European Search Report dated Sep. 29, 2021, in European Patent Application No. 18891199.4.
Extended European Search Report dated Oct. 5, 2021, in European Patent Application No. 18882087.2.
Extended European Search Report dated Sep. 14, 2021, in European Patent Application No. 18881496.6.
Extended European Search Report dated Oct. 5, 2021, in European Patent Application No. 19736023.3.
Extended European Search Report dated Oct. 7, 2021, in European Patent Application No. 21182984.1.
Notice of Reasons for Refusal dated Sep. 14, 2021, in Japanese Patent Application No. 2020-532747.
Notice of Allowance dated Aug. 26, 2021, in U.S. Appl. No. 16/789,877.
Notice of Allowance dated Jul. 12, 2021, in U.S. Appl. No. 16/198,784.
Non-Final Office Action dated Jul. 8, 2021, in U.S. Appl. No. 16/228,621.
Final Office Action dated Dec. 2, 2021, in U.S. Appl. No. 16/228,621.
Notice of Allowance dated Dec. 9, 2021, in U.S. Appl. No. 16/915,384.
Final Office Action dated Nov. 12, 2021, in U.S. Appl. No. 16/673,184.
Non-Final Office Action dated Jan. 12, 2022, in U.S. Appl. No. 16/988,272.
Non-Final Office Action dated Jan. 21, 2022, in U.S. Appl. No. 16/673,114.

(56) References Cited

OTHER PUBLICATIONS

Notice of Allowance for U.S. Appl. No. 16/236,737 dated Oct. 28, 2020.
Non-Final Office Action for U.S. Appl. No. 16/198,784 dated Nov. 19, 2020.
Notice of Allowance issued in U.S. Appl. No. 16/228,621 dated Feb. 17, 2022.
Notice of Allowance issued in U.S. Appl. No. 16/673,184 dated Mar. 15, 2022.
Examination Report issued in Indian Patent Application 202037026094 dated Mar. 28, 2022.
Notice of Allowance issued in U.S. Appl. No. 16/228,601 dated Mar. 17, 2022.
Notice of Allowance issued in U.S. Appl. No. 16/198,850 dated Mar. 30, 2022.
Search Report issued in European Patent Application 21182998.1 dated Oct. 12, 2021.
Search Report issued in European Patent Application 21182996.5 dated Oct. 22, 2021.
Examination Report issued in Indian Patent Application 202037026000 dated Mar. 25, 2022.
Examination Report issued in Indian Patent Application 202037028070 dated Mar. 30, 2022.
Extended European Search Report issued in European Patent Application 18886954.9 dated Aug. 3, 2021.
Notice of Allowance issued in U.S. Appl. No. 16/915,384 dated Apr. 21, 2022.
Non-Final Office Action dated May 11, 2022, in U.S. Appl. No. 17/164,829.
Notice of Allowance issued in U.S. Appl. No. 16/988,272 dated Jun. 8, 2022.
Notice of Allowance issued in U.S. Appl. No. 16/228,621 dated Jun. 15, 2022.
Substantive Examination Report Notice dated Jun. 15, 2022, in Saudi Arabian Patent Application No. 520412046.
Notice of Allowance issued in U.S. Appl. No. 16/673,184 dated Jun. 23, 2022.
Office Action dated Jul. 5, 2022 for Japanese Patent Application No. 2020-536804(with English Translation).
Office Action dated Jul. 19, 2022 for Japanese Patent Application No. 2020-528916(with English Translation).
Notice of Allowance issued in U.S. Appl. No. 16/673,114 dated Jul. 27, 2022.
Office Action dated Aug. 2, 2022 for Japanese Patent Application No. 2020-529153(with English Translation).
Office Action dated Aug. 2, 2022 for Japanese Patent Application No. 2020-527964(with English Translation).
Notice of Allowance issued in U.S. Appl. No. 16/228,601 dated Aug. 9, 2022.
Non-Final Office Action dated Aug. 23, 2022, in U.S. Appl. No. 16/200,036.
Office Action dated Aug. 30, 2022 for Japanese Patent Application No. 2020-529553(with English Translation).
Office Action dated Aug. 30, 2022 for Japanese Patent Application No. 2020-534346(with English Translation).
Office Action dated Aug. 30, 2022 for Japanese Patent Application No. 2020-532579(with English Translation).
Substantive Examination Report Notice dated Aug. 29, 2022, in Saudi Arabian Patent Application No. 520412047.
Notice of Allowance issued in U.S. Appl. No. 16/198,850 dated Sep. 8, 2022.
Substantive Examination Report Notice dated Aug. 28, 2022, in Saudi Arabian Patent Application No. 520412187.
Takatoshi Tsujimura et al., Development of a color-tunable polychromatic organic-light-emitting-diode device for roll-to-roll manufacturing, Apr. 14, 2016, pp. 262-269, Journal of the SID.
Office Action dated Sep. 20, 2022 for Japanese Patent Application No. 2020-528905(with English Translation).
Office Action dated Sep. 20, 2022 for Japanese Patent Application No. 2020-528919(with English Translation).
Notice of Allowance issued in U.S. Appl. No. 17/164,829 dated Sep. 26, 2022.
Notice of Allowance issued in U.S. Appl. No. 16/915,384 dated Nov. 8, 2022.

* cited by examiner

LED UNIT FOR DISPLAY AND DISPLAY APPARATUS HAVING THE SAME

CROSS REFERENCE TO RELATED APPLICATIONS

This application claims priority from and the benefit of the U.S. Provisional Patent Application No. 62/590,870, filed on Nov. 27, 2017, United States Provisional Patent Application No. 62/590,854, filed on Nov. 27, 2017, U.S. Provisional Patent Application No. 62/608,297, filed on Dec. 20, 2017, U.S. Provisional Patent Application No. 62/614,900, filed on Jan. 8, 2018, U.S. Provisional Patent Application No. 62/635,284, filed on Feb. 26, 2018, U.S. Provisional Patent Application No. 62/643,563, filed on Mar. 15, 2018, United States Provisional Patent Application No. 62/657,589, filed on Apr. 13, 2018, U.S. Provisional Patent Application No. 62/657,607, filed on Apr. 13, 2018, U.S. Provisional Patent Application No. 62/683,564, filed on Jun. 11, 2018, the disclosures of which are hereby incorporated by reference for all purposes as if fully set forth herein.

BACKGROUND

Field

Exemplary implementations of the invention relate generally to a light emitting device for a display and a display apparatus including the same, and more specifically, to a micro light emitting device for a display and a display apparatus including the same.

Discussion of the Background

As an inorganic light source, light emitting diodes (LEDs) have been used in various fields including displays, vehicular lamps, general lighting, and the like. Due to advantages of an LED, such as longer lifespan, lower power consumption, and quicker than an existing light source, light emitting diodes have been quickly replacing existing light sources.

To date, conventional LEDs have been used as a backlight light source in a display apparatus. Recently, however, an LED display that directly generates an image using light emitting diodes has been developed.

In general, a display apparatus emits various colors through mixture of blue, green, and red light. In order to generate various images, a display apparatus includes a plurality of pixels, each of which includes subpixels corresponding to blue, green, and red light. As such, a color of a certain pixel is determined based on the colors of the subpixels, and an image is generated by combination of such pixels.

Since LEDs can emit various colors depending upon materials thereof, individual LED chips emitting blue, green, and red light may be arranged in a two-dimensional plane of a display apparatus. However, when one LED chip forms each subpixel, the number of LED chips required to form a display apparatus can exceed millions, thereby causing excessive time consumption for a mounting process.

Moreover, since the subpixels are arranged in the two-dimensional plane in the display apparatus, a relatively large area is occupied by one pixel including the subpixels for blue, green, and red light. Thus, there is a need for reducing the area of each subpixel, such that the subpixels may be formed in a restricted area. However, such would cause deterioration in brightness from reduced luminous area.

The above information disclosed in this Background section is only for understanding of the background of the inventive concepts, and, therefore, it may contain information that does not constitute prior art.

SUMMARY

Light emitting diodes constructed according to the principles and some exemplary implementations of the invention and displays using the same are capable of increasing an area of each subpixel without increasing the pixel area.

Light emitting diodes and display using the light emitting diodes, e.g., micro LEDs, constructed according to the principles and some exemplary implementations of the invention provide a light emitting device for a display, which can reduce the time for a mounting process.

Light emitting diodes and display using the light emitting diodes, e.g., micro LEDs, constructed according to the principles and some exemplary implementations of the invention provide a structurally stable light emitting device for a display and a display apparatus including the same by stacking first to third LED stacks one above another.

Light emitting diodes and display using the light emitting diodes, e.g., micro LEDs, constructed according to the principles and some exemplary implementations of the invention have a compact configuration achieved by a unique structure in which each LED stack is connected to two electrode pads to be independently driven. For example, one of the n- or p-type semiconductor layers in each LED stack may be connected to a separate via structure or directly to a respective one of the electrode pads and the other n- or p-type semi-conductor layer in each LED stack is connected to a common electrode.

Light emitting diodes and display using the light emitting diodes, e.g., micro LEDs, constructed according to the principles and some exemplary implementations of the invention include a growth substrate for the first LED stack, which may be a GaAs substrate, to obviate a process of removing the growth substrate from the first LED stack and to provide a more robust structure.

Light emitting diodes and display using the light emitting diodes, e.g., micro LEDs, constructed according to the principles and some exemplary implementations of the invention provide a light emitting device for a display that includes growth substrates for the first to third LED stacks, respectively, which may simplify manufacturing process as the process of removing the growth substrate from the LED stacks may be obviated.

Light emitting diodes and display using the light emitting diodes, e.g., micro LEDs, constructed according to the principles and some exemplary implementations of the invention may include electrode pads that overlap a portion of an ohmic electrode formed above an insulation layer to prevent or reduce the likelihood of the ohmic electrode from being peeled off during manufacture or use.

Additional features of the inventive concepts will be set forth in the description which follows, and in part will be apparent from the description, or may be learned by practice of the inventive concepts.

A light emitting diode according to an exemplary embodiment includes a first substrate, a first LED sub-unit adjacent to the first substrate, a second LED sub-unit adjacent to the first LED sub-unit, a third LED sub-unit adjacent to the second LED sub-unit, electrode pads disposed on the first substrate, and through-hole vias to electrically connect each electrode pad to a respective one of the first, second, and third LED sub-units, in which at least one of the through-hole vias is formed through the first substrate, the first LED sub-unit, and the second LED sub-unit.

The first LED sub-unit may be disposed under the first substrate, the second LED sub-unit may be disposed under the first LED sub-unit, the third LED sub-unit may be disposed under the second LED sub-unit, and the first, second, and third LED sub-units may be configured to emit red light, green light, and blue light, respectively.

The light emitting device may further include a distributed Bragg reflector interposed between the first substrate and the first LED sub-unit.

The first substrate may include a GaAs material.

The light emitting device may further include a second substrate disposed under the third LED sub-unit.

The second substrate may include at least one of a sapphire substrate and a GaN substrate.

The first LED sub-unit, the second LED sub-unit, and the third LED sub-unit may be configured to be independently driven, light generated from the first LED sub-unit may be configured to be emitted to the outside of the light emitting device by passing through the second LED sub-unit, the third LED sub-unit, and the second substrate, and light generated from the second LED sub-unit may be configured to be emitted to the outside of the light emitting device by passing through the third LED sub-unit and the second substrate.

The electrode pads may include a common electrode pad electrically connected to each of the first, second, and third LED sub-units, and a first electrode pad, a second electrode pad, and a third electrode pad may be electrically connected to the first LED sub-unit, the second LED sub-unit, and the third LED sub-unit, respectively.

The common electrode pad may be electrically connected to at least two of the through-hole vias.

The second electrode pad may be electrically connected to the second LED sub-unit through a first one of the through-hole vias formed through the first substrate and the first LED sub-unit, and the third electrode pad may be electrically connected to the third LED sub-unit through a second one of the through-hole vias formed through the first substrate, the first LED sub-unit, and the second LED sub-unit.

The first electrode pad may be electrically connected to the first substrate.

The first electrode pad may be electrically connected to the first LED sub-unit through a third one of the through-hole vias formed through the first substrate.

The light emitting device may further include a first transparent electrode interposed between the first LED sub-unit and the second LED sub-unit, and forming ohmic contact with a lower surface of the first LED sub-unit, a second transparent electrode interposed between the second LED sub-unit and the third LED sub-unit, and forming ohmic contact with a lower surface of the second LED sub-unit, and a third transparent electrode interposed between the second transparent electrode and the third LED sub-unit, and forming ohmic contact with an upper surface of the third LED sub-unit.

One of the electrode pads disposed on the first substrate may be electrically connected to the each of first transparent electrode, the second transparent electrode, and the third transparent electrode through three of the through-hole vias.

One of the electrode pads disposed on the first substrate may be connected to the first substrate.

The light emitting device may further include a first color filter interposed between the second and third transparent electrodes, and a second color filter interposed between the second LED sub-unit and the first transparent electrode, in which the first color filter and the second color filter include insulation layers having different refractive indices.

The light emitting device may further include an insulation layer interposed between the first substrate and the electrode pads and covering at least a portion of side surfaces of the first, second, and third LED sub-units.

The first, second, and third LED sub-units may include a first LED stack, a second LED stack, and a third LED stack, respectively.

The light emitting device may include a micro LED having a surface area less than about 10,000 square μm.

The first LED sub-unit may be configured to emit any one of red, green, and blue light, the second LED sub-unit may be configured to emit a different one of red, green, and blue light from the first LED sub-unit, and the third LED sub-unit may be configured to emit a different one of red, green, and blue light from the first and second LED sub-units.

A display apparatus may include a circuit board and a plurality of light emitting devices arranged on the circuit board, in which at least some of the light emitting devices may include the light emitting device according to an exemplary embodiment.

Each of the light emitting devices may further include a second substrate coupled to the third LED sub-unit.

A light emitting device for a display according to an exemplary embodiment includes a first light emitting diode (LED) sub-unit, a second LED sub-unit disposed below the first LED sub-unit, a third LED sub-unit disposed below the second LED sub-unit, a first substrate on which the first LED sub-unit is grown, a second substrate on which the second LED sub-unit is grown, and a third substrate on which the third LED sub-unit is grown.

The first, second, and third LED sub-units may be configured to emit red, green, and blue light, respectively.

The light emitting device may further include a distributed Bragg reflector disposed between the first substrate and the first LED sub-unit.

The second substrate may be configured to transmit red light.

The first substrate may include a GaAs material, the second substrate may include a GaP material, and the third may include at least one of a sapphire substrate and a GaN substrate.

The first LED sub-unit, the second LED sub-unit, and the third LED sub-unit may be configured to be independently driven, light generated by the first LED sub-unit may be configured to the emitted to the outside of the light emitting device by passing through the second substrate, the second LED sub-unit, the third LED sub-unit, and the third substrate, and light generated by the second LED sub-unit may be configured to be emitted to the outside of the light emitting device by passing through the third LED sub-unit and the third substrate.

The light emitting device may further include electrode pads disposed on the first substrate and through-vias passing through the first substrate to electrically connect the electrode pads to the first, second, and third LED sub-units, in which at least one of the through-vias passes through the first substrate, the first LED sub-unit, the second substrate, and the second LED sub-unit.

The electrode pads may include a common electrode pad electrically connected to each of the first, second, and third LED sub-units, and a first electrode pad, a second electrode pad, and a third electrode pad electrically connected to the first LED sub-unit, the second LED sub-unit, and the third LED sub-unit, respectively.

The common electrode pad may be electrically connected to at least two of the through-vias.

The second electrode pad may be electrically connected to the second LED sub-unit through a first one of the through-vias passing through the first substrate and the first LED sub-unit, and the third electrode pad may be electrically connected to the third LED sub-unit through a second one of the through-vias passing through the first substrate, the first LED sub-unit, the second substrate, and the second LED sub-unit.

The first electrode pad may be electrically connected to the first substrate.

The first electrode pad may be electrically connected to the first LED sub-unit through a third one of the through-vias passing through the first substrate.

The light emitting device may further include a first transparent electrode in ohmic contact with the first LED sub-unit, a second transparent electrode in ohmic contact with the second LED sub-unit, and a third transparent electrode in ohmic contact with the third LED sub-unit.

One of the electrode pads disposed on the first substrate may be electrically connected to the first transparent electrode, the second transparent electrode, and the third transparent electrode through the through-vias.

One of the electrode pads disposed on the first substrate may be connected to the first substrate.

The light emitting device may further include an insulating layer disposed between the first substrate and the electrode pads and covering at least a portion of a lateral surface of the first, second, and third LED sub-units, a first color filter disposed between the second and third LED sub-units, and a second color filter disposed between the first and second LED sub-units, in which the first color filter and the second color filter include insulating layer with different refractive indices.

The first, second, and third LED sub-units may include a first LED stack, a second LED stack, and a third LED stack, respectively.

The light emitting device may include a micro LED having a surface area less than about 10,000 square μm.

The first LED sub-unit may be configured to emit any one of red, green, and blue light, the second LED sub-unit may be configured to emit a different one of red, green, and blue light from the first LED sub-unit, and the third LED sub-unit may be configured to emit a different one of red, green, and blue light from the first and second LED sub-units.

A display apparatus includes a circuit board and a plurality of light emitting devices arranged on the circuit board, at least some of the light emitting devices including the light emitting device according to an exemplary embodiment, electrode pads disposed on the first substrate, and through-vias passing through the first substrate to electrically connect the electrode pads to the first, second, and third LED sub-units, in which at least one of the through-vias passes through the first substrate, the first LED sub-unit, the second substrate, and the second LED sub-unit, and the electrode pads are electrically connected to the circuit board.

The second substrate may include a plurality of first through-vias.

The light emitting device may further include electrode pads disposed on the first substrate, and second through-vias passing through the first substrate to electrically connect the electrode pads to the first, second, and third LED sub-units, in which the second through-vias are disposed on the second substrate and are electrically connected to the first through-vias.

The light emitting device may further include connectors disposed between the second through-vias and the first through-vias and electrically connecting the second through-vias and the first through-vias.

The electrode pads may include a common electrode pad electrically connected to each of the first, second, and third LED sub-units, and a first electrode pad, a second electrode pad, and a third electrode pad electrically connected to the first LED sub-unit, the second LED sub-unit, and the third LED sub-unit, respectively.

The light emitting device may further include a conductor disposed between the second substrate and the third substrate and electrically connecting at least one of the first through-vias to the third LED sub-unit.

The second electrode pad may be electrically connected to the second LED sub-unit through at least one of the first through-vias, and the third electrode pad may be electrically connected to the third LED sub-unit through at least one of the first through-vias and the conductor.

The light emitting device may further include an ohmic electrode connected to an n-type semiconductor layer of the third LED sub-unit, in which the third electrode pad is electrically connected to the ohmic electrode through the conductor.

At least some of the first through-vias may not be filled with a conductive material.

The first through-vias may include a first group overlapping the connectors and a second group not overlapping the connectors, and the first group of the first through-vias may be filled with a material different from the second group of the first through-vias.

The second group of the first through-vias may include air or be in vacuum.

The third substrate may have a longitudinal width different from those of the first and second substrates.

The third substrate may have a greater longitudinal width than the first and second substrates, and the first and second substrates may have substantially the same longitudinal widths.

The first through-via, the second through-via, and the third through-via may have different widths from each other.

A light emitting device for a display according to an exemplary embodiment includes a first substrate, a first LED sub-unit disposed on the first substrate, a second LED sub-unit disposed on the first LED sub-unit, a third LED sub-unit disposed on the second LED sub-unit, a second substrate disposed on the third LED sub-unit, a first electrode pad, a second electrode pad, a third electrode pad, and a fourth electrode pad disposed on the second substrate, and through-hole vias electrically connecting the second, third, and fourth electrode pads to the first, second, and third LED sub-units, respectively, in which the first electrode pad is electrically connected to the first LED sub-unit without overlapping any through-hole vias.

The fourth electrode pad may overlap a greater number of through-hole vias than the second or third electrode pad, and be electrically connected to each of the first, second, and third LED sub-units.

The first, second, and third LED sub-units may include a first LED stack, a second LED stack, and a third LED stack, respectively, and the light emitting device may include a micro LED having a surface area less than about 10,000 square μm.

The first LED stack may be configured to emit any one of red, green, and blue light, the second LED stack may be configured to emit a different one of red, green, and blue light from the first LED sub-unit, and the third LED stack may be configured to emit a different one of red, green, and blue light from the first and second LED sub-units.

The light emitting device may further include a first insulating layer disposed on the second substrate.

The light emitting device may further include an electrode disposed on the second substrate, in which the first insulating layer has at least one opening, and a first portion of the electrode is disposed in the at least one opening of the first insulating layer.

A second portion of the electrode may be disposed on the first insulating layer.

At least one of the first, second, third, and fourth electrode pads may partially overlap the second portion of the electrode.

The light emitting device may further include a second insulating layer disposed on the first insulating layer.

The second insulating layer may have openings, and portions of the first, second, third, and fourth electrode pads may be disposed in the openings of the second insulating layer, respectively.

Each of the openings in the second insulating layer may have substantially the same size.

The size of an area of the first electrode pad contacting the electrode may be different from the size of an area of one of the second, third, and fourth electrode pads contacting a corresponding through-hole via.

The size of an area of the first electrode pad contacting the electrode may be substantially the same as the size of an area of one of the second, third, and fourth electrode pads contacting a corresponding through-hole via.

At least one of the first and second insulating layers may cover a side surface of the second substrate and expose a side surface of the first substrate.

A portion of the second insulating layer may be disposed between the first electrode pad and the electrode.

The electrode may at least partially overlap each of the first, second, third, and fourth electrode pads.

At least one of the first, second, third, and fourth electrode pads may be disposed on a plane different from at least one of the remaining ones of the first, second, third, and fourth electrode pads.

The through-hole vias may be formed through the second substrate.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
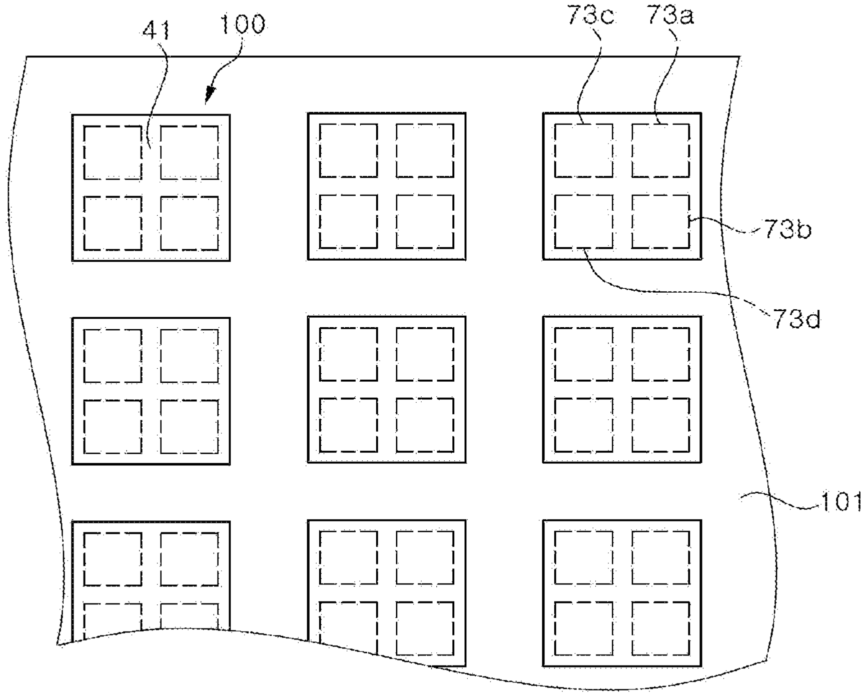
FIG. 1 is a schematic plan view of a display apparatus according to an exemplary embodiment of the invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

As used herein, a light emitting device or a light emitting diode according to exemplary embodiments may include a micro LED, which has a surface area less than about 10,000 square μm as known in the art. In other exemplary embodiments, the micro LED's may have a surface area of less than about 4,000 square μm, or less than about 2,500 square μm, depending upon the particular application.

FIG. 1 is a schematic plan view of a display apparatus according to an exemplary embodiment.

Referring to FIG. 1, the display apparatus according to an exemplary embodiment includes a circuit board 101 and a plurality of light emitting devices 100.

The circuit board 101 may include a circuit for passive matrix driving or active matrix driving. In one exemplary embodiment, the circuit board 101 may include interconnection lines and resistors. In another exemplary embodiment, the circuit board 101 may include interconnection lines, transistors, and capacitors. In addition, the circuit board 101 may have electrode pads disposed on an upper surface thereof to allow electrical connection to the circuit therein.

The light emitting devices 100 are arranged on the circuit board 101. Each of the light emitting devices 100 may constitute one pixel. The light emitting device 100 includes electrode pads 73*a*, 73*b*, 73*c*, and 73*d*, which are electrically connected to the circuit board 101. In addition, the light emitting device 100 includes a substrate 41 on an upper surface thereof. Since the light emitting devices 100 are separated from one another, the substrates 41 disposed on the upper surfaces of the light emitting devices 100 are also separated from one another.

Figure 2A:
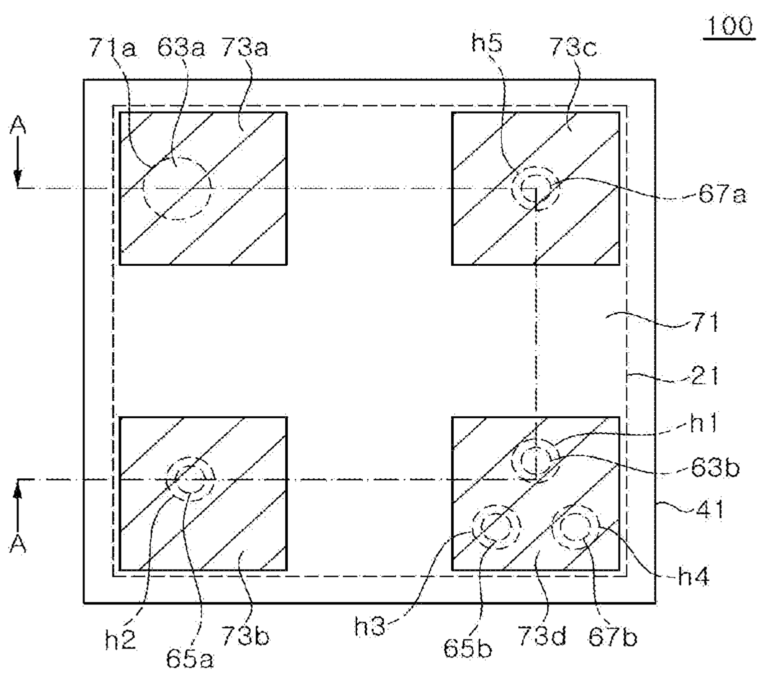
FIG. 2A is a schematic plan view of a light emitting device for a display according to an exemplary embodiment.
Figure 2B:
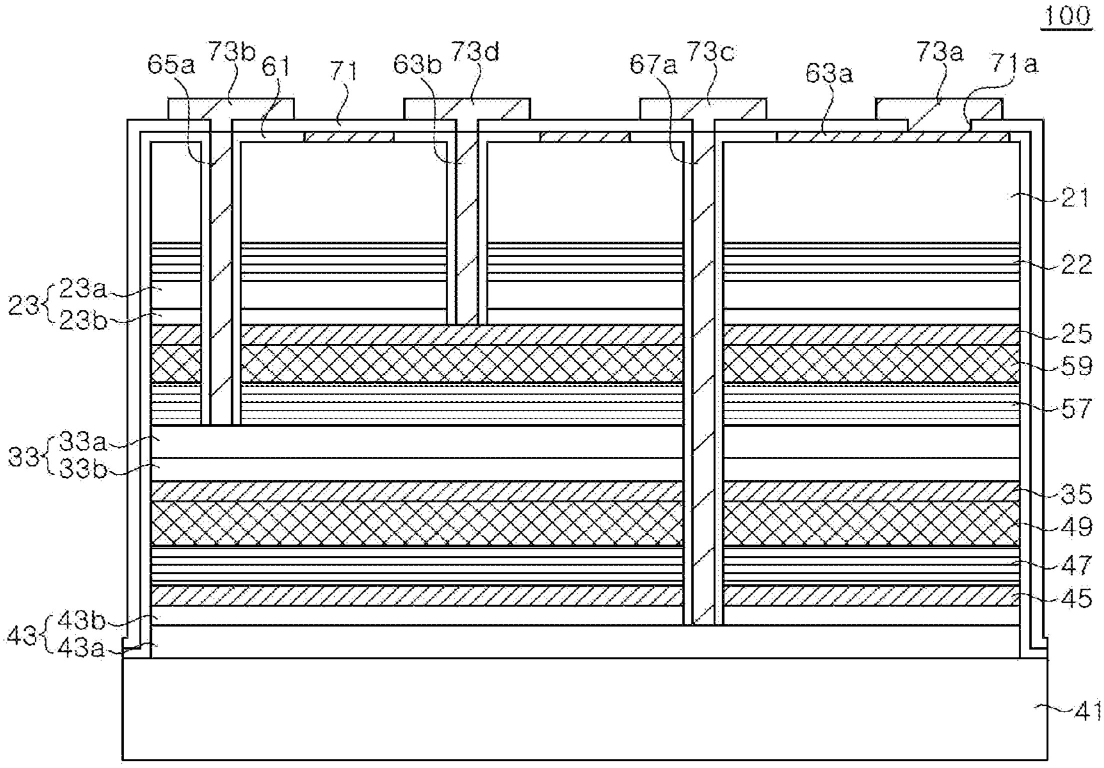
FIG. 2B is a schematic cross-sectional view taken along line A-A of FIG. 2A.

Details of the light emitting device 100 will be described with reference to FIG. 2A and FIG. 2B. FIG. 2A is a schematic plan view of the light emitting device 100 for a display according to an exemplary embodiment, and FIG. 2B is a schematic cross-sectional view taken along line A-A of FIG. 2A. Although the electrode pads 73*a*, 73*b*, 73*c*, and 73*d* are illustrated as being disposed at an upper side, the inventive concepts are not limited thereto, and the light emitting device 100 may be flip-bonded to the circuit board 101, and thus, the electrode pads 73*a*, 73*b*, 73*c*, and 73*d* may be disposed at a lower side.

Referring to FIG. 2A and FIG. 2B, the light emitting device 100 includes a first substrate 21, a second substrate 41, a distributed Bragg reflector 22, a first LED stack 23, a second LED stack 33, a third LED stack 43, a first transparent electrode 25, a second transparent electrode 35, a third transparent electrode 45, a first color filter 47, a second color filter 57, a first bonding layer 49, a second bonding layer 59, a lower insulation layer 61, an upper insulation layer 71, an ohmic electrode 63*a*, through-hole vias 63*b*, 65*a*, 65*b*, 67*a*, and 67*b*, and electrode pads 73*a*, 73*b*, 73*c*, and 73*d*.

The first substrate 21 may support the LED stacks 23, 33, and 43. The first substrate 21 may be a growth substrate for growth of the first LED stack 23, for example, a GaAs substrate. In particular, the first substrate 21 may have conductivity.

The second substrate 41 may support the LED stacks 23, 33, and 43. The LED stacks 23, 33, and 43 are disposed between the first substrate 21 and the second substrate 41. The second substrate 41 may be a growth substrate for growth of the third LED stack 43. For example, the second substrate 41 may be a sapphire substrate or a GaN substrate, for example, a patterned sapphire substrate. The first to third LED stacks are disposed on the second substrate 41 in the sequence of the third LED stack 43, the second LED stack 33 and the first LED stack 23 from the second substrate 41. In one exemplary embodiment, one third LED stack 43 may be disposed on one second substrate 41. The second LED stack 33, the first LED stack 23, and the first substrate 21 may be disposed on the third LED stack 43. Accordingly, the light emitting device 100 may have a single chip structure of a single pixel.

In another exemplary embodiment, a plurality of third LED stacks 43 may be disposed on one second substrate 41. The second LED stack 33, the first LED stack 23, and the first substrate 21 may be disposed on each of the third LED stacks 43, whereby the light emitting device 100 has a single chip structure of a plurality of pixels.

According to an exemplary embodiment, the second substrate 41 may be omitted and a lower surface of the third LED stack 43 may be exposed. In this case, a roughened surface may be formed on the lower surface of the third LED stack 43 by surface texturing.

Each of the first LED stack 23, the second LED stack 33, and the third LED stack 43 includes a first conductivity type semiconductor layer 23*a*, 33*a*, and 43*a*, a second conductivity type semiconductor layer 23*b*, 33*b*, and 43*b*, and an active layer interposed therebetween, respectively. The active layer may have a multi-quantum well structure.

The LED stacks may emit light having a shorter wavelength as being disposed closer to the second substrate 41. For example, the first LED stack 23 may be an inorganic light emitting diode configured to emit red light, the second LED stack 33 may be an inorganic light emitting diode configured to emit green light, and the third LED stack 43 may be an inorganic light emitting diode configured to emit blue light. The first LED stack 23 may include an AlGaInP-based well layer, the second LED stack 33 may include an AlGaInP or AlGaInN-based well layer, and the third LED stack 43 may include an AlGaInN-based well layer. However, the inventive concepts are not limited thereto. When the light emitting device 100 includes a micro LED, which has a surface area less than about 10,000 square μm as known in the art, or less than about 4,000 square μm or 2,500 square μm in other exemplary embodiments, the first LED stack 23 may emit any one of red, green, and blue light, and the second and third LED stacks 33 and 43 may emit a different one of red, green, and blue light, without adversely affecting operation, due to the small form factor of a micro LED.

The first conductivity type semiconductor layer 23*a*, 33*a*, and 43*a* of each of the LED stacks 23, 33, and 43 may be an n-type semiconductor layer, and the second conductivity type semiconductor layer 23*b*, 33*b*, and 43*b* thereof may be a p-type semiconductor layer. In particular, an upper surface of the first LED stack 23 may be an n-type semiconductor layer 23*a*, an upper surface of the second LED stack 33 may be an n-type semiconductor layer 33*a*, and an upper surface of the third LED stack 43 may be a p-type semiconductor layer 43*b*. More particularly, only the semiconductor layers of the third LED stack 43 may be stacked in a different sequence from those of the first and second LED stacks 23 and 33. The first conductivity type semiconductor layer 43*a* of the third LED stack 43 may be surface textured in order to improve light extraction efficiency. In addition, the first conductivity type semiconductor layer 33*a* of the second LED stack 33 may also be subjected to surface texturing.

The first LED stack 23, the second LED stack 33, and the third LED stack 43 may be stacked to overlap one another, and may have substantially the same luminous area. Further, in each of the LED stacks 23, 33, and 43, the first conductivity type semiconductor layer 23*a*, 33*a*, 43*a* may have substantially the same area as the second conductivity type semiconductor layer 23*b*, 33*b*, 43*b*. In particular, in each of the first LED stack 23 and the second LED stack 33, the first conductivity type semiconductor layer 23*a* and 33*a* may completely overlap the second conductivity type semiconductor layer 23*b* and 33*b*. In the third LED stack 43, a hole h5 is formed to expose the first conductivity type semiconductor layer 43$a$, such that the first conductivity type semiconductor layer 43$a$ has a slightly larger area than the second conductivity type semiconductor layer 43$b$.

The first LED stack 23 is disposed apart from the second substrate 41, the second LED stack 33 is disposed under the first LED stack 23, and the third LED stack 43 is disposed under the second LED stack. Since the first LED stack 23 may emit light having a longer wavelength than the second and third LED stacks 33 and 43, light generated from the first LED stack 23 may be emitted after passing through the second and third LED stacks 33 and 43 and the second substrate 41. In addition, since the second LED stack 33 may emit light having a longer wavelength than the third LED stack 43, light generated from the second LED stack 33 may be emitted after passing through the third LED stack 43 and the second substrate 41.

A distributed Bragg reflector 22 may be interposed between the first substrate 21 and the first LED stack 23. The distributed Bragg reflector 22 reflects light generated from the first LED stack 23 to prevent light from being lost through absorption by the first substrate 21. For example, the distributed Bragg reflector 22 may be formed by alternately stacking AlAs and AlGaAs-based semiconductor layers one above another.

The first transparent electrode 25 may be interposed between the first LED stack 23 and the second LED stack 33. The first transparent electrode 25 forms ohmic contact with the second conductivity type semiconductor layer 23$b$ of the first LED stack 23 and transmits light generated from the first LED stack 23. The first transparent electrode 25 may include a metal layer or a transparent oxide layer, such as an indium tin oxide (ITO) layer.

The second transparent electrode 35 forms ohmic contact with the second conductivity type semiconductor layer 33$b$ of the second LED stack 33. As shown in the drawings, the second transparent electrode 35 is interposed between the second LED stack 33 and the third LED stack 43 and adjoins the lower surface of the second LED stack 33. The second transparent electrode 35 may include a metal layer or a conductive oxide layer transparent to red light and green light.

The third transparent electrode 45 forms ohmic contact with the second conductivity type semiconductor layer 43$b$ of the third LED stack 43. The third transparent electrode 45 may be interposed between the second LED stack 33 and the third LED stack 43 and adjoin the upper surface of the third LED stack 43. The third transparent electrode 45 may include a metal layer or a conductive oxide layer transparent to red light and green light. The third transparent electrode 45 may also be transparent to blue light. Each of the second transparent electrode 35 and the third transparent electrode 45 forms ohmic contact with the p-type semiconductor layer of each of the LED stacks to assist in current spreading. Examples of conductive oxides for the second and third transparent electrodes 35 and 45 may include $SnO_2$, $InO_2$, ITO, ZnO, IZO, or others.

The first color filter 47 may be interposed between the third transparent electrode 45 and the second LED stack 33, and the second color filter 57 may be interposed between the second LED stack 33 and the first LED stack 23. The first color filter 47 transmits light generated from the first and second LED stacks 23 and 33 while reflecting light generated from the third LED stack 43. The second color filter 57 transmits light generated from the first LED stack 23 while reflecting light generated from the second LED stack 33. Accordingly, light generated from the first LED stack 23 can be emitted to the outside through the second LED stack 33 and the third LED stack 43, and light generated from the second LED stack 33 can be emitted outside through the third LED stack 43. In this manner, the light emitting device according to an exemplary embodiment can prevent light loss by preventing light generated from the second LED stack 33 from entering the first LED stack 23, or light generated from the third LED stack 43 from entering the second LED stack 33.

In some exemplary embodiments, the second color filter 57 can reflect light generated from the third LED stack 43.

The first and second color filters 47 and 57 may be, for example, a low pass filter that allows light in a low frequency band, that is, in a long wavelength band, to pass therethrough, a band pass filter that allows light in a predetermined wavelength band to pass therethrough, or a band stop filter that prevents light in a predetermined wavelength band from passing therethrough. In particular, each of the first and second color filters 47 and 57 may be formed by alternately stacking insulation layers having different indices of refraction one above another, for example, $TiO_2$ and $SiO_2$. In particular, each of the first and second color filters 47, 57 may include a distributed Bragg reflector (DBR). In addition, the stop band of the distributed Bragg reflector can be controlled by adjusting the thicknesses of $TiO_2$ and $SiO_2$ layers. The low pass filter and the band pass filter may be formed by alternately stacking insulation layers having different indices of refraction one above another.

The first bonding layer 49 couples the second LED stack 33 to the third LED stack 43. The first bonding layer 49 may be interposed between the first color filter 47 and the second transparent electrode 35 to couple the first color filter 47 to the second transparent electrode 35. For example, the first bonding layer 49 may be formed of a transparent organic material or a transparent inorganic material. Examples of the organic material may include SU8, poly(methyl methacrylate) (PMMA), polyimide, Parylene, benzocyclobutene (BCB), or others, and examples of the inorganic material may include $Al_2O_3$, $SiO_2$, $SiN_x$, or others. Particularly, the first bonding layer 49 may be formed of spin-on-glass (SOG).

The second bonding layer 59 couples the second LED stack 33 to the first LED stack 23. As shown in the drawings, the second bonding layer 59 may be interposed between the second color filter 57 and the first transparent electrode 25. The second bonding layer 59 may include substantially the same material forming the first bonding layer 49.

Holes h1, h2, h3, h4, and h5 are formed through the first substrate 21. The hole h1 may be formed through the first substrate 21, the distributed Bragg reflector 22, and the first LED stack 23 to expose the first transparent electrode 25. The hole h2 may be formed through the first substrate 21, the distributed Bragg reflector 22, the first transparent electrode 25, the second bonding layer 59, and the second color filter 57 to expose the first conductivity type semiconductor layer 33$a$ of the second LED stack 33.

The hole h3 may be formed through the first substrate 21, the distributed Bragg reflector 22, the first transparent electrode 25, the second bonding layer 59, the second color filter 57, and the second LED stack 33 to expose the second transparent electrode 35. The hole h4 may be formed through the first substrate 21, the distributed Bragg reflector 22, the first transparent electrode 25, the second bonding layer 59, the second color filter 57, the second LED stack 33, the second transparent electrode 35, the first bonding layer 49, and the first color filter 47 to expose the third transparent electrode 45. The hole h5 may be formed through the first substrate 21, the distributed Bragg reflector 22, the first transparent electrode 25, the second bonding layer 59, the second color filter 57, the second LED stack 33, the second transparent electrode 35, the first bonding layer 49, the first color filter 47, the third transparent electrode 45, and the second conductivity type semiconductor layer 43*b* to expose the first conductivity type semiconductor layer 43*a* of the third LED stack 43.

Although the holes h1, h3, and h4 are illustrated as being separated from one another to expose the first to third transparent electrodes 25, 35, and 45, respectively, however, the inventive concepts are not limited thereto. For example, the first to third transparent electrodes 25, 35, and 45 may be exposed through a single hole.

The lower insulation layer 61 covers the side surfaces of the first substrate 21 and the first to third LED stacks 23, 33, and 43, while covering the upper surface of the first substrate 21. The lower insulation layer 61 may also covers side surfaces of the holes h1, h2, h3, h4, and h5. The lower insulation layer 61 may be subjected to patterning to expose the bottom of each of the holes h1, h2, h3, h4, and h5. Furthermore, the lower insulation layer 61 may be subjected to patterning to expose the upper surface of the first substrate 21.

The ohmic electrode 63*a* forms ohmic contact with the upper surface of the first substrate 21. The ohmic electrode 63*a* may be formed in an exposed region of the first substrate 21, which is exposed by patterning the lower insulation layer 61. For example, the ohmic electrode 63*a* may be formed of Au—Te alloys or Au—Ge alloys. According to some exemplary embodiments, a portion of the ohmic electrode 63*a* may be formed on the top surface of the lower insulation layer 61, which will be described in more detail below with reference to FIG. 13C.

The through-hole vias 63*b*, 65*a*, 65*b*, 67*a*, and 67*b* are disposed in the holes h1, h2, h3, h4, and h5, respectively. The through-hole via 63*b* may be disposed in the hole h1 and connected to the first transparent electrode 25. The through-hole via 65*a* may be disposed in the hole h2 and form ohmic contact with the first conductivity type semiconductor layer 33*a*. The through-hole via 65*b* may be disposed in the hole h3 and connected to the second transparent electrode 35. The through-hole via 67*a* may be disposed in the hole h5 and form ohmic contact with the first conductivity type semiconductor layer 43*a*. The through-hole via 67*b* may be disposed in the hole h4 and connected to the third transparent electrode 45.

The upper insulation layer 71 covers the lower insulation layer 61 and the ohmic electrode 63*a*. The upper insulation layer 71 may cover the lower insulation layer 61 at the side surfaces of the first substrate 21 and the first to third LED stacks 23, 33, and 43, and may cover the lower insulation layer 61 at the upper side of the first substrate 21. The upper insulation layer 71 may have an opening 71*a* which exposes the ohmic electrode 63*a*, and openings which expose the through-hole vias 63*b*, 65*a*, 65*b*, 67*a*, and 67*b*.

The lower insulation layer 61 and the upper insulation layer 71 may be formed of silicon oxide or silicon nitride, without being limited thereto. For example, the lower insulation layer 61 and the upper insulation layer 71 may be a distributed Bragg reflector formed by stacking insulation layers having different indices of refraction. In particular, the upper insulation layer 71 may be a light reflective layer or a light blocking layer.

The electrode pads 73*a*, 73*b*, 73*c*, and 73*d* are disposed on the upper insulation layer 71, and are electrically connected to the first to third LED stacks 23, 33, and 43. For example, the first electrode pad 73*a* is electrically connected to the ohmic electrode 63*a* exposed through the opening 71*a* of the upper insulation layer 71, and the second electrode pad 73*b* is electrically connected to the through-hole via 65*a* exposed through the opening of the upper insulation layer 71. In addition, the third electrode pad 73*c* is electrically connected to the through-hole via 67*a* exposed through the opening of the upper insulation layer 71. The common electrode pad 73*d* is commonly electrically connected to the through-hole vias 63*b*, 65*b*, and 67*b*. As such, the first electrode pad 73*a* may not overlap a through-hole via in a plan view.

Accordingly, the common electrode pad 73*d* is commonly electrically connected to the second conductivity type semiconductor layers 23*b*, 33*b*, and 43*b* of the first to third LED stacks 23, 33, and 43, and each of the electrode pads 73*a*, 73*b*, and 73*c* is electrically connected to the first conductivity type semiconductor layers 23*a*, 33*a*, and 43*a* of the first to third LED stacks 23, 33, and 43, respectively.

According to an exemplary embodiment, the first LED stack 23 is electrically connected to the electrode pads 73*d* and 73*a*, the second LED stack 33 is electrically connected to the electrode pads 73*d* and 73*b*; and the third LED stack 43 is electrically connected to the electrode pads 73*d* and 73*c*. In this case, the anodes of the first to third LED stacks 23, 33, and 43 are commonly electrically connected to the electrode pad 73*d*, and the cathodes thereof are electrically connected to the first to third electrode pads 73*a*, 73*b*, and 73*c*, respectively. Accordingly, the first to third LED stacks 23, 33, and 43 can be independently driven. According to an exemplary embodiment, the size of an area of the electrode pad 73*a* contacting the ohmic electrode 63*a* may be different from the size of an area of the electrode pad 73*c*, for example, contacting the thorough-hole via 67*a*. According to other exemplary embodiments, the size of an area of the electrode pad 73*a* contacting the ohmic electrode 63*a* may be substantially the same as the size of an area of the electrode pad 73*c*, for example, contacting the thorough-hole via 67*a*.

FIGS. 3, 4, 5, 6, 7, 8, 9A, 9B, 10A, 10B, 11A, 11B, 12A, 12B, 13A, and 13B are schematic plan views and cross-sectional views illustrating a method of manufacturing a light emitting device for a display according to an exemplary embodiment. In these drawings, each plan view corresponds to FIG. 2A and each cross-sectional view corresponds to the cross-sectional view taken along line A-A of FIG. 2A.

Figure 3:
FIGS. 3, 4, 5, 6, 7, 8, 9A, 9B, 10A, 10B, 11A, 11B, 12A, 12B, 13A, 13B, and 13C are schematic plan views and cross-sectional views illustrating a method of manufacturing a light emitting device for a display according to exemplary embodiments.

Referring to FIG. 3, a first LED stack 23 is grown on a first substrate 21. The first substrate 21 may be, for example, a GaAs substrate. The first LED stack 23 may be formed on AlGaInP-based semiconductor layers and includes a first conductivity type semiconductor layer 23*a*, an active layer, and a second conductivity type semiconductor layer 23*b*. Here, the first conductivity type may be n-type and the second conductivity type may be p-type. On the other hand, the distributed Bragg reflector 22 may be formed prior to growth of the first LED stack 23. The distributed Bragg reflector 22 may have a stack structure formed by repeatedly stacking AlAs/AlGaAs layers.

A first transparent electrode 25 may be formed on the second conductivity type semiconductor layer 23*b*. The first transparent electrode 25 may be formed of a transparent oxide such as indium tin oxide (ITO) or a transparent metal.

Figure 4:
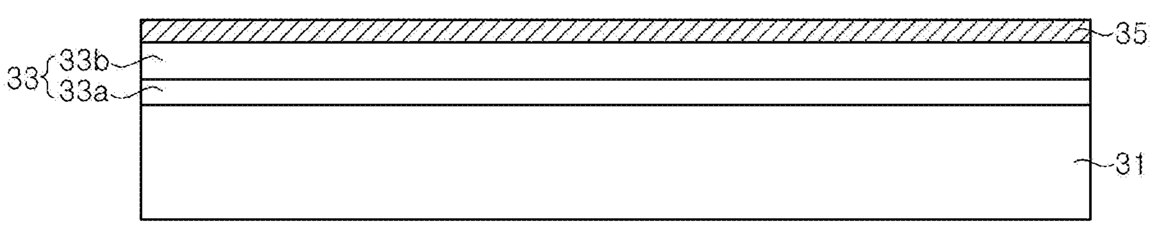

Referring to FIG. 4, a second LED stack 33 is grown on a substrate 31 and a second transparent electrode 35 is formed on the second LED stack 33. The second LED stack 33 may be formed of AlGaInP-based or AlGaInN-based semiconductor layers, and may include a first conductivity type semiconductor layer 33*a*, an active layer, and a second conductivity type semiconductor layer 33*b*. The substrate 31 may be a substrate that allows growth of AlGaInP-based semiconductor layers thereon, for example, a GaAs substrate or a GaP, or a substrate that allows growth of AlGaInN-based semiconductor layers thereon, for example, a sapphire substrate. The first conductivity type may be n-type and the second conductivity type may be p-type. The composition ratio of Al, Ga, and In for the second LED stack 33 may be determined such that the second LED stack 33 emits green light. In addition, when the GaP substrate is used, a pure GaP layer or a nitrogen (N) doped GaP layer is formed on the GaP to emit green light. The second transparent electrode 35 forms ohmic contact with the second conductivity type semiconductor layer 33*b*. The second transparent electrode 35 may be formed of a metal or a conductive oxide, for example, $SnO_2$, $InO_2$, ITO, ZnO, IZO, and the like.

Figure 5:
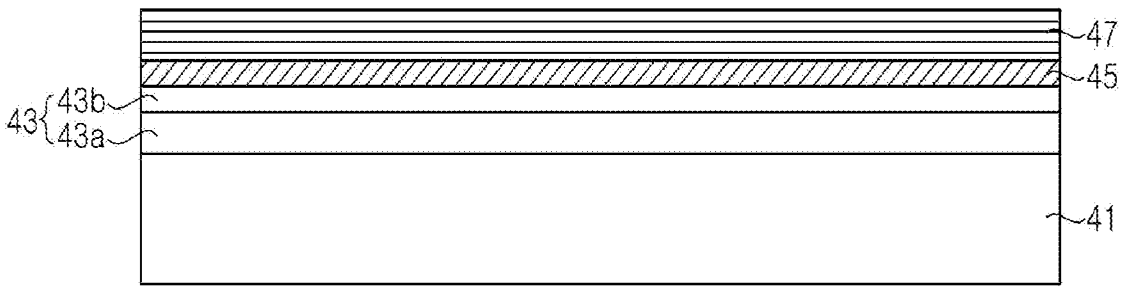

Referring to FIG. 5, a third LED stack 43 is grown on a second substrate 41, and a third transparent electrode 45 and a first color filter 47 are formed on the third LED stack 43. The third LED stack 43 is formed of AlGaInN-based semiconductor layers, and may include a first conductivity type semiconductor layer 43*a*, an active layer, and a second conductivity type semiconductor layer 43*b*. Here, the first conductivity type may be n-type and the second conductivity type may be p-type.

The second substrate 41 is a substrate that allows growth of GaN-based semiconductor layers thereon, and is different from the first substrate 21. The composition ratio of AlGaInN for the third LED stack 43 is determined to allow the third LED stack 43 to emit blue light. The third transparent electrode 45 forms ohmic contact with the second conductivity type semiconductor layer 43*b*. The third transparent electrode 45 may be formed of a conductive oxide, for example, $SnO_2$, $InO_2$, ITO, ZnO, IZO, and the like.

The first color filter 47 is substantially the same as that described with reference to FIG. 2A and FIG. 2B, and thus, detailed descriptions thereof will be omitted to avoid redundancy.

Figure 6:
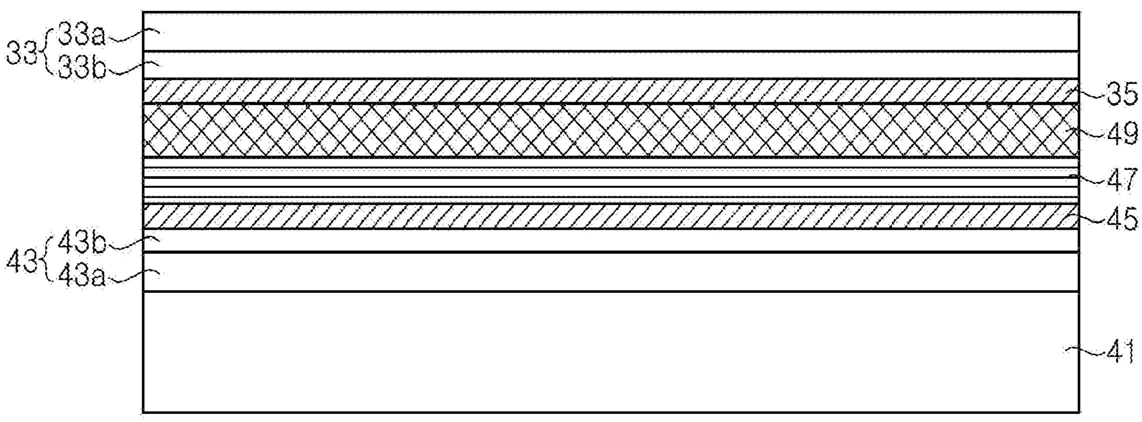

Referring to FIG. 6, the second LED stack 33 of FIG. 4 is bonded to an upper side of the third LED stack 43 of FIG. 5, and the substrate 31 is removed therefrom.

The first color filter 47 is bonded to the second transparent electrode 35 so as to face each other. For example, bonding material layers may be formed on the first color filter 47 and the second transparent electrode 35, which are bonded to each other, thereby forming a first bonding layer 49. The bonding material layers may be, for example, transparent organic material layers or transparent inorganic material layers. Examples of the organic material may include SU8, poly(methyl methacrylate) (PMMA), polyimide, Parylene, benzocyclobutene (BCB), or others, and examples of the inorganic material may include $Al_2O_3$, $SiO_2$, $SiN_x$, or others. More particularly, the first bonding layer 49 may be formed of spin-on-glass (SOG).

Thereafter, the substrate 31 may be removed from the second LED stack 33 by laser lift-off or chemical lift-off. As such, an upper surface of the first conductivity type semiconductor layer 33*a* of the second LED stack 33 is exposed. The exposed surface of the first conductivity type semiconductor layer 33*a* may be subjected to texturing.

Figure 7:
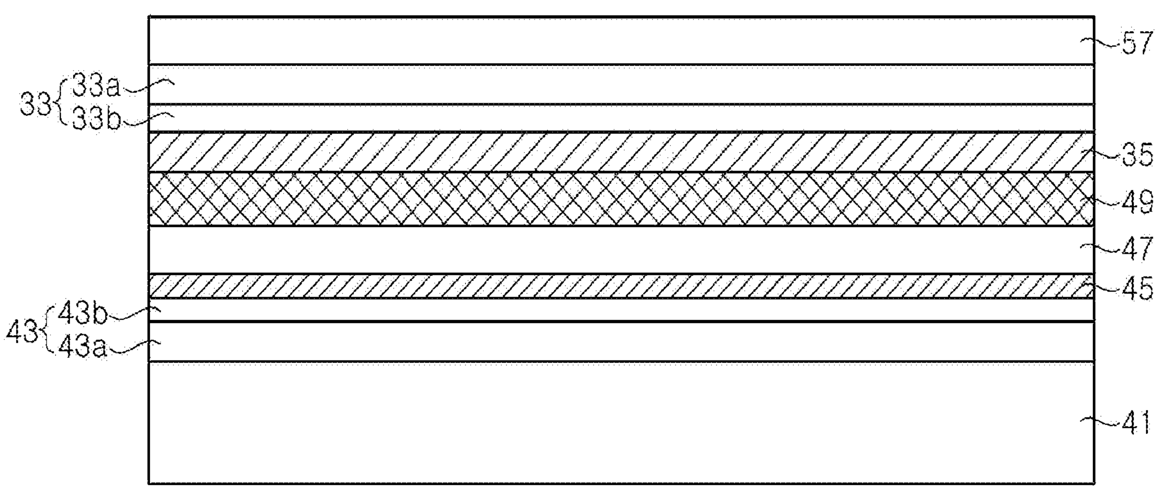

Referring to FIG. 7, a second color filter 57 is formed on the second LED stack 33. The second color filter 57 may be formed by alternately stacking insulation layers having different indices of refraction, and is substantially the same as that described with reference to FIG. 2A and FIG. 2B, and thus, detailed descriptions thereof will be omitted to avoid redundancy.

Figure 8:
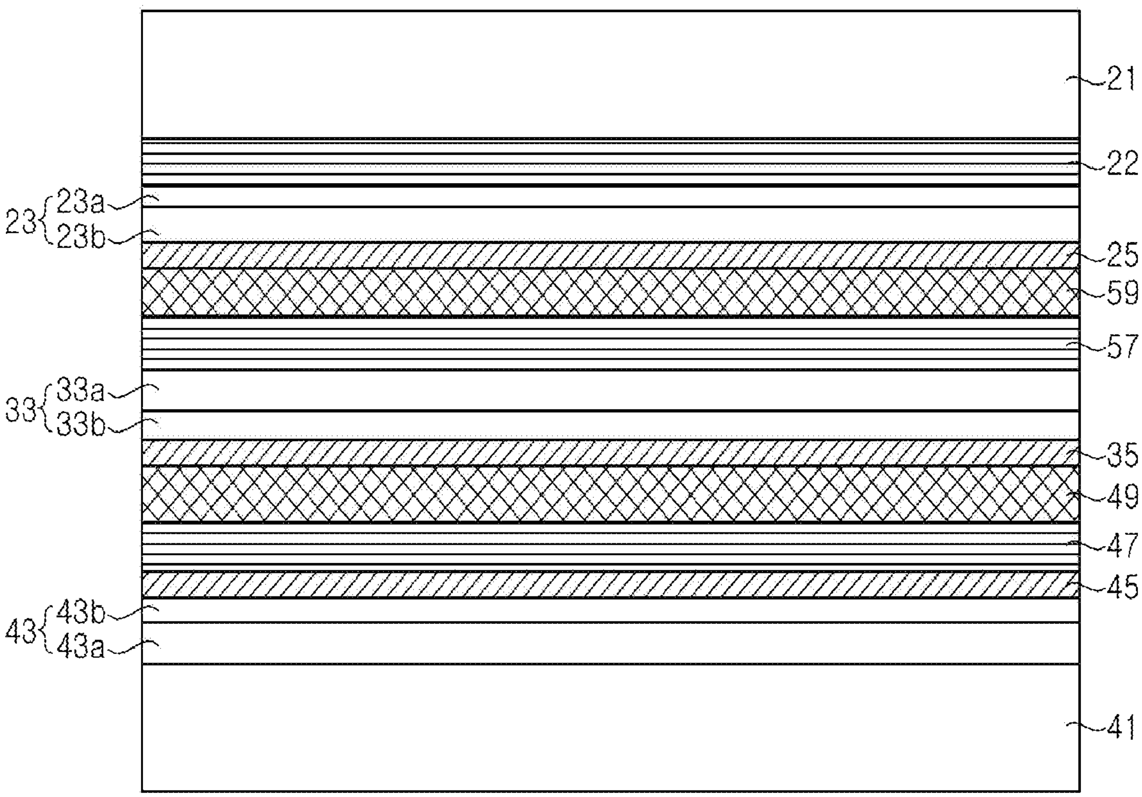

Referring to FIG. 8, the first LED stack 23 of FIG. 3 is bonded to the second LED stack 33. The second color filter 57 may be bonded to the first transparent electrode 25 so as to face each other. For example, bonding material layers may be formed on the second color filter 57 and the first transparent electrode 25, which are bonded to each other, thereby forming a second bonding layer 59. The bonding material layers are substantially the same as those of the first bonding layer 49, and thus, detailed descriptions thereof will be omitted to avoid redundancy.

Figure 9A:
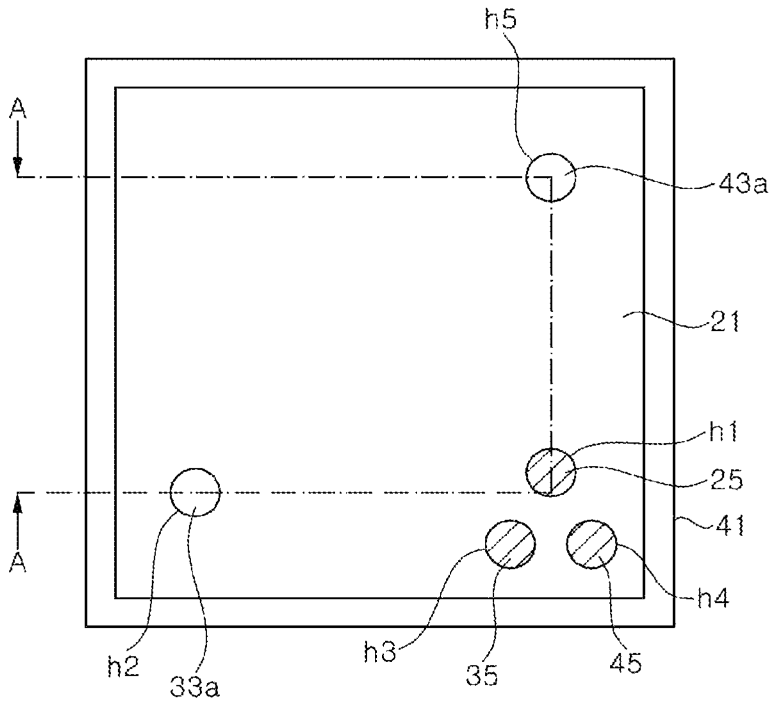
Figure 9B:
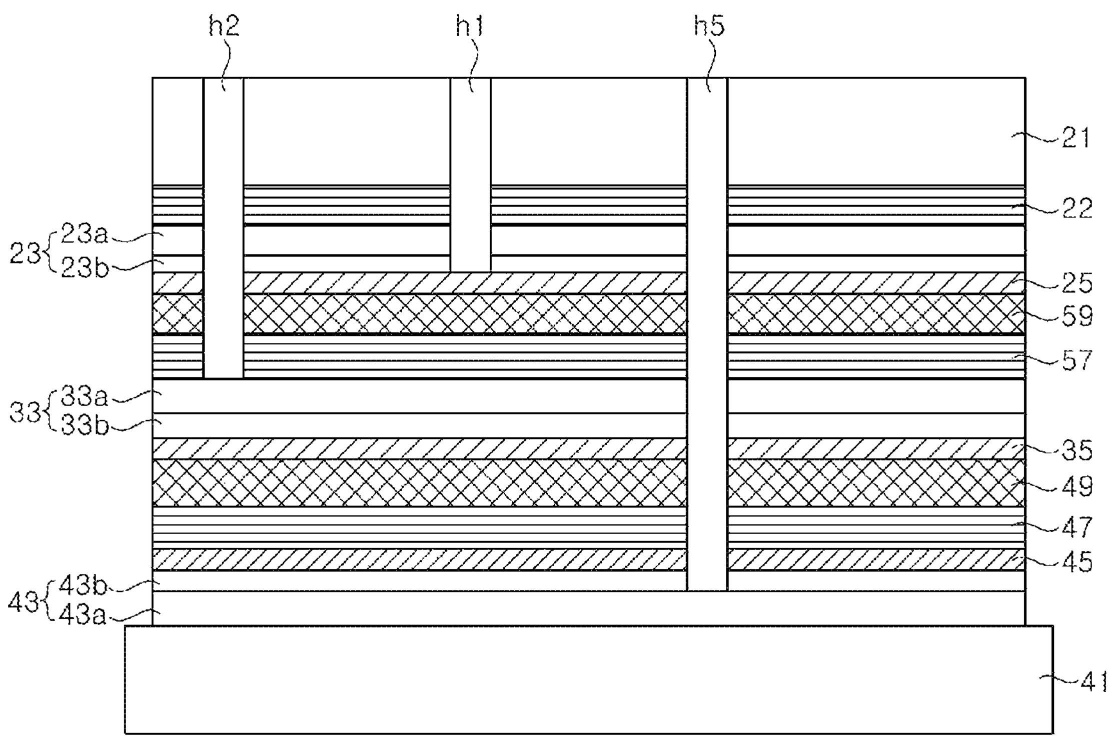

Referring to FIG. 9A and FIG. 9B, holes h1, h2, h3, h4, and h5 are formed through the first substrate 21 and isolation trenches defining device regions are formed to expose the second substrate 41.

The hole h1 exposes the first transparent electrode 25, the hole h2 exposes the first conductivity type semiconductor layer 33*a*, the hole h3 exposes the second transparent electrode 35, the hole h4 exposes the third transparent electrode 45, and the hole h5 exposes the first conductivity type semiconductor layer 43*a*.

The isolation trench may be formed to expose the second substrate 41 along the periphery of each of the first to third LED stacks 23, 33, and 43. Although the isolation trench is illustrated as being formed to expose the second substrate 41, the isolation trench may be formed to expose the first conductivity type semiconductor layer 43*a*. In this case, the hole h5 may be formed together with the isolation trench.

The holes h1, h2, h3, h4, and h5, and the isolation trenches may be formed by photolithography and etching, which are not limited to a particular formation sequence. For example, a shallower hole may be formed prior to a deeper hole, or vice versa. The isolation trench may be formed after or before formation of the holes h1, h2, h3, h4, and h5. Alternatively, the isolation trench may be formed together with the hole h5, as described above.

Figure 10A:
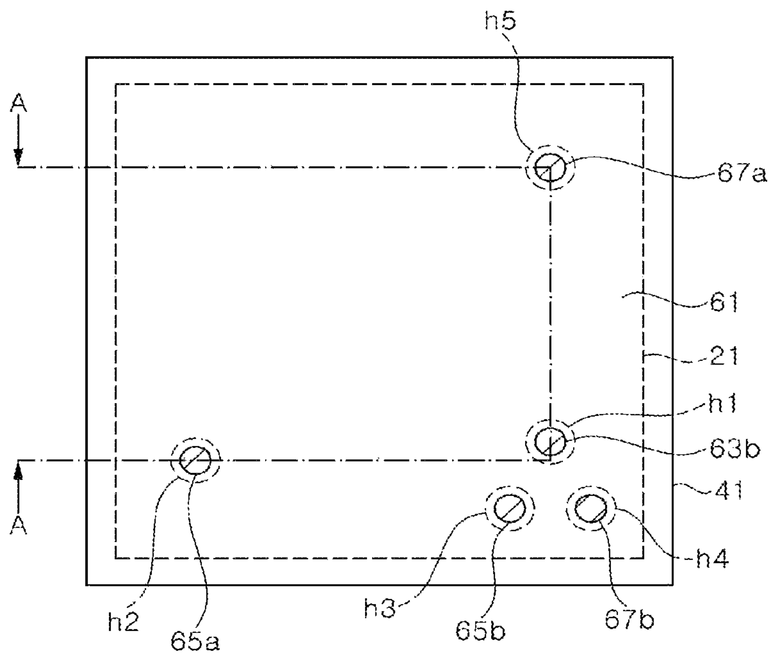
Figure 10B:
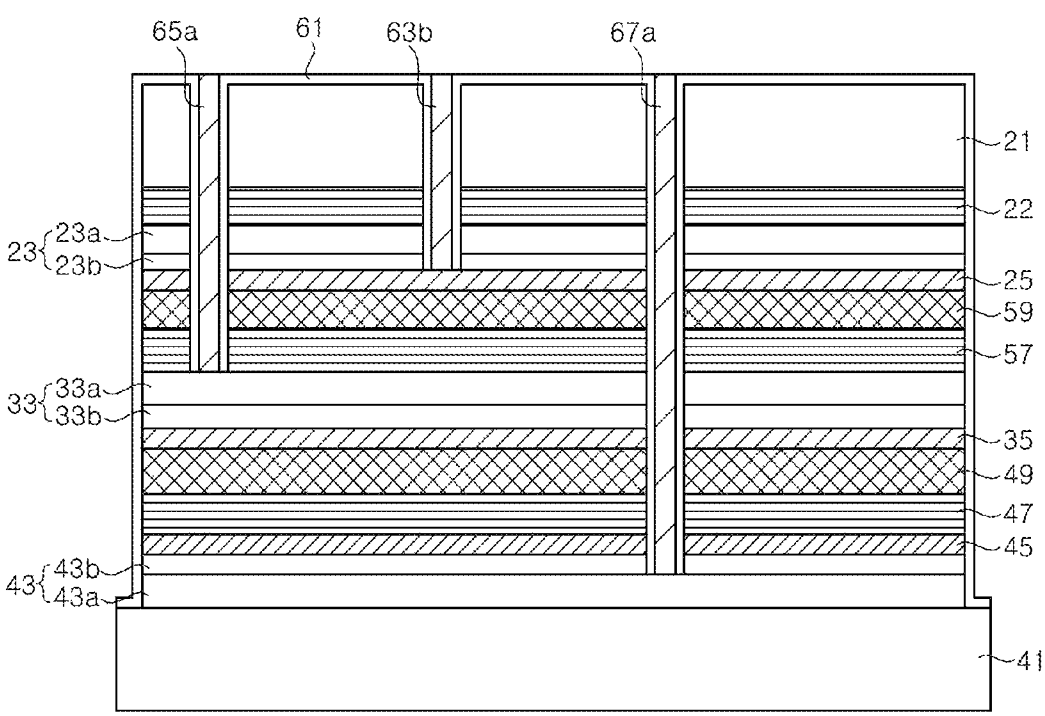

Referring to FIG. 10A and FIG. 10B, a lower insulation layer 61 is formed on the first substrate 21. The lower insulation layer 61 may cover the side surfaces of the first substrate 21 and the side surfaces of the first to third LED stacks 23, 33, and 43, which are exposed through the isolation trench.

The lower insulation layer 61 may cover the side surfaces of the holes h1, h2, h3, h4, and h5. Here, the lower insulation layer 61 is subjected to patterning so as to expose the bottom of each of the holes h1, h2, h3, h4, and h5.

The lower insulation layer 61 may be formed of silicon oxide or silicon nitride, without being limited thereto. The lower insulation layer 61 may be a distributed Bragg reflector.

Thereafter, through-hole vias 63*b*, 65*a*, 65*b*, 67*a*, and 67*b* are formed in the holes h1, h2, h3, h4, and h5, respectively. The through-hole vias 63*b*, 65*a*, 65*b*, 67*a*, and 67*b* may be formed by electric plating, or the like. For example, a seed layer may be first formed inside the holes h1, h2, h3, h4, h5, and the through-hole vias 63*b*, 65*a*, 65*b*, 67*a*, 67*b* may be formed by plating with copper using the seed layer. The seed layer may be formed of, for example, Ni/Al/Ti/Cu.

Figure 11A:
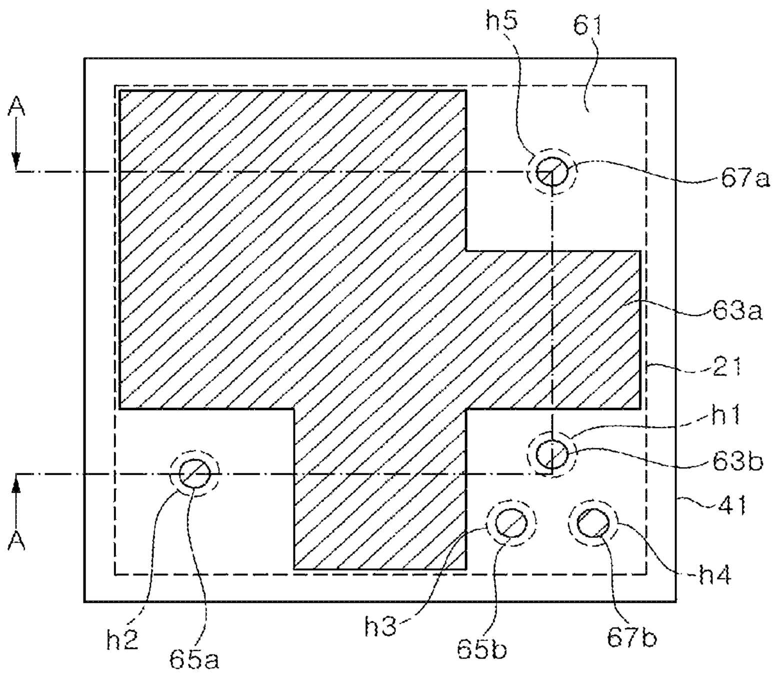
Figure 11B:
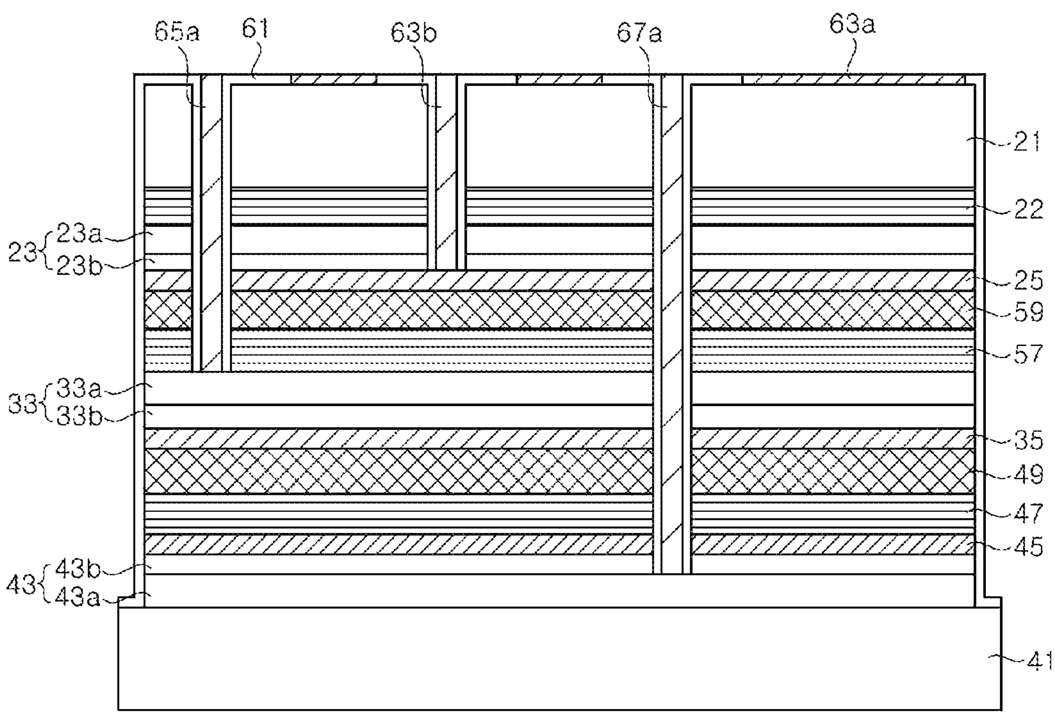

Referring to FIG. 11A and FIG. 11B, the upper surface of the first substrate 21 may be exposed by patterning the lower insulation layer 61. The process of patterning the lower insulation layer 61 to expose the upper surface of the first substrate 21 may be performed upon patterning the lower insulation layer 61 to expose the bottoms of the holes h1, h2, h3, h4, h5. The upper surface of the first substrate 21 may be exposed in a broad area that may exceed, for example, about half of the area of the light emitting device.

Then, an ohmic electrode 63*a* is formed on the exposed upper surface of the first substrate 21. The ohmic electrode 63*a* may be a conductive layer forming ohmic contact with the first substrate 21, and may be formed of, for example, Au—Te alloys or Au—Ge alloys.

Referring to FIG. 11A, the ohmic electrode 63*a* is separated from the through-hole vias 63*b*, 65*a*, 65*b*, 67*a*, and 67*b*.

Figure 12A:
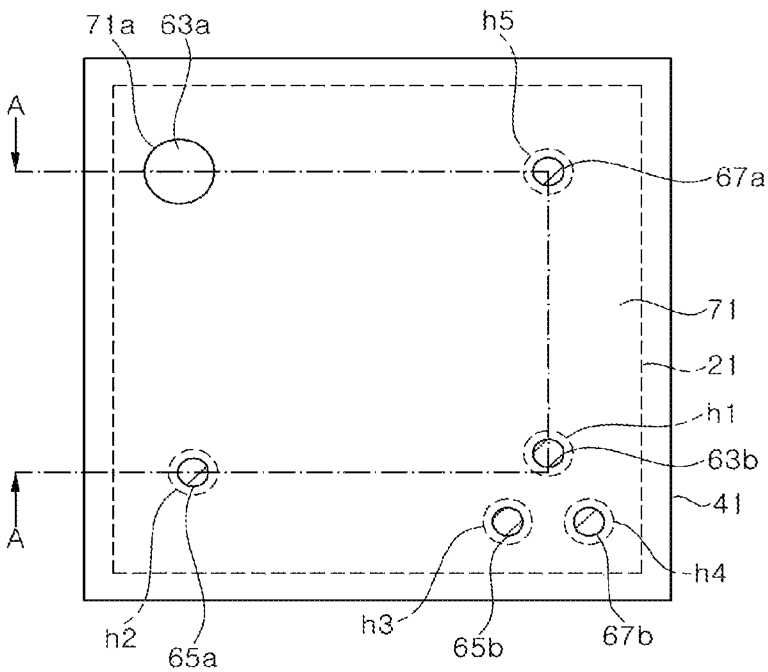
Figure 12B:
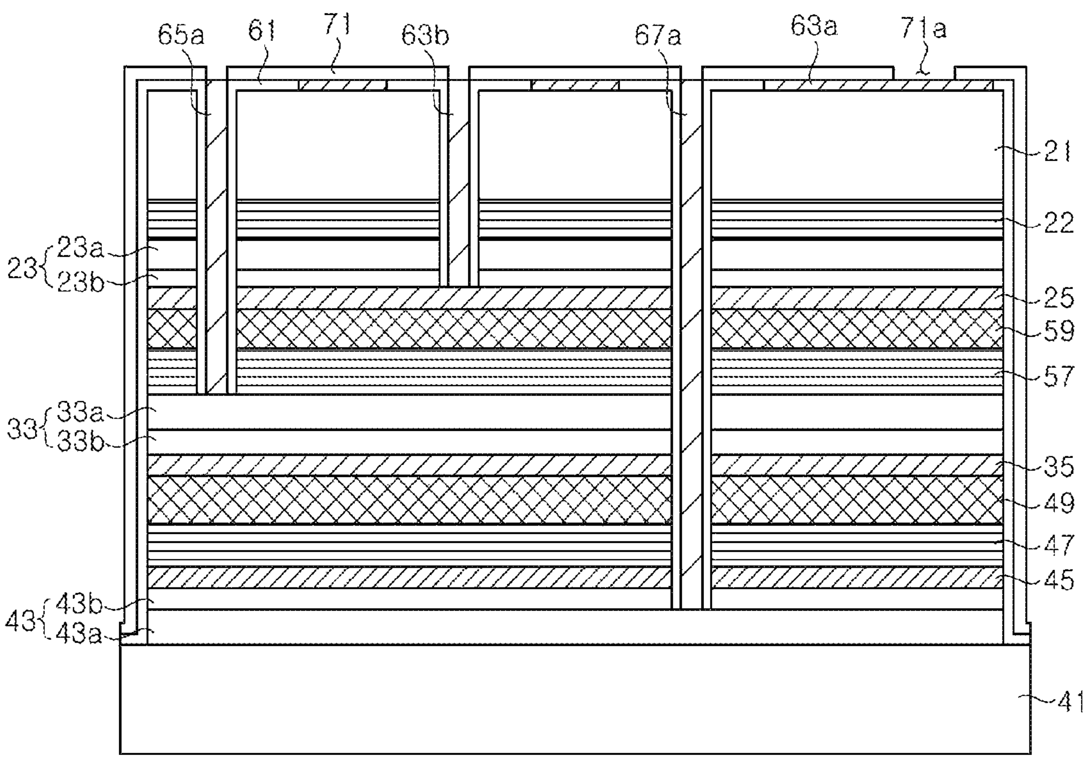

Referring to FIG. 12A and FIG. 12B, an upper insulation layer 71 is formed to cover the lower insulation layer 61 and the ohmic electrode 63*a*. The upper insulation layer 71 may cover the lower insulation layer 61 at the side surfaces of the first to third LED stacks 23, 33, and 43, and the first substrate 21. Here, the upper insulation layer 71 may be subjected to patterning so as to form openings that expose the through-hole vias 63*b*, 65*a*, 65*b*, 67*a*, 67*b* together with an opening 71*a* exposing the ohmic electrode 63*a*.

The upper insulation layer 71 may be formed of silicon oxide or silicon nitride, without being limited thereto. For example, the upper insulation layer 71 may be a light reflective layer, for example, a distributed Bragg reflector, or a light blocking layer such as a light absorption layer.

Figure 13A:
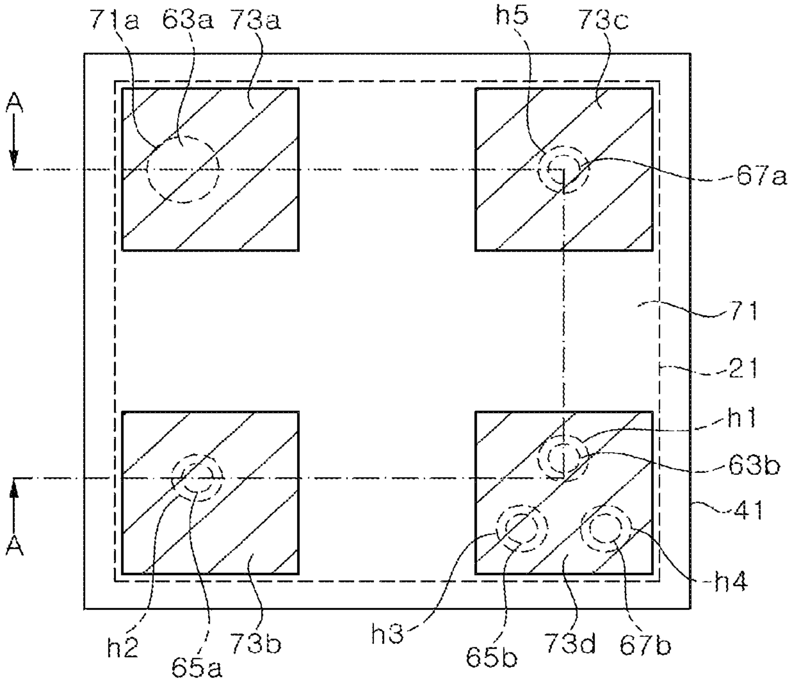
Figure 13B:
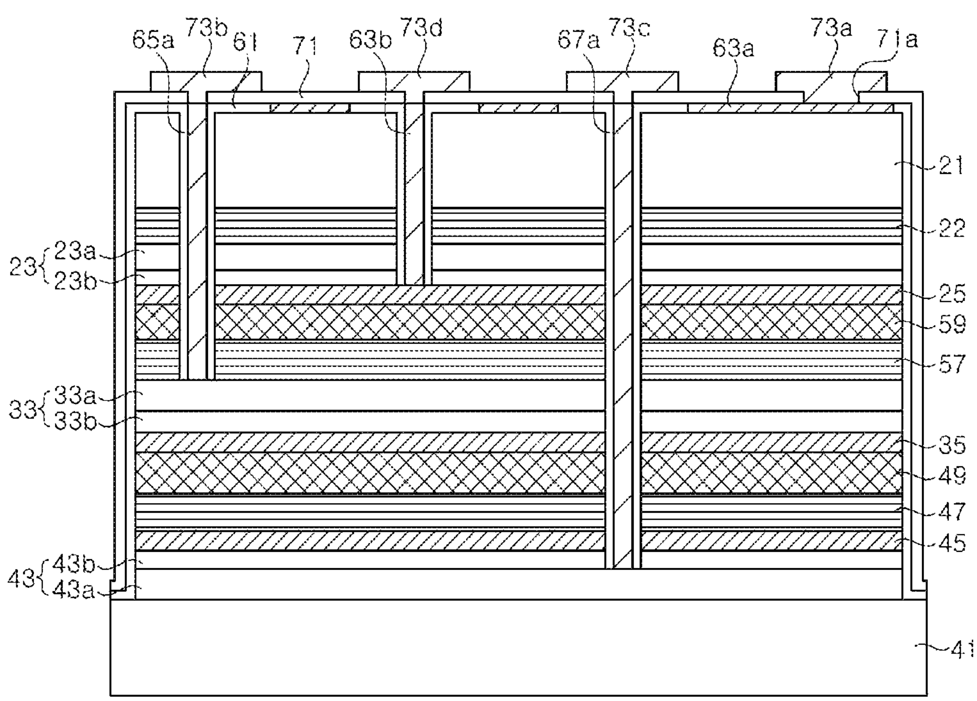

Referring to FIG. 13A and FIG. 13B, electrode pads 73*a*, 73*b*, 73*c*, 73*d* are formed on the upper insulation layer 71. The electrode pads 73*a*, 73*b*, 73*c*, 73*d* may include first to third electrode pads 73*a*, 73*b*, 73*c*, and a common electrode pad 73*d*.

The first electrode pad 73*a* may be connected to the ohmic electrode 63*a* exposed through the opening 71*a* of the upper insulation layer 71, the second electrode pad 73*b* may be connected to the through-hole via 65*a*, and the third electrode pad 73*c* may be connected to the through-hole via 67*a*. The common electrode pad 73*d* may be commonly connected to the through-hole vias 63*b*, 65*b*, 67*b*.

The electrode pads 73*a*, 73*b*, 73*c*, 73*d* are electrically separated from one another, and thus, each of the first to third LED stacks 23, 33, 43 is electrically connected to two electrode pads and thus, may be independently driven.

Thereafter, the second substrate 41 is divided into regions for each light emitting device, thereby providing the light emitting device 100. As shown in FIG. 13A, the electrode pads 73*a*, 73*b*, 73*c*, 73*d* may be disposed at four corners of each light emitting device 100. Furthermore, the electrode pads 73*a*, 73*b*, 73*c*, 73*d* may have substantially a rectangular shape, without being limited thereto.

Although the second substrate 41 is illustrated as being divided in the illustrated exemplary embodiment, in some exemplary embodiments, the second substrate 41 may be removed. In this case, the exposed surface of the first conductivity type semiconductor layer 43*a* may be subjected to texturing.

Figure 13C:
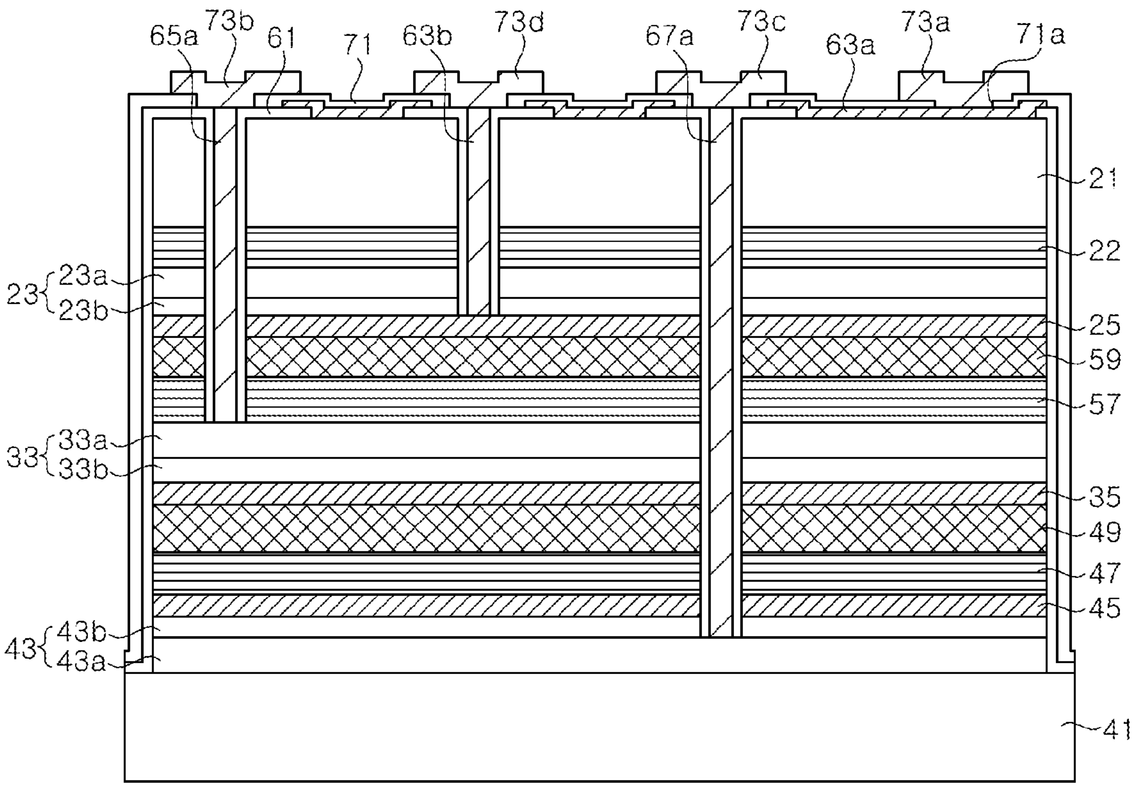

Referring to FIG. 13C, a light emitting device according to another exemplary embodiment is substantially similar to that of FIG. 12B, and thus, detailed descriptions of the substantially similar elements will be omitted to avoid redundancy. In the light emitting device according to the illustrated exemplary embodiment, each portion of the ohmic electrode 63*a* that overlaps the lower insulation layer 61 may be covered by the electrode pads 73*a*, 73*b*, 73*c*, and 73*d*. In this manner, the electrode pads 73*a*, 73*b*, 73*c*, and 73*d*, which overlap end portions of the ohmic electrode 63*a* that overlap the lower insulation layer 61, may prevent or reduce the likelihood of the ohmic electrode 63*a* from being peeled off during manufacture or use.

According to some exemplary embodiments, the size of an area of the electrode pad 73*a* contacting the ohmic electrode 63*a* may be different from the size of an area of the electrode pad 73*c*, for example, contacting the thorough-hole via 67*a*. As such, an area through which current is supplied may be different for each of the LED stacks 23, 33, and 43. In this manner, a distance between conductors with different polarities may be controlled for each LED stack 23, 33, and 43, and thus, the light emitting efficiency in each LED stack 23, 33, and 43 may be balanced with each other to obtain a uniform light pattern from the light emitting device.

According to other exemplary embodiments, the size of an area of the electrode pad 73*a* contacting the ohmic electrode 63*a* may be substantially the same as the size of an area of the electrode pad 73*c*, for example, contacting the thorough-hole via 67*a*. In this manner, a contact resistance in each of the LED stacks 23, 33, and 34 may be substantially the same as each other, thereby preventing the reliability degradation of the light emitting device caused by different resistance in the LED stacks 23, 33, and 34.

According to some exemplary embodiments, one of the electrode pads, such as the electrode pad 73*a*, may be disposed on a plane lower than the remaining electrode pads. For example, a distance from the second substrate 41 to a lower surface of the electrode pad 73*a* may be less than a distance from the second substrate 41 to a lower surface of the electrode pads 73*b*, 73*c*, and 73*d*. In this manner, when bumps are formed on each electrode pad 73*a*, 73*b*, 73*c*, and 73*d* for connection to an external device or a circuit, the bump formed on the electrode pad 73*a* may be formed to be thicker than the bumps formed on the electrode pads 73*b*, 73*c*, and 73*d*, which may improve the reliability of the light emitting device as a thermal path to the electrode pad 73*a* may be increased to dissipate heat.

Figure 14A:
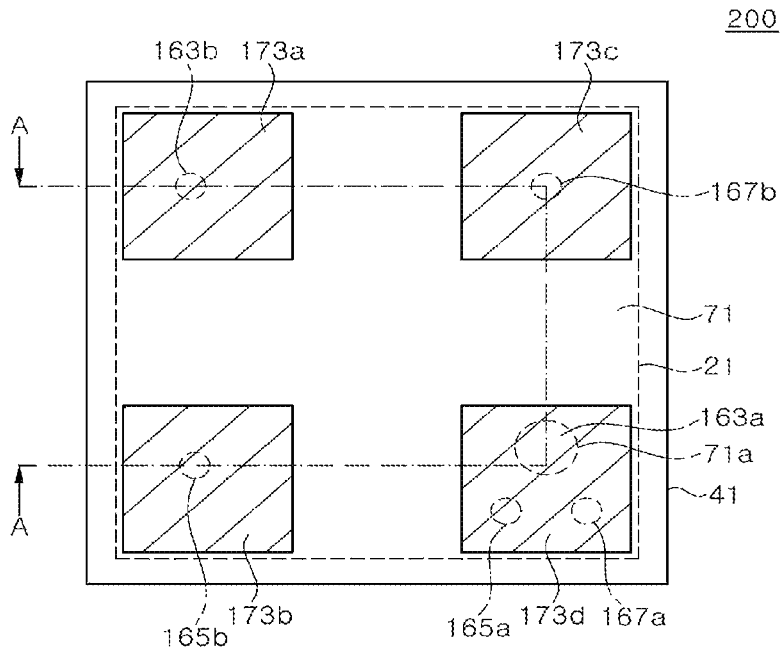
FIG. 14A and FIG. 14B are a schematic plan view and a cross-sectional view of a light emitting device for a display according to another exemplary embodiment.
Figure 14B:
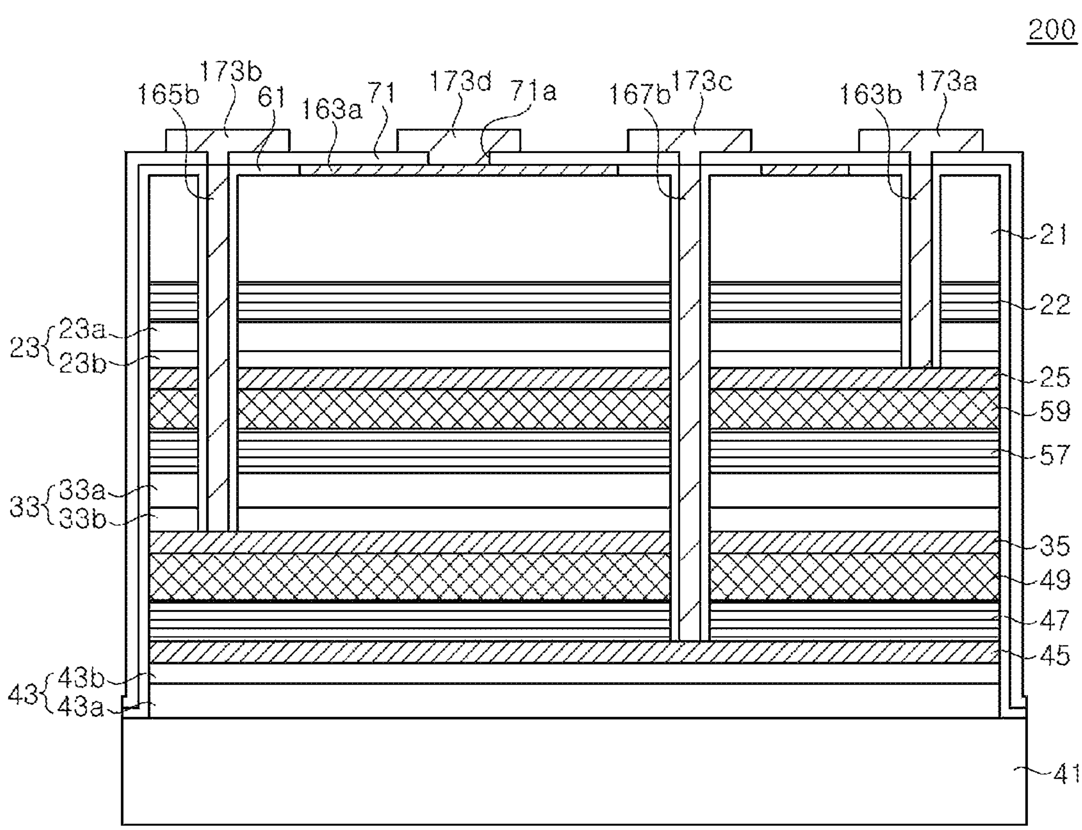

FIG. 14A and FIG. 14B are a schematic plan view and a cross-sectional view of a light emitting device 200 for a display according to another exemplary embodiment.

Referring to FIG. 14A and FIG. 14B, the light emitting device 200 according to an exemplary embodiment is generally similar to the light emitting device 100 described with reference to FIG. 2A and FIG. 2B, except that the anodes of the first to third LED stacks 23, 33, 43 are independently connected to first to third electrode pads 173*a*, 173*b*, 173*c*, and the cathodes thereof are electrically connected to a common electrode pad 173*d*.

More specifically, the first electrode pad 173*a* is electrically connected to the first transparent electrode 25 through a through-hole via 163*b*, the second electrode pad 173*b* is electrically connected to the second transparent electrode 35 through a through-hole via 165*b*, and the third electrode pad 173*c* is electrically connected to the third transparent electrode 45 through a through-hole via 167*b*. The common electrode pad 173*d* is electrically connected to an ohmic electrode 163*a* exposed through the opening 71*a* of the upper insulation layer 71, and is also electrically connected to the first conductivity type semiconductor layers 33*a*, 43*a* of the second LED stack 33 and the third LED stack 43 through the through-hole vias 165*a*, 167*a*.

Each of the light emitting devices 100 and 200 according to exemplary embodiments includes the first to third LED stacks 23, 33, 43, which may emit red, green, and blue light, respectively, and thus can be used as one pixel in a display apparatus. As described in FIG. 1, the display apparatus may be provided by arranging a plurality of light emitting devices 100 or 200 on the circuit board 101. Since each of the light emitting devices 100, 200 includes the first to third LED stacks 23, 33, 43, it is possible to increase the area of a subpixel in one pixel. Furthermore, the first to third LED stacks 23, 33, 43 can be mounted on the circuit board by mounting one light emitting device, thereby reducing the number of mounting processes. The light emitting devices mounted on the circuit board 101 according to exemplary embodiments can be driven in a passive matrix or active matrix driving manner.

Figure 15:
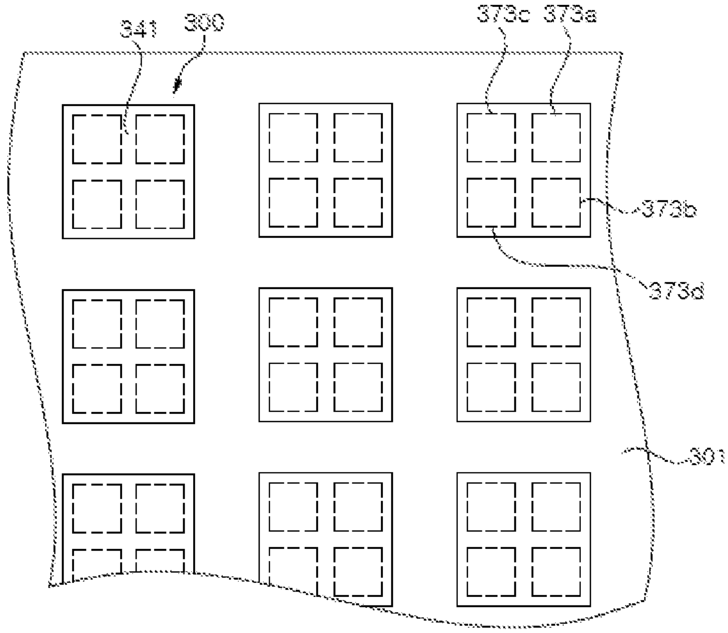
FIG. 15 is a schematic plan view of a display apparatus according to an exemplary embodiment.

FIG. 15 is a schematic plan view a display apparatus according to an exemplary embodiment.

Referring to FIG. 15, the display apparatus may include a circuit board 301 and a plurality of light emitting devices 300.

The circuit board 301 may include a circuit for passive matrix driving or active matrix driving. According to an exemplary embodiment, the circuit board 301 may include interconnection lines and resistors therein. According to another exemplary embodiment, the circuit board 301 may include interconnection lines, transistors, and capacitors. The circuit board 301 may also include pads that are disposed on an upper surface thereof, which provide electrical connection with a circuit disposed in the circuit board 301.

The plurality of light emitting devices 300 may be arranged on the circuit board 301. Each of the light emitting devices 300 may include one pixel. Each of the light emitting devices 300 may include electrode pads 373*a*, 373*b*, 373*c*, and 373*d*, and the electrode pads 373*a*, 373*b*, 373*c*, and 373*d* may be electrically connected to the circuit board 301. The light emitting device 300 may include substrates 341 disposed on an upper surface thereof and. Since the light emitting devices 300 are spaced apart from each other, the substrates 341 disposed on the upper surface of the light emitting devices 300 may also be spaced apart from each other.

Figure 16A:
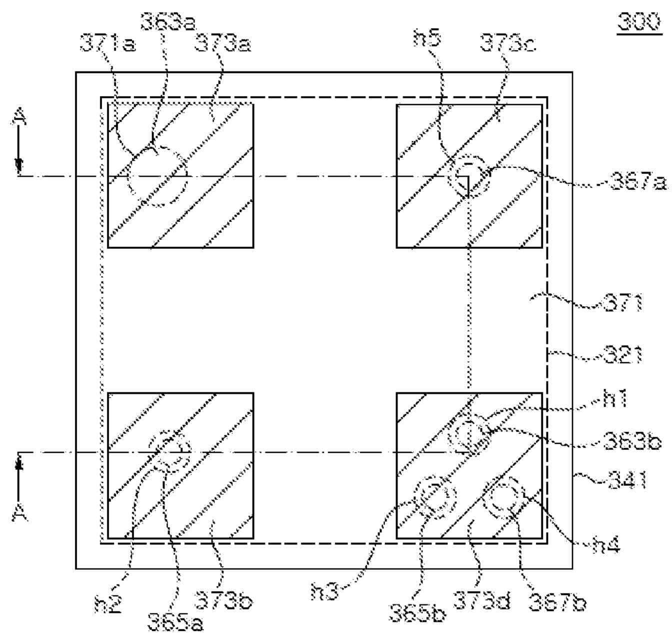
FIG. 16A is a schematic plan view of a light emitting device according to an exemplary embodiment.
Figure 16B:
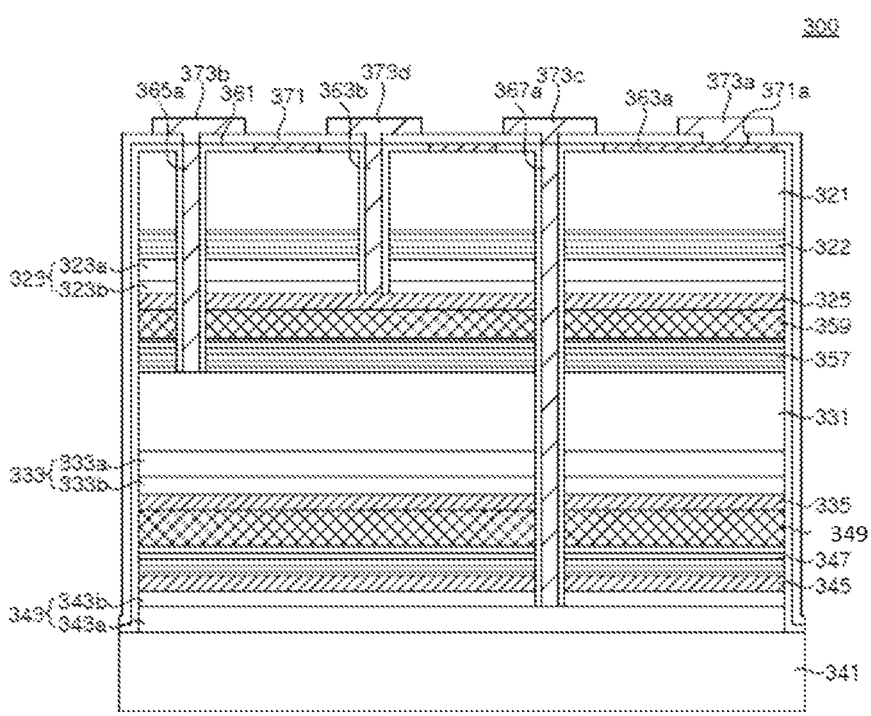
FIG. 16B is a cross-sectional view taken along line A-A of FIG. 16A.

The light emitting device 300 according to an exemplary embodiment is described in detail with reference to FIGS. 16A and 16B. FIG. 16A is a schematic plan view of a light emitting device according to an exemplary embodiment. FIG. 16B is a cross-sectional view taken along line A-A of FIG. 16A. While FIGS. 16A and 16B show that the electrode pads 373*a*, 373*b*, 373*c*, and 373*d* are arranged at an upper side, according to some exemplary embodiments, a light emitting device may be flip-bonded onto the circuit board 301 of FIG. 15 and, the electrode pads 373*a*, 373*b*, 373*c*, and 373*d* may be arranged at a lower side.

Referring to FIGS. 16A and 16B, the light emitting device 300 may include a first substrate 321, a second substrate 331, a third substrate 341, a distributed Bragg reflector 322, a first LED stack 323, a second LED stack 333, a third LED stack 343, a first transparent electrode 325, a second transparent electrode 335, a third transparent electrode 345, a first color filter 347, a second color filter 357, a first bonding layer 349, a second bonding layer 359, a lower insulating layer 361, an upper insulating layer 371, an ohmic electrode 363*a*, through-vias 363*b*, 365*a*, 365*b*, 367*a*, and 367*b*, and the electrode pads 373*a*, 373*b*, 373*c*, and 373*d*.

The first substrate 321 may support the LED stacks 323, 333, and 343. The first substrate 321 may be a substrate for growing the first LED stack 323 and, for example, may be a GaAs substrate. In particular, the first substrate 321 may have conductivity.

The second substrate 331 may be a substrate for growing the second LED stack 333 and, for example, may be a GaP substrate. The second substrate 331 may have conductivity.

The third substrate 341 may support the LED stacks 323, 333, and 343. The third substrate 341 may be a growth substrate for growing the third LED stack 343. For example, the third substrate 341 may be a sapphire substrate or a gallium nitride substrate, in particular, a patterned sapphire substrate. First to third LED stacks may be arranged in order of the third LED stack 343, the second LED stack 333, and the first LED stack 323 on the third substrate 341. According to an exemplary embodiment, single third LED stack may be disposed on single third substrate 341. The second LED stack 333, the second substrate 331, the first LED stack 323, and the first substrate 321 may be disposed on the third LED stack. Accordingly, the light emitting device 300 may have a single chip structure of a single pixel.

According to another exemplary embodiment, the plurality of third LED stacks 343 may be disposed on single third substrate 341. The second LED stack 333, the second substrate 331, the first LED stack 323, and the first substrate 321 may be disposed on each of the third LED stack 343 and, accordingly, the light emitting device 300 may have a single chip structure of a plurality of pixels.

The first LED stack 323, the second LED stack 333, and the third LED stack 343 may each include a first conductivity type semiconductor layer 323*a*, 333*a*, and 343*a*, a second conductivity type semiconductor layer 323*b*, 333*b*, and 343*b*, and an active layer interposed therebetween. The active layer may have, in particular, a multi quantum well structure.

As an LED stack is disposed closer to the third substrate 341, the LED stack may emit light with a shorter wavelength. For example, the first LED stack 323 may be an inorganic light emitting diode for emitting red light, the second LED stack 333 may be an inorganic light emitting diode for emitting green light, and the third LED stack 343 may be an inorganic light emitting diode for emitting blue light. The first LED stack 323 may include an AlGaInP-based well layer, the second LED stack 333 may include an AlGaP-based well layer, for example, a GaP well layer doped with nitrogen (N), and the third LED stack 343 may include an AlGaInN-based well layer. However, the inventive concepts are not limited thereto. For example, when the light emitting device includes a micro LED, the first LED stack 323 may emit any one of red, green, and blue light, and second and third LED stacks 333 and 343 may emit a different one of red, green, and blue light without adversely affecting operation due to the small form factor of a micro LED.

The first conductivity type semiconductor layers 323*a*, 333*a*, and 343*a* of the respective LED stacks 323, 333, and 343 may each be an n-type semiconductor layer, and the second conductivity type semiconductor layers 323*b*, 333*b*, and 343*b* may each be a p-type semiconductor layer. According to an exemplary embodiment, an upper surface of the first LED stack 323 may be an n-type semiconductor layer 323*a*, an upper surface of the second LED stack 333 may be an n-type semiconductor layer 333*a*, and an upper surface of the third LED stack 343 may be a p-type semiconductor layer 343*b*. In particular, semiconductor layers of the third LED stack 343 only may be stacked in the reverse order. However, the inventive concepts are not limited thereto. For example, the second LED stack 333 may be disposed on the other side of the second substrate 331 to be adjacent to the first LED stack 323, and, accordingly, semiconductor layers of the second LED stack 333 may also be stacked in the reverse order.

The first LED stack 323, the second LED stack 333, and the third LED stack 343 may overlap with each other, and may have emissive areas that have substantially the same size. In each of the LED stacks 323, 333, and 343, the first conductivity type semiconductor layers 323*a*, 333*a*, and 343*a* may have areas that are substantially the same as those of the second conductivity type semiconductor layers 323*b*, 333*b*, and 343*b*, respectively. In particular, in the case of the first LED stack 323 and the second LED stack 333, the first conductivity type semiconductor layers 323*a* and 333*a* may completely overlap with the second conductivity type semiconductor layers 323*b* and 333*b*, respectively. In the case of the third LED stack 343, as a hole h5 is formed to expose the first conductivity type semiconductor layer 343*a* therethrough, the first conductivity type semiconductor layer 343*a* may have a slightly larger area than the second conductivity type semiconductor layer 343*b*.

The first LED stack 323 may be disposed on the third substrate 341, the second LED stack 333 may be disposed below the first LED stack 323, and the third LED stack 343 may be disposed below the second LED stack 333. The first LED stack 323 may emit light with a longer wavelength than the second and third stacks 333 and 343 and, thus, light generated by the first LED stack 323 may be transmitted through the second substrate 331, the second and third LED stacks 333 and 343, and the third substrate 341, and then may be emitted to the outside. The second LED stack 333 may emit light with a longer wavelength than the third LED stack 343 and, thus, light generated by the second LED stack 333 may be transmitted through the third LED stack 343 and the third substrate 341, and then may be emitted to the outside. The second substrate 331 may be disposed below the second LED stack 333 and, in this case, light generated by the second LED stack 333 may be transmitted through the second substrate 331.

The distributed Bragg reflector 322 may be disposed between the first substrate 321 and the first LED stack 323. The distributed Bragg reflector 322 may reflect light generated by the first LED stack 323 to prevent light from being absorbed and lost by the first substrate 321. For example, the distributed Bragg reflector 322 may be formed by alternately stacking AlAs and AlGaAs-based semiconductor layers.

The first transparent electrode 325 may be in ohmic contact with the first LED stack 323. As shown in the drawing, the first transparent electrode 325 may be disposed between the first LED stack 323 and the second LED stack 333. The first transparent electrode 325 may be in ohmic contact with the second conductivity type semiconductor layer 323*b* of the first LED stack 323, and may transmit light generated by the first LED stack 323. The first transparent electrode 325 may be formed using a transparent oxide layer, such as indium-tin oxide (ITO) or a metal layer.

The second transparent electrode 335 may be in ohmic contact with the second conductivity type semiconductor layer 333*b* of the second LED stack 333. As shown in the drawing, the second transparent electrode 335 may contact a lower surface of the second LED stack 333 between the second LED stack 333 and the third LED stack 343. The second transparent electrode 335 may be formed of a metal layer or a conductive oxide layer which is transparent to red light and green light.

The third transparent electrode 345 may be in ohmic contact with the second conductivity type semiconductor layer 343*b* of the third LED stack 343. The third transparent electrode 345 may be disposed between the second LED stack 333 and the third LED stack 343, and may contact an upper surface of the third LED stack 343. The third transparent electrode 345 may be formed of a metal layer or a conductive oxide layer which is transparent to red light and green light. The third transparent electrode 345 may be transparent with respect to blue light. The second transparent electrode 335 and the third transparent electrode 345 may be in ohmic contact with a p-type semiconductor layer of each LED stack to facilitate current spreading. The conductive oxide layer used in the second and third transparent electrodes 335 and 345 may be, for example, $SnO_2$, $InO_2$, ITO, ZnO, IZO, or others.

The first color filter 347 may be disposed between the third LED stack 343 and the second LED stack 333, and the second color filter 357 may be disposed between the second LED stack 333 and the first LED stack 323. The first color filter 347 may transmit light generated by the first and second LED stacks 323 and 333, and may reflect light generated by the third LED stack 343. The second color filter 357 may transmit light generated by the first LED stack 323, and may reflect light generated by the second LED stack 333. Accordingly, light generated by the first LED stack 323 may be emitted to the outside through the second LED stack 333 and the third LED stack 343, and light generated by the second LED stack 333 may be emitted to the outside through the third LED stack 343. In addition, light generated by the second LED stack 333 may be prevented from being incident on and lost in the first LED stack 323, and light generated by the third LED stack 343 may be prevented from being incident on and lost in the second LED stack 333.

In some exemplary embodiments, the second color filter 357 may reflect light generated by the third LED stack 343.

The first and second color filters 347 and 357 may be, for example, a low pass filter for passing only a low frequency domain (e.g., a long wavelength range), a band pass filter for passing only a predetermined wavelength range, or a band stop filter for blocking only a predetermined wavelength range. In particular, the first and second color filters 347 and 357 may be formed by alternately stacking insulating layers with different refractive indices and, for example, may be formed by alternately stacking $TiO_2$ and $SiO_2$. In particular, the first and second color filters 347 and 357 may include a distributed Bragg reflector (DBR). A stop band of the DBR may be controlled by adjusting a thickness of $TiO_2$ and $SiO_2$. The low pass filter and the band pass filter may be formed by alternately stacking insulating layers with different refractive indices.

The first bonding layer 349 may couple the second LED stack 333 to the third LED stack 343. The first bonding layer 349 may be disposed between the first color filter 347 and the second transparent electrode to bond the first color filter 347 and the second transparent electrode. According to another exemplary embodiment, the first bonding layer 349 may be disposed between the first color filter 347 and the second substrate 331 to bond and the first color filter 347 and the second substrate 331.

For example, the first bonding layer 349 may be formed of a transparent organic layer or a transparent inorganic layer. An example of a material of the organic layer may include SU8, poly(methylmethacrylate) (PMMA), polyimide, parylene, benzocyclobutene (BCB), or others, and an example of a material of the inorganic layer may include $Al_2O_3$, $SiO_2$, $SiN_x$, or others. The first bonding layer 349 may also be formed by spin-on-glass (SOG).

The second bonding layer 359 may couple the second LED stack 333 to the first LED stack 323. As shown in the drawing, the second bonding layer 359 may be disposed between the second color filter 357 and the first transparent electrode 325. The second bonding layer 359 may be formed of substantially the same material forming the first bonding layer 349.

Holes h1, h2, h3, h4, and h5 may pass through the first substrate 321. The hole h1 may pass through the first substrate 321, the distributed Bragg reflector 322, and the first LED stack 323 to expose the first transparent electrode 325 therethrough. The hole h2 may pass through the first substrate 321, the distributed Bragg reflector 322, the first transparent electrode 325, the second bonding layer 359, and the second color filter 357 to expose the second substrate 331 therethrough. According to another exemplary embodiment, the hole h2 may pass through the second substrate 331 to expose the first conductivity type semiconductor layer 333*a* therethrough.

The hole h3 may pass through the first substrate 321, the distributed Bragg reflector 322, the first transparent electrode 325, the second bonding layer 359, the second color filter 357, the second substrate 331, and the second LED stack 333 to expose the second transparent electrode 335 therethrough. The hole h4 may pass through the first substrate 321, the distributed Bragg reflector 322, the first transparent electrode 325, the second bonding layer 359, the second color filter 357, the second substrate 331, the second LED stack 333, the second transparent electrode 335, the first bonding layer 349, and the first color filter 347 to expose the third transparent electrode 345 therethrough. The hole h5 may pass through the first substrate 321, the distributed Bragg reflector 322, the first transparent electrode 325, the second bonding layer 359, the second color filter 357, the second substrate 331, the second LED stack 333, the second transparent electrode 335, the first bonding layer 349, the first color filter 347, the third transparent electrode 345, and the second conductivity type semiconductor layer 343*b* to expose the first conductivity type semiconductor layer 343*a* of the third LED stack 343 therethrough.

FIG. 16A shows that the holes h1, h3, and h4 are spaced apart from each other to expose the first to third transparent electrodes 325, 335, and 345 therethrough, respectively, however, the inventive concepts are not limited thereto and, the first to third transparent electrodes 325, 335, and 345 may be exposed through a single hole.

The lower insulating layer 361 may cover side surfaces of the first substrate 321, and the first to third LED stacks 323, 333, and 343, and may cover an upper surface of the first substrate 321. The lower insulating layer 361 may also cover side walls of the holes h1, h2, h3, h4, and h5. However, the lower insulating layer 361 may be patterned to expose bottom portions of the holes h1, h2, h3, h4, and h5, respectively. Furthermore, the lower insulating layer 361 may also be patterned to expose an upper surface of the first substrate 321.

The ohmic electrode 363*a* may be in ohmic contact with the upper surface of the first substrate 321. The ohmic electrode 363*a* may be formed on a portion of the first substrate 321, which is exposed by patterning the lower insulating layer 361. The ohmic electrode 363*a* may be formed of, for example, an Au—Te alloy or an Au—Ge alloy.

The through-vias 363*b*, 365*a*, 365*b*, 367*a*, and 367*b* may be disposed in the holes h1, h2, h3, h4, and h5, respectively. The through-via 363*b* may be disposed in the hole h1 and may be connected to the first transparent electrode 325. The through-via 365*a* may be disposed in the hole h2 and may be in ohmic contact with the second substrate 331. According to another exemplary embodiment, the through-via 365*a* may be in ohmic contact with the first conductivity type semiconductor layer 333*a*. The through-via 365*b* may be disposed in the hole h3 and may be connected to the second transparent electrode 335. The through-via 367*a* may be disposed in the hole h5 and may be in ohmic contact with the first conductivity type semiconductor layer 343*a*. The through-via 367*b* may be disposed in the hole h4 and may be connected to the third transparent electrode 345.

The upper insulating layer 371 may cover the lower insulating layer 361 and may cover the ohmic electrode 363*a*. The upper insulating layer 371 may cover the lower insulating layer 361 from lateral surfaces of the first substrate 321, and the first to third LED stacks 323, 333, and 343, and may cover the lower insulating layer 361 from an upper portion of the first substrate 321. The upper insulating layer 371 may have an opening 371*a* for exposing the ohmic electrode 363*a* therethrough, and may also have openings for exposing the through-vias 363*b*, 365*a*, 365*b*, 367*a*, and 367*b* therethrough.

The lower insulating layer 361 or the upper insulating layer 371 may be formed of silicon oxide or silicon nitride, but is not limited thereto. For example, the lower insulating layer 361 or the upper insulating layer 371 may be formed of a distributed Bragg reflector using insulation layers with different refractive indices. In particular, the upper insulating layer 371 may be formed as a light reflective layer or a light blocking layer.

The electrode pads 373*a*, 373*b*, 373*c*, and 373*d* may be disposed on the upper insulating layer 371 and may be electrically connected to the first to third LED stacks 323, 333, and 343. For example, the first electrode pad 373*a* may be electrically connected to a portion of the ohmic electrode 363*a*, which is exposed through an opening 371*a* of the upper insulating layer 371. The second electrode pad 373*b* may be electrically connected to a portion of the through-via 365*a*, which is exposed through an opening of the upper insulating layer 371. The third electrode pad 373*c* may be electrically connected to a portion of the through-via 367*a*, which is exposed through an opening of the upper insulating layer 371. The common electrode pad 373*d* may be commonly and electrically connected to the through-vias 363*b*, 365*b*, and 367*b*.

Accordingly, the common electrode pad 373*d* may be commonly and electrically connected to the second conductivity type semiconductor layers 323*b*, 333*b*, and 343*b* of the first to third LED stacks 323, 333, and 343, and the electrode pads 373*a*, 373*b*, and 373*c* may be electrically connected to the first conductivity type semiconductor layers 323*a*, 333*a*, and 343*a* of the first to third LED stacks 323, 333, and 343, respectively.

According to an exemplary embodiment, the first LED stack 323 may be electrically connected to the electrode pads 373*d* and 373*a*, the second LED stack 333 may be electrically connected to the electrode pads 373*d* and 373*b*, and the third LED stack 343 may be electrically connected to the electrode pads 373*d* and 373*c*. Accordingly, anodes of the first LED stack 323, the second LED stack 333, and the third LED stack 343 may be commonly and electrically connected to the electrode pad 373*d*, and cathodes may be electrically connected to the first to third electrode pads 373*a*, 373*b*, and 373*c*, respectively. Accordingly, the first to third LED stacks 323, 333, and 343 may be independently driven.

FIGS. 17, 18, 19, 20, 21, 22, 23A, 23B, 24A, 24B, 25A, 25B, 26A, 26B, 27A, and 27B are schematic plan views and cross-sectional views illustrating a method of manufacturing the light emitting device 300 according to an exemplary embodiment. In the drawings, each plan view corresponds to the plan view of FIG. 16A, and each cross-sectional view corresponds to the cross-sectional view taken along line A-A of FIG. 16A.

Figure 17:
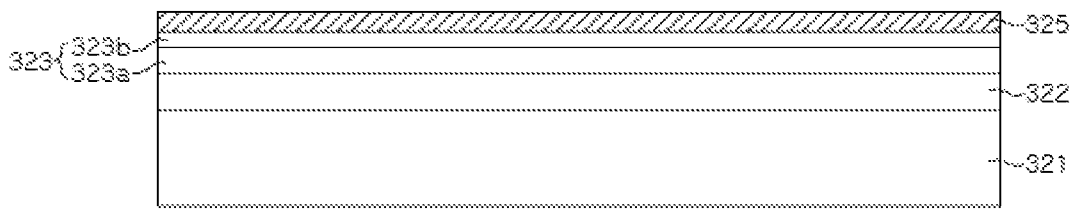
FIGS. 17, 18, 19, 20, 21, 22, 23A, 23B, 24A, 24B, 25A, 25B, 26A, 26B, 27A, and 27B are schematic plan views and cross-sectional views illustrating a method of manufacturing a light emitting device according to an exemplary embodiment.

First, referring to FIG. 17, a first LED stack 323 may be grown on a first substrate 321. The first substrate 321 may be, for example, a GaAs substrate. The first LED stack 323 may be formed of AlGaInP-based semiconductor layers, and may include a first conductivity type semiconductor layer 323*a*, an active layer, and a second conductivity type semiconductor layer 323*b*. Here, the first conductive type may be an n-type and the second conductive type may be a p-type. Prior to growth of the first LED stack 323, a distributed Bragg reflector 322 may be first formed. The distributed Bragg reflector 322 may have, for example, a stack structure in which AlAs/AlGaAs is repeatedly stacked.

A first transparent electrode 325 may be formed on the second conductivity type semiconductor layer 323*b*. The first transparent electrode 325 may be formed of a transparent oxide layer, for example, indium-tin oxide (ITO) or a transparent metal layer.

Figure 18:
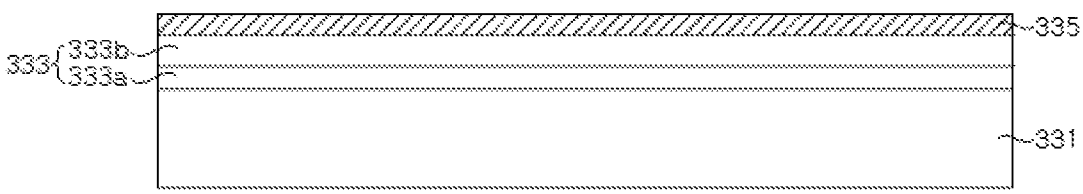

Referring to FIG. 18, a second LED stack 333 may be grown on a second substrate 331, and a second transparent electrode 335 may be formed on the second LED stack 333. The second LED stack 333 may be formed of AlGaP-based semiconductor layers, and may include a first conductivity type semiconductor layer 333*a*, an active layer, and a second conductivity type semiconductor layer 333*b*. The second substrate 331 may be a substrate for growing GaP or AlGaP semiconductor layers, for example, a GaP substrate. Here, the first conductive type may be an n-type and the second conductive type may be a p-type. The second LED stack 333 may emit green light. For example, a pure GaP layer or a GaP layer doped with nitrogen (N) may be formed on a GaP substrate to emit green light. The second transparent electrode 335 may be in ohmic contact with the second conductivity type semiconductor layer 333*b*. The second transparent electrode 335 may be formed of a conductive oxide layer of, for example, $SnO_2$, $InO_2$, ITO, ZnO, or IZO, or a metal layer.

Figure 19:
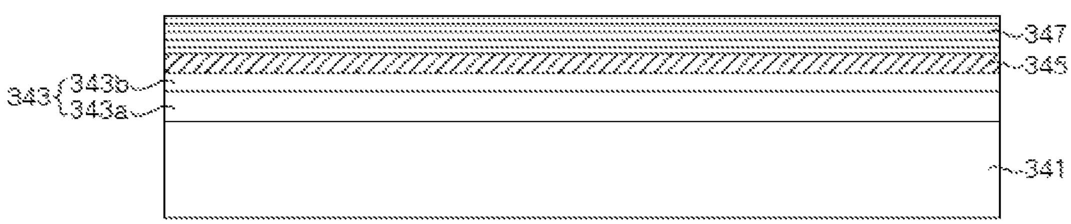

Referring to FIG. 19, a third LED stack 343 may be grown on a third substrate 341, and a third transparent electrode 345 and a first color filter 347 may be formed on the third LED stack 343. The third LED stack 343 may be formed of AlGaInN-based semiconductor layers, and may include a first conductivity type semiconductor layer 343*a*, an active layer, and a second conductivity type semiconductor layer 343*b*. Here, the first conductive type may be an n-type and the second conductive type may be a p-type.

The third substrate 341 may be a substrate for growing a gallium nitride-based semiconductor layer, and may be different from the first substrate 321. A composition ratio of AlGaInN may be determined such that the third LED stack 343 emits blue light. The third transparent electrode 345 may be in ohmic contact with the second conductivity type semiconductor layer 343*b*. The third transparent electrode 345 may be formed of a conductive oxide layer of, for example, $SnO_2$, $InO_2$, ITO, ZnO, or IZO.

The first color filter 347 is substantially the same as that described with reference to FIGS. 16A and 16B and, thus, detailed descriptions thereof are omitted to avoid redundancy.

Figure 20:
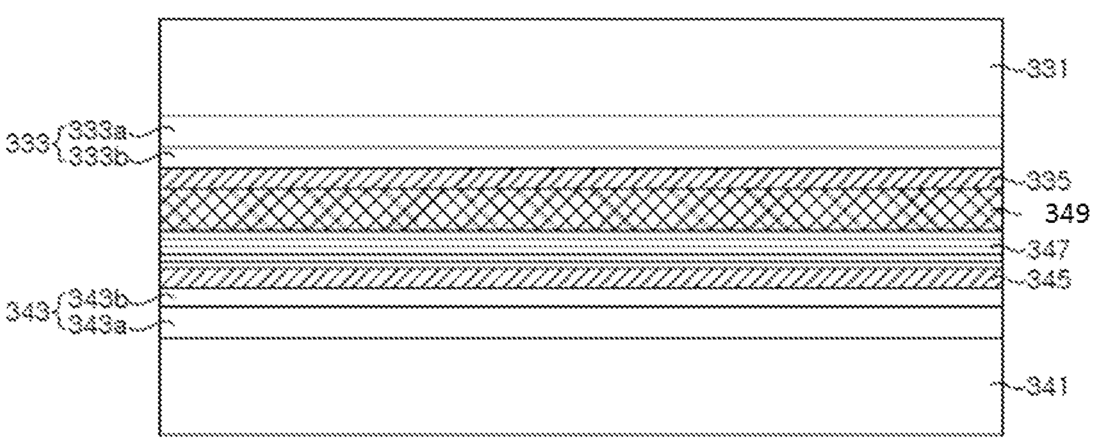

Referring to FIG. 20, the second LED stack 333 of FIG. 18 may be bonded onto the third LED stack 343 of FIG. 19.

According to an exemplary embodiment, the first color filter 347 and the second transparent electrode 335 may be bonded to each other to face each other. For example, bonding material layers may be formed on the first color filter 347 and the second transparent electrode 335, respectively, and may bond the first color filter 347 and the second transparent electrode 335 to form a first bonding layer 349. According to another exemplary embodiment, the first color filter 347 and the second substrate 331 may be bonded to each other to face each other. The bonding material layers may be, for example, a transparent organic layer or a transparent inorganic layer. An example of a material of the organic layer may include SU8, poly(methylmethacrylate) (PMMA), polyimide, parylene, benzocyclobutene (BCB), or others, and an example of a material of the inorganic layer may include $Al_2O_3$, $SiO_2$, $SiN_x$, or others. The first bonding layer 349 may also be formed by spin-on-glass (SOG).

Figure 21:
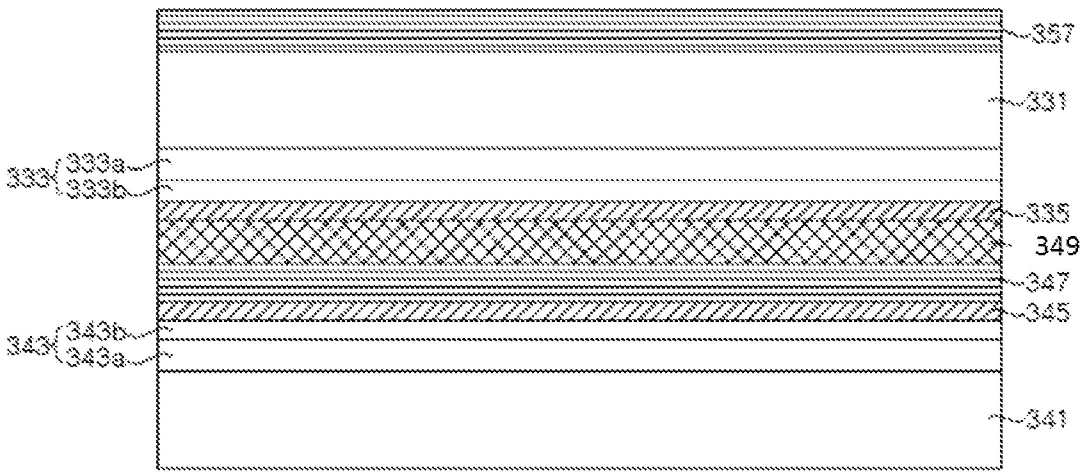

Referring to FIG. 21, a second color filter 357 may be formed on the second substrate 331. The second color filter 357 may be formed by alternately stacking insulating layers with different refractive indices, and is substantially the same as that described reference to FIGS. 16A and 16B and, thus, detailed descriptions thereof are omitted to avoid redundancy.

Although the second color filter 357 is described as being formed on the second substrate 331 after the second LED stack is bonded, according to some exemplary embodiments, when the first color filter 347 and the second substrate 331 are bonded to each other to face each other, the second color filter 357 may be first formed on the second transparent electrode 335 prior to bonding.

Figure 22:
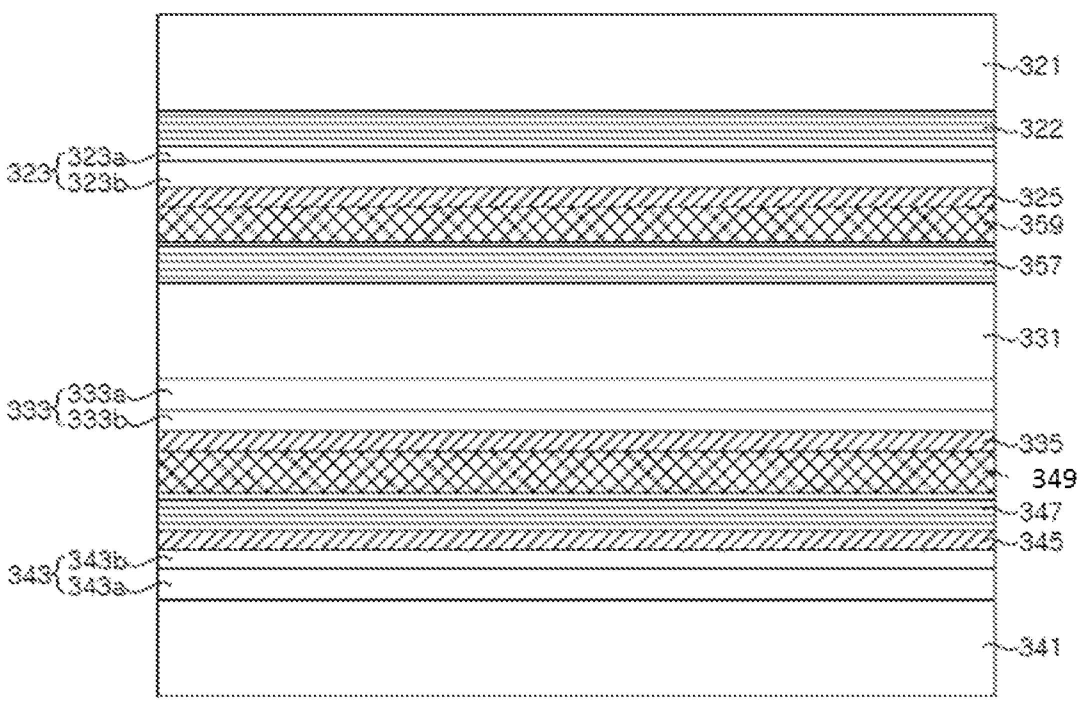

Then, referring to FIG. 22, the first LED stack 323 shown in FIG. 17 is bonded onto the second LED stack 333. The second color filter 357 and the first transparent electrode 325 may be bonded to each other to face each other. For example, bonding material layers may be formed on the second color filter 357 and the first transparent electrode 325, respectively, and may bond the second color filter 357 and the first transparent electrode 325 to form a second bonding layer 359. The bonding material layers are substantially the same as the first bonding layer 349 and thus, detailed descriptions thereof are omitted to avoid redundancy.

Figure 23A:
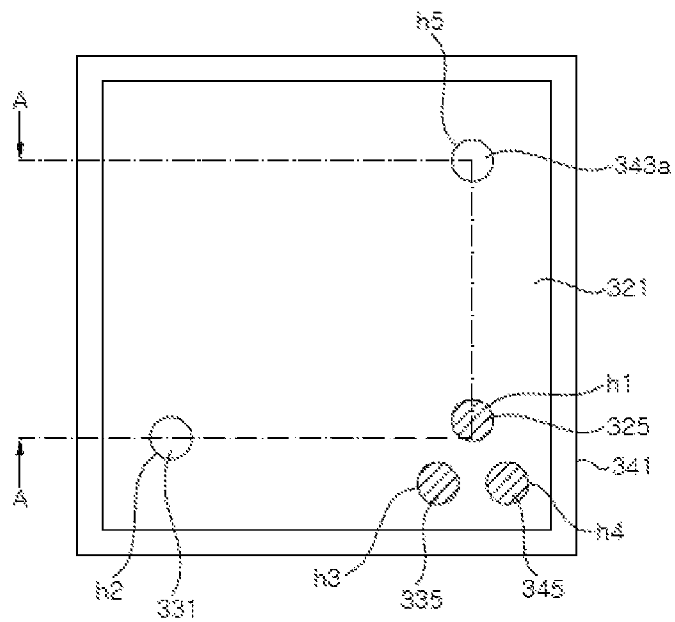
Figure 23B:
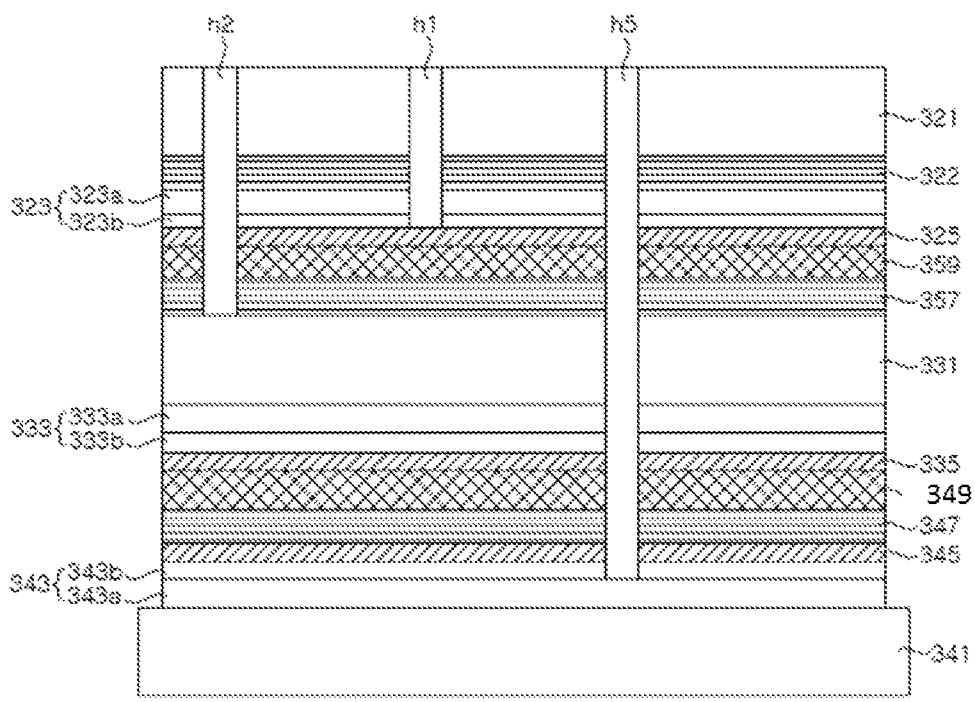

Referring to FIGS. 23A and 23B, holes h1, h2, h3, h4, and h5 passing through the first substrate 321 may be formed, and separation grooves for exposing the first substrate 321 may be formed to define a device region.

The hole h1 may expose the first transparent electrode 325 therethrough, the hole h2 may expose the second substrate 331 therethrough, the hole h3 may expose the second transparent electrode 335 therethrough, the hole h4 may expose the third transparent electrode 345 therethrough, and the hole h5 may expose the first conductivity type semiconductor layer 343*a* therethrough. In some exemplary embodiments, the hole h2 may expose the first conductivity type semiconductor layer 333*a* therethrough.

The separation groove may expose the third substrate 341 therethrough along a circumference of the first to third LED stacks 323, 333, and 343. Although FIGS. 23A and 23B show that the separation groove is formed to expose the third substrate 341 therethrough, in some exemplary embodiments, the separation groove may expose the first conductivity type semiconductor layer 343*a* therethrough. In this case, the hole h5 and the separation groove may be simultaneously formed.

The holes h1, h2, h3, h4, and h5 and the separation groove may be formed using a photography process and an etching process, respectively, and an order for forming these is not particularly limited. For example, a hole with a low depth may be first formed and holes with sequentially deep depths may be formed, or the holes may be formed in the reverse order. The separation groove may be formed after or before all of the holes h1, h2, h3, h4, and h5 are formed. As described above, the hole h5 may also be formed together with the separation groove.

Figure 24A:
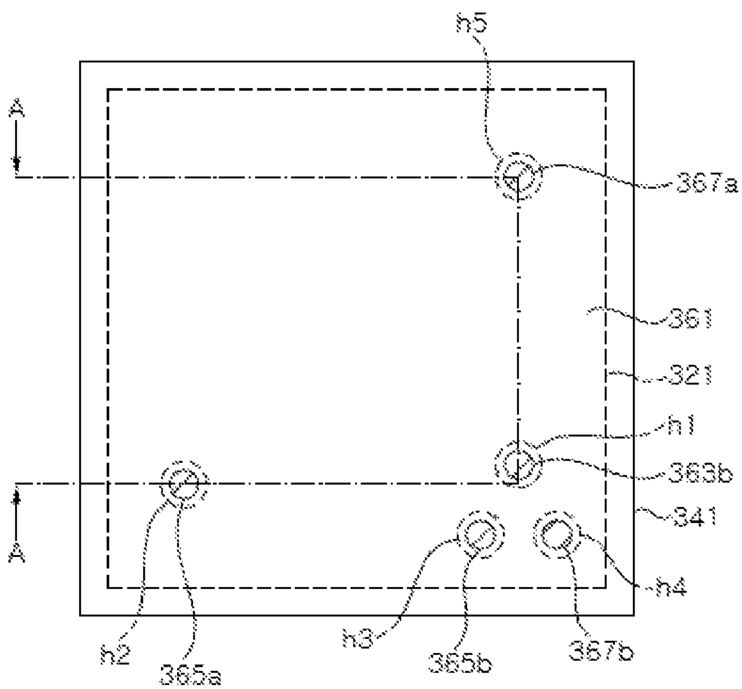
Figure 24B:
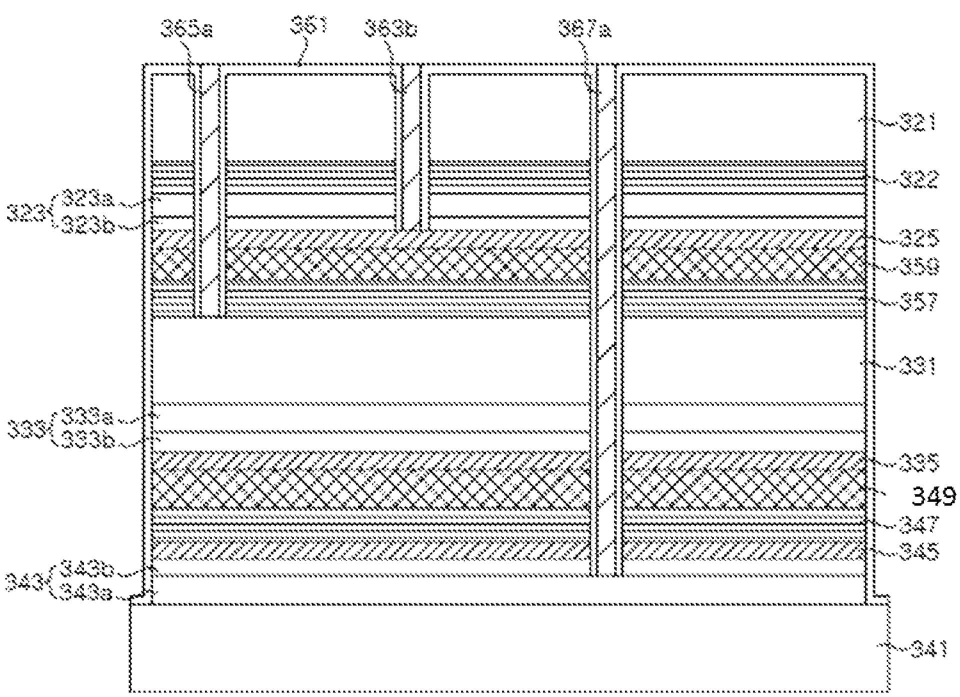

Referring to FIGS. 24A and 24B, the lower insulating layer 361 may be formed on the first substrate 321. The lower insulating layer 361 may cover a side surface of the first substrate 321 and side surfaces of the first to third LED stacks 323, 333, and 343, which are exposed through the separation groove.

The lower insulating layer 361 may also cover side walls of the holes h1, h2, h3, h4, and h5. The lower insulating layer 361 may be patterned to expose a bottom portion of the holes h1, h2, h3, h4, and h5.

The lower insulating layer 361 may be formed of silicon oxide or silicon nitride, but the inventive concepts are not limited thereto, and the lower insulating layer 361 may be formed as, for example, a distributed Bragg reflector.

Then, through-vias 363*b*, 365*a*, 365*b*, 367*a*, and 367*b* are formed in the holes h1, h2, h3, h4, and h5. The through-vias 363*b*, 365*a*, 365*b*, 367*a*, and 367*b* may be formed using electro plating. For example, a seed layer may be formed in the holes h1, h2, h3, h4, and h5 and, then, the holes h1, h2, h3, h4, and h5 may be plated with copper using the seed layer to form the through-vias 363*b*, 365*a*, 365*b*, 367*a*, and 367*b*. The seed layer may be formed of, for example, Ni/Al/Ti/Cu.

Figure 25A:
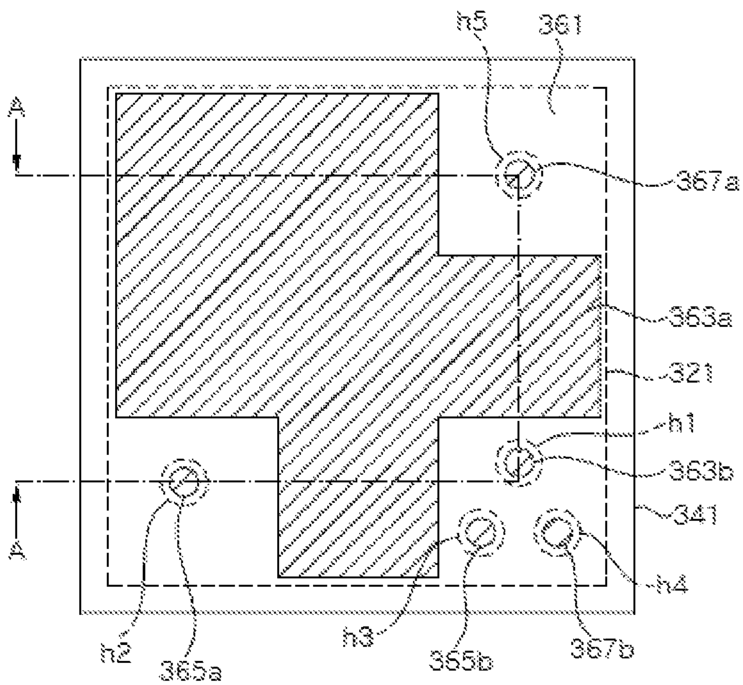
Figure 25B:
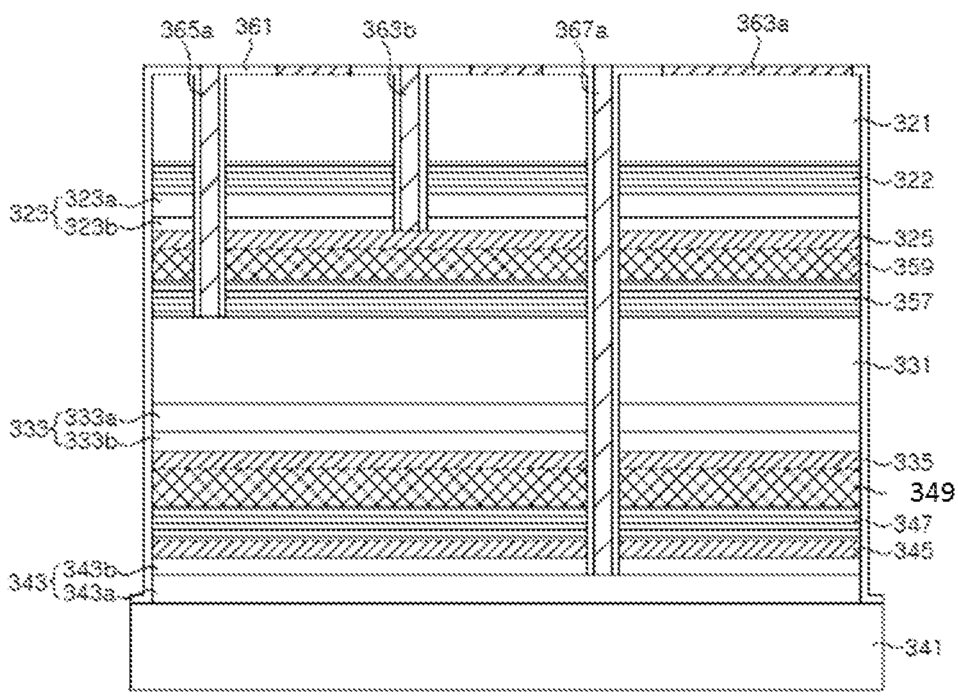

Referring to FIGS. 25A and 25B, the lower insulating layer 361 may be patterned to expose an upper surface of the first substrate 321. The process of patterning the lower insulating layer 361 to expose the upper surface of the first substrate 321 may be substantially simultaneously performed with the process of patterning of the lower insulating layer 361 to expose a bottom portion of the holes h1, h2, h3, h4, and h5.

An exposed region of the upper surface of the first substrate 321 may be formed over a large region and, for example, may be greater than ½ of a light emitting device region.

Then, the ohmic electrode 363*a* may be formed on the exposed portion of the first substrate 321. The ohmic electrode 363*a* may be formed as a conductive layer, which is in ohmic contact with the first substrate 321, and may be formed of, for example, an Au—Te alloy or an Au—Ge alloy.

Figure 26A:
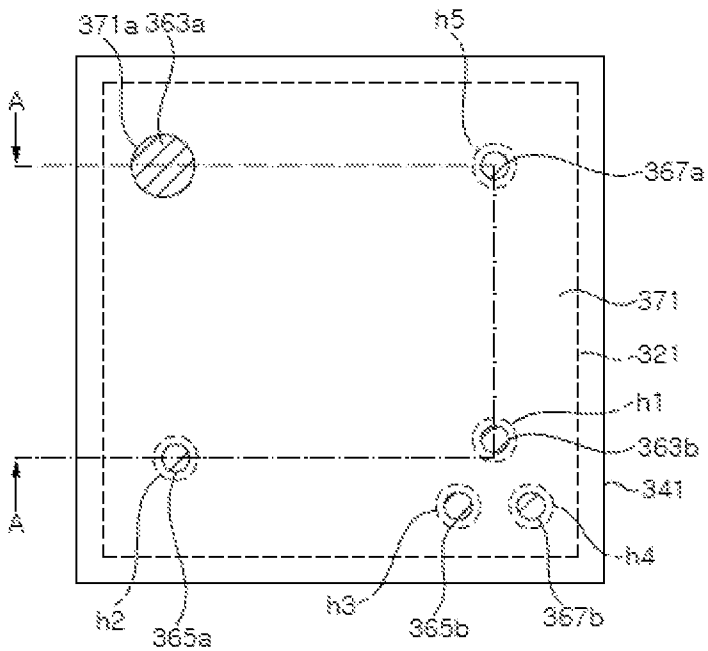

As shown in FIG. 26A, the ohmic electrode 363*a* may be spaced apart from the through-vias 363*b*, 365*a*, 365*b*, 367*a*, and 367*b*.

Figure 26B:
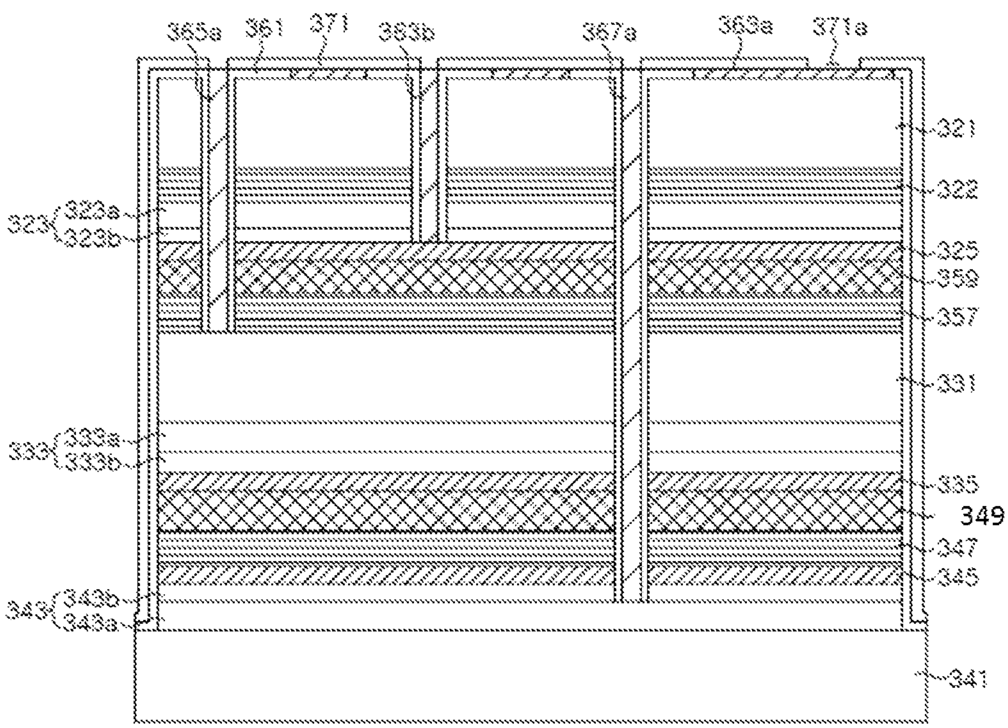

Referring to FIGS. 26A and 26B, an upper insulating layer 371 that covers the lower insulating layer 361 and the ohmic electrode 363*a* may be formed. The upper insulating layer 371 may also cover the lower insulating layer 361 at side surfaces of the first to third LED stacks 323, 333, and 343, and the first substrate 321. The upper insulating layer 371 may be patterned to have openings for exposing the through-vias 363*b*, 365*a*, 365*b*, 367*a*, and 367*b* therethrough, including the opening 371*a* that exposes the ohmic electrode 363*a* therethrough.

The upper insulating layer 371 may be formed as a transparent oxide layer formed of a material, such as silicon oxide or silicon nitride but is not limited thereto. The upper insulating layer 371 may be formed of, for example, a light reflective insulating layer such as a distributed Bragg reflector, or a light block layer such as a light absorbing layer.

Figure 27A:
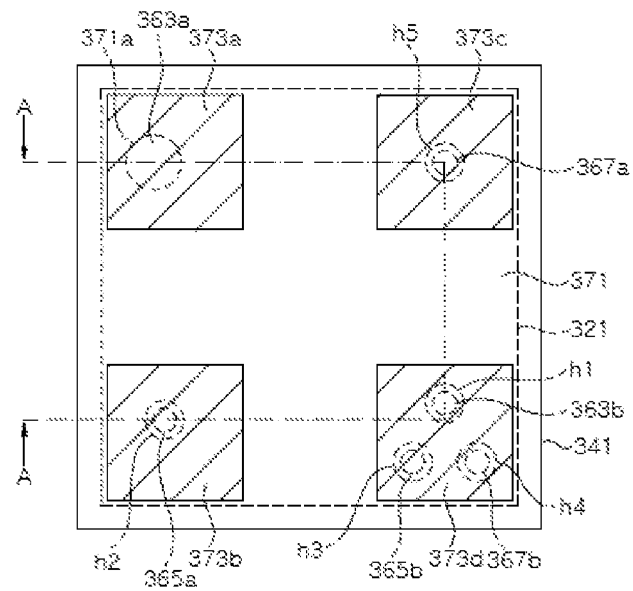
Figure 27B:
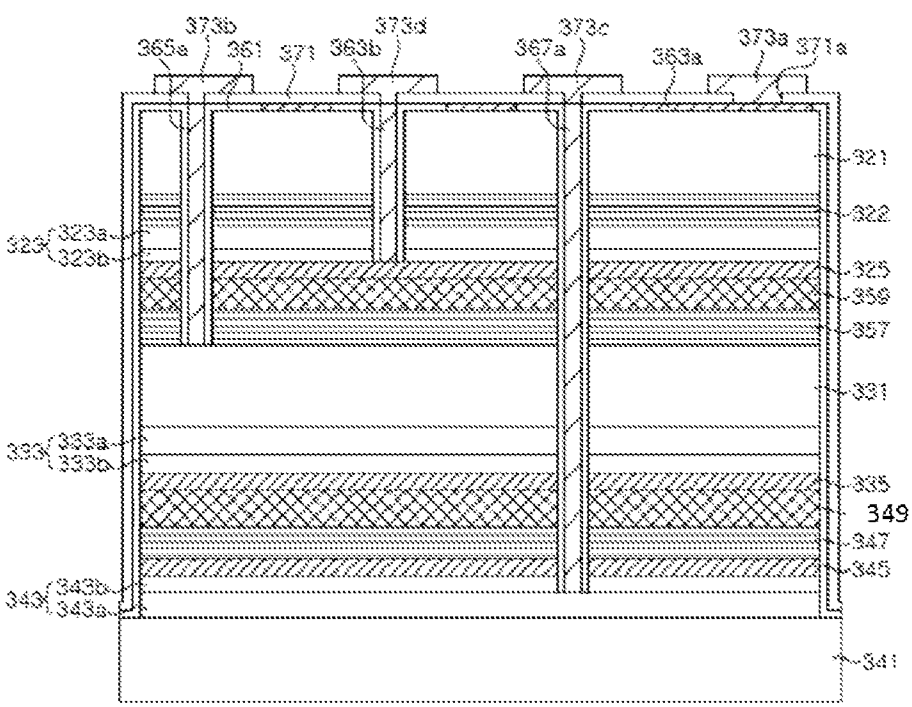

Referring to FIGS. 27A and 27B, the electrode pads 373*a*, 373*b*, 373*c*, and 373*d* may be formed on the upper insulating layer 371. The electrode pads 373*a*, 373*b*, 373*c*, and 373*d* may include the first to third electrode pads 373*a*, 373*b*, and 373*c*, and the common electrode pad 373*d*.

The first electrode pad 373*a* may be connected to the ohmic electrode 363*a* that is exposed through the opening 371*a* of the upper insulating layer 371, the second electrode pad 373*b* may be connected to the through-via 365*a*, and the third electrode pad 373*c* may be connected to the through-via 367*a*. The common electrode pad 373*d* may be commonly connected to the through-vias 363*b*, 365*b*, and 367*b*.

The electrode pads 373*a*, 373*b*, 373*c*, and 373*d* may be electrically separated from one another and, thus, each of the first to third LED stacks 323, 333, and 343 may be electrically connected to two electrode pads, respectively, and may be independently driven.

Then, the third substrate 341 may be divided in units of light emitting device regions to provide the light emitting device 300. As shown in FIG. 27A, the electrode pads 373*a*, 373*b*, 373*c*, and 373*d* may be disposed at four edges of the light emitting device 300, respectively. The electrode pads 373*a*, 373*b*, 373*c*, and 373*d* may have substantially a rectangular shape, but are not limited thereto.

Figure 28A:
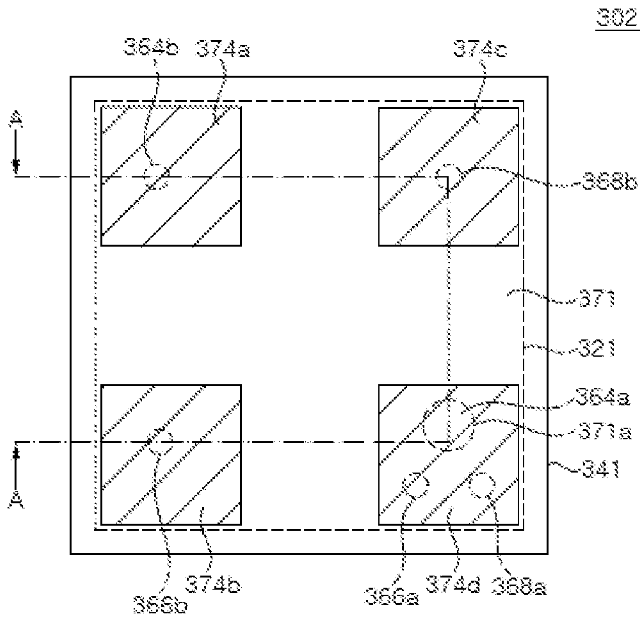
FIGS. 28A and 28B are a schematic plan view and cross-sectional view of a light emitting device for a display according to another exemplary embodiment.
Figure 28B:
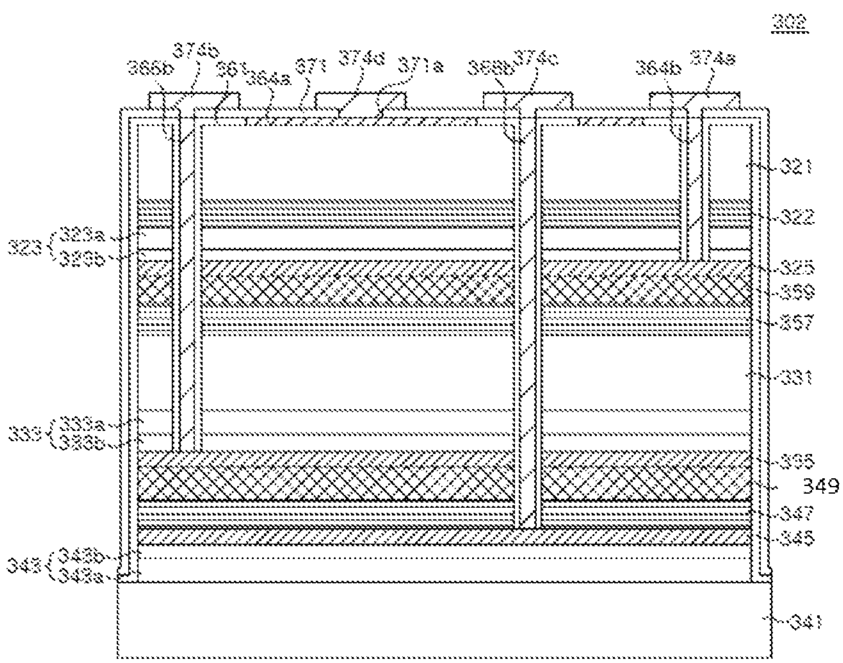

FIGS. 28A and 28B are a schematic plan view and a cross-sectional view of a light emitting device 302 for a display according to another exemplary embodiment.

Referring to FIGS. 28A and 28B, the light emitting device 302 according to an exemplary embodiment is substantially similar to the light emitting device 300 described above with reference to FIGS. 16A and 16B, except that anodes of the first to third LED stacks 323, 333, and 343 are independently connected to the first to third electrode pads 374*a*, 374*b*, and 374*c*, and cathodes are electrically connected to the common electrode pad 374*d*.

More particularly, the first electrode pad 374*a* may be electrically connected to the first transparent electrode 325 through the through-via 364*b*, the second electrode pad 374*b* may be electrically connected to the second transparent electrode 335 through the through-via 366*b*, and the third electrode pad 374*c* may be electrically connected to the third transparent electrode 345 through the through-via 368*b*. The common electrode pad 374*d* may be electrically connected to the ohmic electrode 364*a* that is exposed through the opening 371*a* of the upper insulating layer 371, and may be electrically connected to the second LED stack 333 and the first conductive type semiconductor layers 333*a* and 343*a* of the third LED stack 343 through the through-vias 366*a* and 368*a*. For example, the through-via 366*a* may be connected to the second substrate 331 or the first conductivity type semiconductor layer 333*a*, and the through-via 368*a* may be connected to the first conductivity type semiconductor layer 333*a*.

The light emitting device 300 and 302 according to exemplary embodiments may include the first to third LED stacks 323, 333, and 343 to emit one of red, green, and blue light and, thus, may be used as one pixel in a display apparatus. As described with reference to FIG. 15, the plurality of light emitting devices 300 or 302 may be arranged on the circuit board 301 to provide a display apparatus. The light emitting devices 300 and 302 include the first to third LED stacks 323, 333, and 343 and, thus, an area of a sub pixel may be increased within one pixel. In addition, one light emitting device may be mounted and, thus, the first to third LED stacks 323, 333, and 343 may be mounted, thereby reducing the number of mounting processes.

As described above, light emitting devices mounted on the circuit board 301 according to exemplary embodiments may be driven in a passive matrix manner or an active matrix manner.

Figure 29:
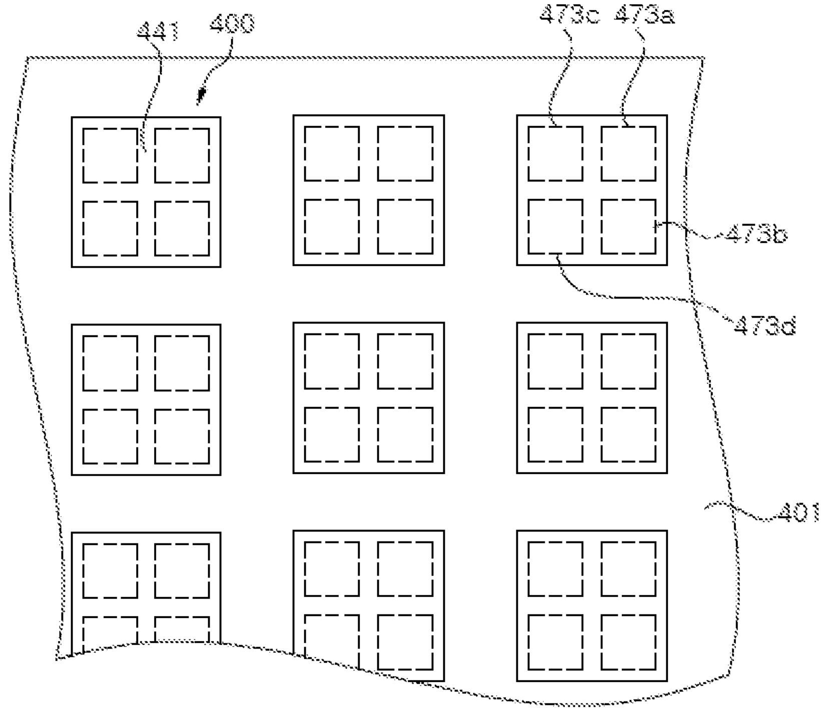
FIG. 29 is a schematic plan view of a display apparatus according to an exemplary embodiment.

FIG. 29 is a schematic plan view of a display apparatus according to an exemplary embodiment.

Referring to FIG. 29, the display apparatus may include a circuit board 401 and a plurality of light emitting devices 400.

The circuit board 401 may include a circuit for passive matrix driving or active matrix driving. According to an exemplary embodiment, the circuit board 401 may include interconnection lines and resistors therein. According to another exemplary embodiment, the circuit board 401 may include interconnection lines, transistors, and capacitors. The circuit board 401 may also include pads that are disposed on an upper surface thereof, which provide electrical connection with a circuit disposed in the circuit board 401.

The plurality of light emitting devices 400 may be arranged on the circuit board 401. Each of the light emitting devices 400 may include one pixel. Each of the light emitting devices 400 may include electrode pads 473*a*, 473*b*, 473*c*, and 473*d*, and the electrode pads 473*a*, 473*b*, 473*c*, and 473*d* may be electrically connected to the circuit board 401. The light emitting device 400 may include substrates 441 disposed on an upper surface thereof. As the light emitting devices 400 are spaced apart from each other, the substrates 441 disposed on the upper surface of the light emitting devices 400 may also be spaced apart from each other.

Figure 30A:
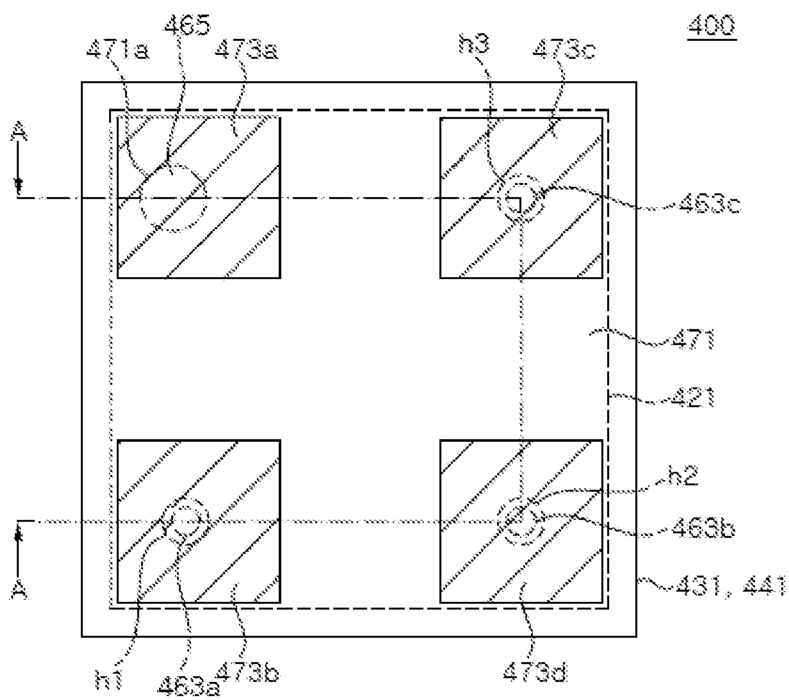
FIG. 30A is a schematic plan view of a light emitting device for a display according to an exemplary embodiment.
Figure 30B:
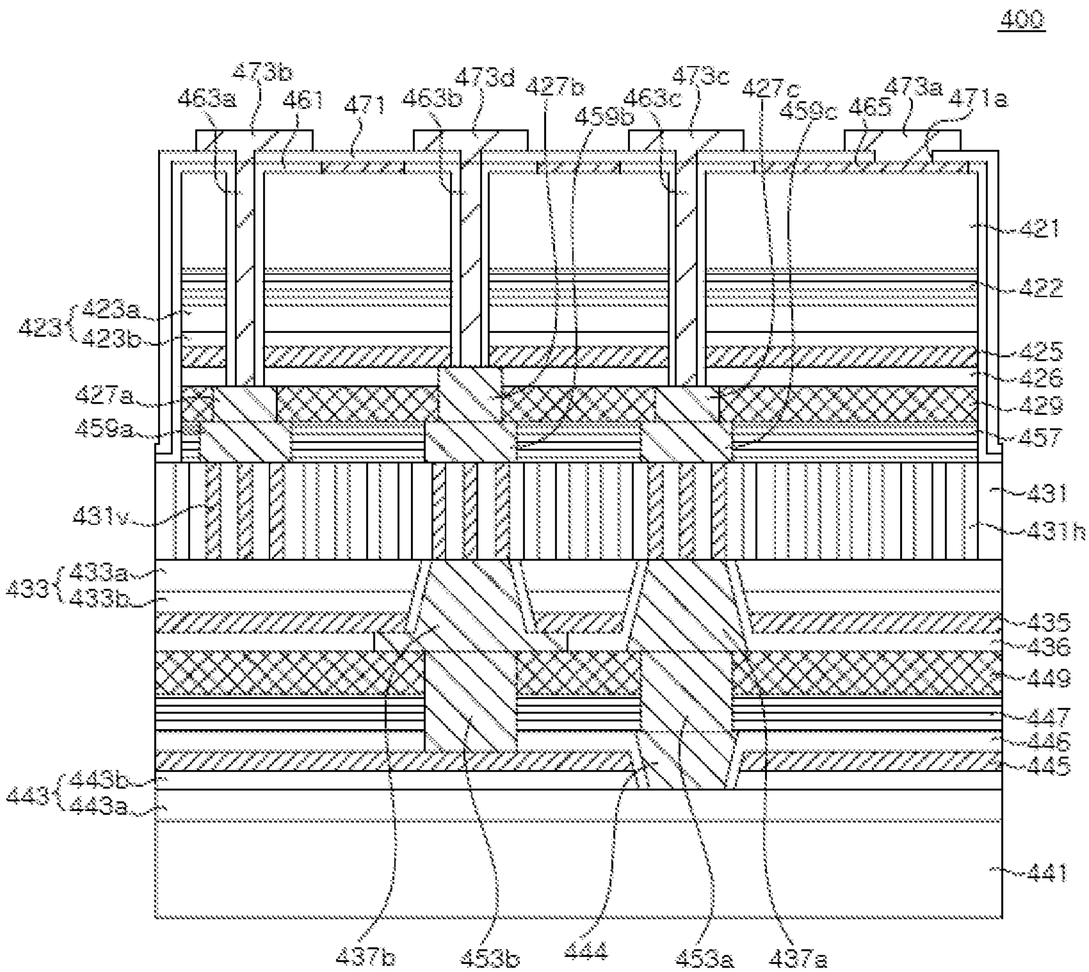
FIG. 30B is a cross-sectional view taken along line A-A of FIG. 30A.

Detailed components of the light emitting device 400 are described in detail with reference to FIGS. 30A and 30B. FIG. 30A is a schematic plan view of the light emitting device 400 according to an exemplary embodiment. FIG. 30B is a cross-sectional view taken along line A-A of FIG. 30A. Although the electrode pads 473*a*, 473*b*, 473*c*, and 473*d* are described as being arranged at an upper side, according to some exemplary embodiments, the light emitting device 400 may be flip-bonded onto the circuit board 401 of FIG. 29 and, in this case, the electrode pads 473*a*, 473*b*, 473*c*, and 473*d* may be arranged at a lower side.

Referring to FIGS. 30A and 30B, the light emitting device 400 may include a first substrate 421, a second substrate 431, a third substrate 441, a distributed Bragg reflector 422, a first LED stack 423, a second LED stack 433, a third LED stack 443, a first transparent electrode 425, a second transparent electrode 435, a third transparent electrode 445, a first color filter 447, a second color filter 457, a first bonding layer 429, a second bonding layer 449, a first insulating layer 426, a second insulating layer 436, a third insulating layer 446, a lower insulating layer 461, an upper insulating layer 471, a lower ohmic electrode 444, an upper ohmic electrode 465, first connectors 427*a*, 427*b*, and 427*c*, second connectors 437*a* and 437*b*, third connectors 453*a* and 453*b*, fourth connectors 459*a*, 459*b*, and 459*c*, first through-vias 431*v*, second through-vias 463*a*, 463*b*, and 463*c*, and electrode pads 473*a*, 473*b*, 473*c*, and 473*d*.

The first substrate 421 may be a substrate for growing the first LED stack 423, for example, a GaAs substrate. In particular, the first substrate 421 may have conductivity.

The second substrate 431 may be a substrate for growing the second LED stack 433, for example, a patterned sapphire substrate. The second substrate 431 may be a substrate formed of an insulating material, and may include the first through-vias 431*v* for electrical connection.

For example, the second substrate 431 may include a plurality of through holes 431*h*. The through holes 431*h* may pass through the second substrate 431. The through holes 431*h* may be connected to a lower surface of the second substrate 431 from an upper surface thereof. At least a portion of the through hole 431*h* may be filled with a conductive material to form the first through-via 431*v*. A portion of the through hole 431*h* may be filled with an insulating material or may be empty. In particular, an internal portion of the through hole 431*h* may be filled with a material with a lower refractive index than the second substrate 431, air, or may be in a vacuum.

The first through-vias 431*v* may provide conductivity to the second substrate 431 formed of insulating materials to provide an electrical path to a lower surface of the second substrate 431 from an upper surface thereof. The first through-vias 431*v* may be disposed in a specific region of the second substrate 431. However, the inventive concepts are not limited thereto, and the through-vias 431*v* may be distributed over a wide area of the second substrate 431.

The third substrate 441 may support the LED stacks 423, 433, and 443. The third substrate 441 may be a growth substrate for growing the third LED stack 443. For example, the third substrate 441 may be a sapphire substrate or a gallium nitride substrate, in particular, a patterned sapphire substrate. First to third LED stacks may be arranged in order of the third LED stack 443, the second LED stack 433, and the first LED stack 423 on the third substrate 441. According to an exemplary embodiment, single third LED stack may be disposed on single third substrate 441. The second LED stack 433, the second substrate 431, the first LED stack 423, and the first substrate 421 may be disposed on the third LED stack 443. Accordingly, the light emitting device 400 may have a single chip structure of a single pixel.

The first LED stack 423, the second LED stack 433, and the third LED stack 443 may each include a first conductivity type semiconductor layer 423*a*, 433*a*, and 443*a*, a second conductivity type semiconductor layer 423*b*, 433*b*, and 443*b*, and an active layer (not shown) interposed therebetween, respectively. The active layer may have, in particular, a multi quantum well structure.

As an LED stack is positioned closer to the third substrate 441, the LED stack may emit light with a shorter wavelength. For example, the first LED stack 423 may be an inorganic light emitting diode for emitting red light, the second LED stack 433 may be an inorganic light emitting diode for emitting green light, and the third LED stack 443 may be an inorganic light emitting diode for emitting blue light. The first LED stack 423 may include an AlGaInP-based well layer, the second LED stack 433 may include an AlGaInN-based well layer and the third LED stack 443 may include an AlGaInN-based well layer. However, the inventive concepts are not limited thereto. For example, when the light emitting device 400 according to an exemplary embodiment includes a micro LED, the first LED stack 423 may emit any one of red, green, and blue light, and the second and third LED stacks 433 and 443 may emit different ones of the red, green, and blue light without adversely affecting operation due to the small form factor of a micro LED.

The first conductivity type semiconductor layers 423*a*, 433*a*, and 443*a* of the respective LED stacks 423, 433, and 443 may each be an n-type semiconductor layer and the second conductivity type semiconductor layers 423*b*, 433*b*, and 443*b* may each be a p-type semiconductor layer. According to an exemplary embodiment, an upper surface of the first LED stack 423 may be an n-type semiconductor layer 423*a*, an upper surface of the second LED stack 433 may be an n-type semiconductor layer 433*a*, and an upper surface of the third LED stack 443 may be a p-type semiconductor layer 443*b*. In particular, semiconductor layers of the third LED stack 443 may only be stacked in reverse order. However, the inventive concepts are not limited thereto. For example, the second LED stack 433 may be disposed on the second substrate 431 and, accordingly, semiconductor layers of the second LED stack 433 may also be stacked in the reverse order.

The lower ohmic electrode 444 may be disposed on the first conductivity type semiconductor layer 443*a* of the third LED stack 443. The lower ohmic electrode 444 may be formed on a portion of the first conductivity type semiconductor layer 443*a*, which is exposed by, for example, etching the second conductivity type semiconductor layer 443*b* and the active layer. The lower ohmic electrode 444 may be in ohmic contact with the first conductivity type semiconductor layer 443*a*.

According to an exemplary embodiment, the first LED stack 423, the second LED stack 433, and the third LED stack 443 may overlap with each other. As shown in FIG. 30B, an outer size of the second LED stack 433 and the third LED stack 443 may be greater than an outer size of the first LED stack 423. As the second connectors 437*a* and 437*b* are formed, an emissive area of the second LED stack 433 may be reduced and, as the lower ohmic electrode 444 is formed, an emissive area of the third LED stack 443 may be reduced. Relative emissive areas of the first to third LED stacks 423, 433, and 443 may be adjusted to control luminous intensity based on visibility. For example, an emissive area of the second LED stack 433 that emits green light with a high visibility may be less than an emissive area of the first LED stack 423 or the third LED stack 443.

The first LED stack 423 may be disposed far away from the third substrate 441, the second LED stack 433 may be disposed below the first LED stack 423, and the third LED stack 443 may be disposed below the second LED stack 433. The first LED stack 423 may emit light with a longer wavelength than the second and third stacks 433 and 443, and thus, light generated by the first LED stack 423 may be transmitted through the second substrate 431, the second and third LED stacks 433 and 443, and the third substrate 441, and then may be emitted to the outside. The second LED stack 433 may emit light with a longer wavelength than the third LED stack 443 and, thus, light generated by the second LED stack 433 may be transmitted through the third LED stack 443 and the third substrate 441, and then may be emitted to the outside. The second substrate 431 may be disposed below the second LED stack 433 and, in this case, light generated by the second LED stack 433 may be transmitted through the second substrate 431.

The distributed Bragg reflector 422 may be disposed between the first substrate 421 and the first LED stack 423. The distributed Bragg reflector 422 may reflect light generated by the first LED stack 423 to prevent the light from being absorbed and lost by the first substrate 421. For example, the distributed Bragg reflector 422 may be formed by alternately stacking AlAs and AlGaAs-based semiconductor layers.

The first transparent electrode 425 may be in ohmic contact with the first LED stack 423. As shown in the drawing, the first transparent electrode 425 may be disposed between the first LED stack 423 and the second LED stack 433. The first transparent electrode 425 may be in ohmic contact with the second conductivity type semiconductor layer 423*b* of the first LED stack 423 and may transmit light generated by the first LED stack 423. The first transparent electrode 425 may be formed using a transparent oxide layer, such as indium-tin oxide (ITO) or a metal layer.

The second transparent electrode 435 may be in ohmic contact with the second conductivity type semiconductor layer 433*b* of the second LED stack 433. As shown in the drawing, the second transparent electrode 435 may contact a lower surface of the second LED stack 433 between the second LED stack 433 and the third LED stack 443. The second transparent electrode 435 may be formed of a metal layer or a conductive oxide layer, which is transparent to red light and green light.

The third transparent electrode 445 may be in ohmic contact with the second conductivity type semiconductor layer 443*b* of the third LED stack 443. The third transparent electrode 445 may be disposed between the second LED stack 433 and the third LED stack 443 and may contact an upper surface of the third LED stack 443. The third transparent electrode 445 may be formed of a metal layer or a conductive oxide layer, which is transparent to red light and green light. The third transparent electrode 445 may also be transparent to blue light. The second transparent electrode 435 and the third transparent electrode 445 may be in ohmic contact with a p-type semiconductor layer of each LED stack to facilitate current spreading. The conductive oxide layer used in the second and third transparent electrodes 435 and 445 may be, for example, $SnO_2$, $InO_2$, ITO, ZnO, IZO, or others.

The first color filter 447 may be disposed between the third LED stack 443 and the second LED stack 433, and the second color filter 457 may be disposed between the second LED stack 433 and the first LED stack 423. The first color filter 447 may transmit light generated by the first and second LED stacks 423 and 433, and may reflect light generated by the third LED stack 443. The second color filter 457 may transmit light generated by the first LED stack 423, and may reflect light generated by the second LED stack 433. Accordingly, light generated by the first LED stack 423 may be emitted to the outside through the second LED stack 433 and the third LED stack 443, and light generated by the second LED stack 433 may be emitted to the outside through the third LED stack 443. In addition, light generated by the second LED stack 433 may be prevented from being incident on and lost in the first LED stack 423, and light generated by the third LED stack 443 may be prevented from being incident on and lost in the second LED stack 433.

In some exemplary embodiments, the second color filter 457 may reflect light generated by the third LED stack 443.

The first and second color filters 447 and 457 may be, for example, a low pass filter for passing only a low frequency domain, e.g., a long wavelength range, a band pass filter for passing only a predetermined wavelength range, or a band stop filter for blocking only a predetermined wavelength range. In particular, the first and second color filters 447 and 457 may be formed by alternately stacking insulating layers with different refractive indices and, for example, may be formed by alternately stacking $TiO_2$ and $SiO_2$. In particular, the first and second color filters 447 and 457 may include a distributed Bragg reflector (DBR). A stop band of the DBR may be controlled by adjusting a thickness of $TiO_2$ and $SiO_2$. The low pass filter and the band pass filter may also be formed by alternately stacking insulating layers with different refractive indices.

The first bonding layer 429 may couple the first LED stack 423 to the second LED stack 433. The first bonding layer 429 may be disposed between the second color filter 457 and the first transparent electrode 425 to bond the second color filter 457 and the first transparent electrode 425. To enhance bonding force of the first bonding layer 429, the first insulating layer 426 formed of a material, such as $SiO_2$, may be disposed on the first transparent electrode 425.

For example, the first bonding layer 429 may be formed of a transparent organic layer or a transparent inorganic layer. An example of the organic layer may include SU8, poly(methylmethacrylate) (PMMA), polyimide, parylene, benzocyclobutene (BCB) or others, and an example of the inorganic layer may include $Al_2O_3$, $SiO_2$, $SiN_x$, or others. The first bonding layer 429 may be formed by spin-on-glass (SOG).

The second bonding layer 449 may couple the third LED stack 443 to the second LED stack 433. As shown in the drawing, the second bonding layer 449 may be disposed between the first color filter 447 and the second transparent electrode 435. To enhance bonding force of the second bonding layer 449, the second insulating layer 436 may be disposed on the second transparent electrode 435. The second bonding layer 449 may be formed of substantially the same material as the first bonding layer 429.

Holes h1, h2, and h3 may pass through the first substrate 421. The hole h1 may pass through the first substrate 421, the distributed Bragg reflector 422, the first LED stack 423, and the first transparent electrode 425. The hole h1 may pass through the first insulating layer 426 to expose the first connector 427*a* therethrough. The hole h2 may pass through the first substrate 421, the distributed Bragg reflector 422, the first LED stack 423, and the first transparent electrode 425 to expose the first connector 427*b* therethrough. The hole h3 may pass through the first substrate 421, the distributed Bragg reflector 422, the first LED stack 423, the first transparent electrode 425, and the first insulating layer 426 to the first connector 427*c* therethrough.

The second through-vias 463*a*, 463*b*, and 463*c* may be disposed in the holes h1, h2, and h3. The second through-via 463*a* may be disposed in the hole h1 and may be connected to the first connector 427*a*. The second through-via 463*b* may be disposed in the hole h2 and may be connected to the first connector 427*b*, and the second through-via 463*c* may be disposed in the hole h3 and may be connected to the first connector 427*c*. The second through-vias 463*a*, 463*b*, and 463*c* may electrically connect the electrode pads 473*b*, 473*d*, and 473*c* and the first connectors 427*a*, 427*b*, and 427*c* to each other.

The first connectors 427*a*, 427*b*, and 427*c* may be disposed between the first LED stack 423 and the second substrate 431. The first connectors 427*a*, 427*b*, and 427*c* may pass through the first bonding layer 429. The first connectors 427*a* and 427*c* may be electrically insulated from the first LED stack 423, and the first connector 427*b* may be electrically connected to the second conductivity type semiconductor layer 423*b* of the first LED stack 423. For example, as shown in FIG. 30B, the first connectors 427*a* and 427*c* may be spaced apart from the first transparent electrode 425 by the first insulating layer 426 and the first connector 427*b* may be connected to the first transparent electrode 425.

The second connectors 437*a* and 437*b* may be disposed on a lower surface of the second substrate 431 and may be connected to the first through-vias 431*v*. The second connectors 437*a* and 437*b* may pass through the second LED stack 433. The second connector 437*a* may be insulated from the second LED stack 433 by, for example, the second insulating layer 436. The second connector 437*b* may be electrically connected to the second transparent electrode 435. The second connector 437*b* may be insulated from the first conductivity type semiconductor layer 433*a* by, for example, the second insulating layer 436.

The third connectors 453*a* and 453*b* may be disposed between the third LED stack 443 and the second LED stack 433, and may be connected to the second connectors 437*a* and 437*b*, respectively. As shown in FIG. 30B, the third connectors 453*a* and 453*b* may be formed to pass through the first color filter 447 and the second bonding layer 449. The third connector 453*a* may be electrically connected to the first conductivity type semiconductor layer 443*a* of the third LED stack 443, and the third connector 453*b* may be electrically connected to the second conductivity type semiconductor layer 443*b*. For example, the ohmic electrode 444 may be disposed on the first conductivity type semiconductor layer 443*a*, and the third connector 453*a* may be connected to the ohmic electrode 444. The third connector 453*b* may be connected to the third transparent electrode 445.

The fourth connectors 459*a*, 459*b*, and 459*c* may be disposed on an upper surface of the second substrate 431 and may be connected to the first through-vias 431*v*. The fourth connectors 459*a*, 459*b*, and 459*c* may pass through the second color filter 457. The fourth connectors 459*a*, 459*b*, and 459*c* may electrically connect the first through-vias 431*v* and the first connectors 427*a*, 427*b*, and 427*c* to each other.

The lower insulating layer 461 may cover side surfaces of the first substrate 421 and the first LED stack 423, and may cover an upper surface of the first substrate 421. The lower insulating layer 461 may also cover side walls of the holes h1, h2, and h3. However, the lower insulating layer 461 may be patterned to expose a bottom portion of each of the holes h1, h2, and h3. The lower insulating layer 461 may also be patterned to expose an upper surface of the first substrate 421.

The upper ohmic electrode 465 may be in ohmic contact with the upper surface of the first substrate 421. The upper ohmic electrode 465 may be formed on a portion of the first substrate 421, which is exposed by patterning the lower insulating layer 461. The upper ohmic electrode 465 may be formed of, for example, an Au—Te ally or an Au—Ge alloy.

The upper insulating layer 471 may cover the lower insulating layer 461 and may cover the upper ohmic electrode 465. The upper insulating layer 471 may cover the lower insulating layer 461 at side surfaces of the first substrate 421 and the first to third LED stacks 423, 433, and 443, and may cover the lower insulating layer 461 at an upper portion of the first substrate 421. The upper insulating layer 471 may include an opening 471*a* for exposing the upper ohmic electrode 465 therethrough and may have openings for exposing the second through-vias 463*a*, 463*b*, and 463*c* therethrough.

The lower insulating layer 461 or the upper insulating layer 471 may be formed of silicon oxide or silicon nitride but is not limited thereto. For example, the lower insulating layer 461 or the upper insulating layer 471 may be formed as a distributed Bragg reflector using insulation layers with different refractive indices. In particular, the upper insulating layer 471 may be formed as a light reflective layer or a light block layer. As shown in FIG. 30B, the lower insulating layer 461 and the upper insulating layer 471 may cover an upper surface of the second substrate 431.

The electrode pads 473*a*, 473*b*, 473*c*, and 473*d* may be disposed on the upper insulating layer 471 and may be electrically connected to the first to third LED stacks 423, 433, and 443. For example, the first electrode pad 473*a* may be electrically connected to a portion of the upper ohmic electrode 465, which is exposed through the opening 471*a* of the upper insulating layer 471, and the second electrode pad 473*b* may be electrically connected to a portion of the second through-via 463*a*, which is exposed through an opening of the upper insulating layer 471. The third electrode pad 473*c* may be electrically connected to a portion of the second through-via 463*c*, which is exposed through an opening of the upper insulating layer 471. The common electrode pad 473*d* may be electrically connected to the second through-via 463*b*.

Accordingly, the common electrode pad 473*d* may be commonly and electrically connected to the second conductivity type semiconductor layers 423*b*, 433*b*, and 443*b* of the first to third LED stacks 423, 433, and 443, and the electrode pads 473*a*, 473*b*, and 473*c* may be electrically connected to the first conductivity type semiconductor layers 423*a*, 433*a*, and 443*a* of the first to third LED stacks 423, 433, and 443, respectively.

According to an exemplary embodiment, the first LED stack 423 may be electrically connected to the electrode pads 473*d* and 473*a*, the second LED stack 433 may be electrically connected to the electrode pads 473*d* and 473*b*, and the third LED stack 443 may be electrically connected to the electrode pads 473*d* and 473*c*. Accordingly, anodes of the first LED stack 423, the second LED stack 433 and the third LED stack 443 may be commonly and electrically connected to the electrode pad 473*d*, and cathodes may be electrically connected to the first to third electrode pads 473*a*, 473*b*, and 473*c*, respectively. Accordingly, the first to third LED stacks 423, 433, and 443 may be independently driven.

FIGS. 31, 32, 33, 34, 35, 36, 37A, 37B, 38A, 38B, 39A, 39B, 40A, 40B, 41A, and 41B are schematic plan views and cross-sectional views illustrating a method of manufacturing the light emitting device 400 according to an exemplary embodiment. In the drawings, each plan view is given to correspond to the plan view of FIG. 30A and each cross-sectional view is given to correspond to the cross-sectional view taken along A-A of FIG. 30A.

Figure 31:
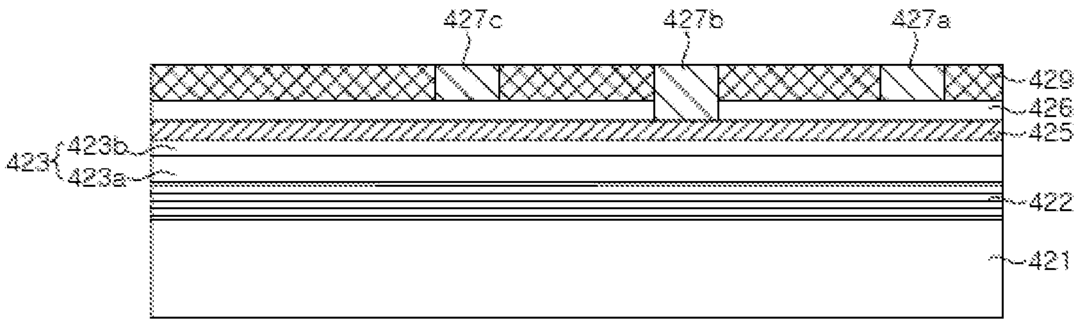
FIGS. 31, 32, 33, 34, 35, 36, 37A, 37B, 38A, 38B, 39A, 39B, 40A, 40B, 41A, and 41B are schematic plan views and cross-sectional views illustrating a method of manufacturing a light emitting device for a display according to an exemplary embodiment.

First, referring to FIG. 31, a first LED stack 423 may be grown on a first substrate 421. The first substrate 421 may be, for example, a GaAs substrate. The first LED stack 423 may be formed of AlGaInP-based semiconductor layers and may include a first conductivity type semiconductor layer 423*a*, an active layer, and a second conductivity type semiconductor layer 423*b*. Here, the first conductive type may be an n-type and the second conductive type may be a p-type. Prior to growth of the first LED stack 423, a distributed Bragg reflector 422 may be first formed. The distributed Bragg reflector 422 may have, for example, a stack structure in which AlAs/AlGaAs are repeatedly stacked.

A first transparent electrode 425 may be formed on the second conductivity type semiconductor layer 423*b*. The first transparent electrode 425 may be formed of a transparent oxide layer, for example, ZnO or a transparent metal layer.

Then, a first insulating layer 426 and a first bonding layer 429 may be sequentially formed, the first insulating layer 426 and the first bonding layer 429 may be patterned, and then, first connectors 427*a*, 427*b*, and 427*c* may be formed. The first connector 427*b* may be formed to be connected to the first transparent electrode 425 and the first connectors 427*a* and 427*c* may be formed on the first insulating layer 426. Upper surfaces of the first connectors 427*a*, 427*b*, and 427*c* may be substantially flush with an upper surface of the first bonding layer 429. The first connectors 427*a*, 427*b*, and 427*c* may be formed of, for example, AuSn, AuIn, or others. The first bonding layer 429 is substantially the same as that described with reference to FIGS. 30A and 30B, and thus, repeated descriptions thereof are omitted to avoid redundancy.

Figure 32:
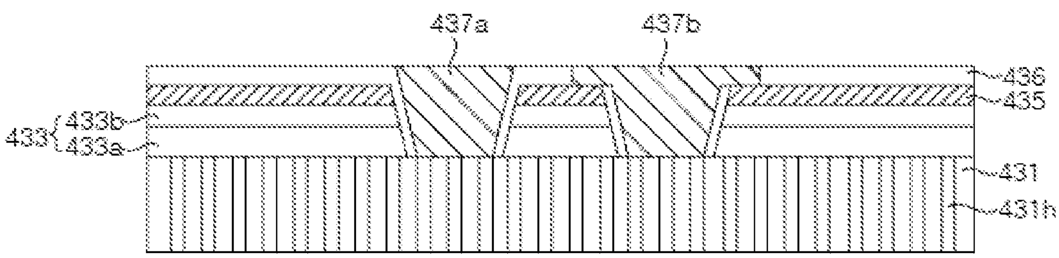

Referring to FIG. 32, a second substrate 431 may be prepared. The second substrate 431 may have a plurality of through holes 431*h*. Although FIG. 32 shows that the through holes 431*h* pass through the second substrate 431, the inventive concepts are not limited thereto. For example, in a preparing operation of the second substrate 431, the through holes 431*h* may be formed to a partial depth of the second substrate 431 and, in a subsequent operation, a portion of the second substrate 431 not formed with the through holes 431*h* may be removed such that the through holes 431*h* pass through the second substrate 431.

A second LED stack 433 may be grown on the second substrate 431 having the through holes 431*h*, and a second transparent electrode 435 may be formed on the second LED stack 433. The second LED stack 433 may be formed of AlGaInN-based semiconductor layers and may include a first conductivity type semiconductor layer 433*a*, an active layer, and a second conductivity type semiconductor 433*b*. The second substrate 431 may be a substrate for growing the second LED stack, for example, a patterned sapphire substrate. Here, the first conductive type may be an n-type and the second conductive type may be a p-type. The second LED stack 433 may emit green light. The second transparent electrode 435 may be in ohmic contact with the second conductivity type semiconductor 433*b*. The second transparent electrode 435 may be formed of a conductive oxide layer of, for example, $SnO_2$, $InO_2$, ITO, ZnO, or IZO, or a metallic layer.

Then, the second transparent electrode 435 and the second LED stack 433 may be patterned to form openings for exposing the second substrate 431 therethrough. A portion of the through holes 431*h* may be exposed through the opening holes. Then, a second insulating layer 436 that covers the second transparent electrode 435 and the openings may be formed. Then, the second insulating layer 436 may be patterned to expose the second substrate 431 through a bottom portion of the openings. In this case, the second insulating layer 436 may be patterned to partially expose an upper surface of the second transparent electrode 435.

Second connectors 437*a* and 437*b* may be formed in the openings. The second connector 437*a* may be electrically insulated from the second LED stack 433. The second connector 437*b* may be connected to the second transparent electrode 435, and may be insulated from the first conductivity type semiconductor layer 433*a*. The second connectors 437*a* and 437*b* may be formed to contact the through holes 431*h* of the second substrate 431 and may fill at least a portion of the through holes 431*h*. The second connectors 437*a* and 437*b* may be formed of AuSn, AuIn, or others.

Figure 33:
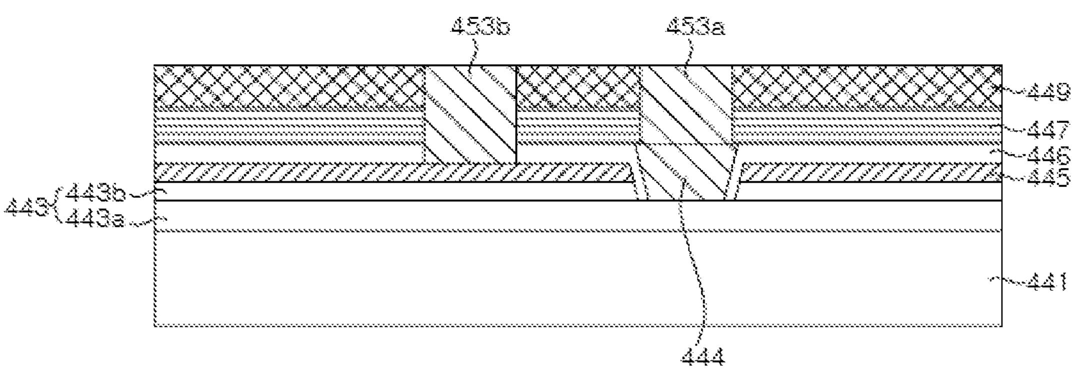

Referring to FIG. 33, a third LED stack 443 may be grown on a third substrate 441, and a third transparent electrode 445 may be formed on the third LED stack 443. The third LED stack 443 may be formed of AlGaInN-based semiconductor layers and may include a first conductivity type semiconductor layer 443*a*, an active layer, and a second conductivity type semiconductor layer 443*b*. Here, the first conductive type may be an n-type and the second conductive type may be a p-type.

The third substrate 441 may be a substrate for growing a gallium nitride-based semiconductor layer and may be different from the first substrate 421. A composition ratio of AlGaInN may be determined such that the third LED stack 443 emits blue light. The third transparent electrode 445 may be in ohmic contact with the second conductivity type semiconductor layer 443*b*. The third transparent electrode 445 may be formed of a conductive oxide layer of, for example, $SnO_2$, $InO_2$, ITO, ZnO, or IZO.

The third transparent electrode 445 and the second conductivity type semiconductor layer 443*b* may be patterned to expose the first conductivity type semiconductor layer 443*a*.

Then, the third insulating layer 446 may be formed and may be patterned to expose the first conductivity type semiconductor layer 443*a*. An ohmic electrode 444 may be formed on the exposed portion of the first conductivity type semiconductor layer 443*a*.

Then, a first color filter 447 and a second bonding layer 449 may be formed. The first color filter 447 and the second bonding layer 449 are substantially the same as those described with reference to FIGS. 30A and 30B, and thus, repeated descriptions thereof are omitted to avoid redundancy.

Then, the second bonding layer 449 and the first color filter 447 may be patterned to form openings for exposing the ohmic electrode 444 and a third transparent electrode 445 therethrough, and third connectors 453*a* and 453*b* may be formed in the openings. The third connectors 453*a* and 453*b* may be formed of AuSn, AuIn, or others. Upper surfaces of the third connectors 453*a* and 453*b* may be substantially flush with an upper surface of the second bonding layer 449.

Figure 34:
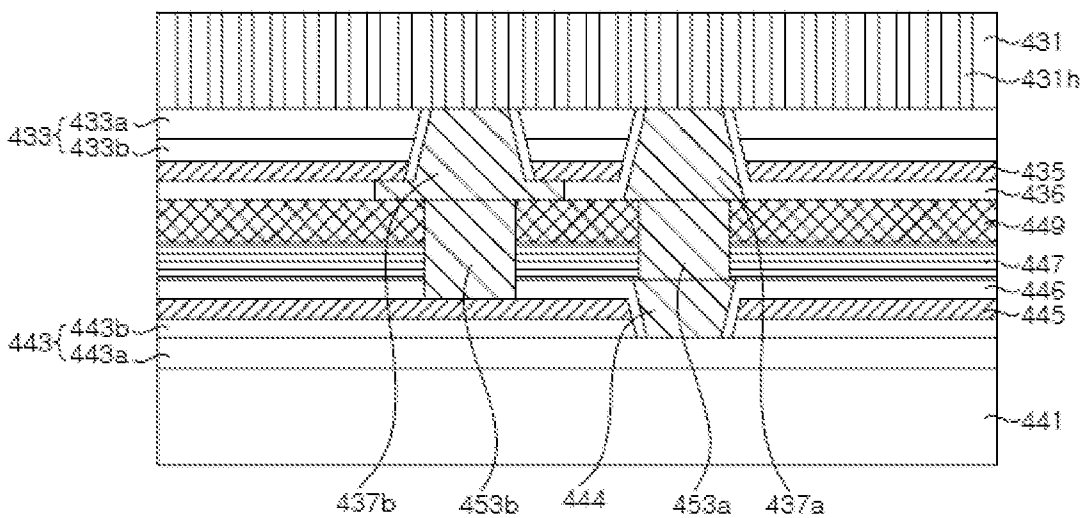

Referring to FIG. 34, the second LED stack 433 shown in FIG. 32 may be bonded onto the third LED stack 443 shown in FIG. 33.

As shown in the drawing, the second insulating layer 436 may be connected to the second bonding layer 449, the second connectors 437*a* and 437*b* may be disposed to contact the third connectors 453*a* and 453*b* and, then, heat may be applied thereto to bond these elements.

Figure 35:
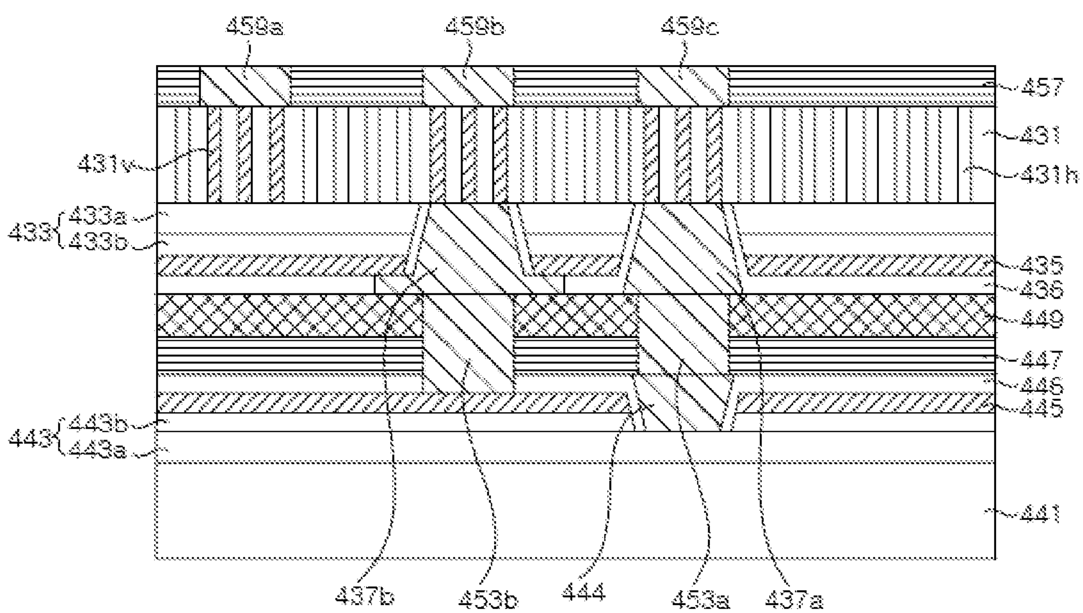

Referring to FIG. 35, a metallic material may be filled in the through holes 431*h* of the second substrate 431 to form first through-vias 431*v*. The first through-vias 431*v* may be formed by using, for example, a plating technology. The first through-vias 431*v* may be connected to the second connectors 437*a* and 437*b*, and may also be connected to the first conductivity type semiconductor layer 433*a*. A portion of through holes 431*h* may remain empty rather than being plated or filled with an insulating material.

Then, a second color filter 457 may be formed on the second substrate 431. The second color filter 457 may be formed by alternately stacking insulation layers with different refractive indices as described above with reference to FIGS. 30A and 30B.

Then, the second color filter 457 may be patterned to expose the first through-vias 431*v*, and fourth connectors 459*a*, 459*b*, and 459*c* may be formed. The fourth connectors 459*a*, 459*b*, and 459*c* may be formed of AuSn, AuIn, or others. Upper surfaces of the fourth connectors 459*a*, 459*b*, and 459*c* may be substantially flush with an upper surface of the second color filter 457.

According to an exemplary embodiment, although the second color filter 457 is described as being formed after the first through-vias 431*v* are formed, according to some exemplary embodiments, the second color filter 457 may be first formed while exposing a region for forming the first through-vias 431*v*, and then, the through-vias 431*v* and the fourth connectors 459*a*, 459*b*, and 459*c* may be formed using a plating technology.

Figure 36:
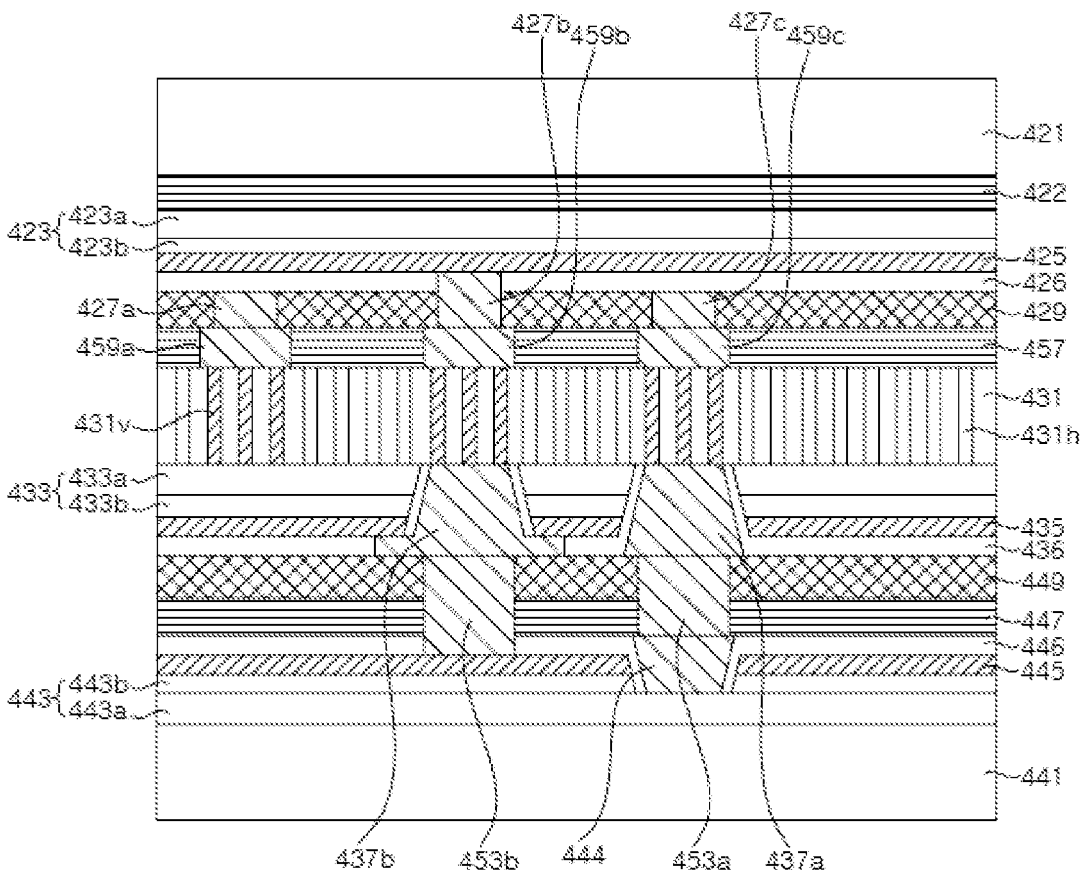

Referring to FIG. 36, then, the first LED stack 423 shown in FIG. 31 may be bonded onto the second substrate 431. The first substrate 421 and the second substrate 431 may be disposed such that the first bonding layer 429 and the second color filter 457 contact each other and the first connectors 427*a*, 427*b*, and 427*c* and the fourth connectors 459*a*, 459*b*, and 459*c* contact each other, and heat may be applied thereto to bond these elements.

Figure 37A:
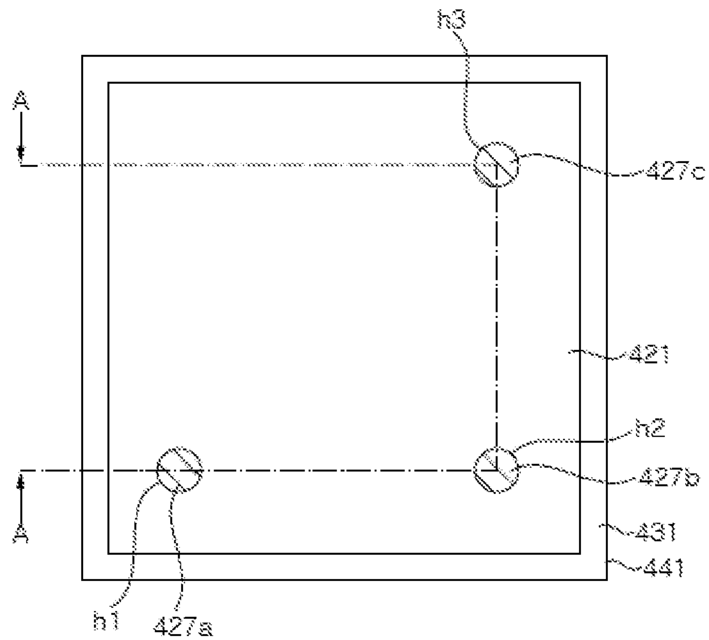
Figure 37B:
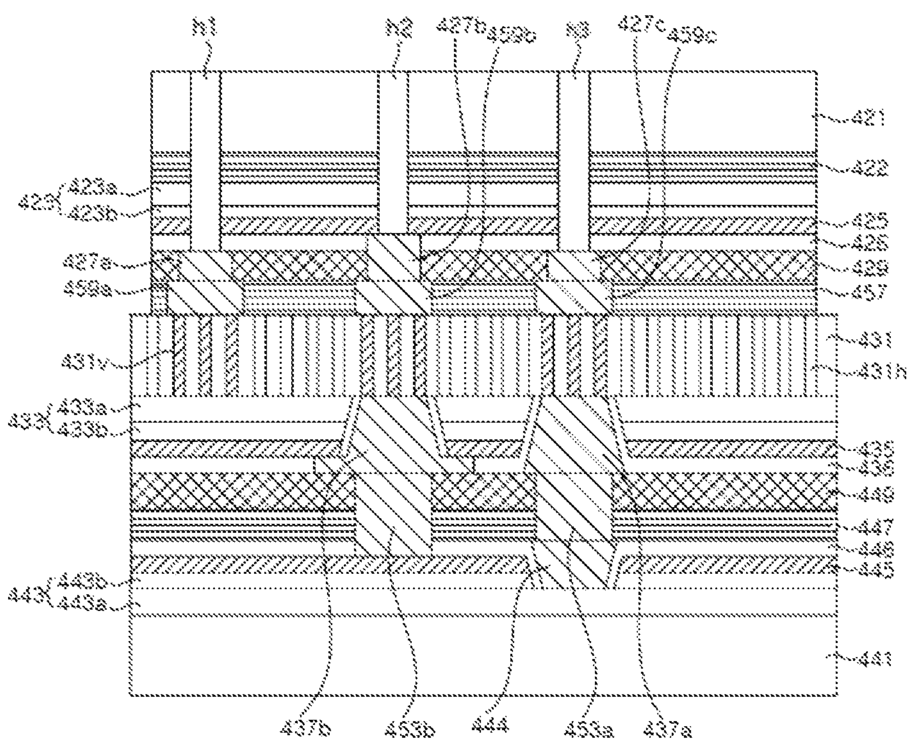

Referring to FIGS. 37A and 37B, the holes h1, h2, and h3 passing through the first substrate 421 may be formed, and separation grooves for exposing the second substrate 431 therethrough may be formed to define a device region.

The holes h1 and h3 may pass through the first LED stack 423, the first transparent electrode 425, and the first insulating layer 426. According to an exemplary embodiment, the hole h2 may pass through the first LED stack 423 and the first transparent electrode 425. Thus, the hole h1 may expose the first connector 427*a*, the hole h2 may expose the first connector 427*b*, and the hole h3 may expose the first connector 427*c*. According to another exemplary embodiment, the hole h2 may pass through the first LED stack 423 to expose an upper surface of the first transparent electrode 425. Accordingly, the first connector 427*b* may not be exposed by the hole h2.

The separation groove may expose the second substrate 431 along a circumference of the first LED stack 423. According FIG. 37A shows that the separation groove exposes the second substrate 431, the inventive concepts are not limited thereto. For example, the separation groove may expose the second color filter 457 therethrough and may expose the first conductivity type semiconductor layer 423*a* therethrough. Alternatively, the separation groove may be omitted.

Holes h1, h2, and h3 and a separation groove may be formed using a photography and etching processes, respectively, and an order for forming these may not be particularly limited. For example, the holes h1, h2, and h3 with a low depth may be first formed and the separation groove may be formed thereafter, or vice versa. The separation groove may be formed with the holes h1, h2, and h3. The holes h1, h2, and h3 may be formed together in substantially the same process or may be formed in different processes.

Figure 38A:
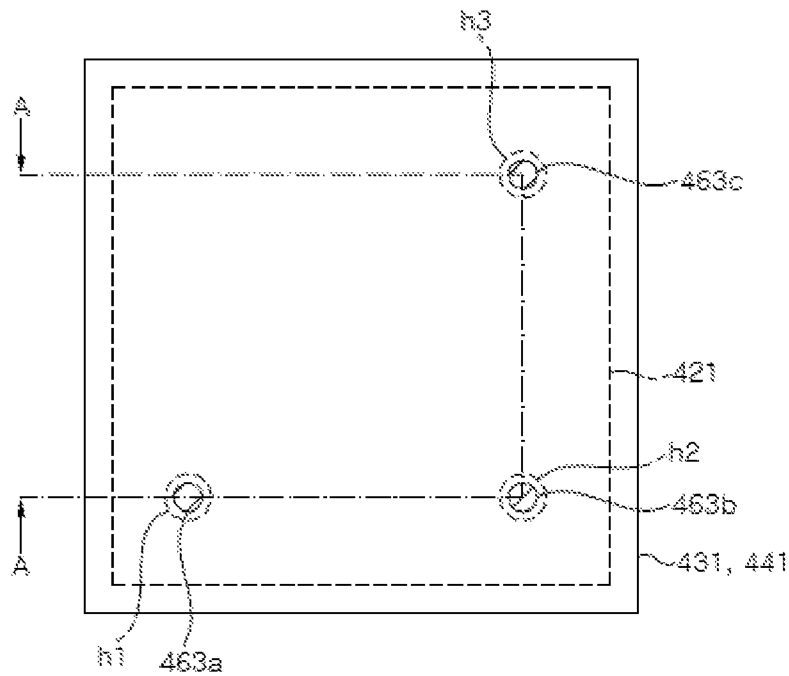
Figure 38B:
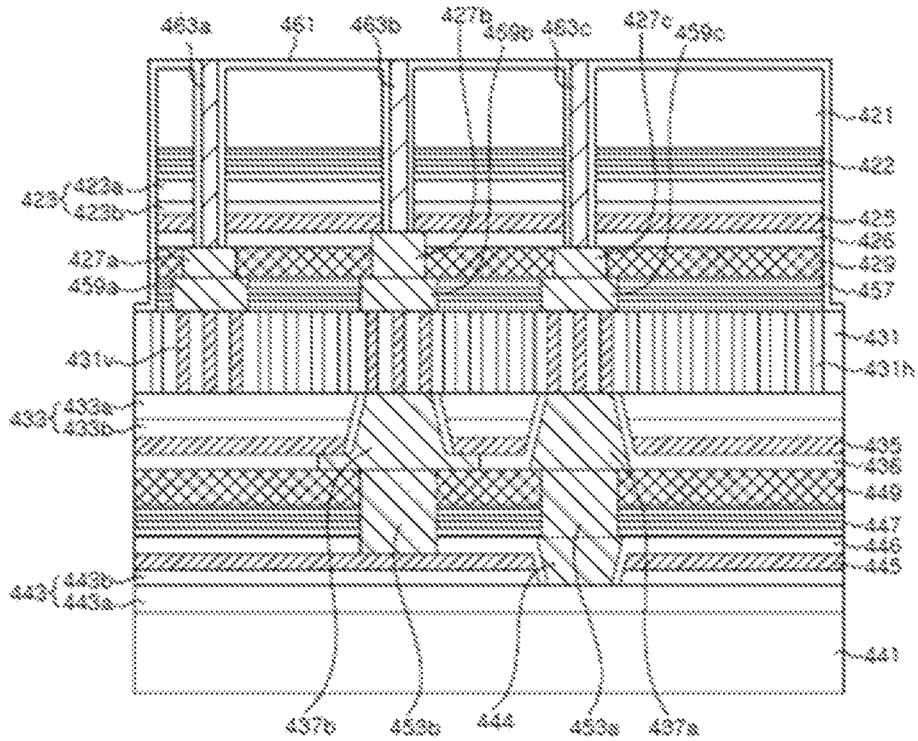

Referring to FIGS. 38A and 38B, a lower insulating layer 461 may be formed on the first substrate 421. The lower insulating layer 461 may cover a side surface of the first substrate 421 and side surfaces of the first LED stack 423, which are exposed through the separation groove.

The lower insulating layer 461 may also cover side walls of the holes h1, h2, and h3. The lower insulating layer 461 may be patterned to expose the first connectors 427*a*, 427*b*, and 427*c*.

The lower insulating layer 461 may be formed of silicon oxide or silicon nitride, but is not limited thereto, and may also be formed as a distributed Bragg reflector.

Then, second through-vias 463*a*, 463*b*, and 463*c* may be formed in the holes h1, h2, and h3. The second through-vias 463*a*, 463*b*, and 463*c* may be formed using electroplating. For example, a seed layer may be first formed in the holes h1, h2, and h3 and, then, the holes h1, h2, and h3 may be plated with copper using the seed layer to form the second through-vias 463*a*, 463*b*, and 463*c*. The seed layer may be formed of, for example, Ni/Al/Ti/Cu. The first connectors 427*a*, 427*b*, and 427*c* may function as a seed and, thus, the seed layer may be omitted.

Figure 39A:
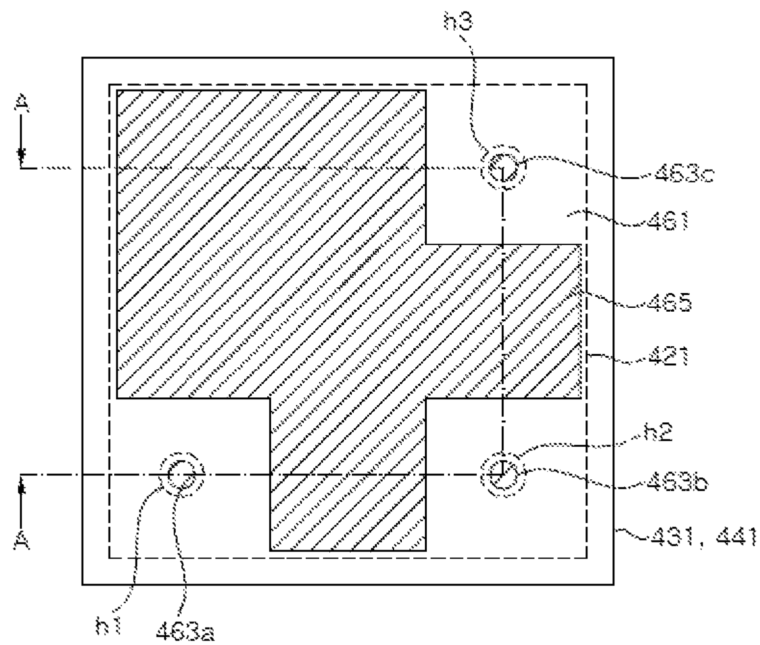
Figure 39B:
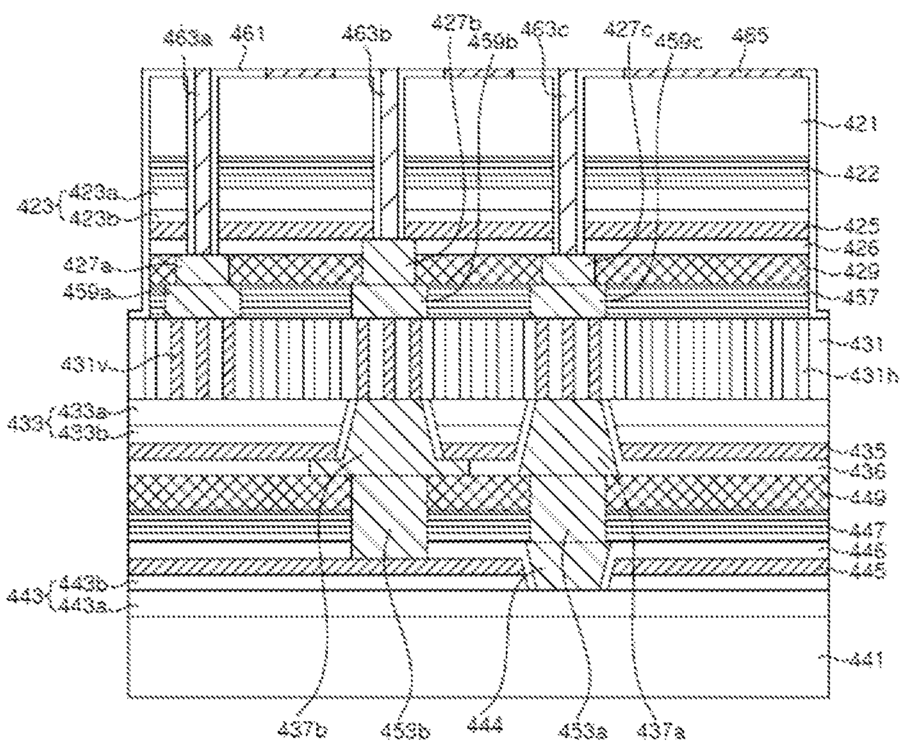

Referring to FIGS. 39A and 39B, the lower insulating layer 461 may be patterned to expose an upper surface of the first substrate 421. The process of patterning the lower insulating layer 461 to expose an upper surface of the first substrate 421 may be performed together with the process of patterning the lower insulating layer 461 to expose a bottom portion of the holes h1, h2, and h3.

An exposed region of the upper surface of the first substrate 421 may be formed over a large region, and, for example, may be greater than ½ of a light emitting device region.

Then, an ohmic electrode 465 may be formed on the exposed portion of the first substrate 421. The ohmic electrode 465 may be formed of a conductive layer which is in ohmic contact with the first substrate 421, and may be formed of, for example, an Au—Te alloy or an Au—Ge alloy.

As shown in FIG. 39A, the ohmic electrode 465 may be spaced apart from the second through-vias 463*a*, 463*b*, and 463*c*.

Figure 40A:
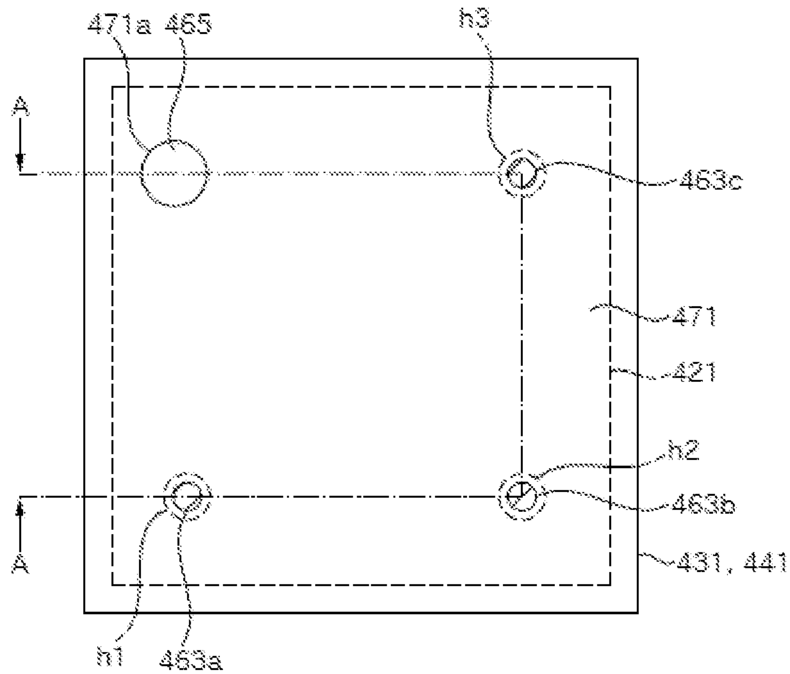
Figure 40B:
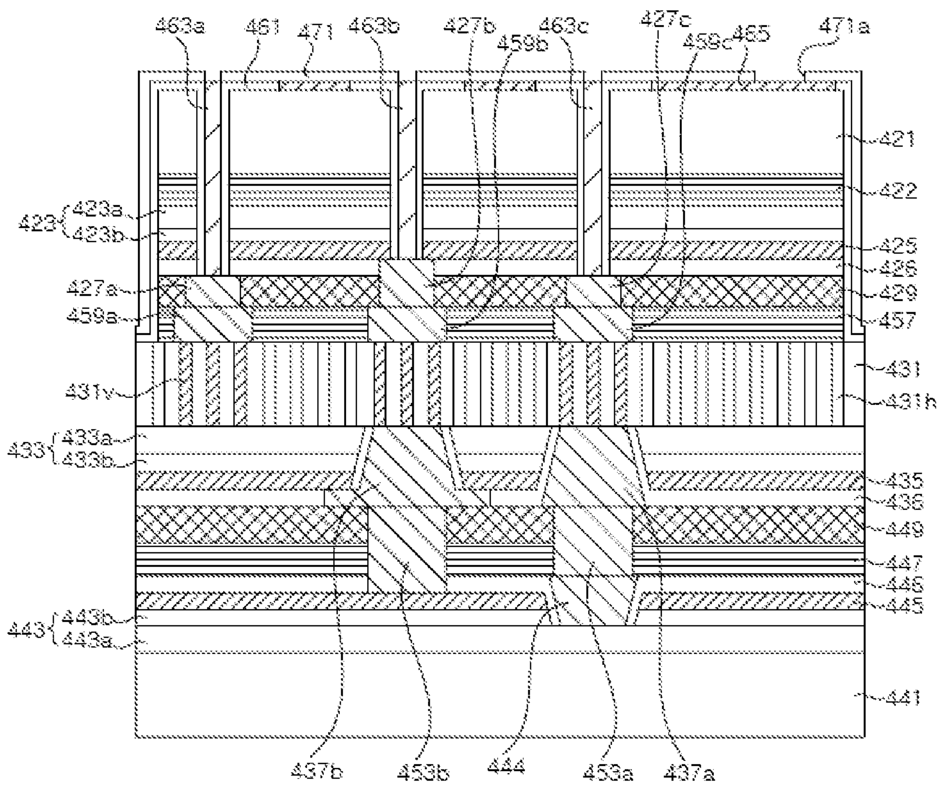

Referring to FIGS. 40A and 40B, an upper insulating layer 471 that covers the lower insulating layer 461 and the ohmic electrode 465 may be formed. The upper insulating layer 471 may also cover the lower insulating layer 461 at side surfaces of the first LED stack 423 and the first substrate 421. The upper insulating layer 471 may be patterned to have openings for exposing the second through-vias 463*a*, 463*b*, and 463*c* therethrough, including the opening 471*a* for exposing the ohmic electrode 465 therethrough.

The upper insulating layer 471 may be formed as a transparent oxide layer formed of a material, such as silicon oxide or silicon nitride, but is not limited thereto. The upper insulating layer 471 may be formed of, for example, a light reflective insulating layer such as a distributed Bragg reflector, or a light block layer such as a light absorbing layer.

Figure 41A:
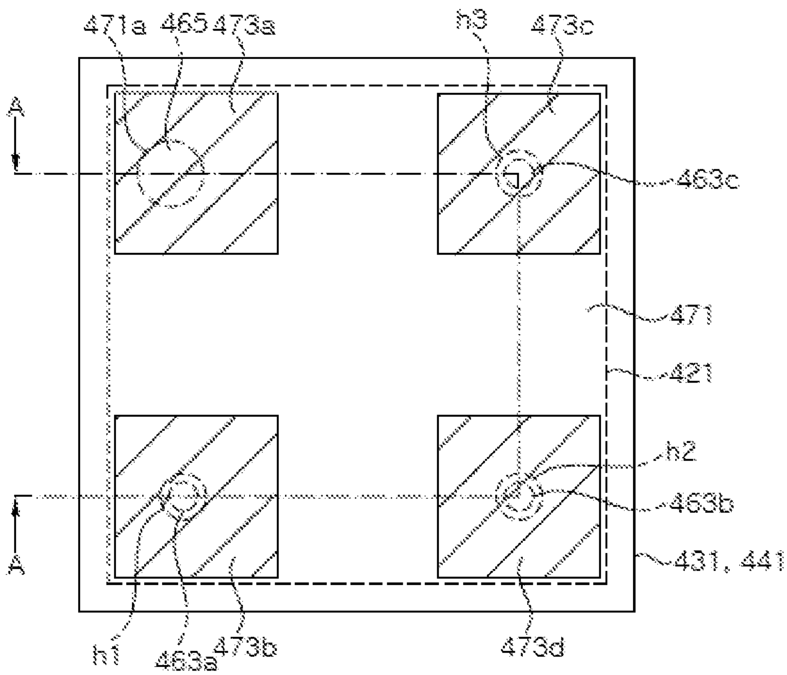
Figure 41B:
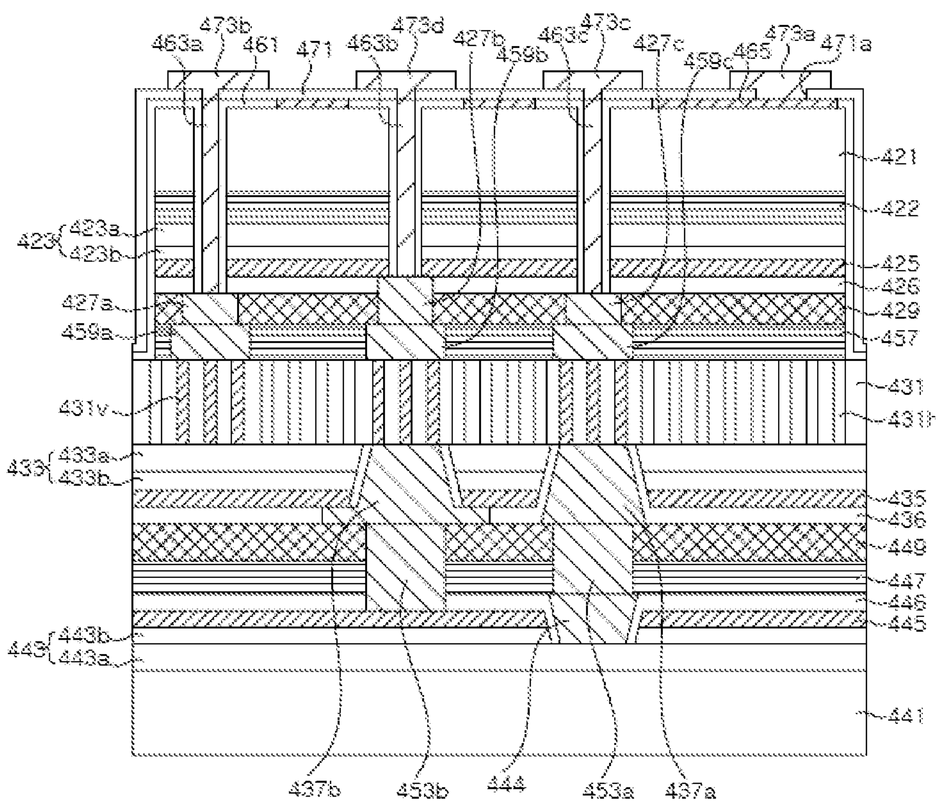

Referring to FIGS. 41A and 41B, electrode pads 473*a*, 473*b*, 473*c*, and 473*d* may be formed on the upper insulating layer 471. The electrode pads 473*a*, 473*b*, 473*c*, and 473*d* may include first to third electrode pads 473*a*, 473*b*, and 473*c* and a common electrode pad 473*d*.

The first electrode pad 473*a* may be connected to a portion of the ohmic electrode 465, which is exposed through the opening 471*a* of the upper insulating layer 471, the second electrode pad 473*b* may be connected to the second through-via 463*a*, and the third electrode pad 473*c* may be connected to the second through-via 463*c*. The common electrode pad 473*d* may be connected to the second through-vias 463*b*.

The electrode pads 473*a*, 473*b*, 473*c*, and 473*d* may be electrically separated from each other, and thus, each of the first to third LED stacks 423, 433, and 443 may be electrically connected to two electrode pads and may be independently driven.

Then, the second substrate 431 and the third substrate 441 may be divided in units of light emitting device regions to provide the light emitting device 400. As shown in FIG. 41A, the electrode pads 473*a*, 473*b*, 473*c*, and 473*d* may be disposed at four edges of the light emitting device 400. The electrode pads 473*a*, 473*b*, 473*c*, and 473*d* may have substantially a rectangular shape, but are not limited thereto.

The light emitting device 400 according to exemplary embodiments may include the first to third LED stacks 423, 433, and 443 to emit red, green, and blue light and, thus, may be used as one pixel in a display apparatus. As described with reference to FIG. 29, the plurality of light emitting devices 400 may be arranged on the circuit board 401 to provide a display apparatus. The light emitting devices 400 include the first to third LED stacks 423, 433, and 443 and, thus, an area of a sub pixel may be increased in one pixel. In addition, mounting one light emitting device may essentially obviate the need of mounting the first to third LED stacks 423, 433, and 443 individually, thereby reducing the number of mounting processes.

As described with reference to FIG. 29, light emitting devices mounted on the circuit board 401 may be driven in a passive matrix manner or an active matrix manner.

Figure 42:
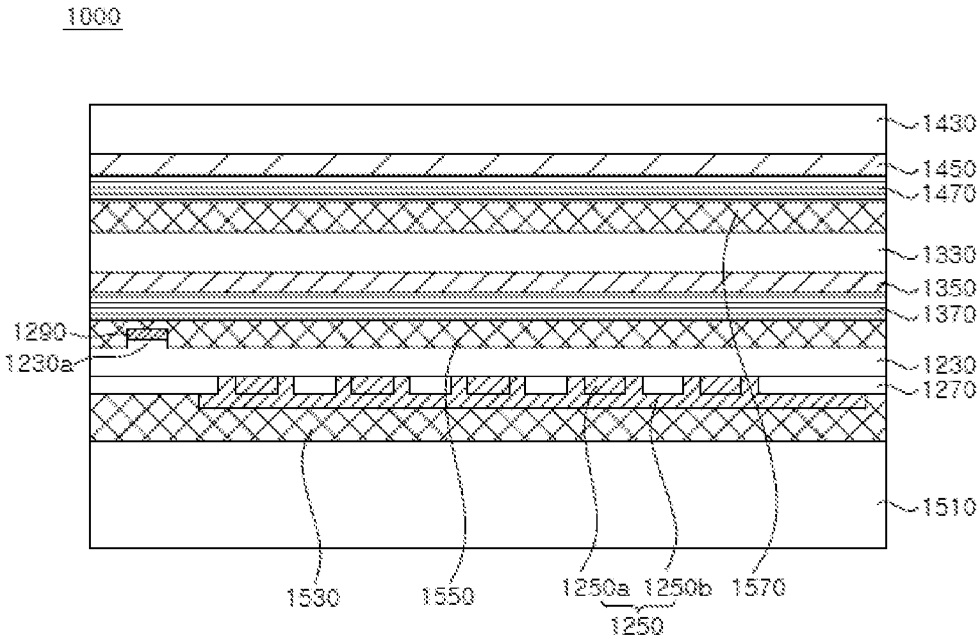
FIG. 42 is a schematic cross-sectional view of a light emitting diode stack for a display according to an exemplary embodiment.

FIG. 42 is a schematic cross-sectional view of a light emitting diode stack for a display according to an exemplary embodiment.

Referring to FIG. 42, the light emitting diode stack 1000 includes a support substrate 1510, a first LED stack 1230, a second LED stack 1330, a third LED stack 1430, a reflective electrode 1250, an ohmic electrode 1290, a second-p transparent electrode 1350, a third-p transparent electrode 1450, an insulation layer 1270, a first color filter 1370, a second color filter 1470, a first bonding layer 1530, a second bonding layer 1550, and a third bonding layer 1570. In addition, the first LED stack 1230 may include an ohmic contact portion 1230*a* for ohmic contact.

The support substrate 1510 supports the LED stacks 1230, 1330, and 1430. The support substrate 1510 may include a circuit on a surface thereof or therein, but the inventive concepts are not limited thereto. The support substrate 1510 may include, for example, a Si substrate or a Ge substrate.

Each of the first LED stack 1230, the second LED stack 1330, and the third LED stack 1430 includes an n-type semiconductor layer, a p-type semiconductor layer, and an active layer interposed therebetween. The active layer may have a multi-quantum well structure.

For example, the first LED stack 1230 may be an inorganic light emitting diode configured to emit red light, the second LED stack 1330 may be an inorganic light emitting diode configured to emit green light, and the third LED stack 1430 may be an inorganic light emitting diode configured to emit blue light. The first LED stack 1230 may include a GaInP-based well layer, and each of the second LED stack 1330 and the third LED stack 1430 may include a GaInN-based well layer.

In addition, both surfaces of each of the first to third LED stacks 1230, 1330, 1430 are an n-type semiconductor layer and a p-type semiconductor layer, respectively. In the illustrated exemplary embodiment, each of the first to third LED stacks 1230, 1330, and 1430 has an n-type upper surface and a p-type lower surface. Since the third LED stack 1430 has an n-type upper surface, a roughened surface may be formed on the upper surface of the third LED stack 1430 through chemical etching. However, the inventive concepts are not limited thereto, and the semiconductor types of the upper and lower surfaces of each of the LED stacks can be alternatively arranged.

The first LED stack 1230 is disposed near the support substrate 1510, the second LED stack 1330 is disposed on the first LED stack 1230, and the third LED stack 1430 is disposed on the second LED stack 1330. Since the first LED stack 1230 emits light having a longer wavelength than the second and third LED stacks 1330 and 1430, light generated from the first LED stack 1230 can be emitted outside through the second and third LED stacks 1330 and 1430. In addition, since the second LED stack 1330 emits light having a longer wavelength than the third LED stack 1430, light generated from the second LED stack 1330 can be emitted outside through the third LED stack 1430.

The reflective electrode 1250 forms ohmic contact with the p-type semiconductor layer of the first LED stack 1230, and reflects light generated from the first LED stack 1230. For example, the reflective electrode 1250 may include an ohmic contact layer 1250*a* and a reflective layer 1250*b*.

The ohmic contact layer 1250*a* partially contacts the p-type semiconductor layer of the first LED stack 1230. In order to prevent absorption of light by the ohmic contact layer 1250*a*, a region in which the ohmic contact layer 1250*a* contacts the p-type semiconductor layer may not exceed 50% of the total area of the p-type semiconductor layer. The reflective layer 1250*b* covers the ohmic contact layer 1250*a* and the insulation layer 1270. As shown in FIG. 42, the reflective layer 1250*b* may cover substantially the entire ohmic contact layer 1250*a*, without being limited thereto. Alternatively, the reflective layer 1250*b* may cover a portion of the ohmic contact layer 1250*a*.

Since the reflective layer 1250*b* covers the insulation layer 1270, an omnidirectional reflector can be formed by the stacked structure of the first LED stack 1230 having a relatively high index of refraction, and the insulation layer 1270 and the reflective layer 1250*b* having a relatively low index of refraction. The reflective layer 1250*b* may cover 50% or more of the area of the first LED stack 1230, or most of the first LED stack 1230, thereby improving luminous efficacy.

The ohmic contact layer 1250*a* and the reflective layer 1250*b* may be metal layers, which may include Au. The reflective layer 1250*b* may be formed of a metal having relatively high reflectance with respect to light generated from the first LED stack 1230, for example, red light. On the other hand, the reflective layer 1250*b* may be formed of a metal having relatively low reflectance with respect to light generated from the second LED stack 1330 and the third LED stack 1430, for example, green light or blue light, to reduce interference of light having been generated from the second and third LED stacks 1330 and 1430 and traveling toward the support substrate 1510.

The insulation layer 1270 is interposed between the support substrate 1510 and the first LED stack 1230 and has openings that expose the first LED stack 1230. The ohmic contact layer 1250*a* is connected to the first LED stack 1230 in the openings of the insulation layer 1270.

The ohmic electrode 1290 is disposed on the upper surface of the first LED stack 1230. In order to reduce ohmic contact resistance of the ohmic electrode 1290, the ohmic contact portion 1230*a* may protrude from the upper surface of the first LED stack 1230. The ohmic electrode 1290 may be disposed on the ohmic contact portion 1230*a*.

The second-p transparent electrode 1350 forms ohmic contact with the p-type semiconductor layer of the second LED stack 1330. The second-p transparent electrode 1350 may include a metal layer or a conducive oxide layer that is transparent to red light and green light.

The third-p transparent electrode 1450 forms ohmic contact with the p-type semiconductor layer of the third LED stack 1430. The third-p transparent electrode 1450 may include a metal layer or a conducive oxide layer that is transparent to red light, green light, and blue light.

The reflective electrode 1250, the second-p transparent electrode 1350, and the third-p transparent electrode 1450 may assist in current spreading through ohmic contact with the p-type semiconductor layer of corresponding LED stack.

The first color filter 1370 may be interposed between the first LED stack 1230 and the second LED stack 1330. The second color filter 1470 may be interposed between the second LED stack 1330 and the third LED stack 1430. The first color filter 1370 transmits light generated from the first LED stack 1230 while reflecting light generated from the second LED stack 1330. The second color filter 1470 transmits light generated from the first and second LED stacks 1230 and 1330, while reflecting light generated from the third LED stack 1430. As such, light generated from the first LED stack 1230 can be emitted outside through the second LED stack 1330 and the third LED stack 1430, and light generated from the second LED stack 1330 can be emitted outside through the third LED stack 1430. Further, light generated from the second LED stack 1330 may be prevented from entering the first LED stack 1230, and light generated from the third LED stack 1430 may be prevented from entering the second LED stack 1330, thereby preventing light loss.

In some exemplary embodiments, the first color filter 1370 may reflect light generated from the third LED stack 1430.

The first and second color filters 1370 and 1470 may be, for example, a low pass filter that transmits light in a low frequency band, that is, in a long wavelength band, a band pass filter that transmits light in a predetermined wavelength band, or a band stop filter that prevents light in a predetermined wavelength band from passing therethrough. In particular, each of the first and second color filters 1370 and 1470 may include a distributed Bragg reflector (DBR). The distributed Bragg reflector may be formed by alternately stacking insulation layers having different indices of refraction one above another, for example, $TiO_2$ and $SiO_2$. In addition, the stop band of the distributed Bragg reflector can be controlled by adjusting the thicknesses of $TiO_2$ and $SiO_2$ layers. The low pass filter and the band pass filter may also be formed by alternately stacking insulation layers having different indices of refraction one above another.

The first bonding layer 1530 couples the first LED stack 1230 to the support substrate 1510. As shown in FIG. 42, the reflective electrode 1250 may adjoin the first bonding layer 1530. The first bonding layer 1530 may be a light transmissive or opaque layer.

The second bonding layer 1550 couples the second LED stack 1330 to the first LED stack 1230. As shown in FIG. 42, the second bonding layer 1550 may adjoin the first LED stack 1230 and the first color filter 1370. The ohmic electrode 1290 may be covered by the second bonding layer 1550. The second bonding layer 1550 transmits light generated from the first LED stack 1230. The second bonding layer 1550 may be formed of, for example, light transmissive spin-on-glass.

The third bonding layer 1570 couples the third LED stack 1430 to the second LED stack 1330. As shown in FIG. 42, the third bonding layer 1570 may adjoin the second LED stack 1330 and the second color filter 1470. However, the inventive concepts are not limited thereto. For example, a transparent conductive layer may be disposed on the second LED stack 1330. The third bonding layer 1570 transmits light generated from the first LED stack 1230 and the second LED stack 1330. The third bonding layer 1570 may be formed of, for example, light transmissive spin-on-glass.

FIGS. 43A, 43B, 43C, 43D, and 43E are schematic cross-sectional views illustrating a method of manufacturing a light emitting diode stack for a display according to an exemplary embodiment.

Figure 43A:
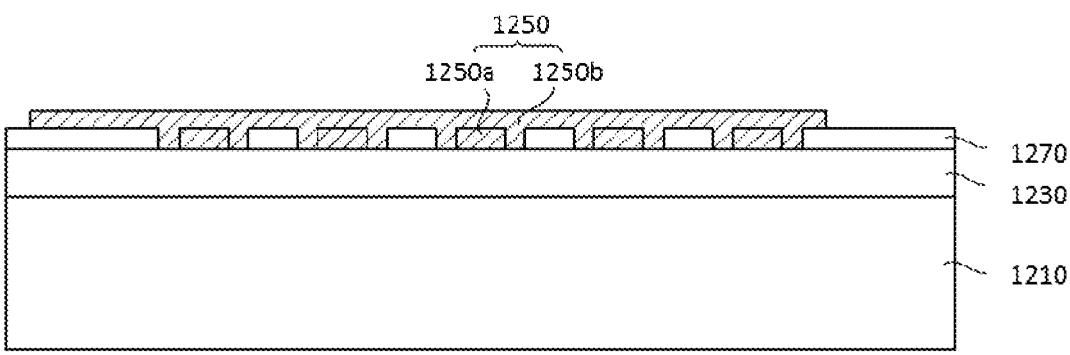
FIGS. 43A, 43B, 43C, 43D, and 43E are schematic cross-sectional views illustrating a method of manufacturing a light emitting diode stack for a display according to an exemplary embodiment.
Figure 43B:
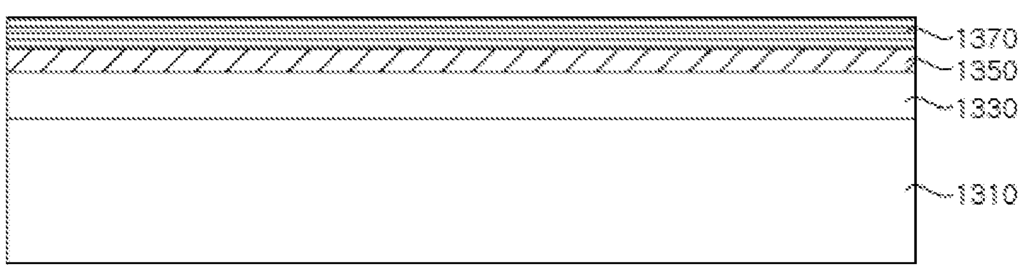
Figure 43C:
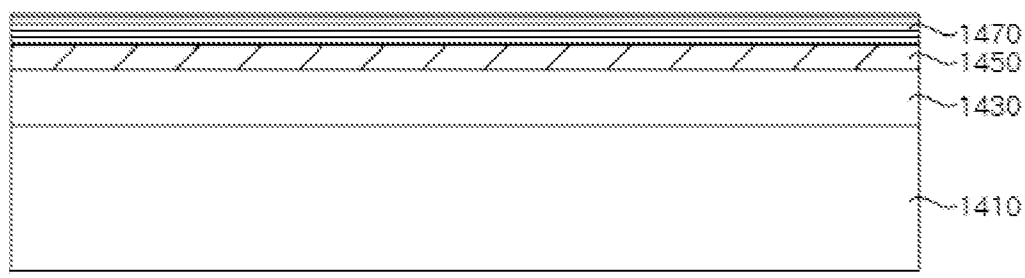
Figure 43D:
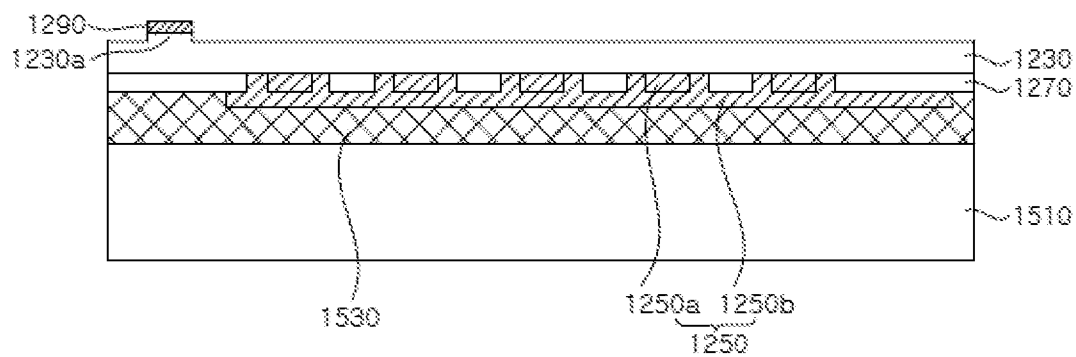

Referring to FIGS. 43A and 43D, a first LED stack 1230 is grown on a first substrate 1210. The first substrate 1210 may be, for example, a GaAs substrate. The first LED stack 1230 may be formed of AlGaInP-based semiconductor layers and includes an n-type semiconductor layer, an active layer, and a p-type semiconductor layer.

An insulation layer 1270 is formed on the first LED stack 1230, and is patterned to form opening(s). For example, a $SiO_2$ layer is formed on the first LED stack 1230 and a photoresist is deposited onto the $SiO_2$ layer, followed by photolithography and development to form a photoresist pattern. Then, the $SiO_2$ layer is patterned through the photoresist pattern used as an etching mask, thereby forming the insulation layer 1270.

Then, an ohmic contact layer 1250*a* is formed in the opening(s) of the insulation layer 1270. The ohmic contact layer 1250*a* may be formed by a lift-off process or the like.

After the ohmic contact layer 1250*a* is formed, a reflective layer 1250*b* is formed to cover the ohmic contact layer 1250*a* and the insulation layer 1270. The reflective layer 1250*b* may be formed by a lift-off process or the like. The reflective layer 1250*b* may cover a portion of the ohmic contact layer 1250*a* or the entirety thereof, as shown in FIG. 43A. The ohmic contact layer 1250*a* and the reflective layer 1250*b* form a reflective electrode 1250.

The reflective electrode 1250 forms ohmic contact with the p-type semiconductor layer of the first LED stack 1230, and thus, will hereinafter be referred to as a first-p reflective electrode 1250.

Referring to FIG. 43B, a second LED stack 1330 is grown on a second substrate 1310, and a second-p transparent electrode 1350 and a first color filter 1370 are formed on the second LED stack 1330. The second LED stack 1330 may be formed of GaN-based semiconductor layers and include a GaInN well layer. The second substrate 1310 is a substrate on which GaN-based semiconductor layers may be grown thereon, and is different from the first substrate 1210. The composition ratio of GaInN for the second LED stack 1330 may be determined such that the second LED stack 1330 emits green light. The second-p transparent electrode 1350 forms ohmic contact with the p-type semiconductor layer of the second LED stack 1330.

Referring to FIG. 43C, a third LED stack 1430 is grown on a third substrate 1410, and a third-p transparent electrode 1450 and a second color filter 1470 are formed on the third LED stack 1430. The third LED stack 1430 may be formed of GaN-based semiconductor layers and include a GaInN well layer. The third substrate 1410 is a substrate on which GaN-based semiconductor layers may be grown thereon, and is different from the first substrate 1210. The composition ratio of GaInN for the third LED stack 1430 may be determined such that the third LED stack 1430 emits blue light. The third-p transparent electrode 1450 forms ohmic contact with the p-type semiconductor layer of the third LED stack 1430.

The first color filter 1370 and the second color filter 1470 are substantially the same as those described with reference to FIG. 42, and thus, repeated descriptions thereof will be omitted to avoid redundancy.

As such, the first LED stack 1230, the second LED stack 1330 and the third LED stack 1430 may be grown on different substrates, and the formation sequence thereof is not limited to a particular sequence.

Referring to FIG. 43D, the first LED stack 1230 is coupled to the support substrate 1510 via a first bonding layer 1530. The first bonding layer 1530 may be previously formed on the support substrate 1510, and the reflective electrode 1250 may be bonded to the first bonding layer 1530 to face the support substrate 1510. The first substrate 1210 is removed from the first LED stack 1230 by chemical etching or the like. Accordingly, the upper surface of the n-type semiconductor layer of the first LED stack 1230 is exposed.

Then, an ohmic electrode 1290 is formed in the exposed region of the first LED stack 1230. In order to reduce ohmic contact resistance of the ohmic electrode 1290, the ohmic electrode 1290 may be subjected to heat treatment. The ohmic electrode 1290 may be formed in each pixel region so as to correspond to the pixel regions.

Figure 43E:
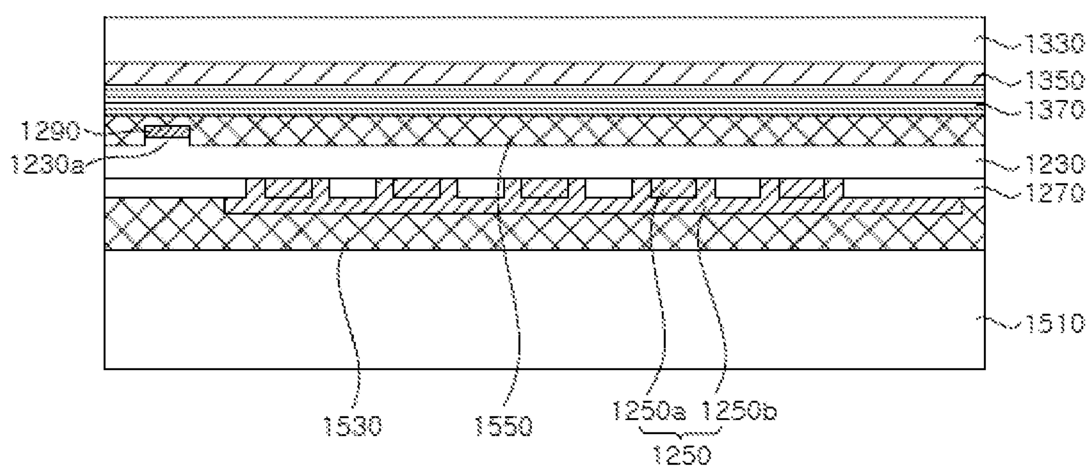

Referring to FIG. 43E, the second LED stack 1330 is coupled to the first LED stack 1230, on which the ohmic electrode 1290 is formed, via a second bonding layer 1550. The first color filter 1370 is bonded to the second bonding layer 1550 to face the first LED stack 1230. The second bonding layer 1550 may be previously formed on the first LED stack 1230 so that the first color filter 1370 may face and be bonded to the second bonding layer 1550. The second substrate 31 may be separated from the second LED stack 1330 by a laser lift-off or chemical lift-off process.

Then, referring to FIG. 42 and FIG. 43C, the third LED stack 1430 is coupled to the second LED stack 1330 via a third bonding layer 1570. The second color filter 1470 is bonded to the third bonding layer 1570 to face the second LED stack 1330. The third bonding layer 1570 may be previously disposed on the second LED stack 1330 so that the second color filter 1470 may face and be bonded to the third bonding layer 1570. The third substrate 1410 may be separated from the third LED stack 1430 by a laser lift-off or chemical lift-off process. As such a light emitting diode stack for a display may be formed as shown in FIG. 42, which has the n-type semiconductor layer of the third LED stack 1430 exposed to the outside.

A display apparatus according to an exemplary embodiment may be provided by patterning the stack of the first to third LED stacks 1230, 1330, and 1430 on the support substrate 1510 in pixel units, followed by connecting the first to third LED stacks to one another through interconnections. Hereinafter, a display apparatus according to exemplary embodiments will be described.

Figure 44:
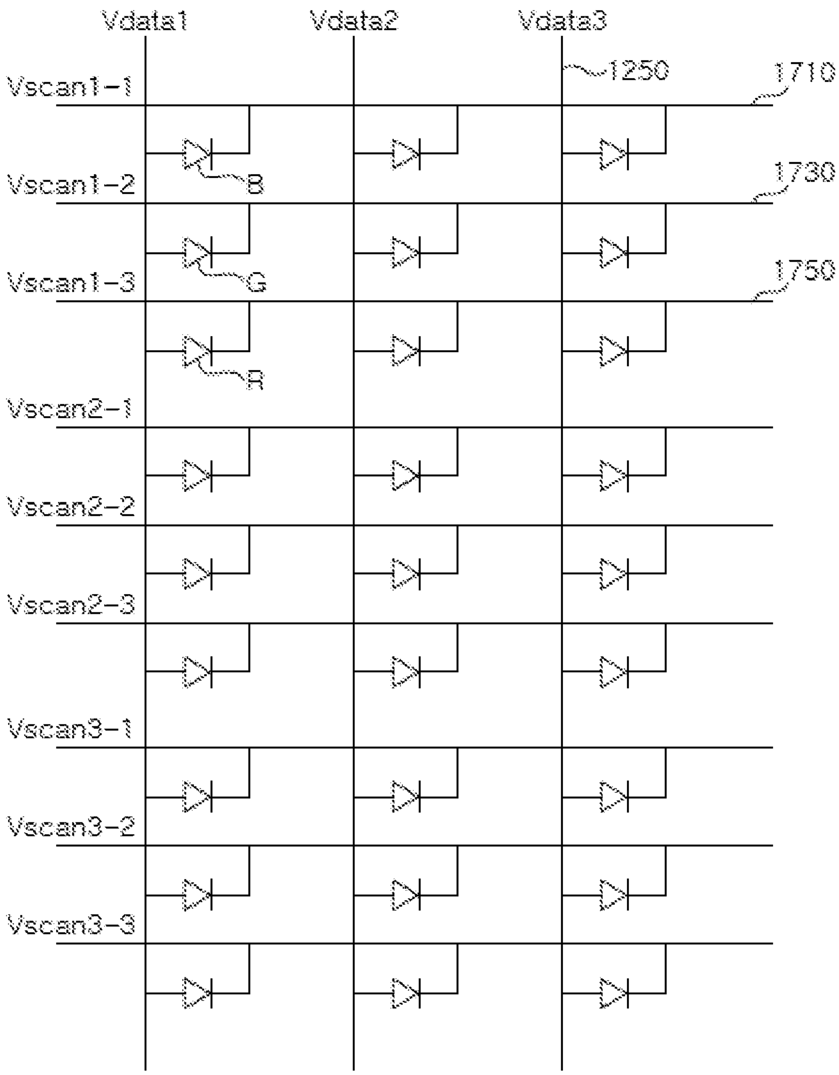
FIG. 44 is a schematic circuit diagram of a display apparatus according to an exemplary embodiment.
Figure 45:
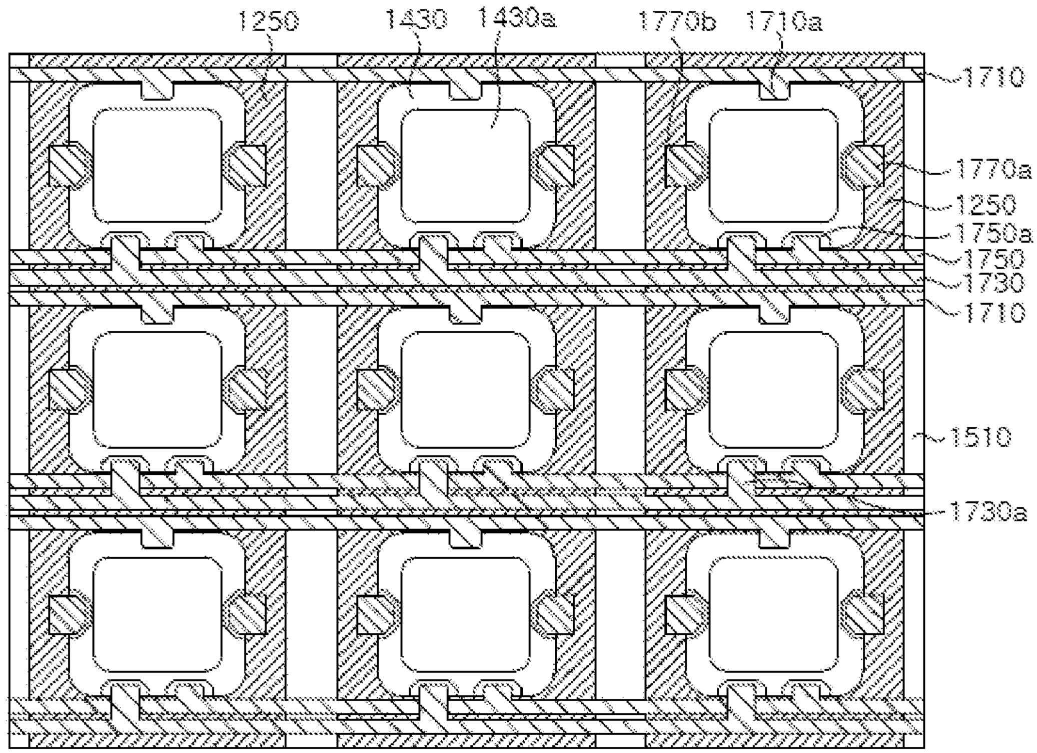
FIG. 45 is a schematic plan view of a display apparatus according to an exemplary embodiment.

FIG. 44 is a schematic circuit diagram of a display apparatus according to an exemplary embodiment, and FIG. 45 is a schematic plan view of the display apparatus according to an exemplary embodiment.

Referring to FIG. 44 and FIG. 45, a display apparatus according to an exemplary embodiment may be operated in a passive matrix manner.

For example, since the light emitting diode stack for a display of FIG. 42 includes the first to third LED stacks 1230, 1330, and 1430 stacked in the vertical direction, one pixel may include three light emitting diodes R, G, and B. A first light emitting diode R may correspond to the first LED stack 1230, a second light emitting diode G may correspond to the second LED stack 1330, and a third light emitting diode B may correspond to the third LED stack 1430.

In FIGS. 42 and 45, one pixel includes the first to third light emitting diodes R, G, and B, each of which corresponds to a subpixel. Anodes of the first to third light emitting diodes R, G, and B are connected to a common line, for example, a data line, and cathodes thereof are connected to different lines, for example, scan lines. More particularly, in a first pixel, the anodes of the first to third light emitting diodes R, G, and B are commonly connected to a data line Vdata1 and the cathodes thereof are connected to scan lines Vscan1-1, Vscan1-2, and Vscan1-3, respectively. As such, the light emitting diodes R, G, and B in each pixel can be driven independently.

In addition, each of the light emitting diodes R, G, and B may be driven by a pulse width modulation or by changing the magnitude of electric current, thereby controlling the brightness of each subpixel.

Referring to FIG. 45, a plurality of pixels is formed by patterning the light emitting diode stack 1000 of FIG. 42, and each of the pixels is connected to the reflective electrodes 1250 and interconnection lines 1710, 1730, and 1750. As shown in FIG. 44, the reflective electrode 1250 may be used as the data line Vdata and the interconnection lines 1710, 1730, and 1750 may be formed as the scan lines.

The pixels may be arranged in a matrix form, in which the anodes of the light emitting diodes R, G, and B of each pixel are commonly connected to the reflective electrode 1250, and the cathodes thereof are connected to the interconnection lines 1710, 1730, and 1750 separated from one another. Here, the interconnection lines 1710, 1730, and 1750 may be used as the scan lines Vscan.

Figure 46:
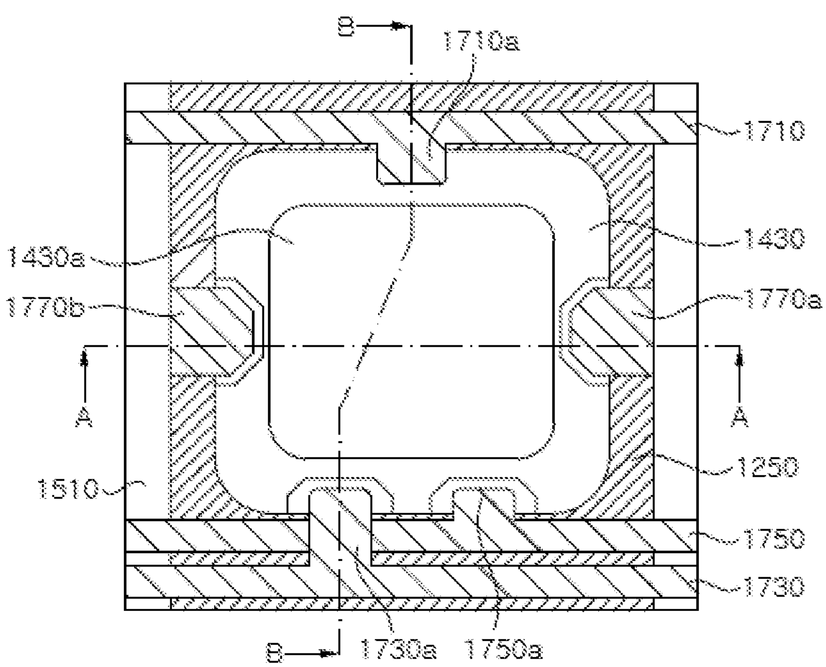
FIG. 46 is an enlarged plan view of one pixel of the display apparatus of FIG. 45.
Figure 47:
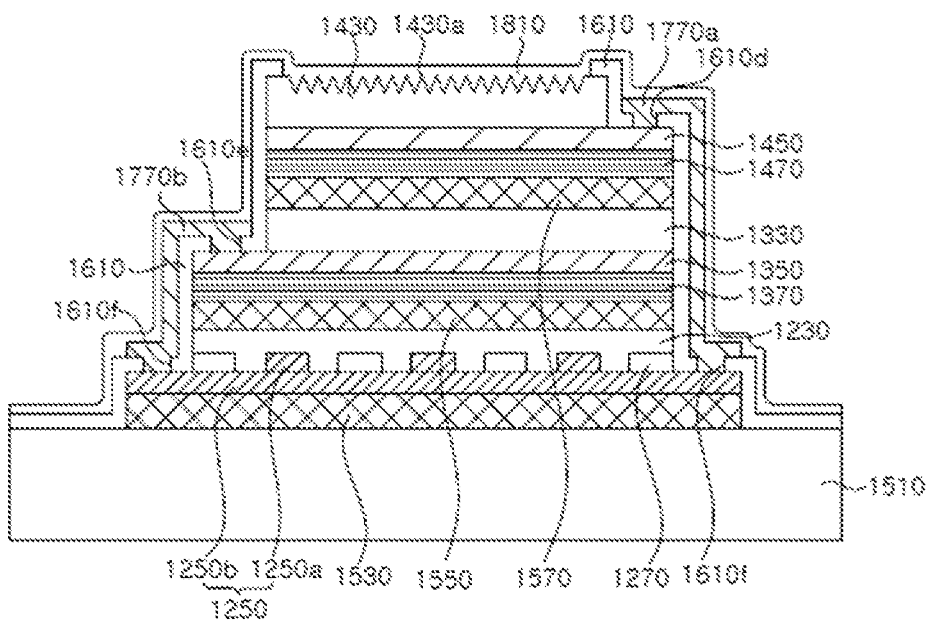
FIG. 47 is a schematic cross-sectional view taken along line A-A of FIG. 46.
Figure 48:
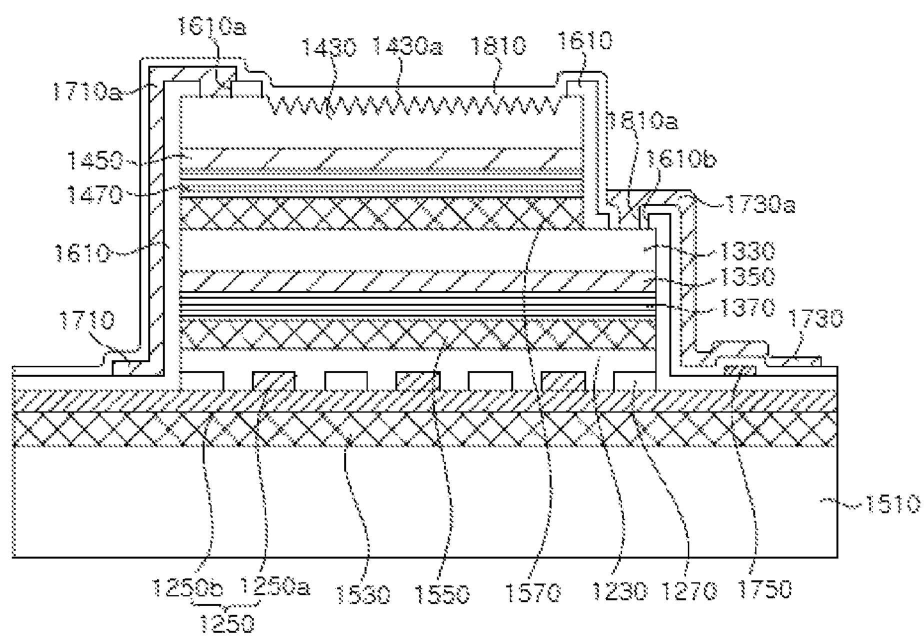
FIG. 48 is a schematic cross-sectional view taken along line B-B of FIG. 46.

FIG. 46 is an enlarged plan view of one pixel of the display apparatus of FIG. 45, FIG. 47 is a schematic cross-sectional view taken along line A-A of FIG. 46, and FIG. 48 is a schematic cross-sectional view taken along line B-B of FIG. 46.

Referring to FIG. 45, FIG. 46, FIG. 47, and FIG. 48, in each pixel, a portion of the reflective electrode 1250, the ohmic electrode 1290 formed on the upper surface of the first LED stack 1230 (see FIG. 49H), a portion of the second-p transparent electrode 1350 (see also FIG. 49H), a portion of the upper surface of the second LED stack 1330 (see FIG. 49J), a portion of the third-p transparent electrode 1450 (see FIG. 49H), and the upper surface of the third LED stack 1430 are exposed to the outside.

The third LED stack 1430 may have a roughened surface 1430*a* on the upper surface thereof. The roughened surface 1430*a* may be formed over the entirety of the upper surface of the third LED stack 1430 or may be formed in some regions thereof, as shown in FIG. 47.

A lower insulation layer 1610 may cover a side surface of each pixel. The lower insulation layer 1610 may be formed of a light transmissive material, such as $SiO_2$. In this case, the lower insulation layer 1610 may cover the entire upper surface of the third LED stack 1430. Alternatively, the lower insulation layer 1610 may include a distributed Bragg reflector to reflect light traveling towards the side surfaces of the first to third LED stacks 1230, 1330, and 1430. In this case, the lower insulation layer 1610 partially exposes the upper surface of the third LED stack 1430.

The lower insulation layer 1610 may include an opening 1610*a* which exposes the upper surface of the third LED stack 1430, an opening 1610*b* which exposes the upper surface of the second LED stack 1330, an opening 1610*c* (see FIG. 49H) which exposes the ohmic electrode 1290 of the first LED stack 1230, an opening 1610*d* which exposes the third-p transparent electrode 1450, an opening 1610*e* which exposes the second-p transparent electrode 1350, and openings 1610*f* which expose the first-p reflective electrode 1250.

The interconnection lines 1710 and 1750 may be formed near the first to third LED stacks 1230, 1330, and 1430 on the support substrate 1510, and may be disposed on the lower insulation layer 1610 to be insulated from the first-p reflective electrode 1250. A connecting portion 1770*a* connects the third-p transparent electrode 1450 to the reflective electrode 1250, and a connecting portion 1770*b* connects the second-p transparent electrode 1350 to the reflective electrode 1250, such that the anodes of the first LED stack 1230, the second LED stack 1330, and the third LED stack 1430 are commonly connected to the reflective electrode 1250.

A connecting portion 1710*a* connects the upper surface of the third LED stack 1430 to the interconnection line 1710, and a connecting portion 1750*a* connects the ohmic electrode 1290 on the first LED stack 1230 to the interconnection line 1750.

An upper insulation layer 1810 may be disposed on the interconnection lines 1710 and 1730 and the lower insulation layer 1610 to cover the upper surface of the third LED stack 1430. The upper insulation layer 1810 may have an opening 1810*a* which partially exposes the upper surface of the second LED stack 1330.

The interconnection line 1730 may be disposed on the upper insulation layer 1810, and the connecting portion 1730*a* may connect the upper surface of the second LED stack 1330 to the interconnection line 1730. The connecting portion 1730*a* may pass through an upper portion of the interconnection line 1750, and is insulated from the interconnection line 1750 by the upper insulation layer 1810.

Although the electrodes of each pixel according to the illustrated exemplary embodiment are described as being connected to the data line and the scan lines, various implementations are possible. In addition, although the interconnection lines 1710 and 1750 are described as being formed on the lower insulation layer 1610, and the interconnection line 1730 is formed on the upper insulation layer 1810, the inventive concepts are not limited thereto. For example, each of the interconnection lines 1710, 1730, and 1750 may be formed on the lower insulation layer 1610, and covered by the upper insulation layer 1810, which may have openings to expose the interconnection line 1730. In this structure, the connecting portion 1730*a* may connect the upper surface of the second LED stack 1330 to the interconnection line 1730 through the openings of the upper insulation layer 1810.

Alternatively, the interconnection lines 1710, 1730, and 1750 may be formed inside the support substrate 1510, and the connecting portions 1710*a*, 1730*a*, and 1750*a* on the lower insulation layer 1610 may connect the ohmic electrode 1290, the upper surface of the second LED stack 1330, and the upper surface of the third LED stack 1430 to the interconnection lines 1710, 1730, and 1750.

FIG. 49A to FIG. 49K are schematic plan views illustrating a method of manufacturing a display apparatus including the pixel of FIG. 46 according to an exemplary embodiment.

First, the light emitting diode stack 1000 described in FIG. 42 is prepared.

Figure 49A:
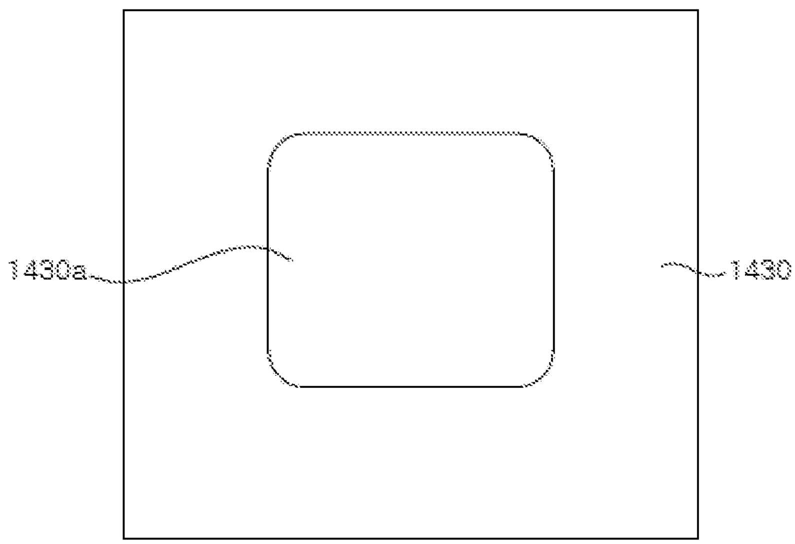
FIGS. 49A, 49B, 49C, 49D, 49E, 49F, 49G, 49H, 49I, 49J, and 49K are schematic plan views illustrating a method of manufacturing a display apparatus according to an exemplary embodiment.

Then, referring to FIG. 49A, a roughened surface 1430*a* may be formed on the upper surface of the third LED stack 1430. The roughened surface 1430*a* may be formed on the upper surface of the third LED stack 1430 so as to correspond to each pixel region. The roughened surface 1430*a* may be formed by chemical etching, for example, photo-enhanced chemical etching (PEC) or the like.

The roughened surface 1430*a* may be partially formed in each pixel region by taking into account a region of the third LED stack 1430 to be etched in the subsequent process, without being limited thereto. Alternatively, the roughened surface 1430*a* may be formed over the entire upper surface of the third LED stack 1430.

Figure 49B:
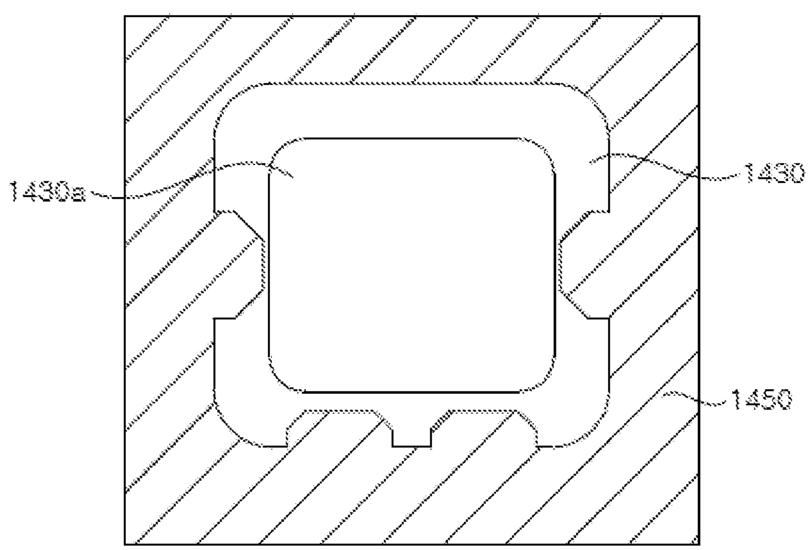

Referring to FIG. 49B, a surrounding region of the third LED stack 1430 in each pixel is removed by etching to expose the third-p transparent electrode 1450. As shown in FIG. 49B, the third LED stack 1430 may be remained to have a rectangular shape or a square shape. The third LED stack 1430 may have a plurality of depressions along edges thereof.

Figure 49C:
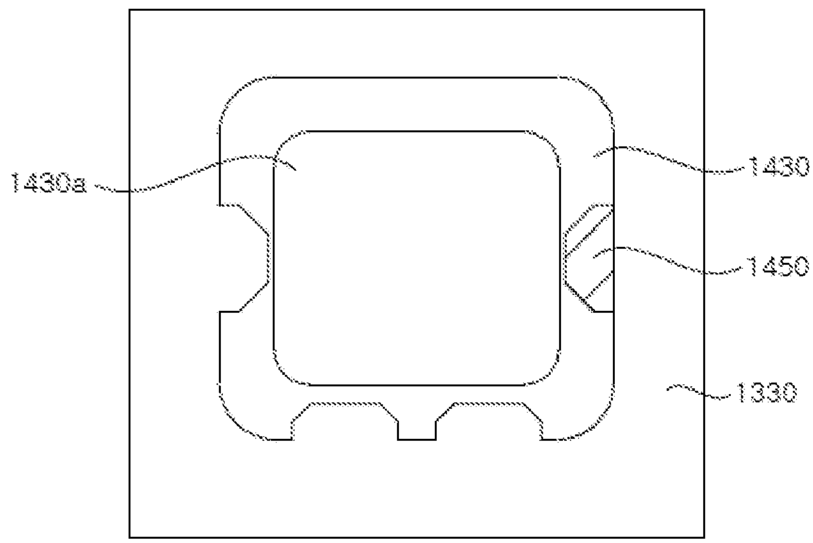

Referring to FIG. 49C, the upper surface of the second LED stack 1330 is exposed by removing the exposed third-p transparent electrode 1450 in areas other than one depression of the third LED stack 1430. Accordingly, the upper surface of the second LED stack 1330 is exposed around the third LED stack 1430 and in other depressions excluding the depression in which the third-p transparent electrode 1450 partially remains.

Figure 49D:
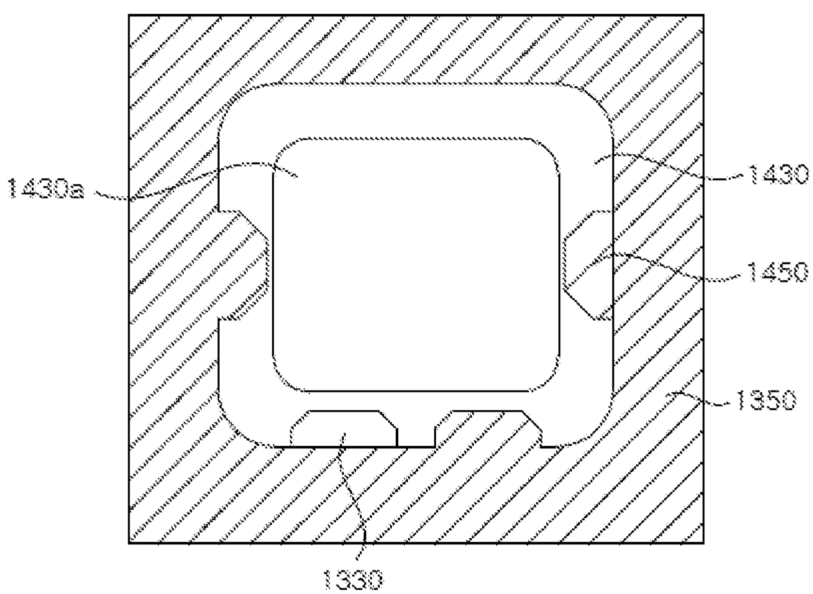

Referring to FIG. 49D, the second-p transparent electrode 1350 is exposed by removing the exposed second LED stack 1330 in areas other than another depression of the third LED stack 1430.

Figure 49E:
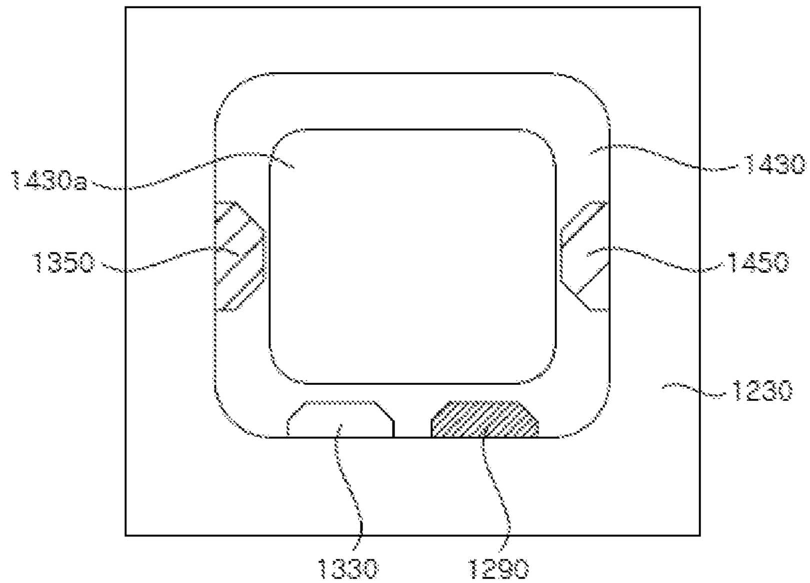

Referring to FIG. 49E, the ohmic electrode 1290 is exposed together with the upper surface of the first LED stack 1230 by removing the exposed second-p transparent electrode 1350 in areas other than still another depression of the third LED stack 1430. In this case, the ohmic electrode 1290 may be exposed in one depression. Accordingly, the upper surface of the first LED stack 1230 is exposed around the third LED stack 1430, and an upper surface of the ohmic electrode 1290 is exposed in at least one of the depressions formed in the third LED stack 1430.

Figure 49F:
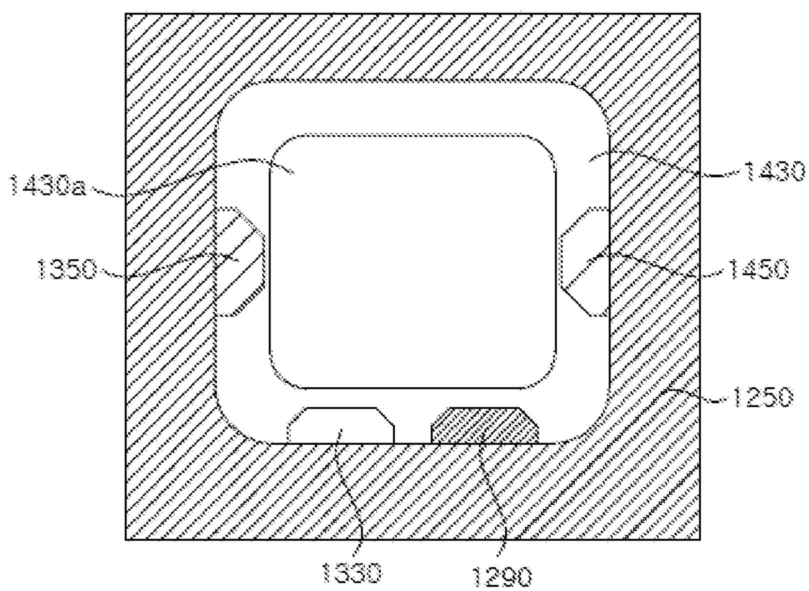

Referring to FIG. 49F, the reflective electrode 1250 is exposed by removing an exposed portion of the first LED stack 1230 other than the ohmic electrode 1290 exposed in one depression. The reflective electrode 1250 is exposed around the third LED stack 1430.

Figure 49G:
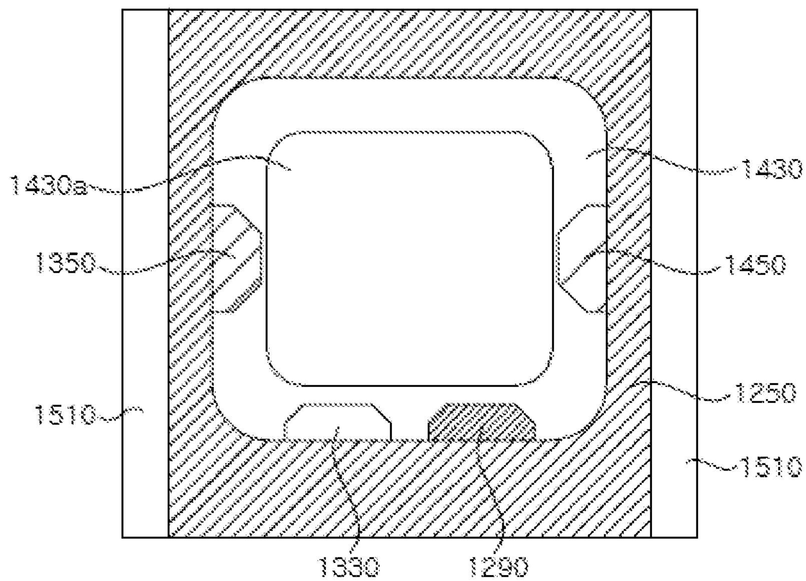

Referring to FIG. 49G, linear interconnection lines are formed by patterning the reflective electrode 1250. Here, the support substrate 1510 may be exposed. The reflective electrode 1250 may connect pixels arranged in one row to each other among pixels arranged in a matrix (see FIG. 45).

Figure 49H:
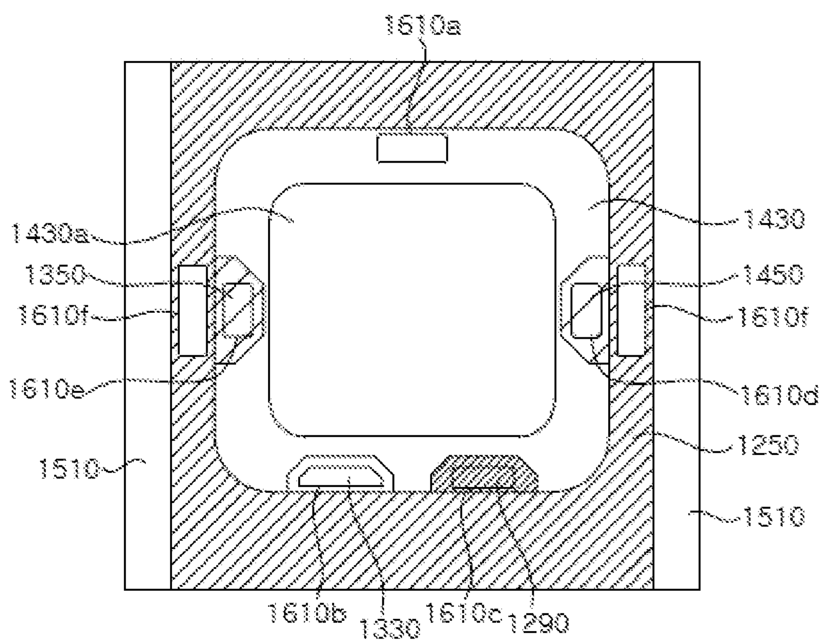

Referring to FIG. 49H, a lower insulation layer 1610 (see FIG. 47 and FIG. 48) is formed to cover the pixels. The lower insulation layer 1610 covers the reflective electrode 1250 and side surfaces of the first to third LED stacks 1230, 1330, and 1430. In addition, the lower insulation layer 1610 may at least partially cover the upper surface of the third LED stack 1430. If the lower insulation layer 1610 is a transparent layer such as a $SiO_2$ layer, the lower insulation layer 1610 may cover the entire upper surface of the third LED stack 1430. Alternatively, when the lower insulation layer 1610 includes a distributed Bragg reflector, the lower insulation layer 1610 may at least partially expose the upper surface of the third LED stack 1430 such that light may be emitted to the outside.

The lower insulation layer 1610 may include an opening 1610*a* which exposes the third LED stack 1430, an opening 1610*b* which exposes the second LED stack 1330, an opening 1610*c* which exposes the ohmic electrode 1290, an opening 1610*d* which exposes the third-p transparent electrode 1450, an opening 1610*e* which exposes the second-p transparent electrode 1350, and an opening 1610*f* which exposes the reflective electrode 1250. One or more openings 1610*f* may be formed to expose the reflective electrode 1250.

Figure 49I:
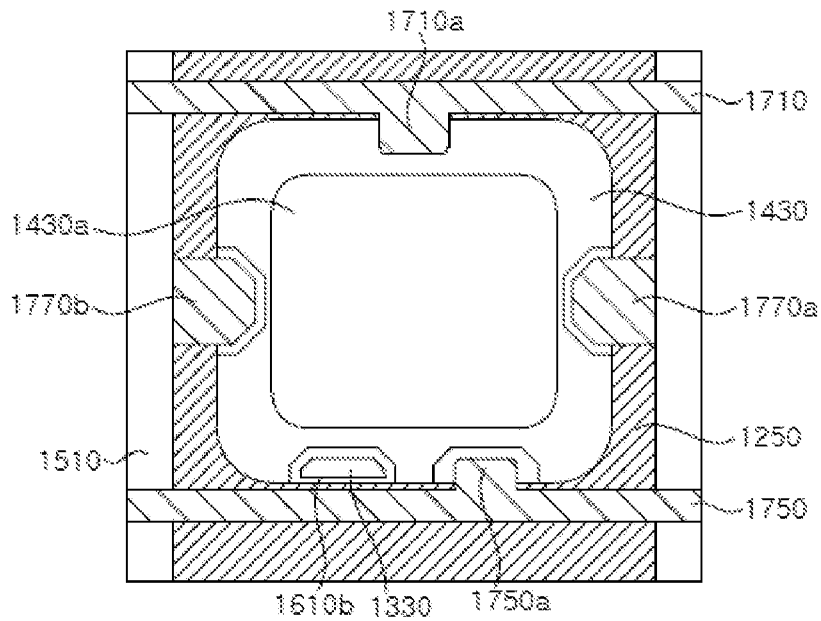

Referring to FIG. 49I, interconnection lines 1710, 1750 and connecting portions 1710*a*, 1750*a*, 1770*a*, and 1770*b* are formed. These may be formed by a lift-off process or the like. The interconnection lines 1710 and 1750 are insulated from the reflective electrode 1250 by the lower insulation layer 1610. The connecting portion 1710*a* electrically connects the third LED stack 1430 to the interconnection line 1710, and the connecting portion 1750*a* electrically connects the ohmic electrode 1290 to the interconnection line 1750 such that the first LED stack 1230 is electrically connected to the interconnection line 1750. The connecting portion 1770*a* electrically connects the third-p transparent electrode 1450 to the first-p reflective electrode 1250, and the connecting portion 1770*b* electrically connects the second-p transparent electrode 1350 to the first-p reflective electrode 1250.

Figure 49J:
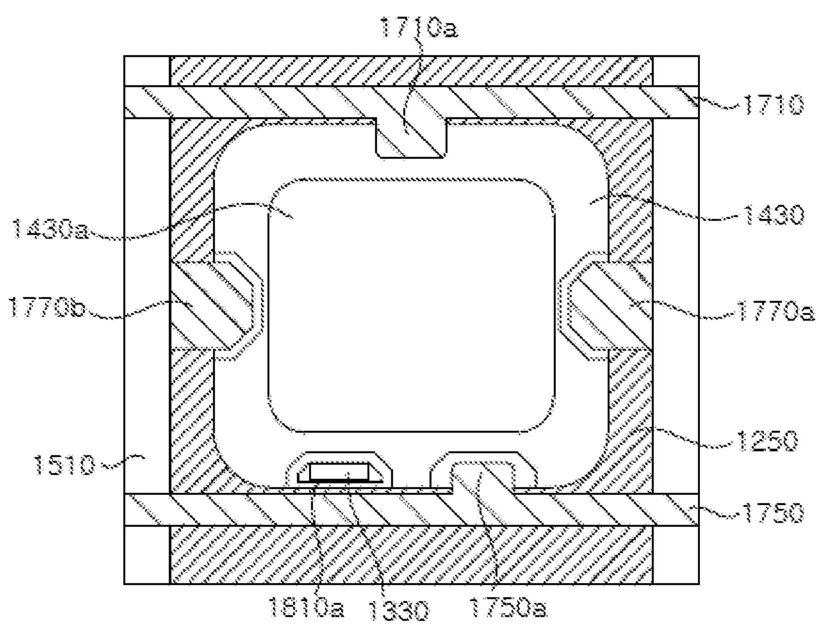

Referring to FIG. 49J, an upper insulation layer 1810 (see FIG. 47 and FIG. 48) covers the interconnection lines 1710 and 1750 and the connecting portions 1710*a*, 1750*a*, 1770*a*, and 1770*b*. The upper insulation layer 1810 may also cover the entire upper surface of the third LED stack 1430. The upper insulation layer 1810 has an opening 1810*a* which exposes the upper surface of the second LED stack 1330. The upper insulation layer 1810 may be formed of, for example, silicon oxide or silicon nitride, and may include a distributed Bragg reflector. When the upper insulation layer 1810 includes the distributed Bragg reflector, the upper insulation layer 1810 may expose at least part of the upper surface of the third LED stack 1430 such that light may be emitted to the outside.

Figure 49K:
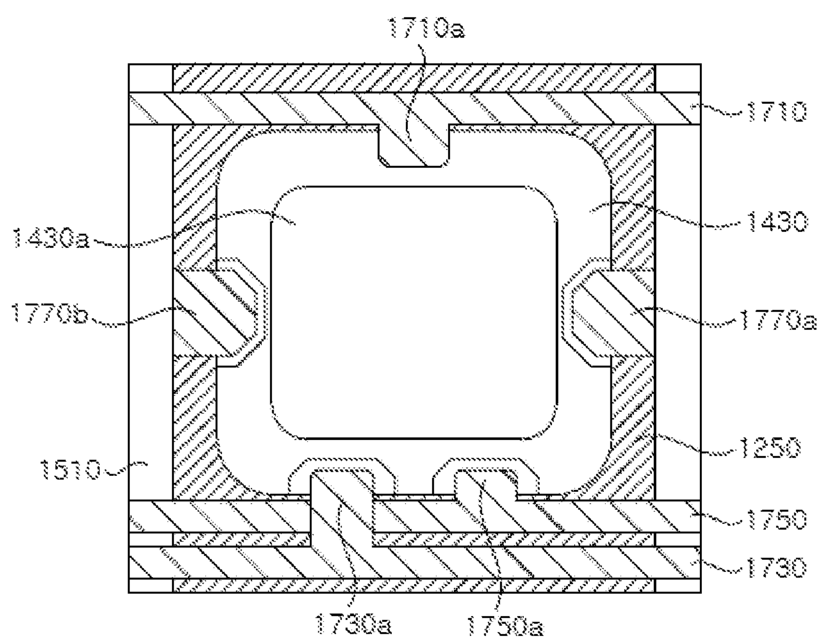

Referring to FIG. 49K, an interconnection line 1730 and a connecting portion 1730*a* are formed. An interconnection line 1750 and a connecting portion 1750*a* may be formed by a lift-off process or the like. The interconnection line 1730 is disposed on the upper insulation layer 1810, and is insulated from the reflective electrode 1250 and the interconnection lines 1710 and 1750. The connecting portion 1730*a* electrically connects the second LED stack 1330 to the interconnection line 1730. The connecting portion 1730*a* may pass through an upper portion of the interconnection line 1750 and is insulated from the interconnection line 1750 by the upper insulation layer 1810.

As such, a pixel region as shown in FIG. 46 may be formed. In addition, as shown in FIG. 45, a plurality of pixels may be formed on the support substrate 1510 and may be connected to one another by the first-p the reflective electrode 1250 and the interconnection lines 1710, 1730, and 1750 to be operated in a passive matrix manner.

Although the display apparatus above has been described as being configured to be operated in the passive matrix manner, the inventive concepts are not limited thereto. More particularly, a display apparatus according to some exemplary embodiments may be manufactured in various ways so as to be operated in the passive matrix manner using the light emitting diode stack shown in FIG. 42.

For example, although the interconnection line 1730 is illustrated as being formed on the upper insulation layer 1810, the interconnection line 1730 may be formed together with the interconnection lines 1710 and 1750 on the lower insulation layer 1610, and the connecting portion 1730*a* may be formed on the upper insulation layer 1810 to connect the second LED stack 1330 to the interconnection line 1730. Alternatively, the interconnection lines 1710, 1730, and 1750 may be disposed inside the support substrate 1510.

Figure 50:
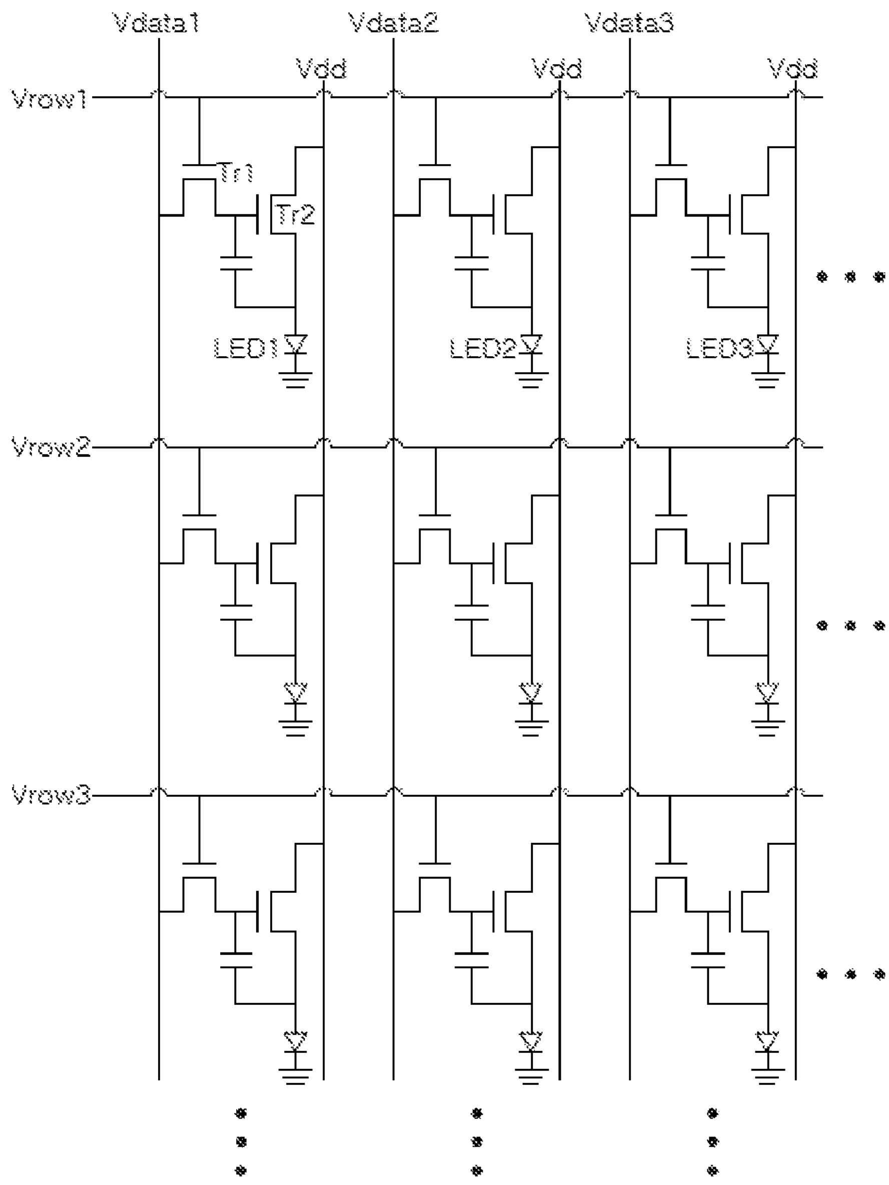
FIG. 50 is a schematic circuit diagram of a display apparatus according to another exemplary embodiment.

FIG. 50 is a schematic circuit diagram of a display apparatus according to another exemplary embodiment. The display apparatus according to the illustrated exemplary embodiment may be driven in an active matrix manner.

Referring to FIG. 50, the drive circuit according to an exemplary embodiment includes at least two transistors Tr1, Tr2 and a capacitor. When a power source is connected to selection lines Vrow1 to Vrow3, and voltage is applied to data lines Vdata1 to Vdata3, the voltage is applied to the corresponding light emitting diode. In addition, the corresponding capacitor is charged according to the values of Vdata1 to Vdata3. Since a turned-on state of a transistor Tr2 can be maintained by the charged voltage of the capacitor, the voltage of the capacitor can be maintained and applied to the light emitting diodes LED1 to LED3 even when power supplied to Vrow1 is cut off. In addition, electric current flowing in the light emitting diodes LED1 to LED3 can be changed depending upon the values of Vdata1 to Vdata3. Electric current can be continuously supplied through Vdd, such that light may be emitted continuously.

The transistors Tr1, Tr2 and the capacitor may be formed inside the support substrate 1510. For example, thin film transistors formed on a silicon substrate may be used for active matrix driving.

The light emitting diodes LED1 to LED3 may correspond to the first to third LED stacks 1230, 1330, and 1430 stacked in one pixel, respectively. The anodes of the first to third LED stacks are connected to the transistor Tr2 and the cathodes thereof are connected to the ground.

Although FIG. 50 shows the circuit for active matrix driving according to an exemplary embodiment, other various types of circuits may be used. In addition, although the anodes of the light emitting diodes LED1 to LED3 are described as being connected to different transistors Tr2, and the cathodes thereof are described as being connected to the ground, the inventive concepts are not limited thereto, and the anodes of the light emitting diodes may be connected to current supplies Vdd and the cathodes thereof may be connected to different transistors.

Figure 51:
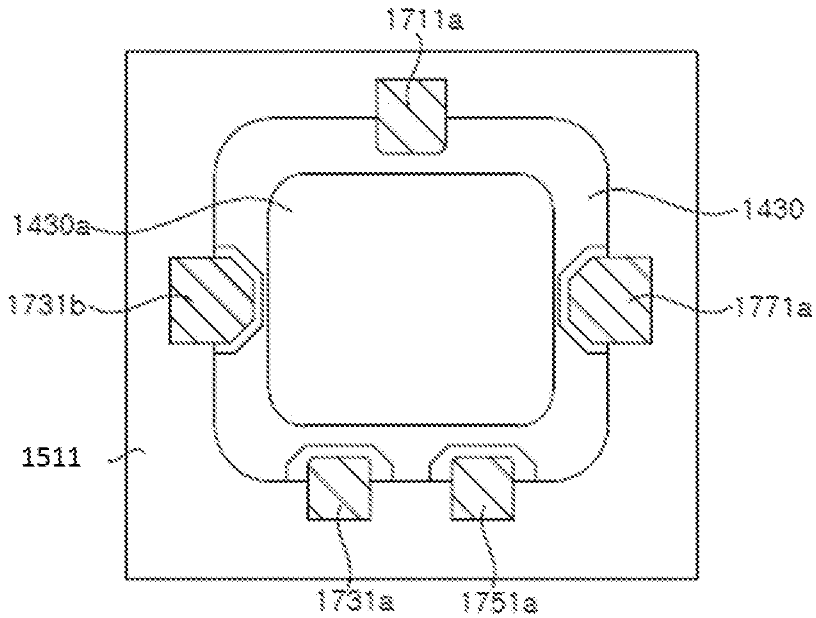
FIG. 51 is a schematic plan view of a display apparatus according to another exemplary embodiment.

FIG. 51 is a schematic plan view of a pixel of a display apparatus according to another exemplary embodiment. The pixel described herein may be one of a plurality of pixels arranged on the support substrate 1511.

Referring to FIG. 51, the pixels according to the illustrated exemplary embodiment are substantially similar to the pixels described with reference to FIG. 45 to FIG. 48, except that the support substrate 1511 is a thin film transistor panel including transistors and capacitors, and the reflective electrode is disposed in a lower region of the first LED stack.

The cathode of the third LED stack is connected to the support substrate 1511 through the connecting portion 1711*a*. For example, as shown in FIG. 51, the cathode of the third LED stack may be connected to the ground through electrical connection to the support substrate 1511. The cathodes of the second LED stack and the first LED stack may also be connected to the ground through electrical connection to the support substrate 1511 via the connecting portions 1731*a* and 1751*a*.

The reflective electrode is connected to the transistors Tr2 (see FIG. 50) inside the support substrate 1511. The third-p transparent electrode and the second-p transparent electrode are also connected to the transistors Tr2 (see FIG. 50) inside the support substrate 1511 through the connecting portions 1771*a* and 1731*b*.

In this manner, the first to third LED stacks are connected to one another, thereby constituting a circuit for active matrix driving, as shown in FIG. 50.

Although FIG. 51 shows electrical connection of a pixel for active matrix driving according to an exemplary embodiment, the inventive concepts are not limited thereto, and the circuit for the display apparatus can be modified into various circuits for active matrix driving in various ways.

In addition, while the reflective electrode 1250, the second-p transparent electrode 1350, and the third-p transparent electrode 1450 of FIG. 42 are described as forming ohmic contact with the corresponding p-type semiconductor layer of each of the first LED stack 1230, the second LED stack 1330, and the third LED stack 1430, and the ohmic electrode 1290 forms ohmic contact with the n-type semiconductor layer of the first LED stack 1230, the n-type semiconductor layer of each of the second LED stack 1330 and the third LED stack 1430 is not provided with a separate ohmic contact layer. When the pixels have a small size of 200 μm or less, there is less difficulty in current spreading even without formation of a separate ohmic contact layer in the n-type semiconductor layer. However, according to some exemplary embodiments, a transparent electrode layer may be disposed on the n-type semiconductor layer of each of the LED stacks in order to secure current spreading.

In addition, although the first to third LED stacks 1230, 1330, and 1430 are coupled to each other via bonding layers 1530, 1550, and 1570, the inventive concepts are not limited thereto, and the first to third LED stacks 1230, 1330, and 1430 may be connected to one another in various sequences and using various structures.

According to exemplary embodiments, since it is possible to form a plurality of pixels at the wafer level using the light emitting diode stack 1000 for a display, individual mounting of light emitting diodes may be obviated. In addition, the light emitting diode stack according to the exemplary embodiments has the structure in which the first to third LED stacks 1230, 1330, and 1430 are stacked in the vertical direction, thereby securing an area for subpixels in a limited pixel area. Furthermore, the light emitting diode stack according to the exemplary embodiments allows light generated from the first LED stack 1230, the second LED stack 1330, and the third LED stack 1430 to be emitted outside therethrough, thereby reducing light loss.

Figure 52:
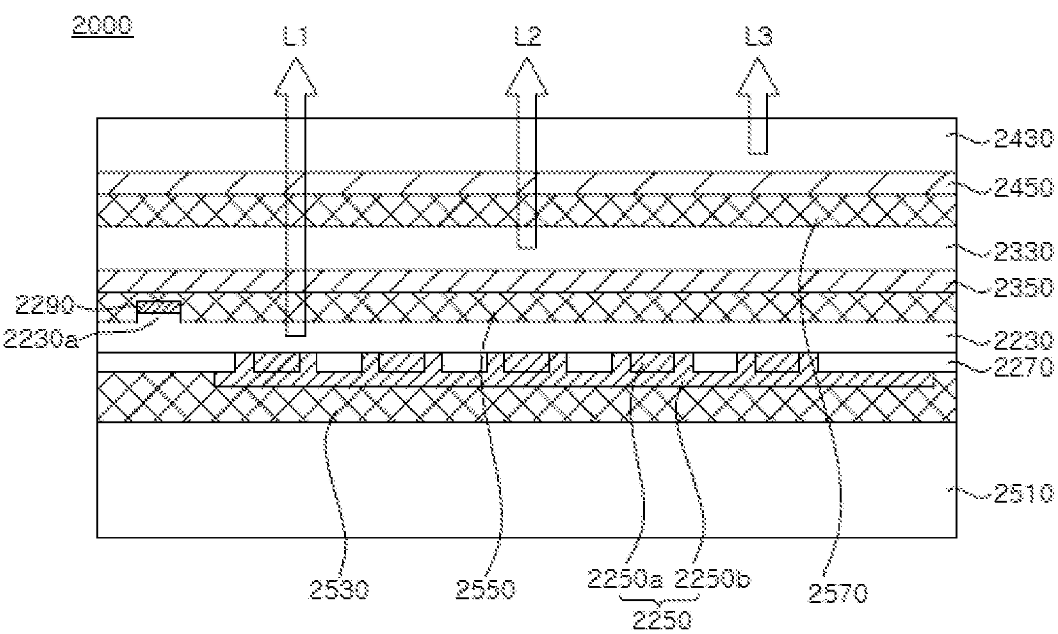
FIG. 52 is a schematic cross-sectional view of a light emitting diode stack for a display according to an exemplary embodiment.

FIG. 52 is a schematic cross-sectional view of a light emitting diode stack for a display according to an exemplary embodiment.

Referring to FIG. 52, the light emitting diode stack 2000 includes a support substrate 2510, a first LED stack 2230, a second LED stack 2330, a third LED stack 2430, a reflective electrode 2250, an ohmic electrode 2290, a second-p transparent electrode 2350, a third-p transparent electrode 2450, an insulation layer 2270, a first bonding layer 2530, a second bonding layer 2550, and a third bonding layer 2570. In addition, the first LED stack 2230 may include an ohmic contact portion 2230*a* for ohmic contact.

In general, light may be generated from the first LED stack by the light emitted from the second LED stack, and light may be generated from the second LED stack by the light emitted from the third LED stack. As such, a color filter may be interposed between the second LED stack and the first LED stack, and between the third LED stack and the second LED stack.

However, while the color filters may prevent interference of light, forming color filters increases manufacturing complexity. A display apparatus according to exemplary embodiments may suppress generation of secondary light between the LED stacks without arrangement of the color filters therebetween.

Accordingly, in some exemplary embodiments, interference of light between the LED stacks can be reduced by controlling the bandgap of each of the LED stacks, which will be described in more detail below.

The support substrate 2510 supports the LED stacks 2230, 2330, and 2430. The support substrate 2510 may include a circuit on a surface thereof or therein, but the inventive concepts are not limited thereto. The support substrate 2510 may include, for example, a Si substrate, a Ge substrate, a sapphire substrate, a patterned sapphire substrate, a glass substrate, or a patterned glass substrate.

Each of the first LED stack 2230, the second LED stack 2330, and the third LED stack 2430 includes an n-type semiconductor layer, a p-type semiconductor layer, and an active layer interposed therebetween. The active layer may have a multi-quantum well structure.

Light L1 generated from the first LED stack 2230 has a longer wavelength than light L2 generated from the second LED stack 2330, which has a longer wavelength than light L3 generated from the third LED stack 2430.

The first LED stack 2230 may be an inorganic light emitting diode configured to emit red light, the second LED stack 2330 may be an inorganic light emitting diode configured to emit green light, and the third LED stack 2430 may be an inorganic light emitting diode configured to emit blue light. The first LED stack 2230 may include a GaInP-based well layer, and each of the second LED stack 2330 and the third LED stack 2430 may include a GaInN-based well layer.

Although the light emitting diode stack 2000 of FIG. 52 is illustrated as including three LED stacks 2230, 2330, and 2430, the inventive concepts are not limited to a particular number of LED stacks one over the other. For example, an LED stack for emitting yellow light may be further added between the first LED stack 2230 and the second LED stack 2330.

Both surfaces of each of the first to third LED stacks 2230, 2330, and 2430 are an n-type semiconductor layer and a p-type semiconductor layer, respectively. In FIG. 52, each of the first to third LED stacks 2230, 2330, and 2430 is described as having an n-type upper surface and a p-type lower surface. Since the third LED stack 2430 has an n-type upper surface, a roughened surface may be formed on the upper surface of the third LED stack 2430 through chemical etching or the like. However, the inventive concepts are not limited thereto, and the semiconductor types of the upper and lower surfaces of each of the LED stacks can be formed alternatively.

The first LED stack 2230 is disposed near the support substrate 2510, the second LED stack 2330 is disposed on the first LED stack 2230, and the third LED stack 2430 is disposed on the second LED stack. Since the first LED stack 2230 emits light having a longer wavelength than the second and third LED stacks 2330 and 2430, light L1 generated from the first LED stack 2230 can be emitted to the outside through the second and third LED stacks 2330 and 2430. In addition, since the second LED stack 2330 emits light having a longer wavelength than the third LED stack 2430, light L2 generated from the second LED stack 2330 can be emitted to the outside through the third LED stack 2430. Light L3 generated in the third LED stack 2430 is directly emitted outside from the third LED stack 2430.

In an exemplary embodiment, the n-type semiconductor layer of the first LED stack 2230 may have a bandgap wider than the bandgap of the active layer of the first LED stack 2230, and narrower than the bandgap of the active layer of the second LED stack 2330. Accordingly, a portion of light generated from the second LED stack 2330 may be absorbed by the n-type semiconductor layer of the first LED stack 2230 before reaching the active layer of the first LED stack 2230. As such, the intensity of light generated in the active layer of the first LED stack 2230 may be reduced by the light generated from the second LED stack 2330.

In addition, the n-type semiconductor layer of the second LED stack 2330 has a bandgap wider than the bandgap of the active layer of each of the first LED stack 2230 and the second LED stack 2330, and narrower than the bandgap of the active layer of the third LED stack 2430. Accordingly, a portion of light generated from the third LED stack 2430 may be absorbed by the n-type semiconductor layer of the second LED stack 2330 before reaching the active layer of the second LED stack 2330. As such, the intensity of light generated in the second LED stack 2330 or the first LED stack 2230 may be reduced by the light generated from the third LED stack 2430.

The p-type semiconductor layer and the n-type semiconductor layer of the third LED stack 2430 has wider bandgaps than the active layers of the first LED stack 2230 and the second LED stack 2330, thereby transmitting light generated from the first and second LED stacks 2230 and 2330 therethrough.

According to an exemplary embodiment, it is possible to reduce interference of light between the LED stacks 2230, 2330, and 2430 by adjusting the bandgaps of the n-type semiconductor layers or the p-type semiconductor layers of the first and second LED stacks 2230 and 2330, which may obviate the need for other components, such as color filters. For example, the intensity of light generated from the second LED stack 2330 and emitted to the outside may be about 10 times or more than the intensity of the light generated from the first LED stack 2230 by the light generated from the second LED stack 2330. Likewise, the intensity of light generated from the third LED stack 2430 and emitted to the outside may be about 10 times or more the intensity of the light generated from the second LED stack 2330 caused by the light generated from the third LED stack 2430. In this case, the intensity of the light generated from the third LED stack 2430 and emitted to the outside may be about 10 times or more the intensity of the light generated from the first LED stack 2230 caused by the light generated from the third LED stack 2430. Accordingly, it is possible to realize a display apparatus free from color contamination caused by interference of light.

The reflective electrode 2250 forms ohmic contact with the p-type semiconductor layer of the first LED stack 2230 and reflects light generated from the first LED stack 2230. For example, the reflective electrode 2250 may include an ohmic contact layer **2250*a* and a reflective layer 2250*b***.

The ohmic contact layer **2250*a* partially contacts the p-type semiconductor layer of the first LED stack 2230. In order to prevent absorption of light by the ohmic contact layer 2250*a*, a region in which the ohmic contact layer 2250*a* contacts the p-type semiconductor layer may not exceed about 50% of the total area of the p-type semiconductor layer. The reflective layer 2250*b* covers the ohmic contact layer 2250*a* and the insulation layer 2270. As shown in FIG. 52, the reflective layer 2250*b* may cover substantially the entire ohmic contact layer 2250*a*, without being limited thereto. Alternatively, the reflective layer 2250*b* may cover a portion of the ohmic contact layer 2250*a***.

Since the reflective layer **2250*b* covers the insulation layer 2270, an omnidirectional reflector can be formed by the stacked structure of the first LED stack 2230 having a relatively high index of refraction and the insulation layer 2270 having a relatively low index of refraction, and the reflective layer 2250*b*. The reflective layer 2250*b* may cover about 50% or more of the area of the first LED stack 2230 or most of the first LED stack 2230**, thereby improving luminous efficacy.

The ohmic contact layer **2250*a* and the reflective layer 2250*b* may be formed of metal layers, which may include Au. The reflective layer 2250*b* may include metal having relatively high reflectance with respect to light generated from the first LED stack 2230, for example, red light. On the other hand, the reflective layer 2250*b* may include metal having relatively low reflectance with respect to light generated from the second LED stack 2330 and the third LED stack 2430, for example, green light or blue light, to reduce interference of light having been generated from the second and third LED stacks 2330, 2430 and traveling toward the support substrate 2510**.

The insulation layer 2270 is interposed between the support substrate 2510 and the first LED stack 2230, and has openings that expose the first LED stack 2230. The ohmic contact layer **2250*a* is connected to the first LED stack 2230 in the openings of the insulation layer 2270**.

The ohmic electrode 2290 is disposed on the upper surface of the first LED stack 2230. In order to reduce ohmic contact resistance of the ohmic electrode 2290, the ohmic contact portion **2230*a* may protrude from the upper surface of the first LED stack 2230. The ohmic electrode 2290 may be disposed on the ohmic contact portion 2230**_a_.

The second-p transparent electrode 2350 forms ohmic contact with the p-type semiconductor layer of the second LED stack 2330. The second-p transparent electrode 2350 may be formed of a metal layer or a conducive oxide layer that is transparent to red light and green light.

The third-p transparent electrode 2450 forms ohmic contact with the p-type semiconductor layer of the third LED stack 2430. The third-p transparent electrode 2450 may be formed of a metal layer or a conducive oxide layer that is transparent to red light, green light, and blue light.

The reflective electrode 2250, the second-p transparent electrode 2350, and the third-p transparent electrode 2450 may assist in current spreading through ohmic contact with the p-type semiconductor layer of corresponding LED stacks.

The first bonding layer 2530 couples the first LED stack 2230 to the support substrate 2510. As shown in FIG. 52, the reflective electrode 2250 may adjoin the first bonding layer 2530. The first bonding layer 2530 may be a light transmissive or opaque layer.

The second bonding layer 2550 couples the second LED stack 2330 to the first LED stack 2230. As shown in FIG. 52, the second bonding layer 2550 may adjoin the first LED stack 2230 and the second-p transparent electrode 2350. The ohmic electrode 2290 may be covered by the second bonding layer 2550. The second bonding layer 2550 transmits light generated from the first LED stack 2230. The second bonding layer 2550 may be formed of a light transmissive bonding material, for example, a light transmissive organic bonding agent or light transmissive spin-on-glass. Examples of the light transmissive organic bonding agent may include SU8, poly(methyl methacrylate) (PMMA), polyimide, Parylene, benzocyclobutene (BCB), and the like. In addition, the second LED stack 2330 may be bonded to the first LED stack 2230 by plasma bonding or the like.

The third bonding layer 2570 couples the third LED stack 2430 to the second LED stack 2330. As shown in FIG. 52, the third bonding layer 2570 may adjoin the second LED stack 2330 and the third-p transparent electrode 2450. However, the inventive concepts are not limited thereto. For example, a transparent conductive layer may be disposed on the second LED stack 2330. The third bonding layer 2570 transmits light generated from the first LED stack 2230 and the second LED stack 2330, and may be formed of, for example, light transmissive spin-on-glass.

Each of the second bonding layer 2550 and the third bonding layer 2570 may transmit light generated from the third LED stack 2430 and light generated from the second LED stack 2330.

FIG. 53A to FIG. 53E are schematic cross-sectional views illustrating a method of manufacturing a light emitting diode stack for a display according to an exemplary embodiment.

Figure 53A:
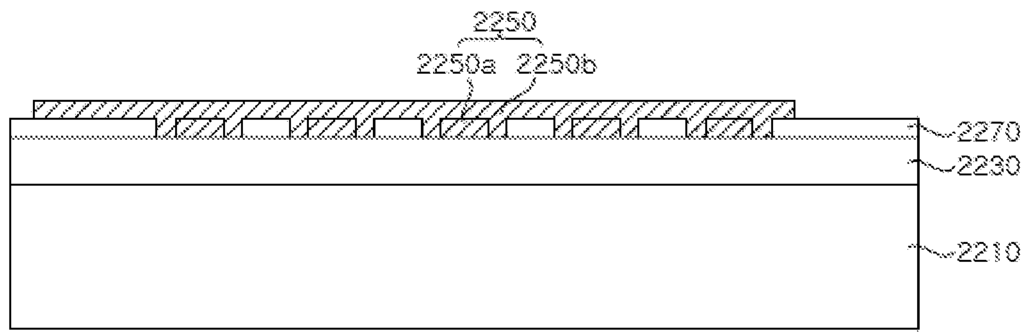
FIGS. 53A, 53B, 53C, 53D, and 53E are schematic cross-sectional views illustrating a method of manufacturing a light emitting diode stack for a display according to an exemplary embodiment.

Referring to FIG. 53A, a first LED stack 2230 is grown on a first substrate 2210. The first substrate 2210 may be, for example, a GaAs substrate. The first LED stack 2230 is formed of AlGaInP-based semiconductor layers, and includes an n-type semiconductor layer, an active layer, and a p-type semiconductor layer. In some exemplary embodiments, the n-type semiconductor layer may have an energy bandgap capable absorbing light generated from the second LED stack 2330, and the p-type semiconductor layer may have an energy bandgap capable absorbing light generated from the second LED stack 2330.

An insulation layer 2270 is formed on the first LED stack 2230 and patterned to form opening(s) therein. For example, a $SiO_2$ layer is formed on the first LED stack 2230, and a photoresist is deposited onto the $SiO_2$ layer, followed by photolithography and development to form a photoresist pattern. Then, the $SiO_2$ layer is patterned through the photoresist pattern used as an etching mask, thereby forming the insulation layer 2270 having the opening(s).

Then, an ohmic contact layer 2250_a_ is formed in the opening(s) of the insulation layer 2270. The ohmic contact layer 2250_a_ may be formed by a lift-off process or the like. After the ohmic contact layer 2250_a_ is formed, a reflective layer 2250_b_ is formed to cover the ohmic contact layer 2250_a_ and the insulation layer 2270. The reflective layer 2250_b_ may be formed by a lift-off process or the like. The reflective layer 2250_b_ may cover a portion of the ohmic contact layer 2250_a_ or the entirety thereof. The ohmic contact layer 2250_a_ and the reflective layer 2250_b_ form a reflective electrode 2250.

The reflective electrode 2250 forms ohmic contact with the p-type semiconductor layer of the first LED stack 2230, and thus, will hereinafter be referred to as a first-p reflective electrode 2250.

Figure 53B:
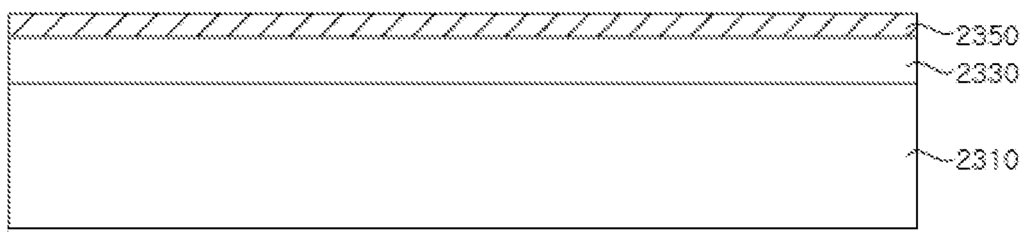

Referring to FIG. 53B, a second LED stack 2330 is grown on a second substrate 2310, and a second-p transparent electrode 2350 is formed on the second LED stack 2330. The second LED stack 2330 may be formed of GaN-based semiconductor layers and may include a GaInN well layer. The second substrate 2310 is a substrate on which GaN-based semiconductor layers may be grown thereon, and is different from the first substrate 2210. The composition ratio of GaInN for the second LED stack 2330 may be determined such that the second LED stack 2330 emits green light. The second-p transparent electrode 2350 forms ohmic contact with the p-type semiconductor layer of the second LED stack 2330. The second LED stack 2330 may include an n-type semiconductor layer, an active layer, and a p-type semiconductor layer. In some exemplary embodiments, the n-type semiconductor layer of the second LED stack 2330 may have an energy bandgap capable of absorbing light generated from the third LED stack 2430, and the p-type semiconductor layer of the second LED stack 2330 may have an energy bandgap capable of absorbing light generated from the third LED stack 2430.

Figure 53C:
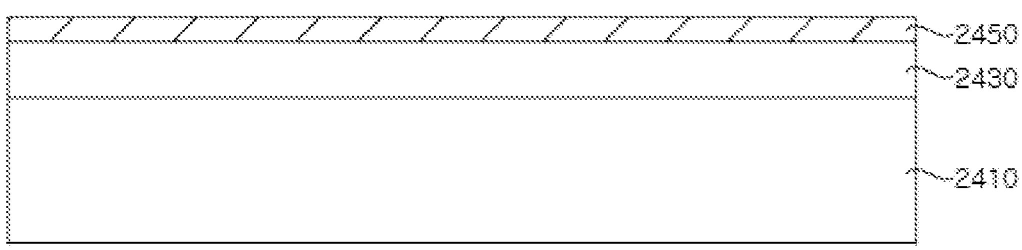

Referring to FIG. 53C, a third LED stack 2430 is grown on a third substrate 2410, and a third-p transparent electrode 2450 is formed on the third LED stack 2430. The third LED stack 2430 may be formed of GaN-based semiconductor layers and may include a GaInN well layer. The third substrate 2410 is a substrate on which GaN-based semiconductor layers may be grown thereon, and is different from the first substrate 2210. The composition ratio of GaInN for the third LED stack 2430 may be determined such that the third LED stack 2430 emits blue light. The third-p transparent electrode 2450 forms ohmic contact with the p-type semiconductor layer of the third LED stack 2430.

As such, the first LED stack 2230, the second LED stack 2330, and the third LED stack 2430 are grown on different substrates, and the formation sequence thereof is not limited to a particular sequence.

Figure 53D:
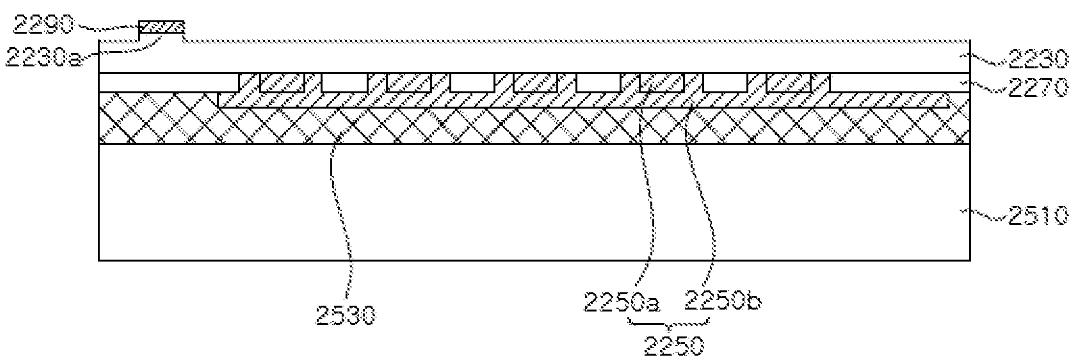

Referring to FIG. 53D, the first LED stack 2230 is coupled to the support substrate 2510 via a first bonding layer 2530. The first bonding layer 2530 may be previously formed on the support substrate 2510 and the reflective electrode 2250 may be bonded to the first bonding layer 2530 to face the support substrate 2510. The first substrate 2210 is removed from the first LED stack 2230 by chemical etching or the like. Accordingly, the upper surface of the n-type semiconductor layer of the first LED stack 2230 is exposed.

Then, an ohmic electrode 2290 is formed in the exposed region of the first LED stack 2230. In order to reduce ohmic contact resistance of the ohmic electrode 2290, the ohmic electrode 2290 may be subjected to heat treatment. The ohmic electrode 2290 may be formed in each pixel region so as to correspond to the pixel regions.

Figure 53E:
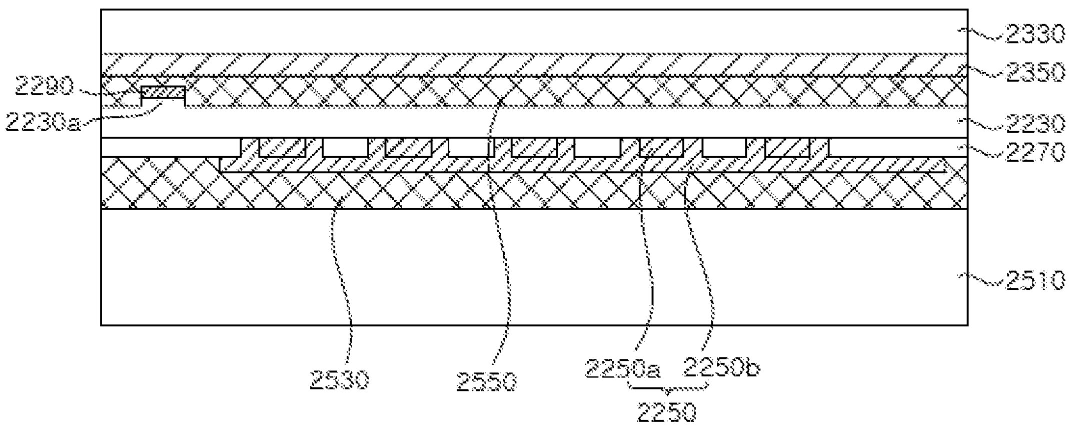

Referring to FIG. 53E, the second LED stack 2330 is coupled to the first LED stack 2230, on which the ohmic electrode 2290 is formed, via a second bonding layer 2550. The second-p transparent electrode 2350 is bonded to the second bonding layer 2550 to face the first LED stack 2230. The second bonding layer 2550 may be previously formed on the first LED stack 2230 such that the second-p transparent electrode 2350 may face and be bonded to the second bonding layer 2550. The second substrate 2310 may be separated from the second LED stack 2330 by a laser lift-off or chemical lift-off process.

Then, referring to FIG. 52 and FIG. 53C, the third LED stack 2430 is coupled to the second LED stack 2330 via a third bonding layer 2570. The third-p transparent electrode 2450 is bonded to the third bonding layer 2570 to face the second LED stack 2330. The third bonding layer 2570 may be previously formed on the second LED stack 2330 such that the third-p transparent electrode 2450 may face and be bonded to the third bonding layer 2570. The third substrate 2410 may be separated from the third LED stack 2430 by a laser lift-off or chemical lift-off process. As such, the light emitting diode stack for a display as shown in FIG. 52 may be formed, which has the n-type semiconductor layer of the third LED stack 2430 exposed to the outside.

A display apparatus may be formed by patterning the stack of the first to third LED stacks 2230, 2330, and 2430 disposed on the support substrate 2510 in pixel units, followed by connecting the first to third LED stacks 2230, 2330, and 2430 to one another through interconnections. However, the inventive concepts are not limited thereto. For example, a display apparatus may be manufactured by dividing the stack of the first to third LED stacks 2230, 2330, and 2430 into individual units, and transferring the first to third LED stacks 2230, 2330, and 2430 to other support substrates, such as a printed circuit board.

Figure 54:
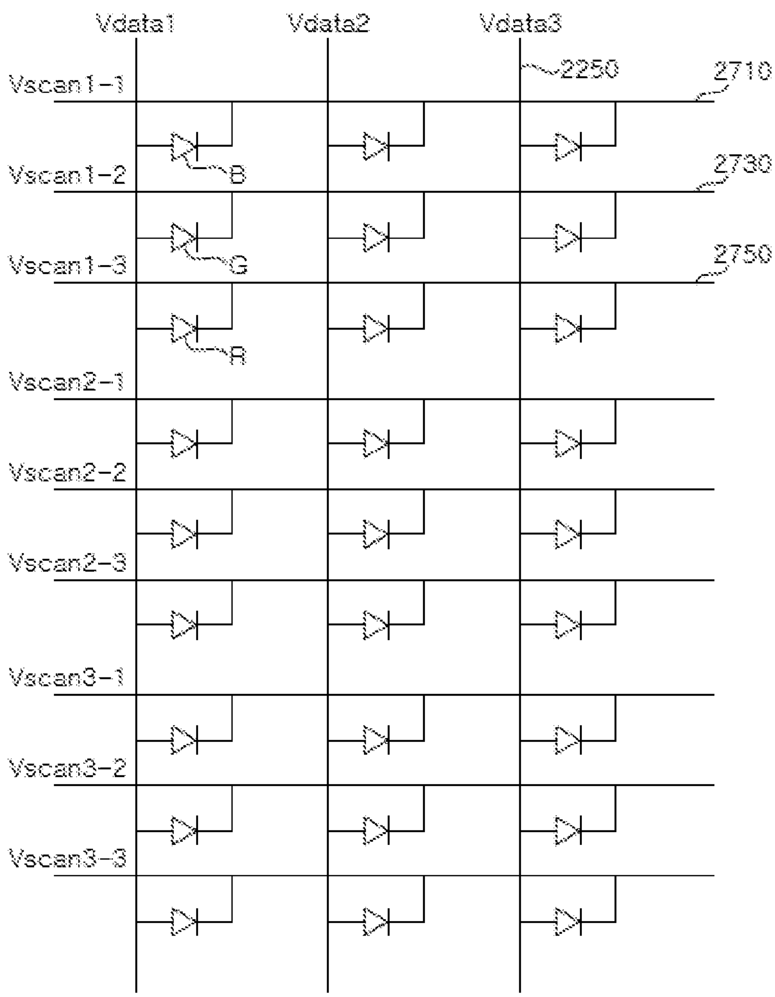
FIG. 54 is a schematic circuit diagram of a display apparatus according to an exemplary embodiment.
Figure 55:
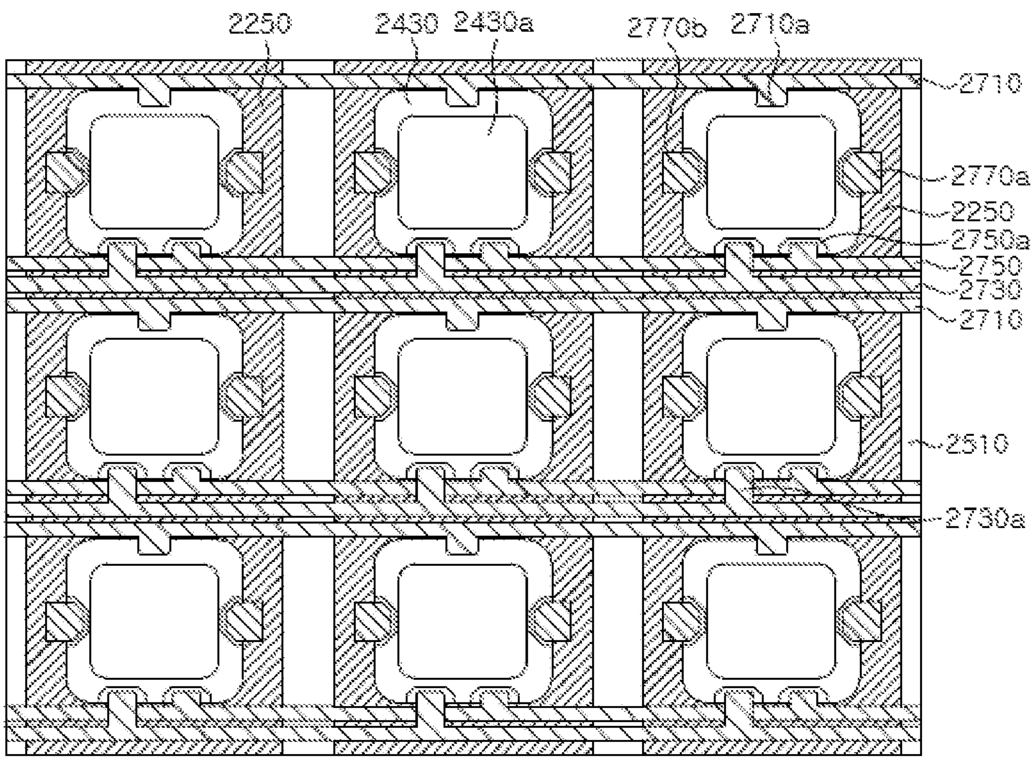
FIG. 55 is a schematic plan view of a display apparatus according to an exemplary embodiment.

FIG. 54 is a schematic circuit diagram of a display apparatus according to an exemplary embodiment. FIG. 55 is a schematic plan view of the display apparatus according to an exemplary embodiment.

Referring to FIG. 54 and FIG. 55, the display apparatus according to an exemplary embodiment may be implemented to be driven in a passive matrix manner.

The light emitting diode stack for a display shown in FIG. 52 has the structure including the first to third LED stacks 2230, 2330, and 2430 stacked in the vertical direction. Since one pixel includes three light emitting diodes R, G, and B, a first light emitting diode R may correspond to the first LED stack 2230, a second light emitting diode G may correspond to the second LED stack 2330, and a third light emitting diode B may correspond to the third LED stack 2430.

Referring to FIGS. 54 and 55, one pixel includes the first to third light emitting diodes R, G, and B, each of which may correspond to a subpixel. Anodes of the first to third light emitting diodes R, G, and B are connected to a common line, for example, a data line, and cathodes thereof are connected to different lines, for example, scan lines. For example, in a first pixel, the anodes of the first to third light emitting diodes R, G, and B are commonly connected to a data line Vdata1, and the cathodes thereof are connected to scan lines Vscan1-1, Vscan1-2, and Vscan1-3, respectively. As such, the light emitting diodes R, G, and B in each pixel can be driven independently.

In addition, each of the light emitting diodes R, G, and B may be driven by a pulse width modulation or by changing the magnitude of electric current to control the brightness of each subpixel.

Referring to FIG. 55, a plurality of pixels is formed by patterning the stack of FIG. 52, and each of the pixels is connected to the reflective electrodes 2250 and interconnection lines 2710, 2730, and 2750. As shown in FIG. 55, the reflective electrode 2250 may be used as the data line Vdata and the interconnection lines 2710, 2730, and 2750 may be formed as the scan lines.

The pixels may be arranged in a matrix form, in which the anodes of the light emitting diodes R, G, and B of each pixel are commonly connected to the reflective electrode 2250, and the cathodes thereof are connected to the interconnection lines 2710, 2730, and 2750 separated from one another. Here, the interconnection lines 2710, 2730, and 2750 may be used as the scan lines Vscan.

Figure 56:
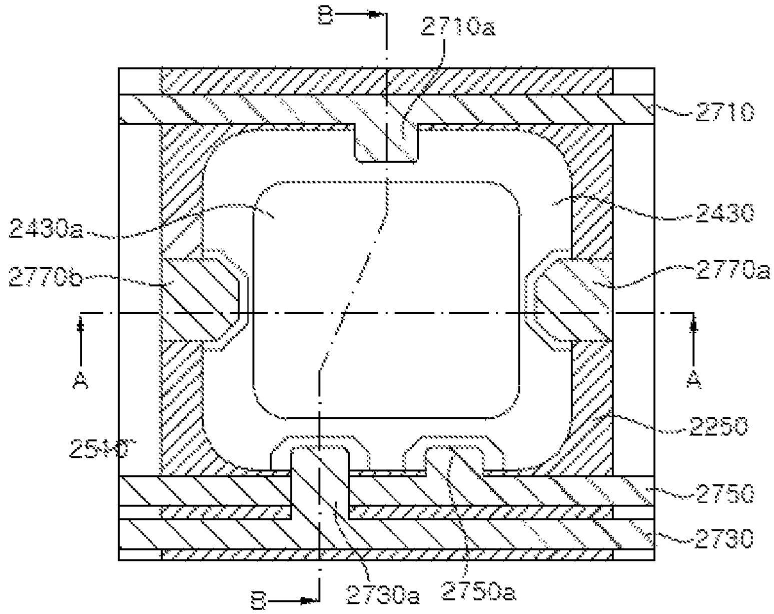
FIG. 56 is an enlarged plan view of one pixel of the display apparatus of FIG. 55.
Figure 57:
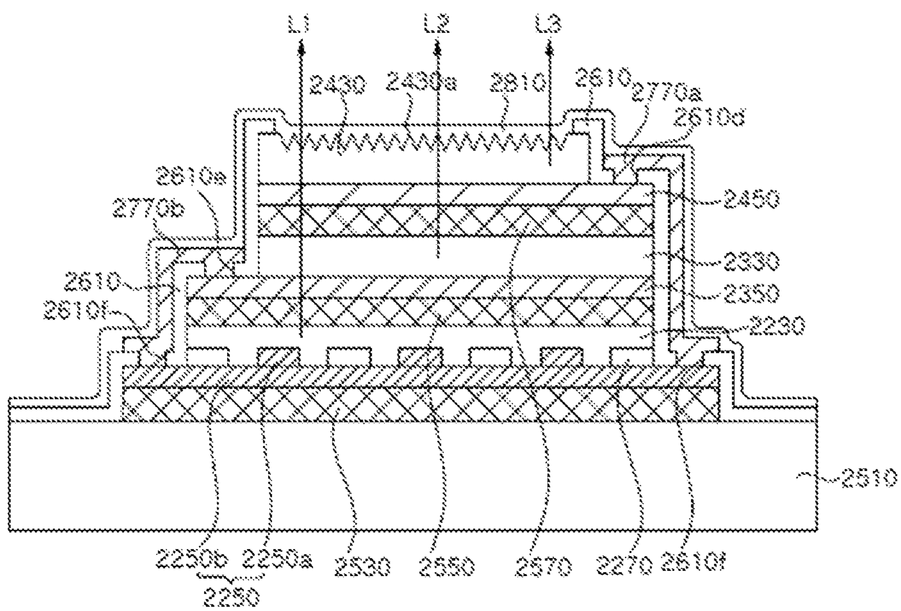
FIG. 57 is a schematic cross-sectional view taken along line A-A of FIG. 56.
Figure 58:
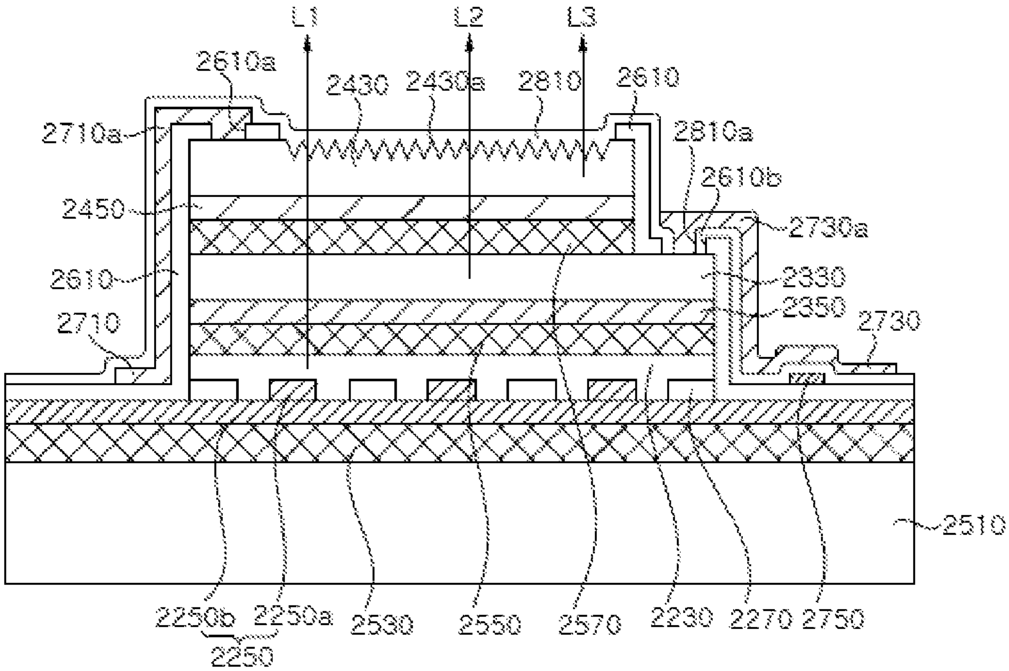
FIG. 58 is a schematic cross-sectional view taken along line B-B of FIG. 56.

FIG. 56 is an enlarged plan view of one pixel of the display apparatus of FIG. 55. FIG. 57 is a schematic cross-sectional view taken along line A-A of FIG. 56, and FIG. 58 is a schematic cross-sectional view taken along line B-B of FIG. 56.

Referring to FIGS. 55 to 58, in each pixel, a portion of the reflective electrode 2250, the ohmic electrode 2290 formed on the upper surface of the first LED stack 2230 (see FIG. 59H), a portion of the second-p transparent electrode 2350 (see FIG. 59H), a portion of the upper surface of the second LED stack 2330 (see FIG. 59J), a portion of the third-p transparent electrode 2450 (see FIG. 59H), and the upper surface of the third LED stack 2430 are exposed to the outside.

The third LED stack 2430 may have a roughened surface 2430*a* on the upper surface thereof. The roughened surface 2430*a* may be formed over the entirety of the upper surface of the third LED stack 2430 or may be formed in some regions thereof.

A lower insulation layer 2610 may cover a side surface of each pixel. The lower insulation layer 2610 may be formed of a light transmissive material, such as $SiO_2$. In this case, the lower insulation layer 2610 may cover substantially the entire upper surface of the third LED stack 2430. Alternatively, the lower insulation layer 2610 may include a distributed Bragg reflector to reflect light traveling towards the side surfaces of the first to third LED stacks 2230, 2330, and 2430. In this case, the lower insulation layer 2610 may partially expose the upper surface of the third LED stack 2430. Still alternatively, the lower insulation layer 2610 may be a black-based insulation layer that absorbs light. Furthermore, an electrically floating metallic reflective layer may be further formed on the lower insulation layer 2610 to reflect light emitted through the side surfaces of the first to third LED stacks 2230, 2330, and 2430.

The lower insulation layer 2610 may include an opening 2610*a* which exposes the upper surface of the third LED stack 2430, an opening 2610*b* which exposes the upper surface of the second LED stack 2330, an opening 2610*c* (see FIG. 59H) which exposes the ohmic electrode 2290 of the first LED stack 2230, an opening 2610*d* which exposes the third-p transparent electrode 2450, an opening 2610*e* which exposes the second-p transparent electrode 2350, and openings 2610*f* which expose the first-p reflective electrode 2250.

The interconnection lines 2710 and 2750 may be formed near the first to third LED stacks 2230, 2330, and 2430 on the support substrate 2510, and may be disposed on the lower insulation layer 2610 to be insulated from the first-p reflective electrode 2250. A connecting portion 2770*a* connects the third-p transparent electrode 2450 to the reflective electrode 2250, and a connecting portion 2770*b* connects the second-p transparent electrode 2350 to the reflective electrode 2250, such that the anodes of the first LED stack 2230, the second LED stack 2330, and the third LED stack 2430 are commonly connected to the reflective electrode 2250.

A connecting portion 2710*a* connects the upper surface of the third LED stack 2430 to the interconnection line 2710, and a connecting portion 2750*a* connects the ohmic electrode 2290 on the first LED stack 2230 to the interconnection line 2750.

An upper insulation layer 2810 may be disposed on the interconnection lines 2710 and 2730 and the lower insulation layer 2610 to cover the upper surface of the third LED stack 2430. The upper insulation layer 2810 may have an opening 2810*a* which partially exposes the upper surface of the second LED stack 2330.

The interconnection line 2730 may be disposed on the upper insulation layer 2810, and the connecting portion 2730*a* may connect the upper surface of the second LED stack 2330 to the interconnection line 2730. The connecting portion 2730*a* may pass through an upper portion of the interconnection line 2750 and is insulated from the interconnection line 2750 by the upper insulation layer 2810.

Although the electrodes of each pixel are described as being connected to the data line and the scan lines, the inventive concepts are not limited thereto. Further, while the interconnection lines 2710 and 2750 are described as being formed on the lower insulation layer 2610 and the interconnection line 2730 is described as being formed on the upper insulation layer 2810, the inventive concepts are not limited thereto. For example, all of the interconnection lines 2710, 2730, and 2750 may be formed on the lower insulation layer 2610, and may be covered by the upper insulation layer 2810, which may have openings that expose the interconnection line 2730. In this manner, the connecting portion 2730*a* may connect the upper surface of the second LED stack 2330 to the interconnection line 2730 through the openings of the upper insulation layer 2810.

Alternatively, the interconnection lines 2710, 2730, and 2750 may be formed inside the support substrate 2510, and the connecting portions 2710*a*, 2730*a*, and 2750*a* on the lower insulation layer 2610 may connect the ohmic electrode 2290, the upper surface of the first LED stack 2230, and the upper surface of the third LED stack 2430 to the interconnection lines 2710, 2730, and 2750.

According to an exemplary embodiment, light L1 generated from the first LED stack 2230 is emitted to the outside through the second and third LED stacks 2330 and 2430, and light L2 generated from the second LED stack 2330 is emitted to the outside through the third LED stack 2430. Furthermore, a portion of light L3 generated from the third LED stack 2430 may enter the second LED stack 2330, and a portion of light L2 generated from the second LED stack 2330 may enter the first LED stack 2230. Furthermore, a secondary light may be generated from the second LED stack 2330 by the light L3, and a secondary light may also be generated from the first LED stack 2230 by the light L2. However, such secondary light may have a low intensity.

FIG. 59A to FIG. 59K are schematic plan views illustrating a method of manufacturing a display apparatus according to an exemplary embodiment. Hereinafter, the following descriptions will be given with reference to the pixel of FIG. 56.

First, the light emitting diode stack 2000 described in FIG. 52 is prepared.

Figure 59A:
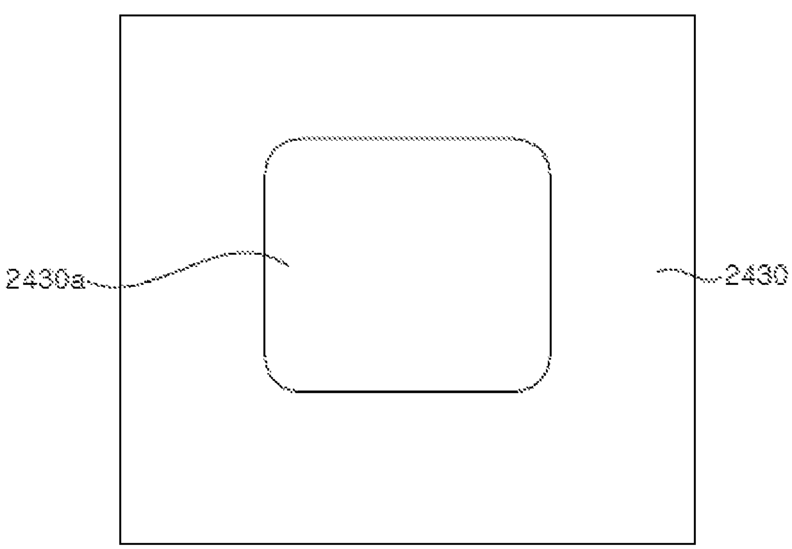
FIGS. 59A, 59B, 59C, 59D, 59E, 59F, 59G, 59H, 59I, 59J, and 59K are schematic plan views illustrating a method of manufacturing a display apparatus according to an exemplary embodiment.

Referring to FIG. 59A, a roughened surface 2430*a* may be formed on the upper surface of the third LED stack 2430. The roughened surface 2430*a* may be formed on the upper surface of the third LED stack 2430 to correspond to each pixel region. The roughened surface 2430*a* may be formed by chemical etching, for example, photo-enhanced chemical etching (PEC) or the like.

The roughened surface 2430*a* may be partially formed in each pixel region by taking into account a region of the third LED stack 2430 to be etched in the subsequent process, without being limited thereto. Alternatively, the roughened surface 2430*a* may be formed over the entire upper surface of the third LED stack 2430.

Figure 59B:
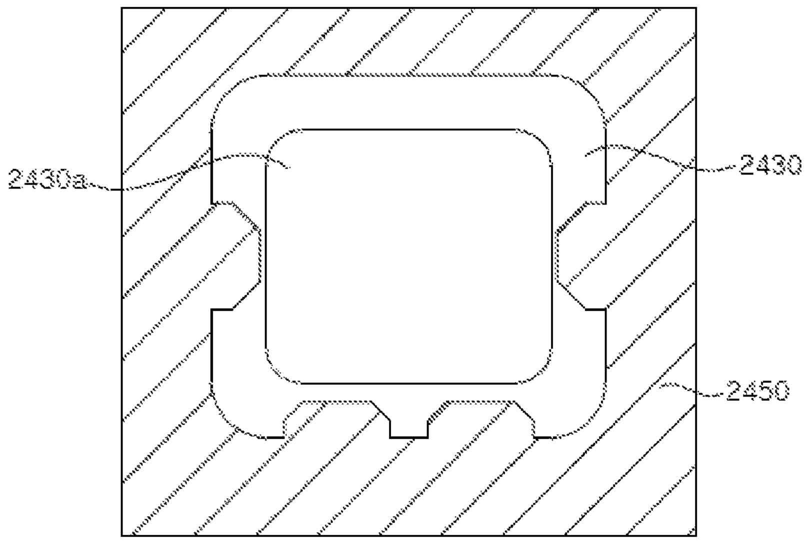

Referring to FIG. 59B, a surrounding region of the third LED stack 2430 in each pixel is removed by etching to expose the third-p transparent electrode 2450. As shown in FIG. 59B, the third LED stack 2430 may be remained to have a rectangular shape or a square shape. The third LED stack 2430 may have a plurality of depressions formed along edges thereof.

Figure 59C:
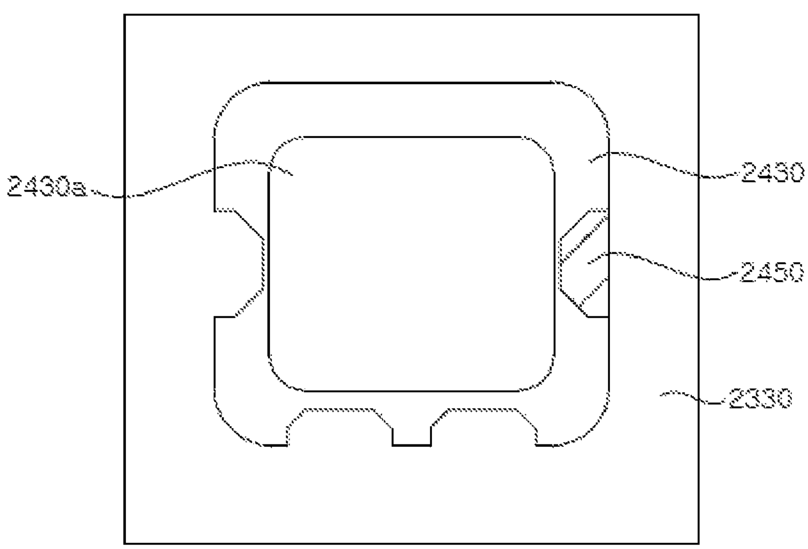

Referring to FIG. 59C, the upper surface of the second LED stack 2330 is exposed by removing the exposed third-p transparent electrode 2450 in areas other than in one depression. Accordingly, the upper surface of the second LED stack 2330 is exposed around the third LED stack 2430 and in other depressions other than the depression where the third-p transparent electrode 2450 is partially remained.

Figure 59D:
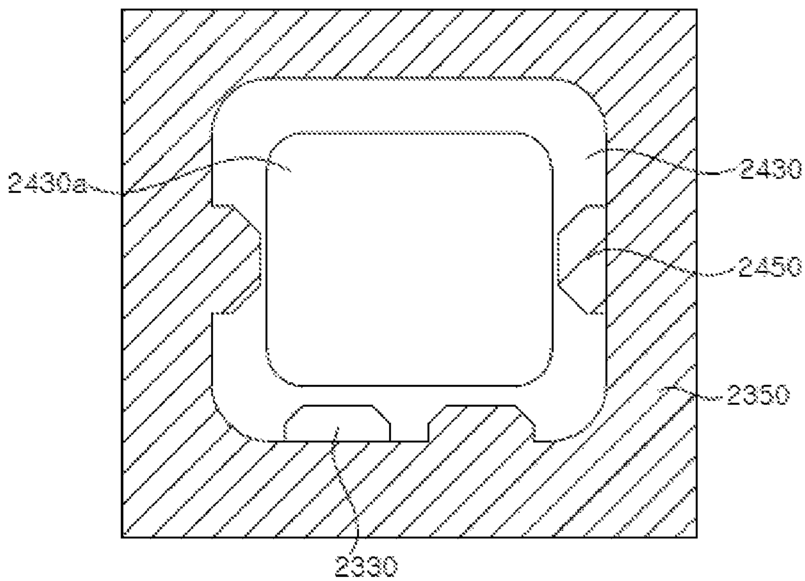

Referring to FIG. 59D, the second-p transparent electrode 2350 is exposed by removing the exposed second LED stack 2330 exposed in areas other than one depression.

Figure 59E:
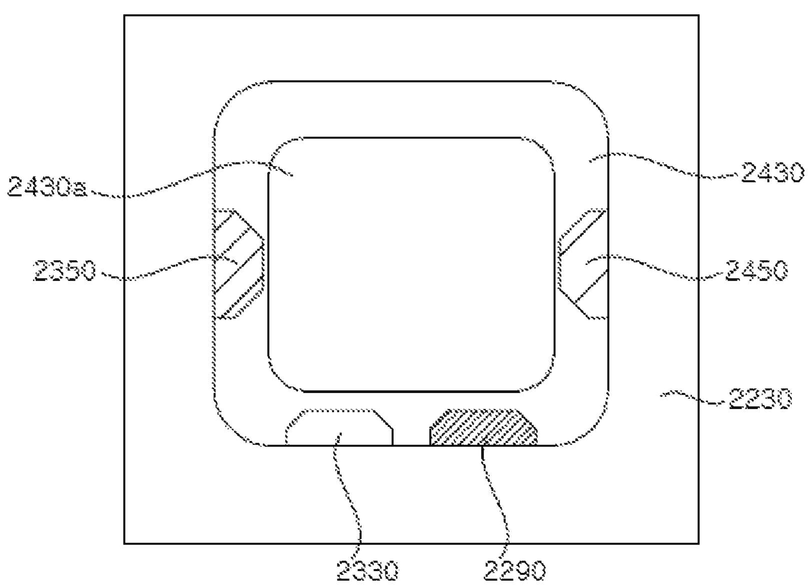

Referring to FIG. 59E, the ohmic electrode 2290 is exposed together with the upper surface of the first LED stack 2230 by removing the exposed second-p transparent electrode 2350 in areas other than in one depression. Here, the ohmic electrode 2290 may be exposed in one depression. Accordingly, the upper surface of the first LED stack 2230 is exposed around the third LED stack 2430, and an upper surface of the ohmic electrode 2290 is exposed in at least one of the depressions formed in the third LED stack 2430.

Figure 59F:
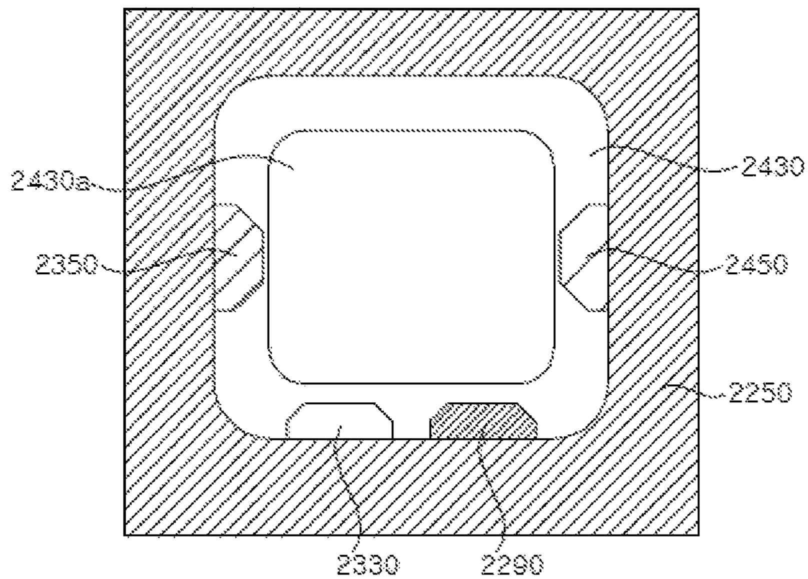

Referring to FIG. 59F, the reflective electrode 2250 is exposed by removing an exposed portion of the first LED stack 2230 in areas other than in one depression. As such, the reflective electrode 2250 is exposed around the third LED stack 2430.

Figure 59G:
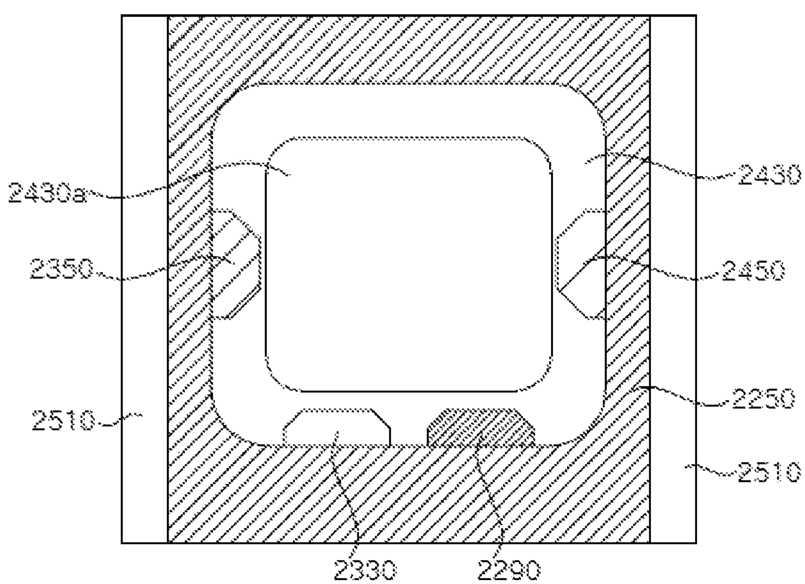

Referring to FIG. 59G, linear interconnection lines are formed by patterning the reflective electrode 2250. Here, the support substrate 2510 may be exposed. The reflective electrode 2250 may connect pixels arranged in one row to each other among pixels arranged in a matrix (see FIG. 55).

Figure 59H:
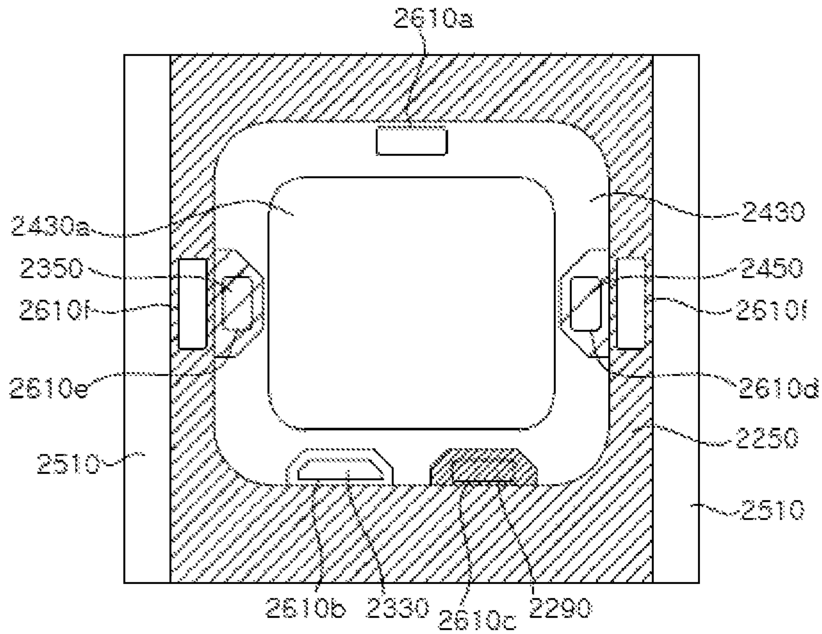

Referring to FIG. 59H, a lower insulation layer 2610 (see FIG. 57 and FIG. 58) is formed to cover the pixels. The lower insulation layer 2610 covers the reflective electrode 2250 and side surfaces of the first to third LED stacks 2230, 2330, and 2430. In addition, the lower insulation layer 2610 may partially cover the upper surface of the third LED stack 2430. If the lower insulation layer 2610 is a transparent layer such as a $SiO_2$ layer, the lower insulation layer 2610 may cover substantially the entire upper surface of the third LED stack 2430. Alternatively, the lower insulation layer 2610 may include a distributed Bragg reflector. In this case, the lower insulation layer 2610 may partially expose the upper surface of the third LED stack 2430 to allow light to be emitted to the outside.

The lower insulation layer 2610 may include an opening 2610*a* which exposes the third LED stack 2430, an opening 2610*b* which exposes the second LED stack 2330, an opening 2610*c* which exposes the ohmic electrode 2290, an opening 2610*d* which exposes the third-p transparent electrode 2450, an opening 2610*e* which exposes the second-p transparent electrode 2350, and an opening 2610*f* which exposes the reflective electrode 2250. The opening 2610*f* that exposes the reflective electrode 2250 may be formed singularly or in plural.

Figure 59I:
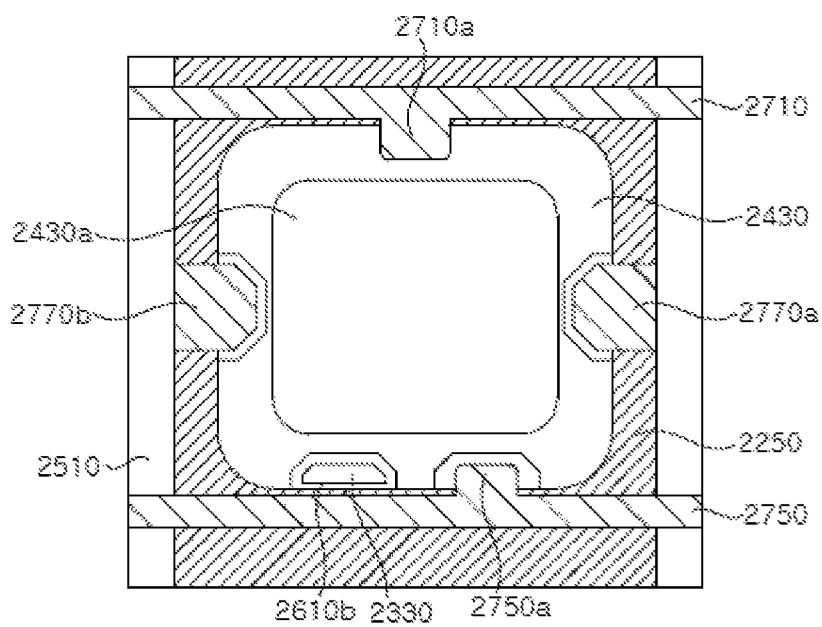

Referring to FIG. 59I, interconnection lines 2710 and 2750, and connecting portions 2710*a*, 2750*a*, 2770*a*, and 2770*b* are formed by a lift-off process or the like. The interconnection lines 2710 and 2750 are insulated from the reflective electrode 2250 by the lower insulation layer 2610. The connecting portion 2710*a* electrically connects the third LED stack 2430 to the interconnection line 2710, and the connecting portion 2750*a* electrically connects the ohmic electrode 2290 to the interconnection line 2750 such that the first LED stack 2230 is electrically connected to the interconnection line 2750. The connecting portion 2770*a* electrically connects the third-p transparent electrode 2450 to the first-p reflective electrode 2250, and the connecting portion 2770*b* electrically connects the second-p transparent electrode 2350 to the first-p reflective electrode 2250.

Figure 59J:
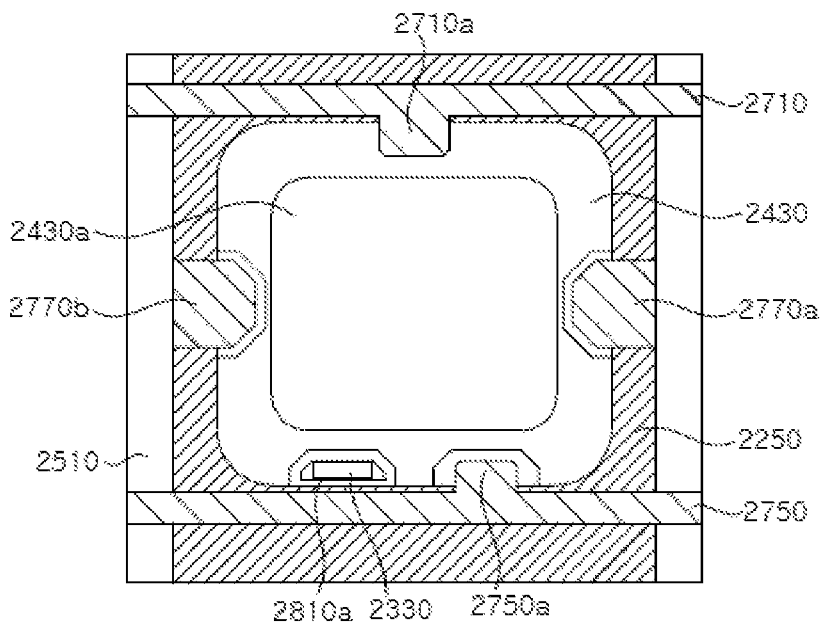

Referring to FIG. 59J, an upper insulation layer 2810 (see FIG. 57 and FIG. 58) covers the interconnection lines 2710, 2750 and the connecting portions 2710*a*, 2750*a*, 2770*a*, and 2770*b*. The upper insulation layer 2810 may also cover substantially the entire upper surface of the third LED stack 2430. The upper insulation layer 2810 has an opening 2810*a* which exposes the upper surface of the second LED stack 2330. The upper insulation layer 2810 may be formed of, for example, silicon oxide or silicon nitride, and may include a distributed Bragg reflector. When the upper insulation layer 2810 includes the distributed Bragg reflector, the upper insulation layer 2810 may expose at least a part of the upper surface of the third LED stack 2430 to allow light to be emitted to the outside.

Figure 59K:
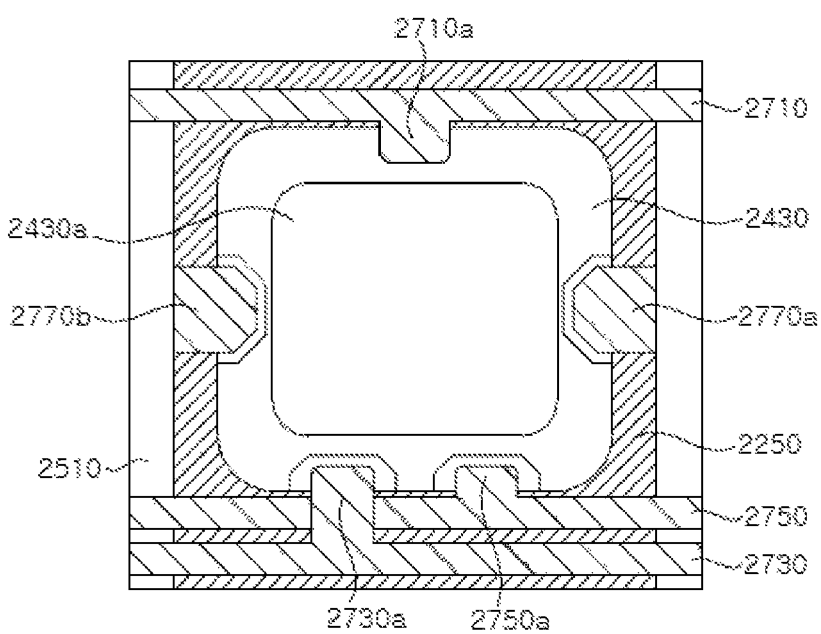

Referring to FIG. 59K, an interconnection line 2730 and a connecting portion 2730*a* are formed. An interconnection line 2750 and a connecting portion 2750*a* may be formed by a lift-off process or the like. The interconnection line 2730 is disposed on the upper insulation layer 2810, and is insulated from the reflective electrode 2250 and the interconnection lines 2710 and 2750. The connecting portion 2730*a* electrically connects the second LED stack 2330 to the interconnection line 2730. The connecting portion 2730*a* may pass through an upper portion of the interconnection line 2750, and is insulated from the interconnection line 2750 by the upper insulation layer 2810.

As such, a pixel region shown in FIG. 56 may be formed. In addition, as shown in FIG. 55, a plurality of pixels may be formed on the support substrate 2510 and may be connected to one another by the first-p the reflective electrode 2250 and the interconnection lines 2710, 2730 and 2750, to be operated in a passive matrix manner.

Although the above describes a method of manufacturing a display apparatus that may be operated in the passive matrix manner, the inventive concepts are not limited thereto. More particularly, the display apparatus according to exemplary embodiments may be manufactured in various ways so as to be operated in the passive matrix manner using the light emitting diode stack shown in FIG. 52.

For example, while the interconnection line 2730 is described as being formed on the upper insulation layer 2810, the interconnection line 2730 may be formed together with the interconnection lines 2710 and 2750 on the lower insulation layer 2610, and the connecting portion 2730*a* may be formed on the upper insulation layer 2810 to connect the second LED stack 2330 to the interconnection line 2730. Alternatively, the interconnection lines 2710, 2730, 2750 may be disposed inside the support substrate 2510.

Figure 60:
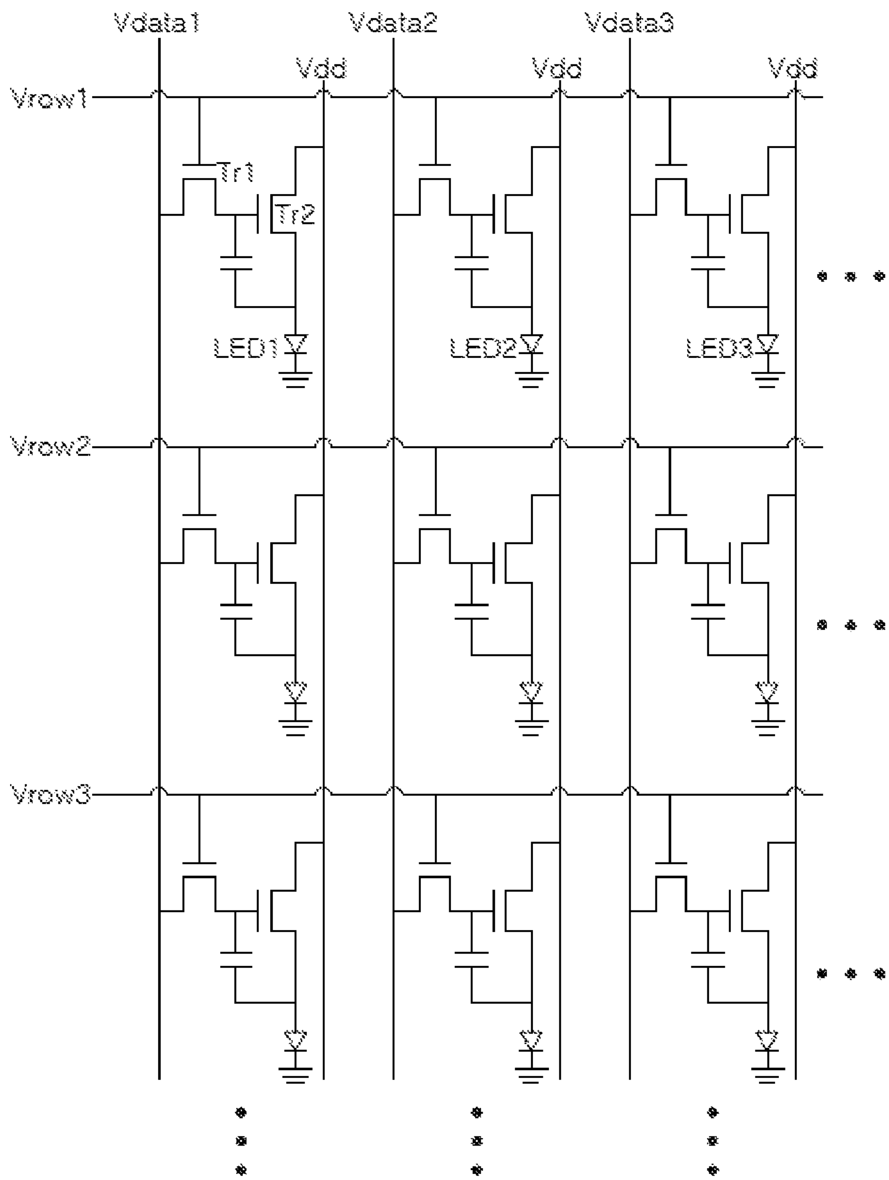
FIG. 60 is a schematic circuit diagram of a display apparatus according to another exemplary embodiment.

FIG. 60 is a schematic circuit diagram of a display apparatus according to another exemplary embodiment. The circuit diagram of FIG. 60 relates to a display apparatus driven in an active matrix manner.

Referring to FIG. 60, the drive circuit according to an exemplary embodiment includes at least two transistors Tr1, Tr2 and a capacitor. When a power source is connected to selection lines Vrow1 to Vrow3 and voltage is applied to data lines Vdata1 to Vdata3, the voltage is applied to the corresponding light emitting diode. In addition, the corresponding capacitors are charged according to the values of Vdata1 to Vdata3. Since a turned-on state of the transistor Tr2 can be maintained by the charged voltage of the capacitor, the voltage of the capacitor can be maintained and applied to the light emitting diodes LED1 to LED3, even when power supplied to Vrow1 is cut off. In addition, electric current flowing in the light emitting diodes LED1 to LED3 can be changed depending upon the values of Vdata1 to Vdata3. Electric current can be continuously supplied through Vdd, and thus, light may be emitted continuously.

The transistors Tr1, Tr2 and the capacitor may be formed inside the support substrate 2510. For example, thin film transistors formed on a silicon substrate may be used for active matrix driving.

Here, the light emitting diodes LED1 to LED3 may correspond to the first to third LED stacks 2230, 2330, and 2430 stacked in one pixel, respectively. The anodes of the first to third LED stacks 2230, 2330, and 2430 are connected to the transistor Tr2 and the cathodes thereof are connected to the ground.

Although FIG. 60 shows the circuit for active matrix driving according to an exemplary embodiment, other types of circuits may be variously used. In addition, although the anodes of the light emitting diodes LED1 to LED3 are described as being connected to different transistors Tr2 and the cathodes thereof are described as being connected to the ground, the anodes of the light emitting diodes may be connected to current supplies Vdd and the cathodes thereof may be connected to different transistors in some exemplary embodiments.

Figure 61:
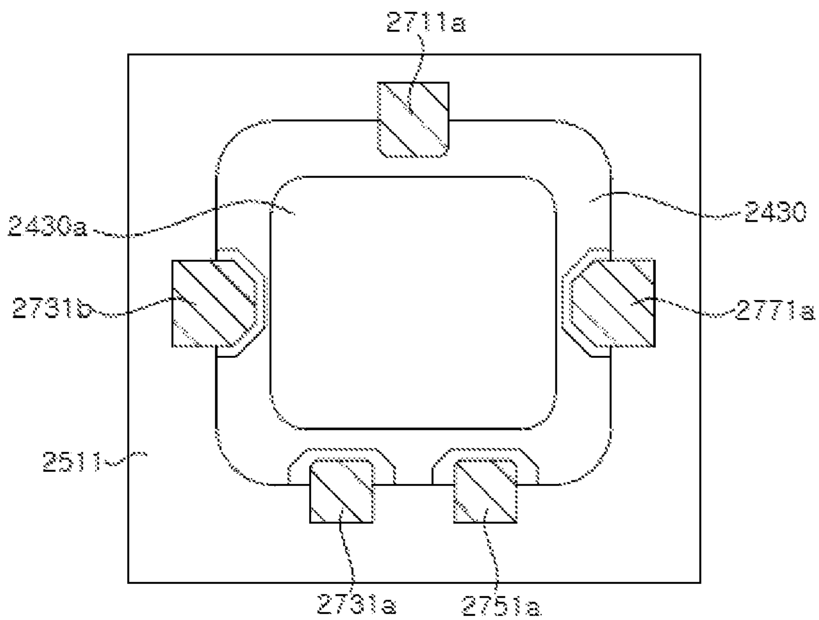
FIG. 61 is a schematic plan view of a display apparatus according to another exemplary embodiment.

FIG. 61 is a schematic plan view of a display apparatus according to another exemplary embodiment. Hereinafter, the following description will be given with reference to one pixel among a plurality of pixels arranged on the support substrate 2511.

Referring to FIG. 61, the pixel according to an exemplary embodiment are substantially similar to the pixel described with reference to FIG. 55 to FIG. 58, except that the support substrate 2511 is a thin film transistor panel including transistors and capacitors and the reflective electrode 2250 is disposed in a lower region of the first LED stack 2230.

The cathode of the third LED stack 2430 is connected to the support substrate 2511 through the connecting portion 2711*a*. For example, as shown in FIG. 60, the cathode of the third LED stack 2430 may be connected to the ground through electrical connection to the support substrate 2511. The cathodes of the second LED stack 2330 and the first LED stack 2230 may also be connected to the ground through electrical connection to the support substrate 2511 via the connecting portions 2731*a* and 2751*a*.

The reflective electrode is connected to the transistors Tr2 (see FIG. 60) inside the support substrate 2511. The third-p transparent electrode and the second-p transparent electrode are also connected to the transistors Tr2 (see FIG. 60) inside the support substrate 2511 through the connecting portions 2711*b* and 2731*b*.

In this manner, the first to third LED stacks are connected to one another, thereby forming a circuit for active matrix driving, as shown in FIG. 60.

Although FIG. 61 shows a pixel having an electrical connection for active matrix driving according to an exemplary embodiment, the inventive concepts are not limited thereto, and the circuit for the display apparatus can be modified into various circuits for active matrix driving in various ways.

In addition, the reflective electrode 2250, the second-p transparent electrode 2350, and the third-p transparent electrode 2450 of FIG. 52 are described as forming ohmic contact with the p-type semiconductor layer of each of the first LED stack 2230, the second LED stack 2330, and the third LED stack 2430, and the ohmic electrode 2290 is described as forming ohmic contact with the n-type semiconductor layer of the first LED stack 2230, the n-type semiconductor layer of each of the second LED stack 2330, and the third LED stack 2430 is not provided with a separate ohmic contact layer. Although there is less difficulty in current spreading even without formation of a separate ohmic contact layer in the n-type semiconductor layer when the pixels have a small size of 200 μm or less, however, a transparent electrode layer may be disposed on the n-type semiconductor layer of each of the LED stacks in order to secure current spreading according to some exemplary embodiments.

In addition, although FIG. 52 shows the coupling of the first to third LED stacks 2230, 2330, and 2430 to one another via a bonding layers, the inventive concepts are not limited thereto, and the first to third LED stacks 2230, 2330, and 2430 may be connected to one another in various sequences and using various structures.

According to exemplary embodiments, since it is possible to form a plurality of pixels at the wafer level using the light emitting diode stack 2000 for a display, the need for individual mounting of light emitting diodes may be obviated. In addition, the light emitting diode stack according to exemplary embodiments has the structure in which the first to third LED stacks 2230, 2330, and 2430 are stacked in the vertical direction, and thus, an area for subpixels may be secured in a limited pixel area. Furthermore, the light emitting diode stack according to the exemplary embodiments allows light generated from the first LED stack 2230, the second LED stack 2330, and the third LED stack 2430 to be emitted outside therethrough, thereby reducing light loss.

Figure 62:
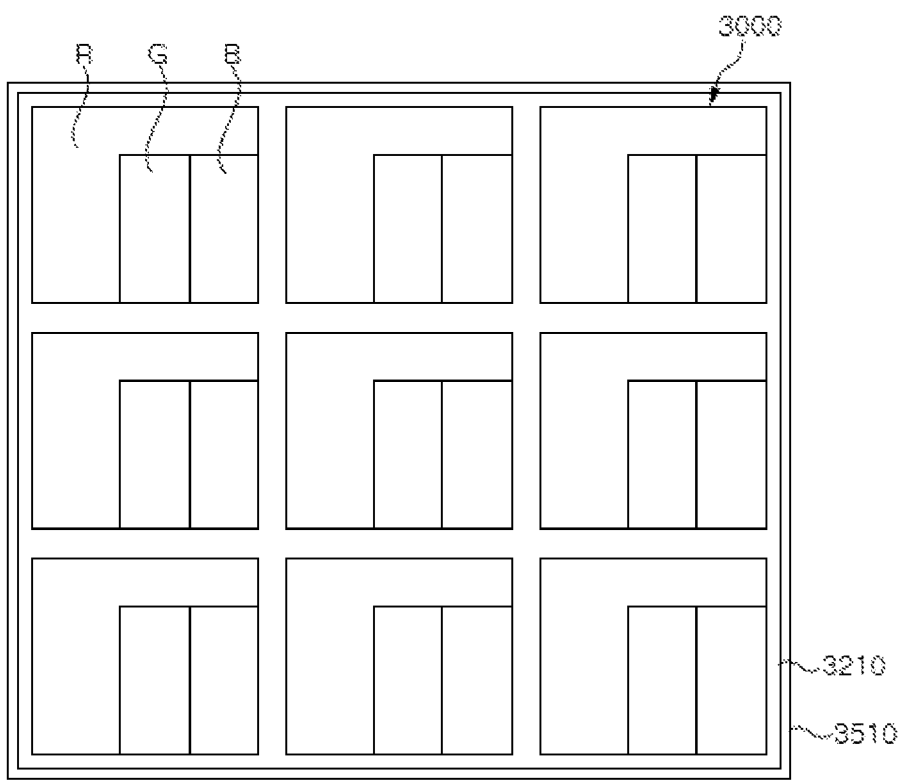
FIG. 62 is a schematic plan view of a display apparatus according to an exemplary embodiment.
Figure 63:
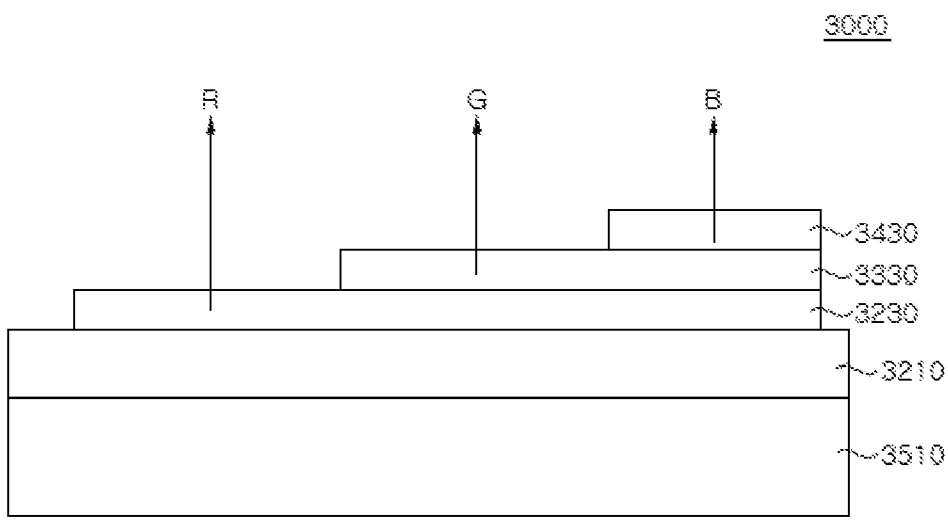
FIG. 63 is a schematic cross-sectional view of a light emitting diode pixel for a display according to an exemplary embodiment.

FIG. 62 is a schematic plan view of a display apparatus according to an exemplary embodiment, and FIG. 63 is a schematic cross-sectional view of a light emitting diode pixel for a display according to an exemplary embodiment.

Referring to FIG. 62 and FIG. 63, the display apparatus includes a circuit board 3510 and a plurality of pixels 3000. Each of the pixels 3000 includes a substrate 3210 and first to third subpixels R, G, and B disposed on the substrate 3210.

The circuit board 3510 may include a passive circuit or an active circuit. The passive circuit may include, for example, data lines and scan lines. The active circuit may include, for example, a transistor and a capacitor. The circuit board 3510 may have a circuit on a surface thereof or therein. The circuit board 3510 may include, for example, a glass substrate, a sapphire substrate, a Si substrate, or a Ge substrate.

The substrate 3210 supports first to third subpixels R, G, and B. The substrate 3210 is continuous over the plurality of pixels 3000 and electrically connects the subpixels R, G, and B to the circuit board 3510. For example, the substrate 3210 may be a GaAs substrate.

The first subpixel R includes a first LED stack 3230, the second subpixel G includes a second LED stack 3330, and the third subpixel B includes a third LED stack 3430. The first subpixel R is configured to allow the first LED stack 3230 to emit light, the second subpixel G is configured to allow the second LED stack 3330 to emit light, and the third subpixel B is configured to allow the third LED stack 3430 to emit light. The first to third LED stacks 3230, 3330, and 3430 may be driven independently.

The first LED stack 3230, the second LED stack 3330, and the third LED stack 3430 are stacked to overlap one another in the vertical direction. Here, as shown in FIG. 63, the second LED stack 3330 may be disposed in a portion of the first LED stack 3230. For example, the second LED stack 3330 may be disposed towards one side on the first LED stack 3230. The third LED stack 3430 may be disposed in a portion of the second LED stack 3330. For example, the third LED stack 3430 may be disposed towards one side on the second LED stack 3330. Although FIG. 63 shows that the third LED stack 3430 is disposed towards right side, the inventive concepts are not limited thereto. Alternatively, the third LED stack 3430 may be disposed towards the left side of the second LED stack 3330.

Light R generated from the first LED stack 3230 may be emitted through a region not covered by the second LED stack 3330, and light G generated from the second LED stack 3330 may be emitted through a region not covered by the third LED stack 3430. More particularly, light generated from the first LED stack 3230 may be emitted to the outside without passing through the second LED stack 3330 and the third LED stack 3430, and light generated from the second LED stack 3330 may be emitted to the outside without passing through the third LED stack 3430.

The region of the first LED stack 3230 through which the light R is emitted, the region of the second LED stack 3330 through which the light G is emitted, and the region of the third LED stack 3340 may have different areas, and the intensity of light emitted from each of the LED stacks 3230, 3330, and 3430 may be adjusted by adjusting the areas thereof.

However, the inventive concepts are not limited thereto. Alternatively, light generated from the first LED stack 3230 may be emitted to the outside after passing through the second LED stack 3330 or after passing through the second LED stack 3330 and the third LED stack 3430, and light generated from the second LED stack 3330 may be emitted to the outside after passing through the third LED stack 3430.

Each of the first LED stack 3230, the second LED stack 3330, and the third LED stack 3430 may include a first conductivity type (for example, n-type) semiconductor layer, a second conductivity type (for example, p-type) semiconductor layer, and an active layer interposed therebetween. The active layer may have a multi-quantum well structure. The first to third LED stacks 3230, 3330, and 3430 may include different active layers to emit light having different wavelengths. For example, the first LED stack 3230 may be an inorganic light emitting diode configured to emit red light, the second LED stack 3330 may be an inorganic light emitting diode configured to emit green light, and the third LED stack 3430 may be an inorganic light emitting diode configured to emit blue light. To this end, the first LED stack 3230 may include an AlGaInP-based well layer, the second LED stack 3330 may include an AlGaInP or AlGaInN-based well layer, and the third LED stack 3430 may include an AlGaInN-based well layer. However, the inventive concepts are not limited thereto. The wavelengths of light generated from the first LED stack 3230, the second LED stack 3330, and the third LED stack 3430 may be varied. For example, the first LED stack 3230, the second LED stack 3330, and the third LED stack 3430 may emit green light, red light, and blue light, respectively, or may emit green light, blue light, and red light, respectively.

In addition, a distributed Bragg reflector may be interposed between the substrate 3210 and the first LED stack 3230 to prevent loss of light generated from the first LED stack 3230 through absorption by the substrate 3210. For example, a distributed Bragg reflector formed by alternately stacking AlAs and AlGaAs semiconductor layers one above another may be interposed therebetween.

Figure 64:
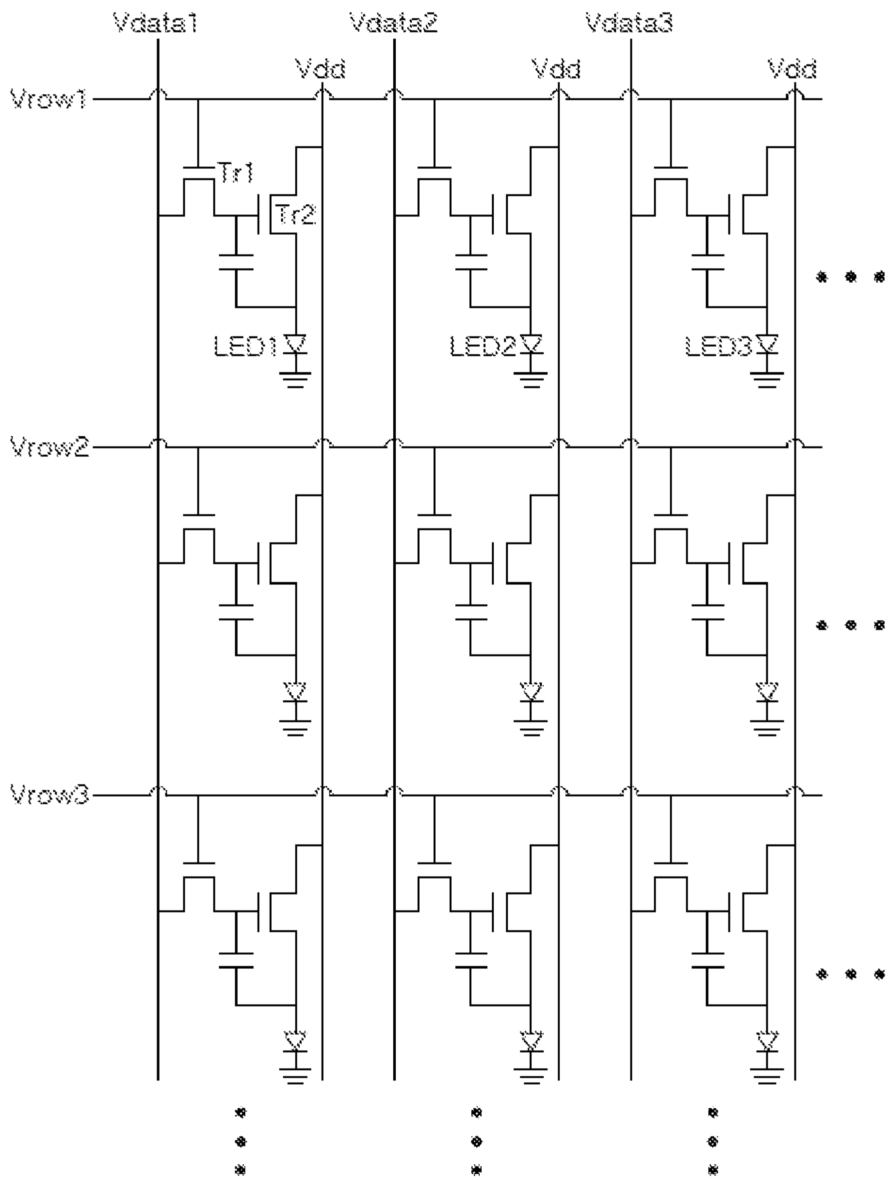
FIG. 64 is a schematic circuit diagram of a display apparatus according to an exemplary embodiment.

FIG. 64 is a schematic circuit diagram of a display apparatus according to an exemplary embodiment.

Referring to FIG. 64, the display apparatus according to an exemplary embodiment may be driven in an active matrix manner. As such, the circuit board may include an active circuit.

For example, the drive circuit may include at least two transistors Tr1, Tr2 and a capacitor. When a power source is connected to selection lines Vrow1 to Vrow3 and voltage is applied to data lines Vdata1 to Vdata3, the voltage is applied to the corresponding light emitting diode. In addition, the corresponding capacitors are charged according to the values of Vdata1 to Vdata3. Since a turned-on state of the transistor Tr2 can be maintained by the charged voltage of the capacitor, the voltage of the capacitor can be maintained and applied to the light emitting diodes LED1 to LED3 even when power supplied to Vrow1 is cut off. In addition, electric current flowing in the light emitting diodes LED1 to LED3 can be changed depending upon the values of Vdata1 to Vdata3. Electric current can be continuously supplied through Vdd, and thus, light may be emitted continuously.

The transistors Tr1, Tr2 and the capacitor may be formed inside the support substrate 3210. Here, the light emitting diodes LED1 to LED3 may correspond to the first to third LED stacks 3230, 3330, and 3430 stacked in one pixel, respectively. The anodes of the first to third LED stacks 3230, 3330, and 3430 are connected to the transistor Tr2 and the cathodes thereof are connected to the ground. The cathodes of the first to third LED stacks 3230, 3330, and 3430, for example, may be commonly connected to the ground.

Although FIG. 64 shows the circuit for active matrix driving according to an exemplary embodiment, other types of circuits may also be used. In addition, although the anodes of the light emitting diodes LED1 to LED3 are described as being connected to different transistors Tr2 and the cathodes thereof are described as being connected to the ground, the anodes of the light emitting diodes may be commonly connected and the cathodes thereof may be connected to different transistors in some exemplary embodiments.

Although the active circuit for active matrix driving is illustrated above, the inventive concepts are not limited thereto, and the pixels according to an exemplary embodiment may be driven in a passive matrix manner. As such, the circuit board 3510 may include data lines and scan lines arranged thereon, and each of the subpixels may be connected to the data line and the scan line. In an exemplary embodiment, the anodes of the first to third LED stacks 3230, 3330, and 3430 may be connected to different data lines and the cathodes thereof may be commonly connected to a scan line. In another exemplary embodiments, the anodes of the first to third LED stacks 3230, 3330, and 3430 may be connected to different scan lines and the cathodes thereof may be commonly connected to a data line.

In addition, each of the LED stacks 3230, 3330, and 3430 may be driven by a pulse width modulation or by changing the magnitude of electric current, thereby controlling the brightness of each subpixel. Furthermore, the brightness may be adjusted by adjusting the areas of the first to third LED stacks 3230, 3330, and 3430, and the areas of the regions of the LED stacks 3230, 3330, and 3430 through which light R, G, and B is emitted. For example, an LED stack emitting light having low visibility, for example, the first LED stack 3230, has a larger area than the second LED stack 3330 or the third LED stack 3430, and thus, can emit light with a higher intensity under the same current density. In addition, since the area of the second LED stack 3330 is larger than the area of the third LED stack 3430, the second LED stack 3330 can emit light with a higher intensity under the same current density than the third LED stack 3430. In this manner, light output can be adjusted based on the visibility of light emitted from the first to third LED stacks 3230, 3330, and 3430 by adjusting the areas of the first LED stack 3230, the second LED stack 3330, and the third LED stack 3430.

Figure 65A:
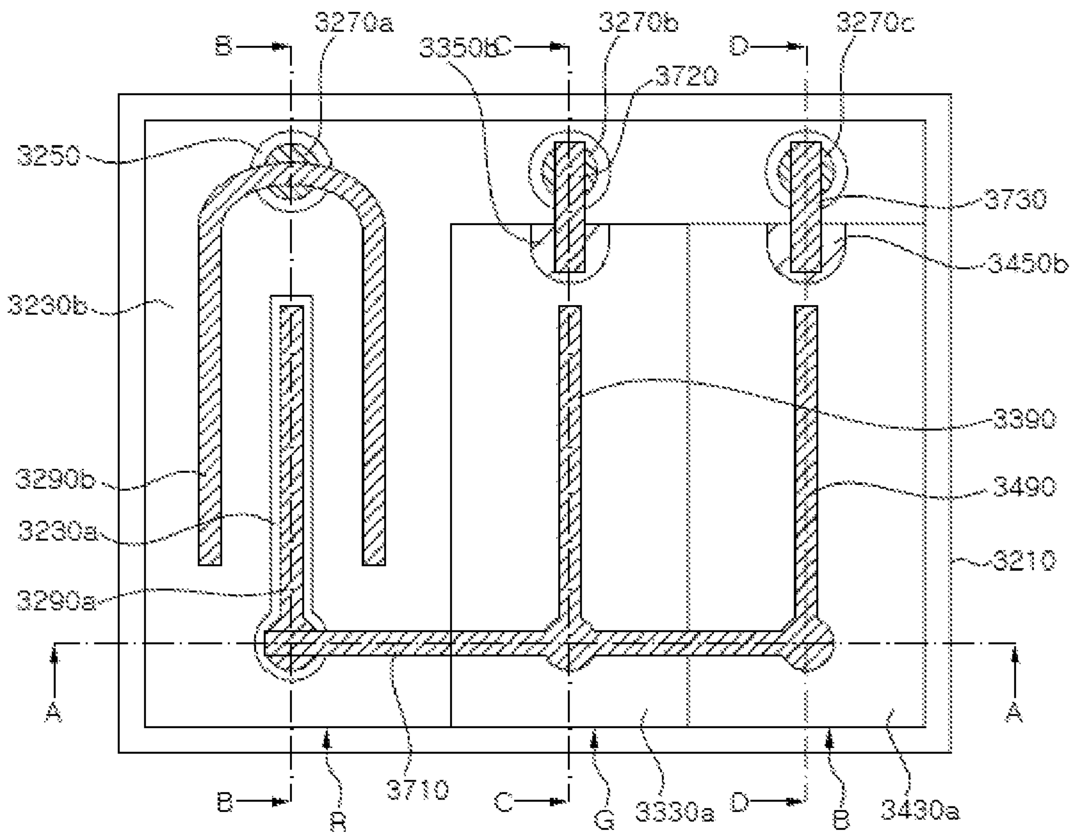
FIG. 65A and FIG. 65B are a top view and a bottom view of one pixel of a display apparatus according to an exemplary embodiment.
Figure 65B:
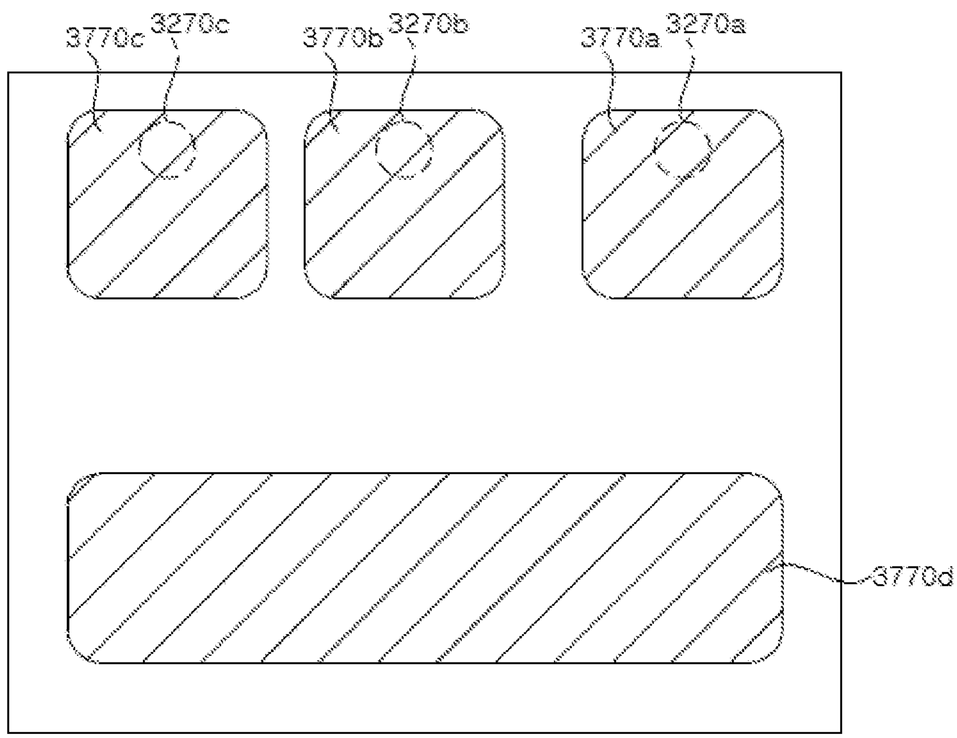
Figure 66A:
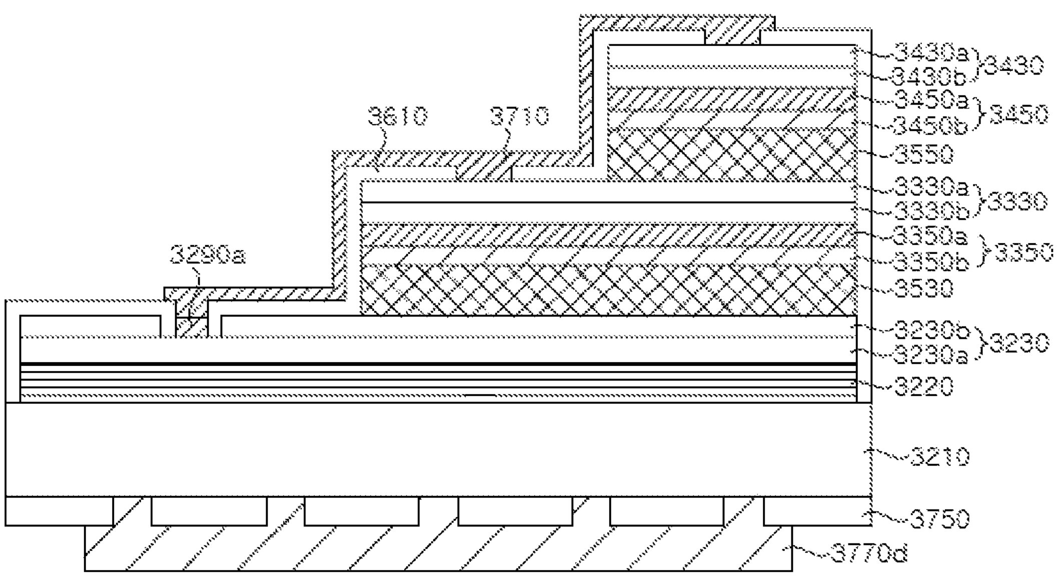
FIG. 66A is a schematic cross-sectional view taken along line A-A of FIG. 65A.
Figure 66B:
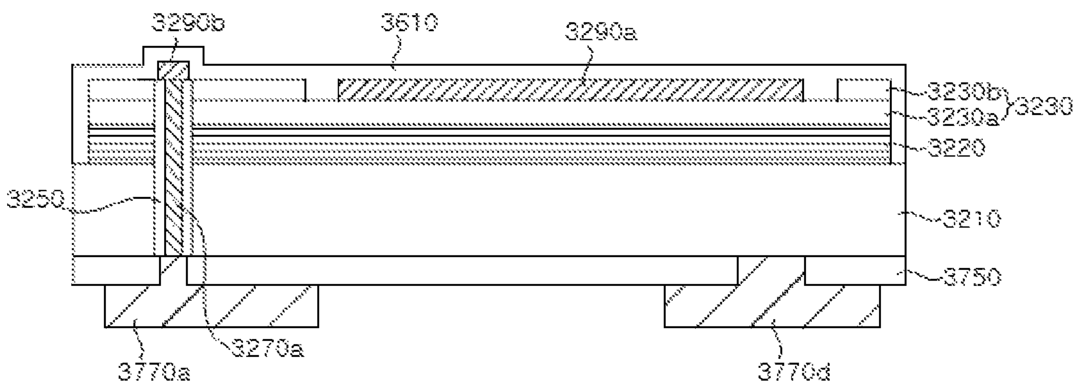
FIG. 66B is a schematic cross-sectional view taken along line B-B of FIG. 65A.
Figure 66C:
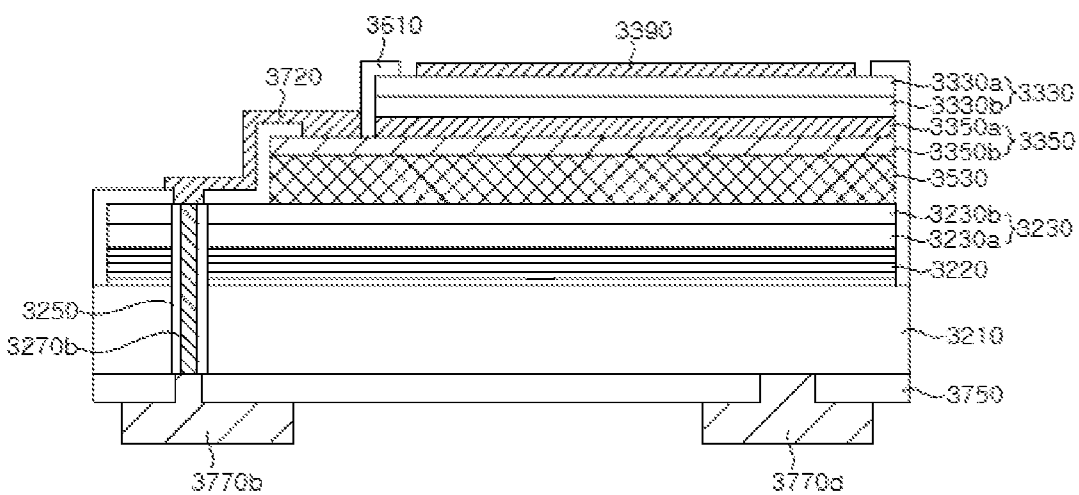
FIG. 66C is a schematic cross-sectional view taken along line C-C of FIG. 65A.
Figure 66D:
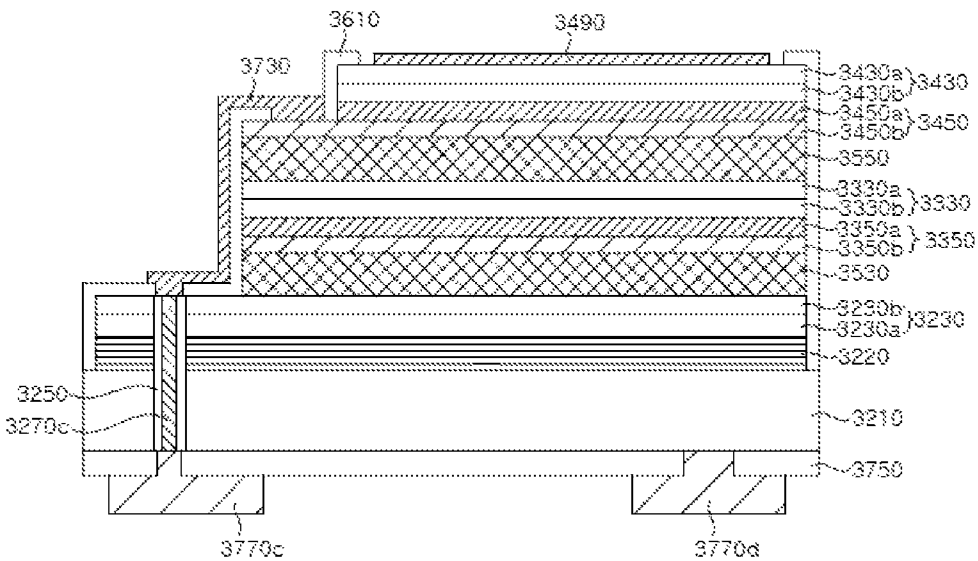
FIG. 66D is a schematic cross-sectional view taken along line D-D of FIG. 65A.

FIG. 65A and FIG. 65B are a top view and a bottom view of one pixel of a display apparatus according to an exemplary embodiment, and FIG. 66A, FIG. 66B, FIG. 66C, and FIG. 66D are schematic cross-sectional views taken along lines A-A, B-B, C-C, and D-D of FIG. 65A, respectively.

In the display apparatus, pixels are arranged on a circuit board 3510 (see FIG. 62) and each of the pixel includes a substrate 3210 and subpixels R, G, and B. The substrate 3210 may be continuous over the plurality of pixels. Hereinafter, a configuration of a pixel according to an exemplary embodiment will be described.

Referring to FIG. 65A, FIG. 65B, FIG. 66A, FIG. 66B, FIG. 66C, and FIG. 66D, the pixel includes a substrate 3210, a distributed Bragg reflector 3220, an insulation layer 3250, through-hole vias 3270*a*, 3270*b*, 3270*c*, a first LED stack 3230, a second LED stack 3330, a third LED stack 3430, a first-1 ohmic electrode 3290*a*, a first-2 ohmic electrode 3290*b*, a second-1 ohmic electrode 3390, a second-2 ohmic electrode 3350, a third-1 ohmic electrode 3490, a third-2 ohmic electrode 3450, a first bonding layer 3530, a second bonding layer 3550, an upper insulation layer 3610, connectors 3710, 3720, 3730, a lower insulation layer 3750, and electrode pads 3770*a*, 3770*b*, 3770*c*, 3770*d*.

Each of subpixels R, G, and B includes the LED stacks 3230, 3330, and 3430 and ohmic electrodes. In addition, anodes of the first to third subpixels R, G, and B may be electrically connected to the electrode pads 3770*a*, 3770*b*, and 3770*c*, respectively, and cathodes thereof may be electrically connected to the electrode pad 3770*d*, thereby allowing the first to third subpixels R, G, and B to be driven independently.

The substrate 3210 supports the LED stacks 3230, 3330, and 3430. The substrate 3210 may be a growth substrate on which AlGaInP-based semiconductor layers may be grown thereon, for example, a GaAs substrate. In particular, the substrate 3210 may be a semiconductor substrate exhibiting n-type conductivity.

The first LED stack 3230 includes a first conductivity type semiconductor layer 3230*a* and a second conductivity type semiconductor layer 3230*b*, the second LED stack 3330 includes a first conductivity type semiconductor layer 3330*a* and a second conductivity type semiconductor layer 3330*b*, and the third LED stack 3430 includes a first conductivity type semiconductor layer 3430*a* and a second conductivity type semiconductor layer 3430*b*. An active layer may be interposed between the first conductivity type semiconductor layer 3230*a*, 3330*a*, or 3430*a* and the second conductivity type semiconductor layer 3230*b*, 3330*b*, or 3430*b*.

According to an exemplary embodiment, each of the first conductivity type semiconductor layers 3230*a*, 3330*a*, 3430*a* may be an n-type semiconductor layer, and each of the second conductivity type semiconductor layers 3230*b*, 3330*b*, 3430*b* may be a p-type semiconductor layer. A roughened surface may be formed on an upper surface of each of the first conductivity type semiconductor layers 3230*a*, 3330*a*, 3430*a* by surface texturing. However, the inventive concepts are not limited thereto and the first and second conductivity types can be changed vice versa.

The first LED stack 3230 is disposed near the support substrate 3210, the second LED stack 3330 is disposed on the first LED stack 3230, and the third LED stack 3430 is disposed on the second LED stack 3330. The second LED stack 3330 is disposed in some region on the first LED stack 3230, so that the first LED stack 3230 partially overlaps the second LED stack 3330. The third LED stack 3430 is disposed in some region on the second LED stack 3330, so that the second LED stack 3330 partially overlaps the third LED stack 3430. Accordingly, light generated from the first LED stack 3230 can be emitted to the outside without passing through the second and third LED stacks 3330 and 3430. In addition, light generated from the second LED stack 3330 can be emitted to the outside without passing through the third LED stack 3430.

Materials for the first LED stack 3230, the second LED stack 3330, and the third LED stack 3430 are substantially the same as those described with reference to FIG. 63, and thus, detailed descriptions thereof will be omitted to avoid redundancy.

The distributed Bragg reflector 3220 is interposed between the substrate 3210 and the first LED stack 3230. The distributed Bragg reflector 3220 may include a semiconductor layer grown on the substrate 3210. For example, the distributed Bragg reflector 3220 may be formed by alternately stacking AlAs layers and AlGaAs layers. The distributed Bragg reflector 3220 may include a semiconductor layer that electrically connects the substrate 3210 to the first conductivity type semiconductor layer 3230*a* of the first LED stack 3230.

Through-hole vias 3270*a*, 3270*b*, 3270*c* are formed through the substrate 3210. The through-hole vias 3270*a*, 3270*b*, 3270*c* may be formed to pass through the first LED stack 3230. The through-hole vias 3270*a*, 3270*b*, 3270*c* may be formed of conductive pastes or by plating.

The insulation layer 3250 is disposed between the through-hole vias 3270*a*, 3270*b*, and 3270*c* and an inner wall of a through-hole formed through the substrate 3210 and the first LED stack 3230 to prevent short circuit between the first LED stack 3230 and the substrate 3210.

The first-1 ohmic electrode 3290*a* forms ohmic contact with the first conductivity type semiconductor layer 3230*a* of the first LED stack 3230. The first-1 ohmic electrode 3290*a* may be formed of, for example, Au—Te or Au—Ge alloys.

In order to form the first-1 ohmic electrode 3290*a*, the second conductivity type semiconductor layer 3230*b* and the active layer may be partially removed to expose the first conductivity type semiconductor layer 3230*a*. The first-1 ohmic electrode 3290*a* may be disposed apart from the region where the second LED stack 3330 is disposed. Furthermore, the first-1 ohmic electrode 3290 may include a pad region and an extension, and the connector 3710 may be connected to the pad region of the first-1 ohmic electrode 3290, as shown in FIG. 65A.

The first-2 ohmic electrode 3290*b* forms ohmic contact with the second conductivity type semiconductor layer 3230*b* of the first LED stack 3230. As shown in FIG. 65A, the first-2 ohmic electrode 3290*b* may be formed to partially surround the first-1 ohmic electrode 3290*a* in order to assist in current spreading. The first-2 ohmic electrode 3290*b* may not include the extension. The first-2 ohmic electrode 3290*b* may be formed of, for example, Au—Zn or Au—Be alloys. Furthermore, the first-2 ohmic electrode 3290*b* may have a single layer or multiple layers structure.

The first-2 ohmic electrode 3290*b* may be connected to the through-hole via 3270*a* such that the through-hole via 3270*a* can be electrically connected to the second conductivity type semiconductor layer 3230*b*.

The second-1 ohmic electrode 3390 forms ohmic contact with the first conductivity type semiconductor layer 3330*a* of the second LED stack 3330. The second-1 ohmic electrode 3390 may also include a pad region and an extension. As shown in FIG. 65A, the connector 3710 may electrically connect the second-1 ohmic electrode 3390 to the first-1 ohmic electrode 3290*a*. The second-1 ohmic electrode 3390 may be disposed apart from the region where the third LED stack 3430 is disposed.

The second-2 ohmic electrode 3350 forms ohmic contact with the second conductivity type semiconductor layer 3330*b* of the second LED stack 3330. The second-2 ohmic electrode 3350 may include a reflective layer 3350*a* and a barrier layer 3350*b*. The reflective layer 3350*a* reflects light generated from the second LED stack 3330 to improve luminous efficacy of the second LED stack 3330. The barrier layer 3350*b* may act as a connection pad, which provides the reflective layer 3350*a*, and is connected to the connector 3720. Although the second-2 ohmic electrode 3350 is described as including a metal layer in this exemplary embodiment, the inventive concepts are not limited thereto. For example, the second-2 ohmic electrode 3350 may be formed of a transparent conductive oxide, such as a conducive oxide semiconductor layer.

The third-1 ohmic electrode 3490 forms ohmic contact with the first conductivity type semiconductor layer 3430*a* of the third LED stack 3430. The third-1 ohmic electrode 3490 may also include a pad region and an extension, and the connector 3710 may connect the third-1 ohmic electrode 3490 to the first-1 ohmic electrode 3290*a*, as shown in FIG. 65A.

The third-2 ohmic electrode 3450 may form ohmic contact with the second conductivity type semiconductor layer 3430*b* of the third LED stack 3430. The third-2 ohmic electrode 3450 may include a reflective layer 3450*a* and a barrier layer 3450*b*. The reflective layer 3450*a* reflects light generated from the third LED stack 3430 to improve luminous efficacy of the third LED stack 3430. The barrier layer 3450*b* may act as a connection pad, which provides the reflective layer 3450*a*, and is connected to the connector 3730. Although the third-2 ohmic electrode 3450 is described as including a metal layer, the inventive concepts are not limited thereto. Alternatively, the third-2 ohmic electrode 3450 may be formed of a transparent conductive oxide, such as a conducive oxide semiconductor layer.

The first-2 ohmic electrode 3290*b*, the second-2 ohmic electrode 3350, and the third-2 ohmic electrode 3450 may form ohmic contact with the p-type semiconductor layers of the corresponding LED stacks to assist in current spreading, and the first-1 ohmic electrode 3290*a*, the second-1 ohmic electrode 3390, and the third-1 ohmic electrode 3490 may form ohmic contact with the n-type semiconductor layers of the corresponding LED stacks to assist in current spreading.

The first bonding layer 3530 couples the second LED stack 3330 to the first LED stack 3230. As shown in the drawings, the second-2 ohmic electrode 3350 may adjoin the first bonding layer 3530. The first bonding layer 3530 may be a light transmissive layer or an opaque layer. The first bonding layer 3530 may be formed of an organic material or an inorganic material. Examples of the organic material may include SU8, poly(methyl methacrylate) (PMMA), polyimide, Parylene, benzocyclobutene (BCB), or others, and examples of the inorganic material may include $Al_2O_3$, $SiO_2$, $SiN_x$, or others. The organic material layer may be bonded under high vacuum, and the inorganic material layer may be bonded under high vacuum after flattening the surface of the first bonding layer by, for example, chemical mechanical polishing, followed by adjusting surface energy through plasma treatment. The first bonding layer 3530 may be formed of spin-on-glass or may be a metal bonding layer formed of AuSn or the like. For the metal bonding layer, an insulation layer may be disposed on the first LED stack 3230 to secure electrical insulation between the first LED stack 3230 and the metal bonding layer. Furthermore, a reflective layer may be further disposed between the first bonding layer 3530 and the first LED stack 3230 to prevent light generated from the first LED stack 3230 from entering the second LED stack 3330.

The second bonding layer 3550 couples the second LED stack 3330 to the third LED stack 3430. The second bonding layer 3550 may be interposed between the second LED stack 3330 and the third-2 ohmic electrode 3450 to bond the second LED stack 3330 to the third-2 ohmic electrode 3450. The second bonding layer 3550 may be formed of substantially the same bonding material as the first bonding layer 3530. Furthermore, an insulation layer and/or a reflective layer may be further disposed between the second LED stack 3330 and the second bonding layer 3550.

When the first bonding layer 3530 and the second bonding layer 3550 are formed of a light transmissive material, and the second-2 ohmic electrode 3350 and the third-2 ohmic electrode 3450 are formed of a transparent oxide material, some fractions of light generated from the first LED stack 3230 may be emitted through the second LED stack 3330 after passing through the first bonding layer 3530 and the second-2 ohmic electrode 3350, and may also be emitted through the third LED stack 3430 after passing through the second bonding layer 3550 and the third-2 ohmic electrode 3450. In addition, some fractions of light generated from the second LED stack 3330 may be emitted through the third LED stack 3430 after passing through the second bonding layer 3550 and the third-2 ohmic electrode 3450.

In this case, light generated from the first LED stack 3230 should be prevented from being absorbed by the second LED stack 3330 while passing through the second LED stack 3330. As such, light generated from the first LED stack 3230 may have a smaller bandgap than the second LED stack 3330, and thus, may have a longer wavelength than light generated from the second LED stack 3330.

In addition, in order to prevent light generated from the second LED stack 3330 from being absorbed by the third LED stack 3430 while passing through the third LED stack 3430, light generated from the second LED stack 3330 may have a longer wavelength than light generated from the third LED stack 3430.

When the first bonding layer 3530 and the second bonding layer 3550 are formed of opaque materials, the reflective layers are interposed between the first LED stack 3230 and the first bonding layer 3530, and between the second LED stack 3330 and the second bonding layer 3550, respectively, to reflect light having been generated from the first LED stack 3230 and entering the first bonding layer 3530, and light having been generated from the second LED stack 3330 and entering the second bonding layer 3550. The reflected light may be emitted through the first LED stack 3230 and the second LED stack 3330.

The upper insulation layer 3610 may cover the first to third LED stacks 3230, 3330, and 3430. In particular, the upper insulation layer 3610 may cover side surfaces of the second LED stack 3330 and the third LED stack 3430, and may also cover the side surface of the first LED stack 3230.

The upper insulation layer 3610 has openings that expose the first to third the through-hole vias 3270*a*, 3270*b*, 3270*c*, and openings that expose the first conductivity type semiconductor layer 3330*a* of the second LED stack 3330, the first conductivity type semiconductor layer 3430*a* of the third LED stack 3430, the second-2 ohmic electrode 3350, and the third-2 ohmic electrode 3450.

The upper insulation layer 3610 may be formed of any insulation material, for example, silicon oxide or silicon nitride, without being limited thereto.

The connector 3710 electrically connects the first-1 ohmic electrode 3290*a*, the second-1 ohmic electrode 3390, and the third-1 ohmic electrode 3490 to one another. The connector 3710 is formed on the upper insulation layer 3610, and is insulated from the second conductivity type semiconductor layer 3430*b* of the third LED stack 3430, the second conductivity type semiconductor layer 3330*b* of the second LED stack 3330, and the second conductivity type semiconductor layer 3230*b* of the first LED stack 3230.

The connector 3710 may be formed of substantially the same material as the second-1 ohmic electrode 3390 and the third-1 ohmic electrode 3490, and thus, may be formed together with the second-1 ohmic electrode 3390 and the third-1 ohmic electrode 3490. Alternatively, the connector 3710 may be formed of a different conductive material from the second-1 ohmic electrode 3390 or the third-1 ohmic electrode 3490, and thus, may be separately formed in a different process from the second-1 ohmic electrode 3390 and/or the third-1 ohmic electrode 3490.

The connector 3720 may electrically connect the second-1 ohmic electrode 3350, for example, the barrier layer 3350*b*, to the second through-hole via 3270*b*. The connector 3730 electrically connects the third-1 ohmic electrode, for example, the barrier layer 3450*b*, to the third through-hole via 3270*c*. The connector 3720 may be electrically insulated from the first LED stack 3230 by the upper insulation layer 3610. The connector 3730 may also be electrically insulated from the second LED stack 3330 and the first LED stack 3230 by the upper insulation layer 3610.

The connectors 3720, 3730 may be formed together by the same process. The connector 3720, 3730 may also be formed together with the connector 3710. Furthermore, the connectors 3720, 3730 may be formed of substantially the same material as the second-1 ohmic electrode 3390 and the third-1 ohmic electrode 3490, and may be formed together therewith. Alternatively, the connectors 3720, 3730 may be formed of a different conductive material from the second-1 ohmic electrode 3390 or the third-1 ohmic electrode 3490, and thus may be separately formed by a different process from the second-1 ohmic electrode 3390 and/or the third-1 ohmic electrode 3490.

The lower insulation layer 3750 covers a lower surface of the substrate 3210. The lower insulation layer 3750 may include openings which expose the first to third through-hole vias 3270*a*, 3270*b*, 3270*c* at a lower side of the substrate 3210, and may also include openings which expose the lower surface of the substrate 3210.

The electrode pads 3770*a*, 3770*b*, 3770*c*, and 3770*d* are disposed on the lower surface of the substrate 3210. The electrode pads 3770*a*, 3770*b*, and 3770*c* are connected to the through-hole vias 3270*a*, 3270*b*, and 3270*c* through the openings of the insulation layer 3750, and the electrode pad 3770*d* is connected to the substrate 3210.

The electrode pads 3770*a*, 3770*b*, and 3770*c* are provided to each pixel to be electrically connected to the first to third LED stacks 3230, 3330, and 3430 of each pixel, respectively. Although the electrode pad 3770*d* may also be provided to each pixel, the substrate 3210 is continuously disposed over a plurality of pixels, which may obviate the need for providing the electrode pad 3770*d* to each pixel.

The electrode pads 3770*a*, 3770*b*, 3770*c*, 3770*d* are bonded to the circuit board 3510, thereby providing a display apparatus.

Next, a method of manufacturing the display apparatus according to an exemplary embodiment will be described.

Figure 67A:
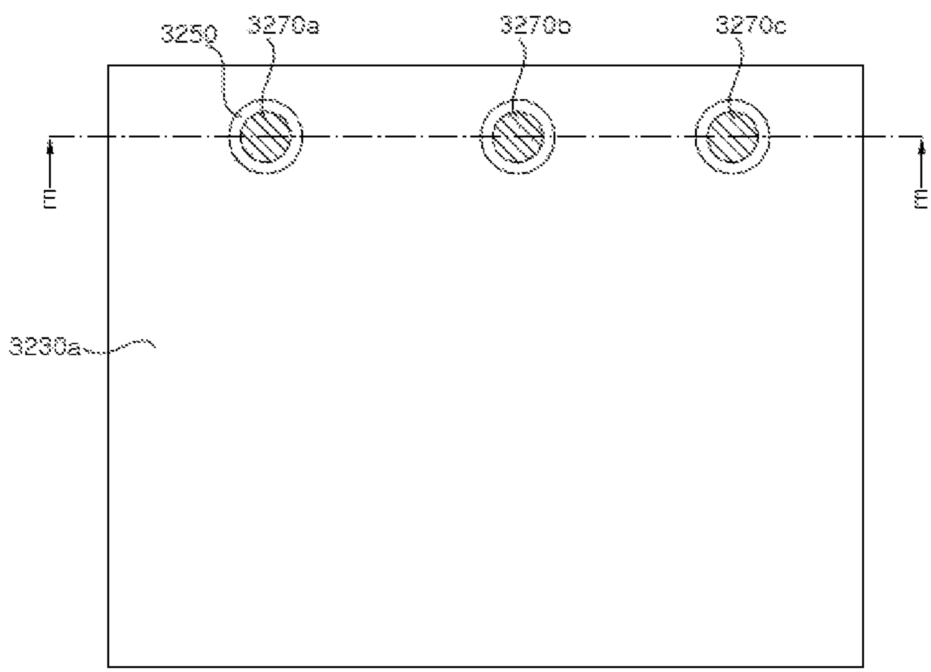
FIGS. 67A, 67B, 68A, 68B, 69A, 69B, 70A, 70B, 71A, 71B, 72A, 72B, 73A, 73B, 74A, and 74B are schematic plan views and cross-sectional view illustrating a method of manufacturing a display apparatus according to an exemplary embodiment.
Figure 67B:
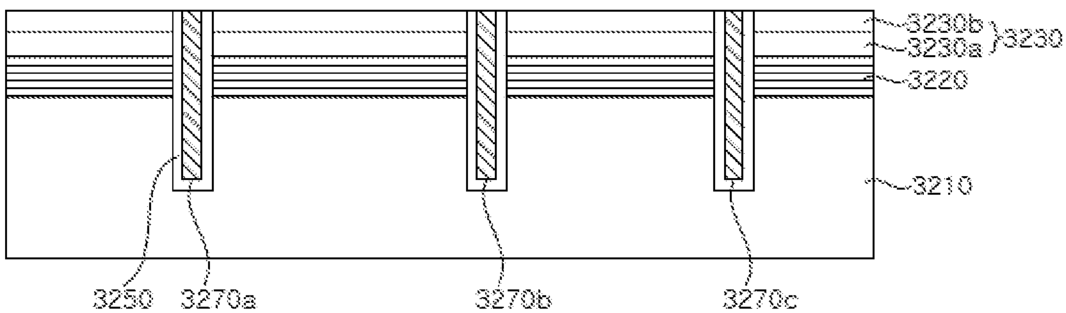

FIG. 67A to FIG. 67B are a schematic plan view and a cross-sectional view illustrating a method of manufacturing the display apparatus according to an exemplary embodiment. Each of the cross-sectional views is taken along a line shown in each corresponding plan view.

Referring to FIGS. 67A and 67B, a first LED stack 3230 is grown on a substrate 3210. The substrate 3210 may be, for example, a GaAs substrate. The first LED stack 3230 is formed of AlGaInP-based semiconductor layers, and includes a first conductivity type semiconductor layer 3230*a*, an active layer, and a second conductivity type semiconductor layer 3230*b*. A distributed Bragg reflector 3220 may be formed prior to growth of the first LED stack 3230. The distributed Bragg reflector 3220 may have a stack structure formed by repeatedly stacking, for example, AlAs/AlGaAs layers.

Then, grooves are formed on the first LED stack 3230 and the substrate 3210 through photolithography and etching. The grooves may be formed to pass through the substrate 3210 or may be formed to a predetermined depth in the substrate 3210, as shown in FIG. 67B.

Then, an insulation layer 3250 is formed to cover sidewalls of the grooves and through-hole vias 3270*a*, 3270*b*, 3270*c* are formed to fill the grooves. The through-hole vias 3270*a*, 3270*b*, and 3270*c* may be formed by, for example, forming an insulation layer to cover the sidewalls of the grooves, filling the groove with a conductive material layer or conductive pastes through plating, and removing the insulation and the conductive material layer from an upper surface of the first LED stack 3230 through chemical mechanical polishing.

Figure 68A:
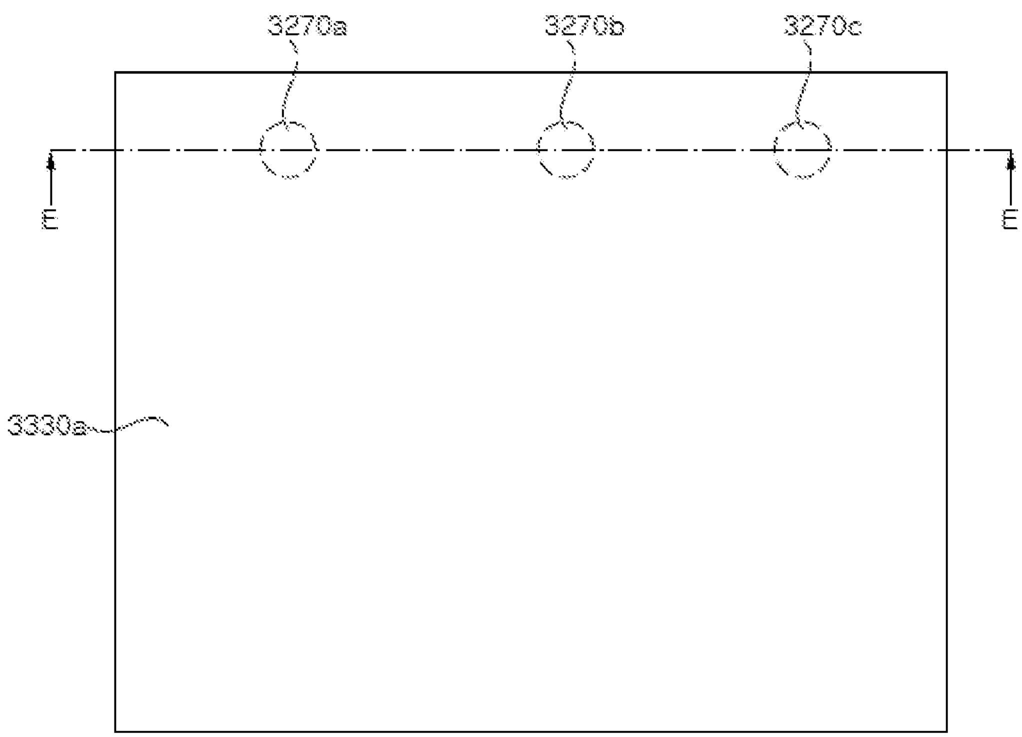
Figure 68B:
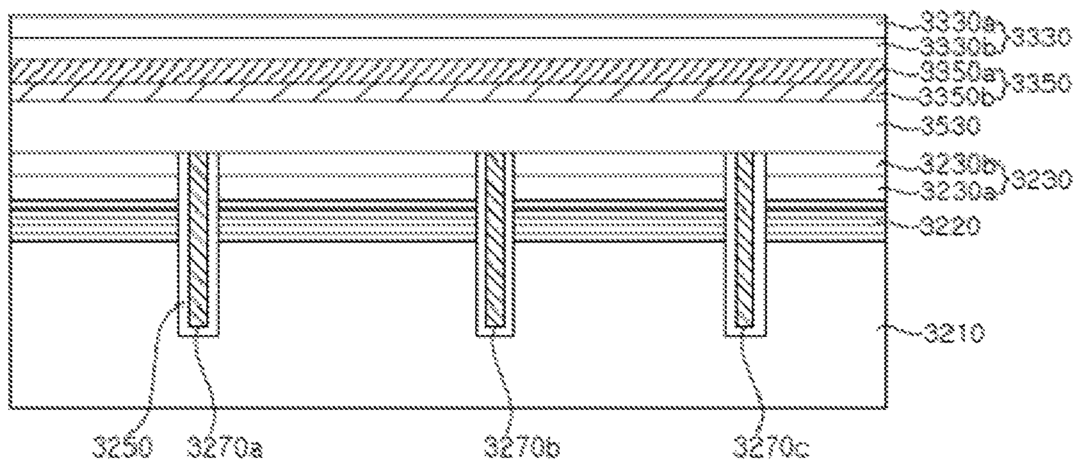

Referring to FIG. 68A and FIG. 68B, a second LED stack 3330 and a second-2 ohmic electrode 3350 may be coupled to the first LED stack 3230 via the first bonding layer 3530.

The second LED stack 3330 is grown on a second substrate, and the second-2 ohmic electrode 3350 is formed on the second LED stack 3330. The second LED stack 3330 is formed of AlGaInP-based or AlGaInN-based semiconductor layers, and may include a first conductivity type semiconductor layer 3330*a*, an active layer, and a second conductivity type semiconductor layer 3330*b*. The second substrate may be a substrate on which AlGaInP-based semiconductor layers may be grown thereon, for example, a GaAs substrate, or a substrate on which AlGaInN-based semiconductor layers may be grown thereon, for example, a sapphire substrate. The composition ratio of Al, Ga, and In for the second LED stack 3330 may be determined such that the second LED stack 3330 can emit green light. The second-2 ohmic electrode 3350 forms ohmic contact with the second conductivity type semiconductor layer 3330*b*, for example, a p-type semiconductor layer. The second-2 ohmic electrode 3350 may include a reflective layer 3350*a*, which reflects light generated from the second LED stack 3330, and a barrier layer 3350*b*.

The second-2 ohmic electrode 3350 is disposed to face the first LED stack 3230 and is coupled to the first LED stack 3230 by the first bonding layer 3530. Thereafter, the second substrate is removed from the second LED stack 3330 to expose the first conductivity type semiconductor layer 3330*a* by chemical etching or laser lift-off. A roughened surface may be formed on the exposed first conductivity type semiconductor layer 3330*a* by surface texturing.

According to an exemplary embodiment, an insulation layer and a reflective layer may be further formed on the first LED stack 3230 before formation of the first bonding layer 3530.

Figure 69A:
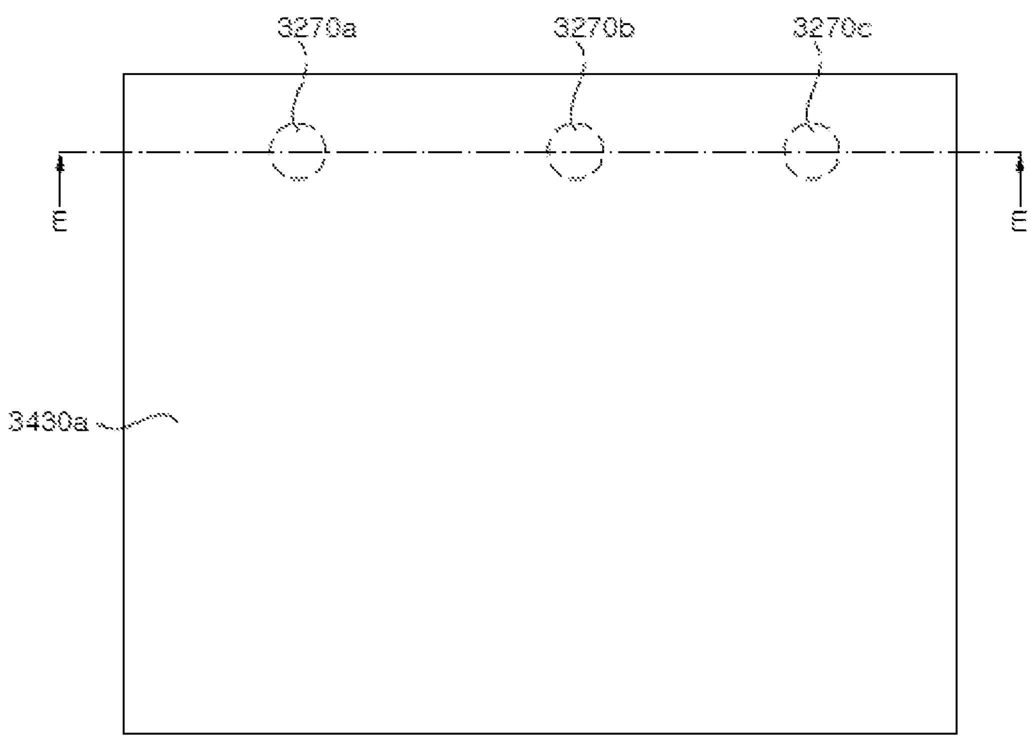
Figure 69B:
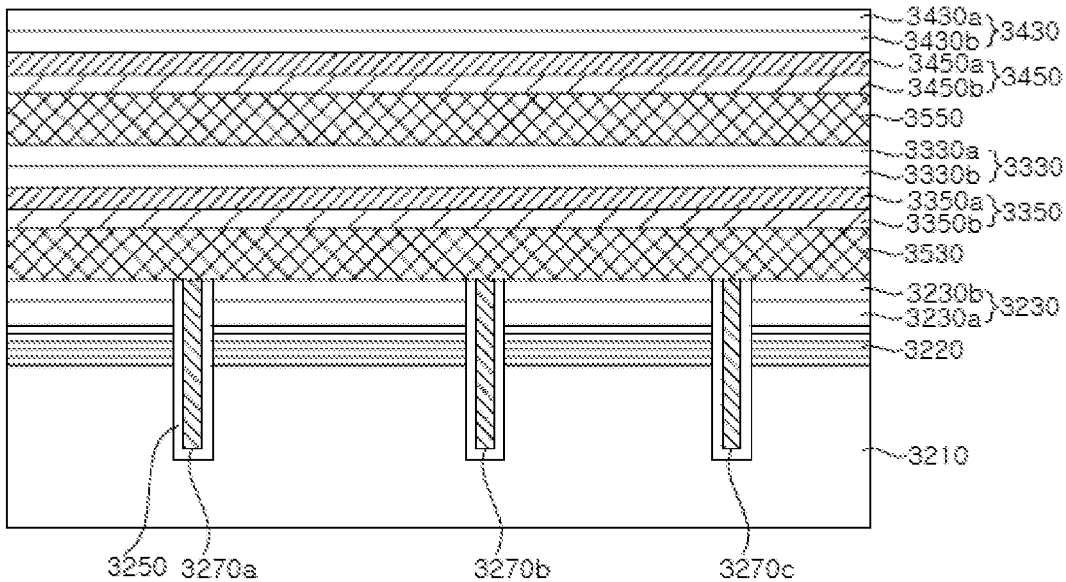

Referring to FIG. 69A and FIG. 69B, a third LED stack 3430 and a third-2 ohmic electrode 3450 may be coupled to the second LED stack 3330 via the second bonding layer 3550.

The third LED stack 3430 is grown on a third substrate, and the third-2 ohmic electrode 3450 is formed on the third LED stack 3430. The third LED stack 3430 is formed of AlGaInN-based semiconductor layers, and may include a first conductivity type semiconductor layer 3430*a*, an active layer, and a second conductivity type semiconductor layer 3430*b*. The third substrate is a substrate on which GaN-based semiconductor layers may be grown thereon, and is different from the first substrate 3210. The composition ratio of AlGaInN for the third LED stack 3430 may be determined such that the third LED stack 3430 can emit blue light. The third-2 ohmic electrode 3450 forms ohmic contact with the second conductivity type semiconductor layer 3430*b*, for example, a p-type semiconductor layer. The third-2 ohmic electrode 3450 may include a reflective layer 3450*a*, which reflects light generated from the third LED stack 3430, and a barrier layer 3450*b*.

The third-2 ohmic electrode 3450 is disposed to face the second LED stack 3330 and is coupled to the second LED stack 3330 by the second bonding layer 3550. Thereafter, the third substrate is removed from the third LED stack 3430 to expose the first conductivity type semiconductor layer 3430*a* by chemical etching or laser lift-off. A roughened surface may be formed on the exposed first conductivity type semiconductor layer 3430*a* by surface texturing.

According to an exemplary embodiment, an insulation layer and a reflective layer may be further formed on the second LED stack 3330 before formation of the second bonding layer 3550.

Figure 70A:
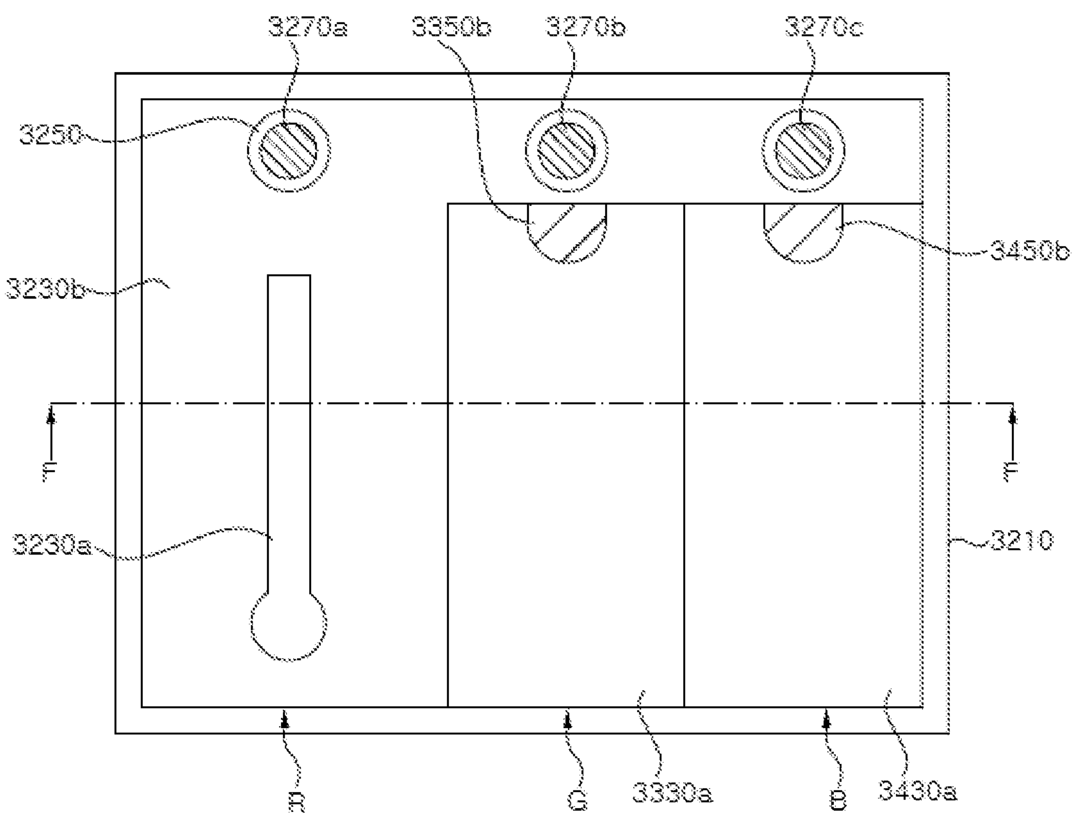
Figure 70B:
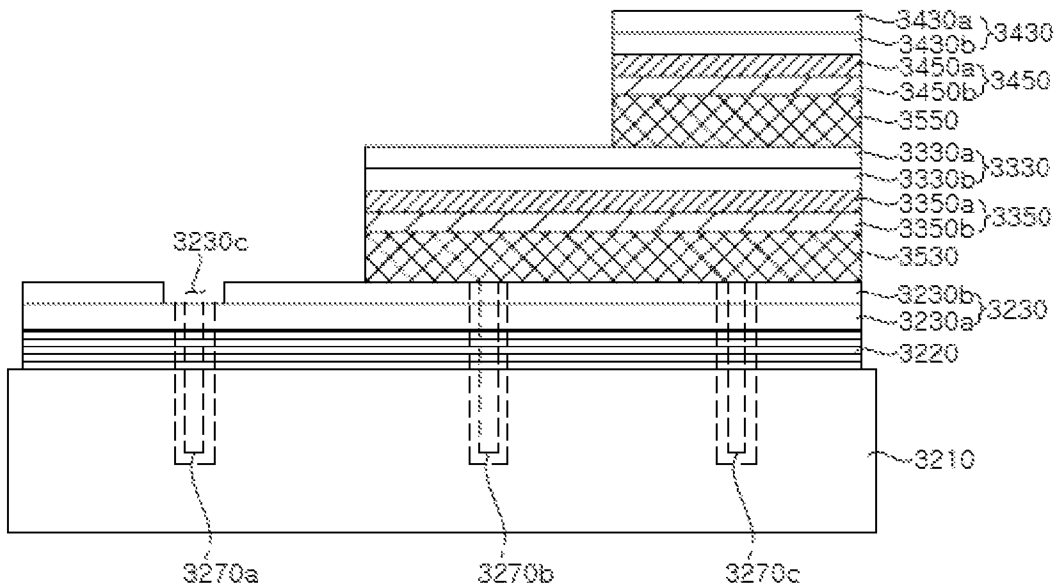

Referring to FIG. 70A and FIG. 70B, in each of pixel regions, the third LED stack 3430 is patterned to remove the third LED stack 3430 other than in the third subpixel B. In a region of the third subpixel B, an indentation is formed on the third LED stack 3430 to expose the barrier layer 3450*b* through the indentation.

Then, in regions other than the third subpixel B, the third-2 ohmic electrode 3450 and the second bonding layer 3550 are removed to expose the second LED stack 3330. As such, the third-2 ohmic electrode 3450 is restrictively placed near the region of the third subpixel B.

In each pixel region, the second LED stack 3330 is patterned to remove the second LED stack 3330 in regions other than the second subpixel G. In the region of the second subpixel G, the second LED stack 3330 partially overlaps the third LED stack 3430.

By patterning the second LED stack 3330, the second-2 ohmic electrode 3350 is exposed. The second LED stack 3330 may include an indentation, and the second-2 ohmic electrode 3350, for example, the barrier layer 3350*b*, may be exposed through the indentation.

Thereafter, the second-2 ohmic electrode 3350 and the first bonding layer 3530 are removed to expose the first LED stack 3230. As such, the second-2 ohmic electrode 3350 is disposed near the region of the second subpixel G. On the other hand, the first to third through-hole vias 3270*a*, 3270*b*, and 3270*c* are also exposed together with the first LED stack 3230.

In each pixel region, the first conductivity type semiconductor layer 3230*a* is exposed by patterning the second conductivity type semiconductor layer 3230*b* of the first LED stack 3230. As shown in FIG. 70A, the first conductivity type semiconductor layer 3230*a* may be exposed in an elongated shape, without being limited thereto.

Furthermore, the pixel regions are divided from one another by patterning the first LED stack 3230. As such, a region of the first subpixel R is defined. Here, the distributed Bragg reflector 3220 may also be divided. Alternatively, the distributed Bragg reflector 3220 may be continuously disposed over the plurality of pixels, rather than being divided. Further, the first conductivity type semiconductor layer 3230*a* may also be continuously disposed over the plurality of pixels.

Figure 71A:
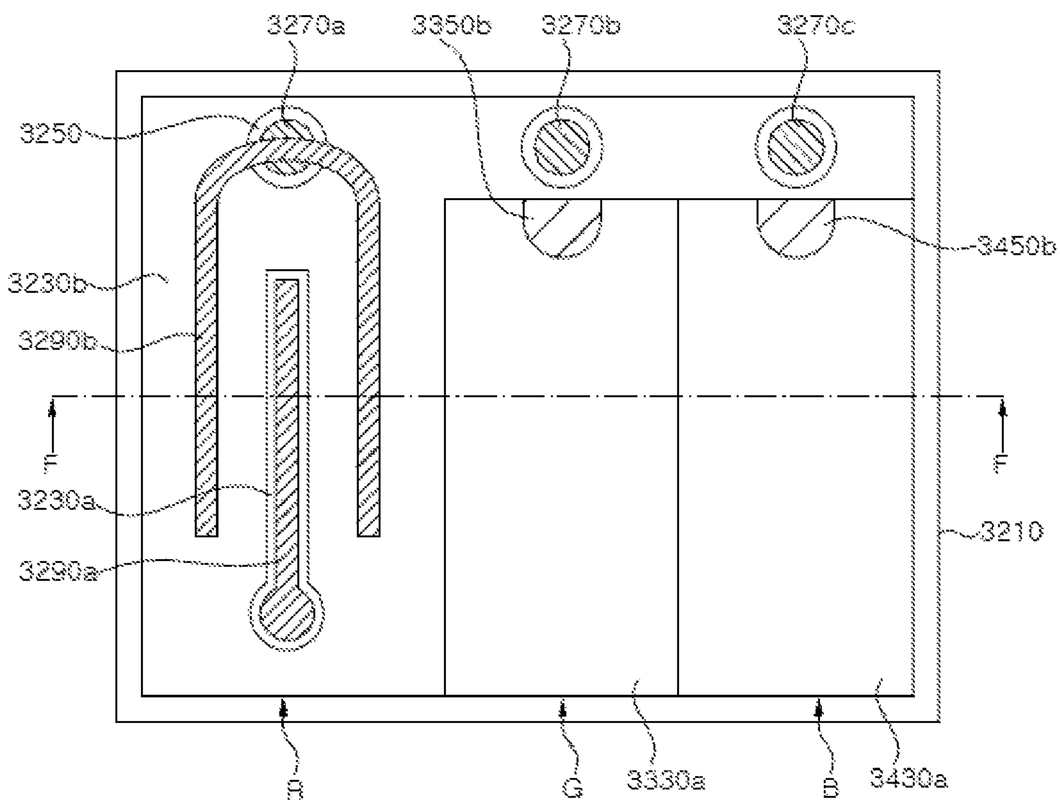
Figure 71B:
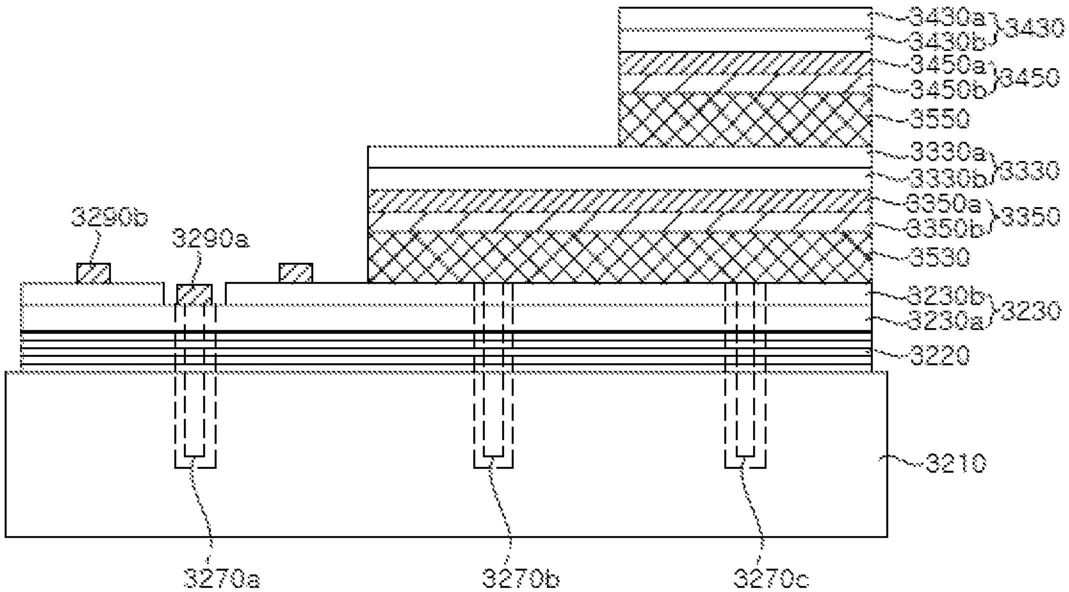

Referring to FIG. 71A and FIG. 71B, a first-1 ohmic electrode 3290*a* and a first-2 ohmic electrode 3290*b* are formed on the first LED stack 3230. The first-1 ohmic electrode 3290*a* may be formed of, for example, Au—Te or Au—Ge alloys on the exposed first conductivity type semiconductor layer 3230*a*. The first-2 ohmic electrode 3290*b* may be formed of, for example, Au—Be or Au—Zn alloys on the second conductivity type semiconductor layer 3230*b*. The first-2 ohmic electrode 3290*b* may be formed prior to the first-1 ohmic electrode 3290*a*, or vice versa. The first-2 ohmic electrode 3290*b* may be connected to the first through-hole via 3270*a*. On the other hand, the first-1 ohmic electrode 3290*a* may include a pad region and an extension, which may extend from the pad region towards the first through-hole via 3270*a*.

For current spreading, the first-2 ohmic electrode 3290*b* may be disposed to at least partially surround the first-1 ohmic electrode 3290*a*. Although each of the first-1 ohmic electrode 3290*a* and the first-2 ohmic electrode 3290*b* is being illustrated as having an elongated shape in FIG. 71A, the inventive concepts are not limited thereto. Alternatively, each of the first-1 ohmic electrode 3290*a* and the first-2 ohmic electrode 3290*b* may have a circular shape, for example.

Figure 72A:
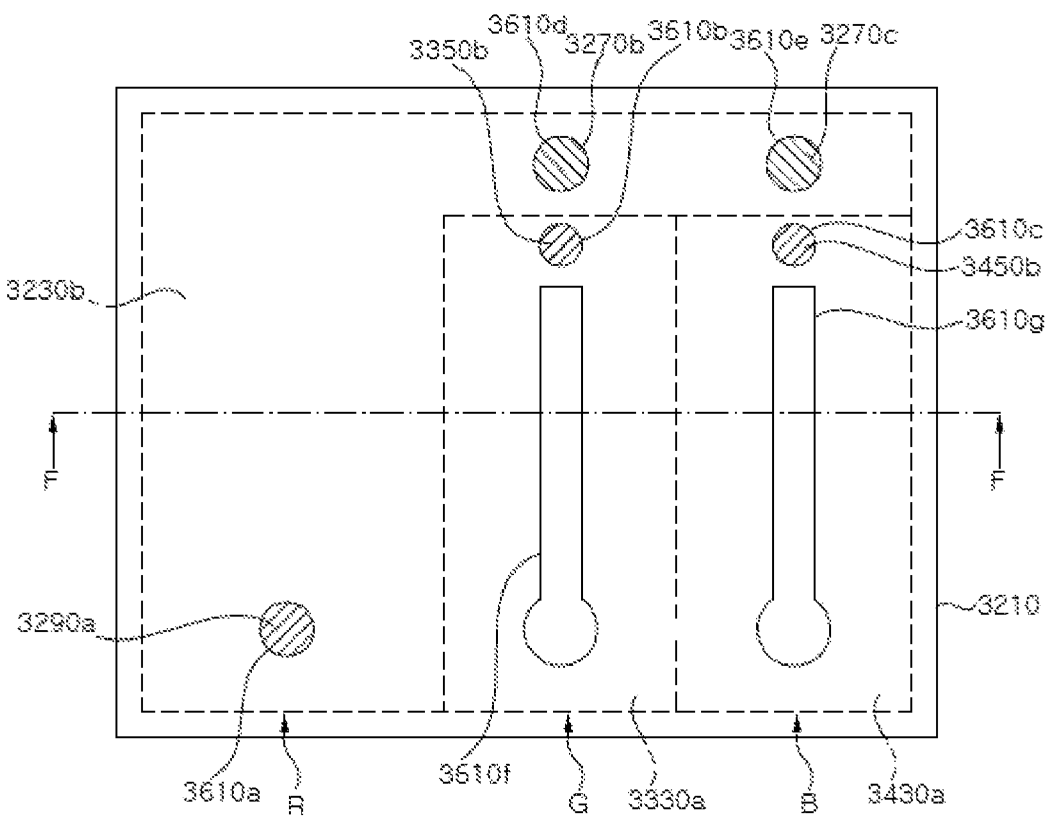
Figure 72B:
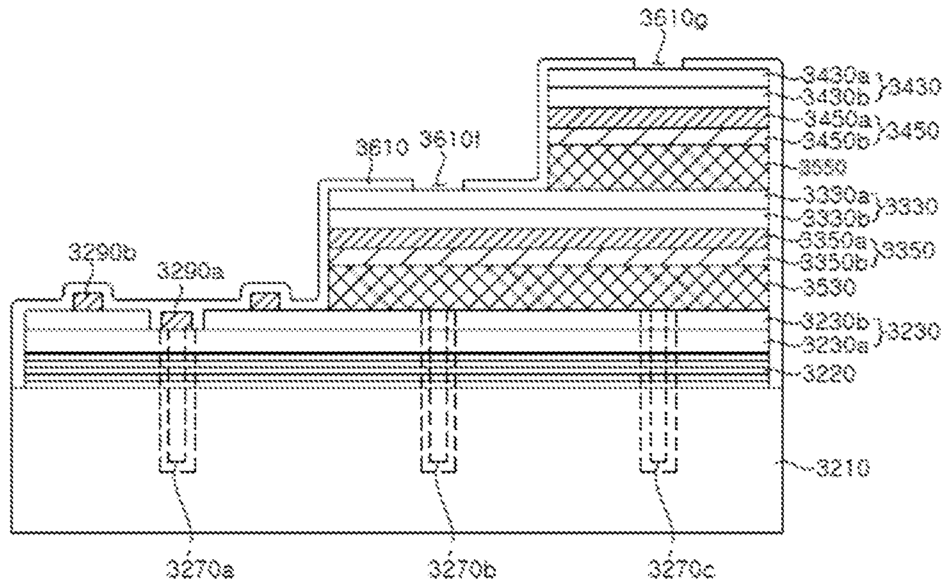

Referring to FIG. 72A and FIG. 72B, an upper insulation layer 3610 is formed to cover the first to third LED stacks 3230, 3330, 3430. The upper insulation layer 3610 may cover the first-1 ohmic electrode 3290*a* and the first-2 ohmic electrode 3290*b*. The upper insulation layer 3610 may also cover side surfaces of the first to third LED stacks 3230, 3330, and 3430, and a side surface of the distributed Bragg reflector 3220.

The upper insulation layer 3610 may have an opening 3610*a* which exposes the first-1 ohmic electrode 3290*a*, openings 3610*b*, 3610*c* which expose the barrier layers 3350*b*, 3450*b*, openings 3610*d*, 3610*e* which expose the second and third through-hole vias 3270*b*, 3270*c*, and openings 3610*f*, 3610*g* which expose the first conductivity type semiconductor layers 3330*a*, 3430*a* of the second LED stack 3330 and the third LED stack 3430.

Figure 73A:
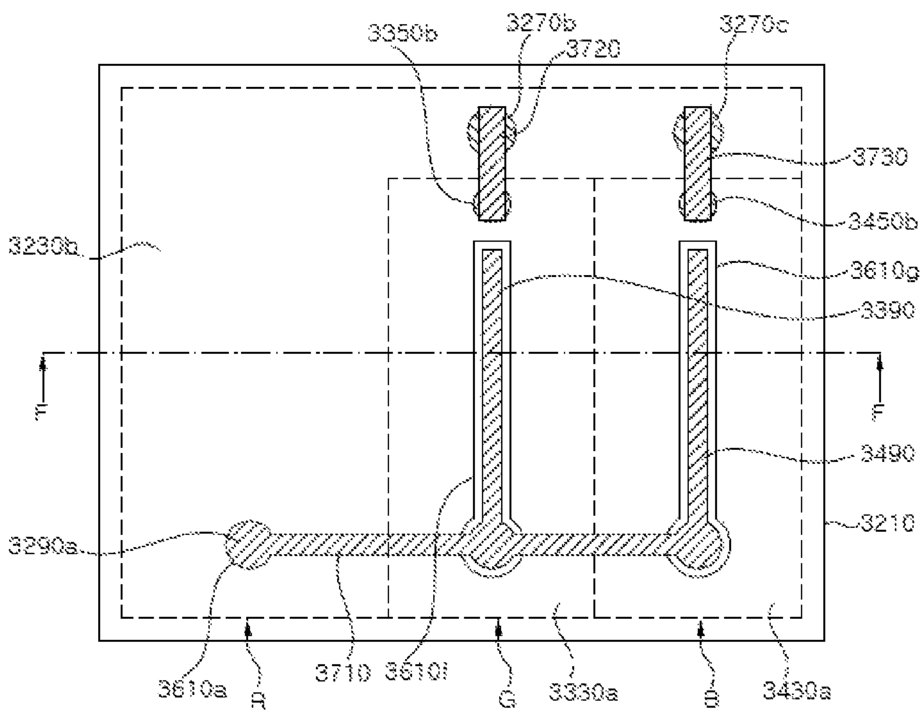
Figure 73B:
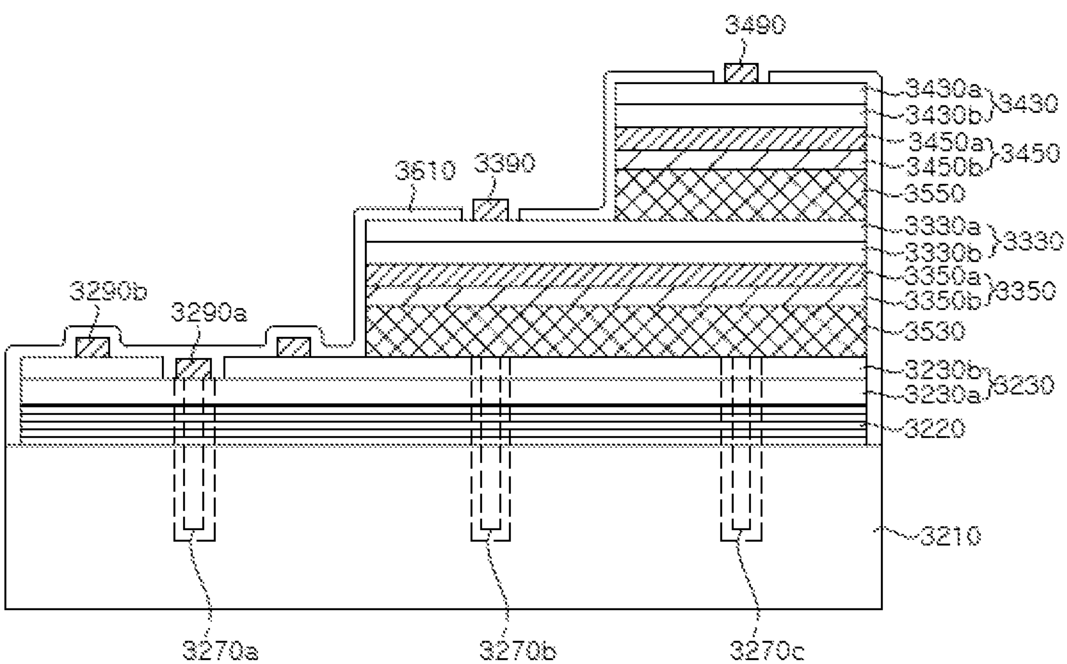

Referring to FIG. 73A and FIG. 73B, a second-1 ohmic electrode 3390, a third-1 ohmic electrode 3490 and connectors 3710, 3720, 3730 are formed. The second-1 ohmic electrode 3390 is formed in the opening 3610*f* to form ohmic contact with the first conductivity type semiconductor layer 3330*a*, and the third-1 ohmic electrode 3490 is formed in the opening 3610*g* to form ohmic contact with the first conductivity type semiconductor layer 3430*a*.

The connector 3710 electrically connects the second-1 ohmic electrode 3390 and the third-1 ohmic electrode 3490 to the first-1 ohmic electrode 3290*a*. The connector 3710 may be connected to, for example, the first-1 ohmic electrode 3290*a* exposed in the opening 3610*a*. The connector 3710 is formed on the upper insulation layer 3610 to be insulated from the second conductivity type semiconductor layers 3230*b*, 3330*b*, and 3430*b*.

The connector 3720 electrically connects the second-2 ohmic electrode 3350 to the second through-hole via 3270*b*, and the connector 3730 electrically connects the third-2 ohmic electrode 3450 to the third through-hole via 3270*c*. The connectors 3720, 3730 are disposed on the upper insulation layer 3610 to prevent short circuit to the first to third LED stacks 3230, 3330, and 3430.

The second-1 ohmic electrode 3390, the third-1 ohmic electrode 3490, and the connectors 3710, 3720, 3730 may be formed of substantially the same material by the same process. However, the inventive concepts are not limited thereto. Alternatively, the second-1 ohmic electrode 3390, the third-1 ohmic electrode 3490, and the connectors 3710, 3720, 3730 may be formed of different materials by different processes.

Figure 74A:
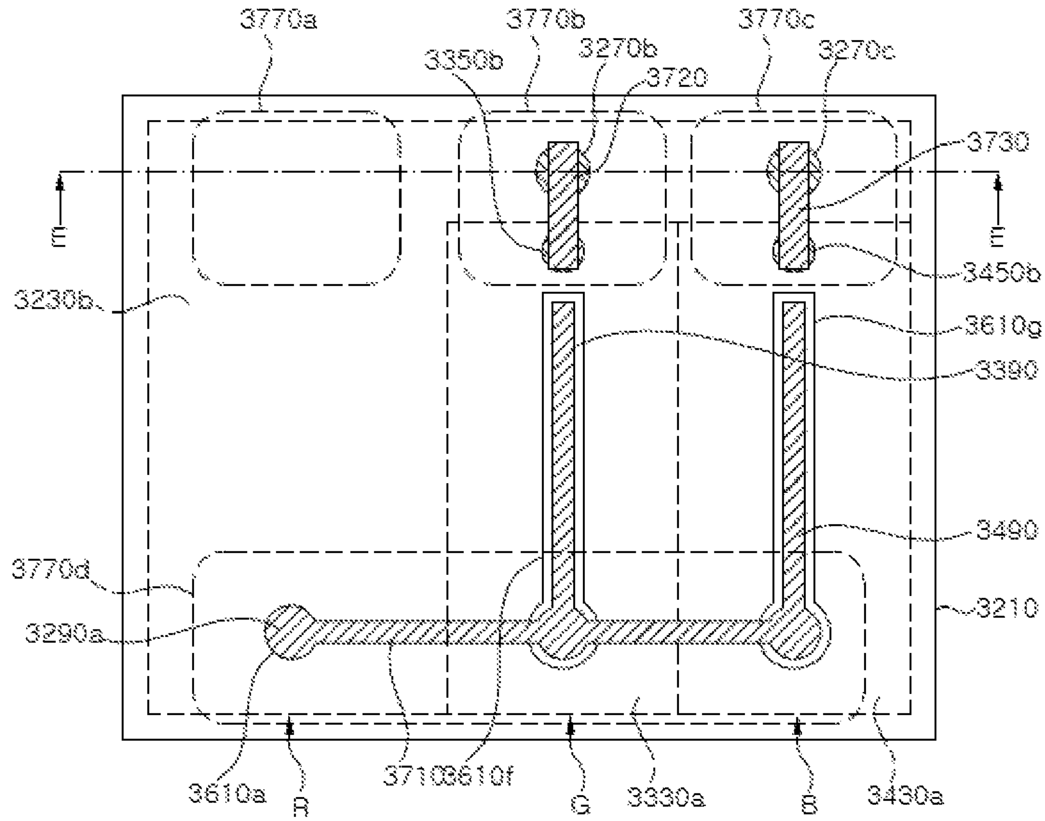
Figure 74B:
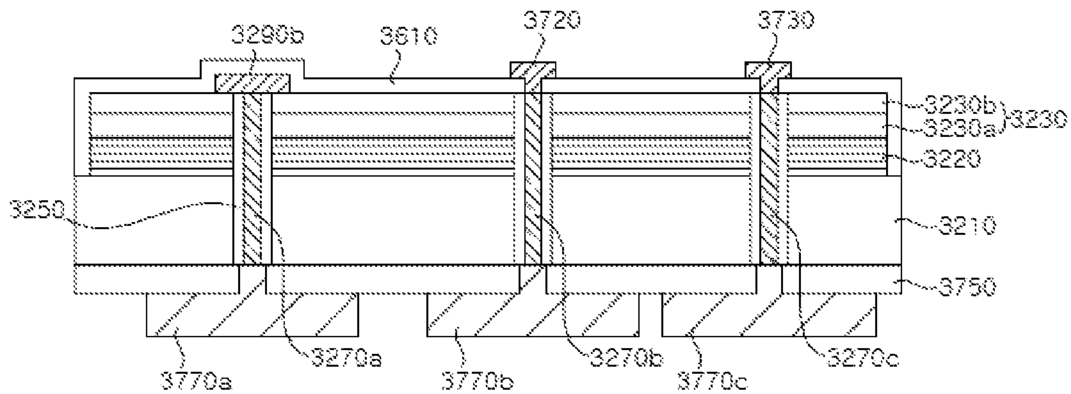

Thereafter, referring to FIG. 74A and FIG. 74B, a lower insulation layer 3750 is formed on a lower surface of the substrate 3210. The lower insulation layer 3750 has openings which expose the first to third the through-hole vias 3270*a*, 3270*b*, 3270*c*, and may also have opening(s) which expose the lower surface of the substrate 3210.

Electrode pads 3770*a*, 3770*b*, 3770*c*, 3770*d* are formed on the lower insulation layer 3750. The electrode pads 3770*a*, 3770*b*, 3770*c* are connected to the first to third the through-hole vias 3270*a*, 3270*b*, 3270*c*, respectively, and the electrode pad 3770*d* is connected to the substrate 3210.

Accordingly, the electrode pad 3770*a* is electrically connected to the second conductivity type semiconductor layer 3230*b* of the first LED stack 3230 through the first through-hole via 3270*a*, the electrode pad 3770*b* is electrically connected to the second conductivity type semiconductor layer 3330*b* of the second LED stack 3330 through the second through-hole via 3270*b*, and the electrode pad 3770*c* is electrically connected to the second conductivity type semiconductor layer 3430*b* of the third LED stack 3430 through the third through-hole via 3270*c*. The first conductivity type semiconductor layers 3230*a*, 3330*a*, 3430*a* of the first to third LED stacks 3230, 3330, 3430 are commonly electrically connected to the electrode pad 3770*d*.

In this manner, a display apparatus according to an exemplary embodiment may be formed by bonding the electrode pads 3770*a*, 3770*b*, 3770*c*, 3770*d* of the substrate 3210 to the circuit board 3510 shown in FIG. 62. As described above, the circuit board 3510 may include an active circuit or a passive circuit, whereby the display apparatus can be driven in an active matrix manner or in a passive matrix manner.

Figure 75:
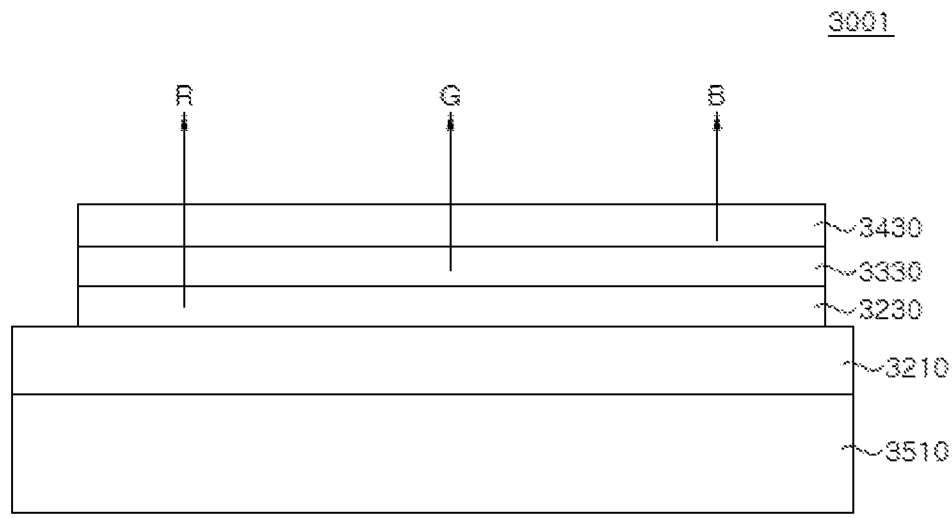
FIG. 75 is a schematic cross-sectional view of a light emitting diode pixel for a display according to another exemplary embodiment.

FIG. 75 is a cross-sectional view of a light emitting diode pixel for a display according to another exemplary embodiment.

Referring to FIG. 75, the light emitting diode pixel 3001 of the display apparatus according to an exemplary embodiment is generally similar to the light emitting diode pixel 3000 of the display apparatus of FIG. 63, except that the second LED stack 3330 covers most of the first LED stack 3230 and the third LED stack 3430 covers most of the second LED stack 3330. In this manner, light generated from the first subpixel R is emitted to the outside after substantially passing through the second LED stack 3330 and the third LED stack 3430, and light generated from the second LED stack 3330 is emitted to the outside after substantially passing through the third LED stack 3430.

The first LED stack 3230 may include an active layer having a narrower bandgap than the second LED stack 3330 and the third LED stack 3430 to emit light having a longer wavelength than the second LED stack 3330 and the third LED stack 3430, and the second LED stack 3330 may include an active layer having a narrower bandgap than the third LED stack 3430 to emit light having a longer wavelength than the third LED stack 3430.

Figure 76:
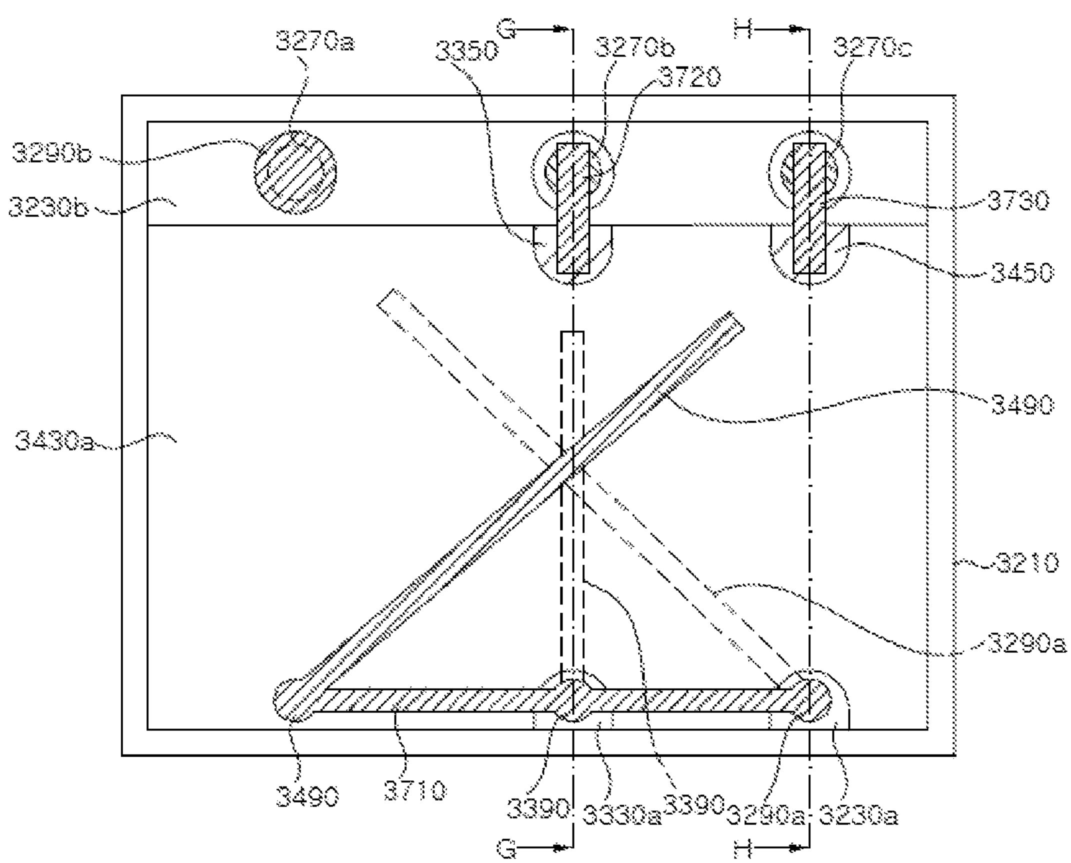
FIG. 76 is an enlarged top view of one pixel of a display apparatus according to an exemplary embodiment.
Figure 77A:
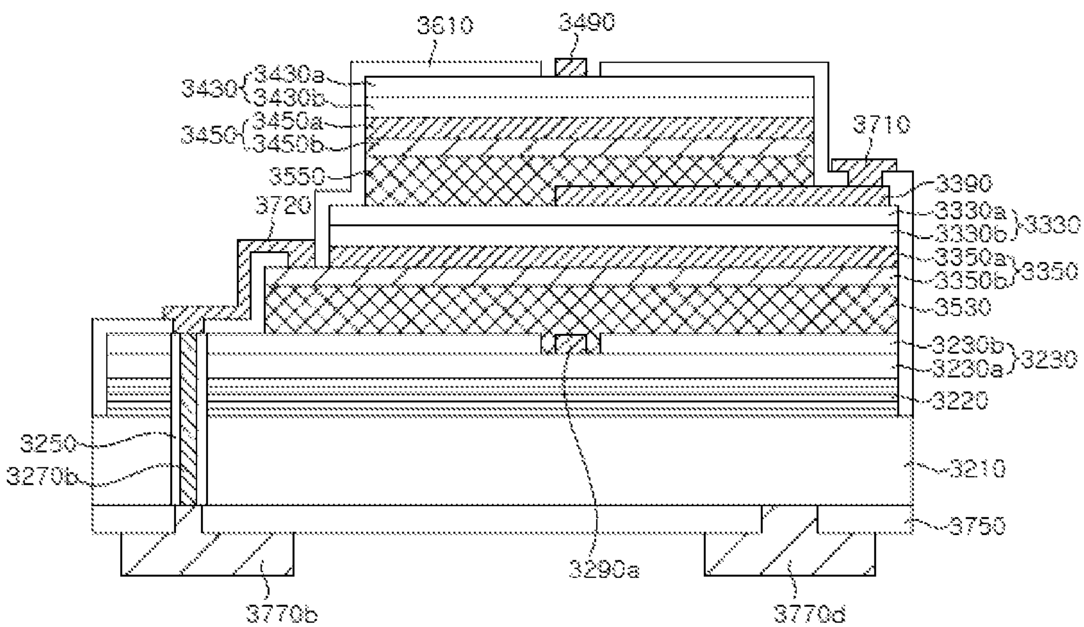
FIG. 77A and FIG. 77B are cross-sectional views taken along lines G-G and H-H in FIG. 76, respectively.
Figure 77B:
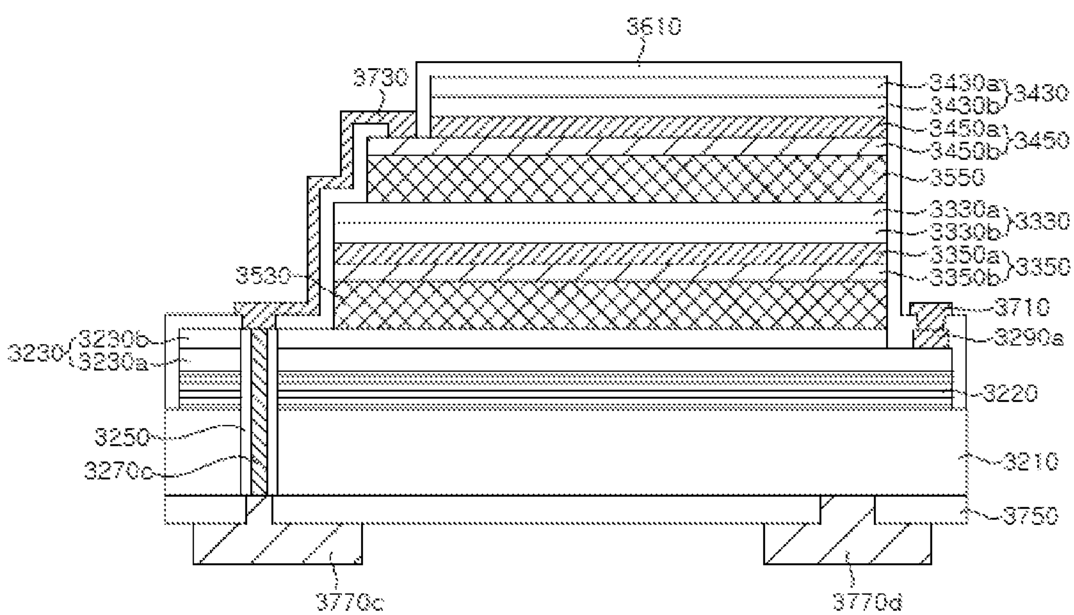

FIG. 76 is an enlarged top view of one pixel of a display apparatus according to an exemplary embodiment, and FIG. 77A and FIG. 77B are cross-sectional views taken along lines G-G and H-H of FIG. 76, respectively.

Referring to FIG. 76, FIG. 77A, and FIG. 77B, the pixel according to an exemplary embodiment is generally similar to the pixel of FIG. 65, FIG. 66A, FIG. 66B, and FIG. 66C, except that the second LED stack 3330 covers most of the first LED stack 3230 and the third LED stack 3430 covers most of the second LED stack 3330. The first to third through-hole vias 3270*a*, 3270*b*, 3270*c* may be disposed outside the second LED stack 3330 and the third LED stack 3430.

In addition, a portion of the first-1 ohmic electrode 3290*a* and a portion of the second-1 ohmic electrode 3390 may be disposed under the third LED stack 3430. As such, the first-1 ohmic electrode 3290*a* may be formed before the second LED stack 3330 is coupled to the first LED stack 3230, and the second-1 ohmic electrode 3390 may also be formed before the third LED stack 3430 is coupled to the second LED stack 3330.

Furthermore, light generated from the first LED stack 3230 is emitted to the outside after substantially passing through the second LED stack 3330 and the third LED stack 3430, and light generated from the second LED stack 3330 is emitted to the outside after substantially passing through the third LED stack 3430. Accordingly, the first bonding layer 3530 and the second bonding layer 3550 are formed of light transmissive materials, and the second-2 ohmic electrode 3350 and the third-2 ohmic electrode 3450 are composed of transparent conductive layers.

On the other hand, as shown in FIGS. 77A and 77B, an indentation may be formed on the third LED stack 3430 to expose the third-2 ohmic electrode 3450, and an indentation is continuously formed on the third LED stack 3430 and the second LED stack 3330 to expose the second-2 ohmic electrode 3350. The second-2 ohmic electrode 3350 and the third-2 ohmic electrode 3450 are electrically connected to the second through-hole via 3270*b*, and the third through-hole via 3270*c* through the connectors 3720, 3730, respectively.

Furthermore, the indentation may be formed on the third LED stack 3430 to expose the second-1 ohmic electrode 3390 formed on the first conductivity type semiconductor layer 3330*a* of the second LED stack 3330, and the indentation may be continuously formed on the third LED stack 3430 and the second LED stack 3330 to expose the first-1 ohmic electrode 3290*a* formed on the first conductivity type semiconductor layer 3230*a* of the first LED stack 3230. The connector 3710 may connect the first-1 ohmic electrode 3290*a* and the second-1 ohmic electrode 3390 to the third-1 ohmic electrode 3490. The third-1 ohmic electrode 3490 may be formed together with the connector 3710 and may be connected to the pad regions of the first-1 ohmic electrode 3290*a* and the second-1 ohmic electrode 3390.

The first-1 ohmic electrode 3290*a* and the second-1 ohmic electrode 3390 are partially disposed under the third LED stack 3430, but the inventive concepts are not limited thereto. For example, the portions of the first-1 ohmic electrode 3290*a* and the second-1 ohmic electrode 3390 disposed under the third LED stack 3430 may be omitted. Furthermore, the second-1 ohmic electrode 3390 may be omitted and the connector 3710 may form ohmic contact with the first conductivity type semiconductor layer 3330*a*.

According to exemplary embodiments, a plurality of pixels may be formed at the wafer level through wafer bonding, and thus, the process of individually mounting light emitting diodes may be obviated or substantially reduced.

Furthermore, since the through-hole vias 3270*a*, 3270*b*, 3270*c* are formed in the substrate 3210 and used as current paths, the substrate 3210 may not need to be removed. Accordingly, a growth substrate used for growth of the first LED stack 3230 can be used as the substrate 3210 without being removed from the first LED stack 3230.

Figure 78:
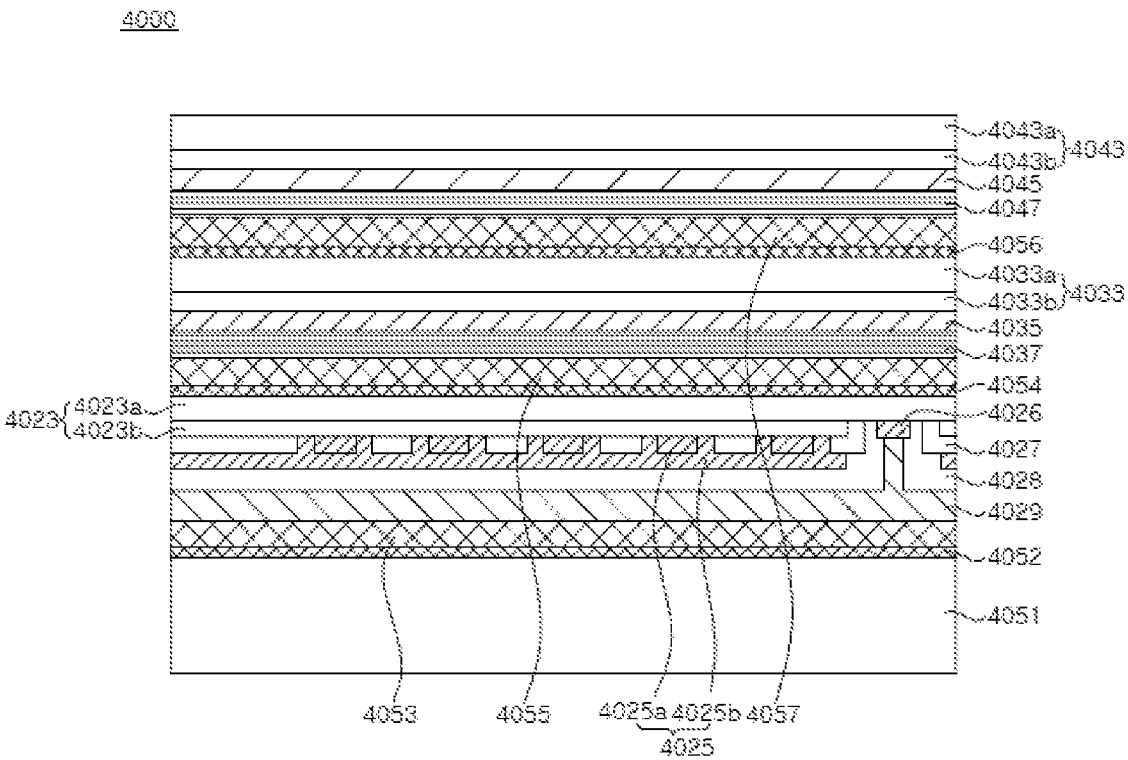
FIG. 78 is a schematic cross-sectional view of a light emitting diode stack for a display according to an exemplary embodiment.

FIG. 78 is a schematic cross-sectional view of a light emitting diode (LED) stack for a display according to an exemplary embodiment.

Referring to FIG. 78, the light emitting diode stack 4000 for a display may include a support substrate 4051, a first LED stack 4023, a second LED stack 4033, a third LED stack 4043, a reflective electrode 4025, an ohmic electrode 4026, a first insulating layer 4027, a second insulating layer 4028, a interconnection line 4029, a second-p transparent electrode 4035, a third-p transparent electrode 4045, a first color filter 4037, a second color filter 4047, hydrophilic material layers 4052, 4054, and 4056, a first bonding layer 4053 (a lower bonding layer), a second bonding layer 4055 (an intermediate bonding layer), and a third bonding layer 4057 (an upper bonding layer).

The support substrate 4051 supports LED stacks 4023, 4033, and 4043. The support substrate 4051 may have a circuit on a surface thereof or an inside thereof, but is not limited thereto. The support substrate 4051 may include, for example, a glass, a sapphire substrate, a Si substrate, or a Ge substrate.

The first LED stack 4023, the second LED stack 4033, and the third LED stack 4043 each include first conductivity type semiconductor layers 4023*a*, 4033*a*, and 4043*a*, second conductivity type semiconductor layers 4023*b*, 4033*b*, and 4043*b*, and active layers interposed between the first conductivity type semiconductor layers and the second conductivity type semiconductor layers. The active layer may have a multiple quantum well structure.

The first LED stack 4023 may be an inorganic LED that emits red light, the second LED stack 4033 may be an inorganic LED that emits green light, and the third LED stack 4043 may be an inorganic LED that emits blue light. The first LED stack 4023 may include a GaInP-based well layer, and the second LED stack 4033 and the third LED stack 4043 may include a GaInN-based well layer. However, the inventive concepts are not limited thereto, and when the LED stacks include micro LEDs, the first LED stack 4023 may emit any one of red, green, and blue light, and the second and third LED stacks 4033 and 4043 may emit a different one of the red, green, and blue light without adversely affecting operation or requiring color filters due to its small form factor.

Opposite surfaces of each LED stack 4023, 4033, or 4043 are an n-type semiconductor layer and a p-type semiconductor layer, respectively. The illustrated exemplary embodiment describes a case in which the first conductivity type semiconductor layers 4023*a*, 4033*a*, and 4043*a* of each of the first to third LED stacks 4023, 4033, and 4043 are n-type, and the second conductivity type semiconductor layers 4023*b*, 4033*b*, and 4043*b* thereof are p-type. A roughened surface may be formed on upper surfaces of the first to third LED stacks 4023, 4033, and 4043. However, the inventive concepts are not limited thereto, and the type of the semiconductor types of the upper surface and the lower surface of each of the LED stacks may be reversed.

The first LED stack 4023 is disposed to be adjacent to the support substrate 4051, the second LED stack 4033 is disposed on the first LED stack 4023, and the third LED stack 4043 is disposed on the second LED stack 4033. Since the first LED stack 4023 emits light of the wavelength longer than the wavelengths of the second and third LED stacks 4033 and 4043, light generated in the first LED stack 4023 may be transmitted through the second and third LED stacks 4033 and 4043 and may be emitted to the outside. In addition, since the second LED stack 4033 emits light of the wavelength longer than the wavelength of the third LED stack 4043, light generated in the second LED stack 4033 may be transmitted through the third LED stack 4043 and may be emitted to the outside.

The reflective electrode 4025 is in ohmic contact with the second conductivity type semiconductor layer of the first LED stack 4023 and reflects light generated in the first LED stack 4023. For example, the reflective electrode 4025 may include an ohmic contact layer 4025*a* and a reflective layer 4025*b*.

The ohmic contact layer 4025*a* is partially in contact with the second conductivity type semiconductor layer, that is, a p-type semiconductor layer. In order to prevent light absorption by the ohmic contact layer 4025*a*, an area in which the ohmic contact layer 4025*a* is in contact with the p-type semiconductor layer may not exceed about 50% of a total area of the p-type semiconductor layer. The reflective layer 4025*b* covers the ohmic contact layer 4025*a* and also covers the first insulating layer 4027. As illustrated, the reflective layer 4025*b* may substantially cover the entirety of the ohmic contact layer 4025*a*, or a portion of the ohmic contact layer 4025*a*.

The reflective layer 4025*b* covers the first insulating layer 4027, such that an omnidirectional reflector may be formed by a stack of the first LED stack 4023 having a relatively high refractive index and the first insulating layer 4027 and the reflective layer 4025*b* having a relatively low refractive index. The reflective layer 4025*b* covers about 50% or more of the area of the first LED stack 4023, preferably, most of the region of the first LED stack 4023, thereby improving light efficiency.

The ohmic contact layer 4025*a* and the reflective layer 4025*b* may be formed of a metal layer containing gold (Au). The ohmic contact layer 4025*a* may be formed of, for example, an Au—Zn alloy or an Au—Be alloy. The reflective layer 4025*b* may be formed of a metal layer having high reflectivity with respect to light generated in the first LED stack 4023, for example, red light, such as aluminum (Al), silver (Ag), or gold (Au). In particular, Au may have relatively low reflectivity with respect to light generated in the second LED stack 4033 and the third LED stack 4043, for example, green light or blue light, and thus, may reduce light interference by absorbing light generated in the second and third LED stacks 4033 and 4043 and traveling toward the support substrate 4051.

The first insulating layer 4027 is disposed between the support substrate 4051 and the first LED stack 4023, and has an opening exposing the first LED stack 4023. The ohmic contact layer 4025*a* is connected to the first LED stack 4023 within the opening of the first insulating layer 4027.

The ohmic electrode 4026 is in ohmic contact with the first conductivity type semiconductor layer 4023*a* of the first LED stack 4023. The ohmic electrode 4026 may be disposed on the first conductivity type semiconductor layer 4023*a* exposed by partially removing the second conductivity type semiconductor layer 4023*b*. Although FIG. 78 illustrates one ohmic electrode 4026, a plurality of ohmic electrodes 4026 are aligned on a plurality of regions on the support substrate 4051. The ohmic electrode 4026 may be formed of, for example, an Au—Te alloy or an Au—Ge alloy.

The second insulating layer 4028 is disposed between the support substrate 4051 and the reflective electrode 4025 to cover the reflective electrode 4025. The second insulating layer 4028 has an opening exposing the ohmic electrode 4026. The second insulating layer 4028 may be formed of $SiO_2$ or SOG.

The interconnection line 4029 is disposed between the second insulating layer 4028 and the support substrate 4051, and is connected to the ohmic electrode 4026 through the opening of the second insulating layer 4028. The interconnection line 4029 may connect a plurality of ohmic electrodes 4026 to one another on the support substrate 4051.

The second-p transparent electrode 4035 is in ohmic contact with the second conductivity type semiconductor layer 4033*b* of the second LED stack 4033, that is, the p-type semiconductor layer. The second-p transparent electrode 4035 may be formed of a metal layer or a conductive oxide layer which is transparent to red light and green light.

The third-p transparent electrode 4045 is in ohmic contact with the second conductivity type semiconductor layer 4043*b* of the third LED stack 4043, that is, the p-type semiconductor layer. The third-p transparent electrode 4045 may be formed of a metal layer or a conductive oxide layer which is transparent to red light, green light, and blue light.

The reflective electrode 4025, the second-p transparent electrode 4035, and the third-p transparent electrode 4045 may be in ohmic contact with the p-type semiconductor layer of each LED stack to assist in current dispersion.

The first color filter 4037 may be disposed between the first LED stack 4023 and the second LED stack 4033. In addition, the second color filter 4047 may be disposed between the second LED stack 4033 and the third LED stack 4043. The first color filter 4037 transmits light generated in the first LED stack 4023 and reflects light generated in the second LED stack 4033. The second color filter 4047 transmits light generated in the first and second LED stacks 4023 and 4033 and reflects light generated in the third LED stack 4043. Accordingly, light generated in the first LED stack 4023 may be emitted to the outside through the second LED stack 4033 and the third LED stack 4043, and light generated in the second LED stack 4033 may be emitted to the outside through the third LED stack 4043. Further, it is possible to prevent light generated in the second LED stack 4033 from being incident on the first LED stack 4023 and lost, or light generated in the third LED stack 4043 from being incident on the second LED stack 4033 and lost.

According to some exemplary embodiments, the first color filter 4037 may also reflect light generated in the third LED stack 4043. According to some exemplary embodiments, when the LED stacks include micro LEDs, the color filters may be omitted due to the small form factor of the micro LEDs.

The first and second color filters 4037 and 4047 may be, for example, a low pass filter that passes only a low frequency region, that is, a long wavelength region, a band pass filter that passes only a predetermined wavelength band, or a band stop filter that blocks only the predetermined wavelength band. In particular, the first and second color filters 4037 and 4047 may be formed by alternately stacking insulating layers having different refractive indices, and may be formed by alternately stacking, for example, $TiO_2$ and $SiO_2$, $Ta_2O_5$ and $SiO_2$, $Nb_2O_5$ and $SiO_2$, $HfO_2$ and $SiO_2$, or $ZrO_2$ and $SiO_2$. Further, the first and/or second color filter 4037 and/or 4047 may include a distributed Bragg reflector (DBR). The distributed Bragg reflector may be formed by alternately stacking insulating layers having different refractive indices. Further, a stop band of the distributed Bragg reflector may be controlled by adjusting a thickness of $TiO_2$ and $SiO_2$.

The first bonding layer 4053 couples the first LED stack 4023 to the support substrate 4051. As illustrated, the interconnection line 4029 may be in contact with the first bonding layer 4053. In addition, the interconnection line 4029 is disposed below some regions of the second insulating layer 4028, and a region of the second insulating layer 4028 that does not have the interconnection line 4029 may be in contact with the first bonding layer 4053. The first bonding layer 4053 may be light transmissive or light non-transmissive. In particular, a contrast of the display apparatus may be improved by using an adhesive layer that absorbs light, such as black epoxy, as the first bonding layer 4053.

The first bonding layer 4053 may be in direct contact with the support substrate 4051, but as illustrated, the hydrophilic material layer 4052 may be disposed on an interface between the support substrate 4051 and the first bonding layer 4053. The hydrophilic material layer 4052 may change a surface of the support substrate 4051 to be hydrophilic to improve adhesion of the first bonding layer 4053. As used herein, the bonding layer and the hydrophilic material layer may collectively be referred to as a buffer layer.

The first bonding layer 4053 has a strong adhesion to the hydrophilic material layer, while it has a weak adhesion to a hydrophobic material layer. Therefore, peeling may occur at a portion in which the adhesion is weak. The hydrophilic material layer 4052 according to an exemplary embodiment may change a hydrophobic surface to be hydrophilic to enhance the adhesion of the first bonding layer 4053, thereby preventing the occurrence of the peeling.

The hydrophilic material layer 4052 may also be formed by depositing, for example, $SiO_2$, or others on the surface of the support substrate 4051, and may also be formed by treating the surface of the support substrate 4051 with plasma to modify the surface. The surface modified layer increases surface energy to change hydrophobic property into hydrophilic property. In a case in which the second insulating layer 4028 has hydrophobic property, the hydrophilic material layer may also be disposed on the second insulating layer 4028, and the first bonding layer 4053 may be in contact with the hydrophilic material layer on the second insulating layer 4028.

The second bonding layer 4055 couples the second LED stack 4033 to the first LED stack 4023. The second bonding layer 4055 may be disposed between the first LED stack 4023 and the first color filter 4037 and may be in contact with the first color filter 4037. The second bonding layer 4055 may transmit light generated in the first LED stack 4023. A hydrophilic material layer 4054 may be disposed in an interface between the first LED stack 4023 and the second bonding layer 4055. The first conductivity type semiconductor layer 4023*a* of the first LED stack 4023 generally exhibits hydrophobic property. Therefore, in a case in which the second bonding layer 4055 is in direct contact with the first conductivity type semiconductor layer 4023*a*, the peeling is likely to occur at an interface between the second bonding layer 4055 and the first conductivity type semiconductor layer 4023*a*.

The hydrophilic material layer 4054 according to an exemplary embodiment changes the surface of the first LED stack 4023 from having hydrophobic properties to having hydrophilic properties, and thus, improves the adhesion of the second bonding layer 4055, thereby reducing or preventing the occurrence of the peeling. The hydrophilic material layer 4054 may be formed by depositing $SiO_2$ or modifying the surface of the first LED stack 4023 with plasma as described above.

A surface layer of the first color filter 4037 which is in contact with the second bonding layer 4055 may be a hydrophilic material layer, for example, $SiO_2$. In a case in which the surface layer of the first color filter 4037 is not hydrophilic, the hydrophilic material layer may be formed on the first color filter 4037, and the second bonding layer 4055 may be in contact with the hydrophilic material layer.

The third bonding layer 4057 couples the third LED stack 4043 to the second LED stack 4033. The third bonding layer 4057 may be disposed between the second LED stack 4033 and the second color filter 4047 and may be in contact with the second color filter 4047. The third bonding layer 4057 transmits light generated in the first LED stack 4023 and the second Led stack 4033. A hydrophilic material layer 4056 may be disposed in an interface between the second LED stack 4033 and the third bonding layer 4057. The second LED stack 4033 may exhibit hydrophobic property, and as a result, in a case in which the third bonding layer 4057 is in direct contact with the second LED stack 4033, the peeling is likely to occur at an interface between the third bonding layer 4057 and the second LED stack 4033.

The hydrophilic material layer 4056 according to an exemplary embodiment changes the surface of the second LED stack 4033 from hydrophobic property into hydrophilic property, and thus, improves the adhesion of the third bonding layer 4057, thereby preventing the occurrence of the peeling. The hydrophilic material layer 4056 may be formed by depositing $SiO_2$ or modifying the surface of the second LED stack 4033 with plasma as described above.

A surface layer of the second color filter 4047 which is in contact with the third bonding layer 4057 may be a hydrophilic material layer, for example, $SiO_2$. In a case in which the surface layer of the second color filter 4047 is not hydrophilic, the hydrophilic material layer may be formed on the second color filter 4047 and the third bonding layer 4057 may be in contact with the hydrophilic material layer.

The first to third bonding layers 4053, 4055, and 4057 may be formed of light transmissive SOC, but is not limited thereto, and other transparent organic material layers or transparent inorganic material layers may be used. Examples of the organic material layer may include SU8, poly(methylmethacrylate) (PMMA), polyimide, parylene, benzocyclobutene (BCB), or others, and examples of the inorganic material layer may include $Al_2O_3$, $SiO_2$, $SiN_x$, or others. The organic material layers may be bonded at high vacuum and high pressure, and the inorganic material layers may be bonded by planarizing a surface with, for example, a chemical mechanical polishing process, changing surface energy using plasma or others, and then using the changed surface energy.

FIGS. 79A to 79F are schematic cross-sectional views illustrating a method of manufacturing the light emitting diode stack 4000 for a display according to the exemplary embodiment.

Figure 79A:
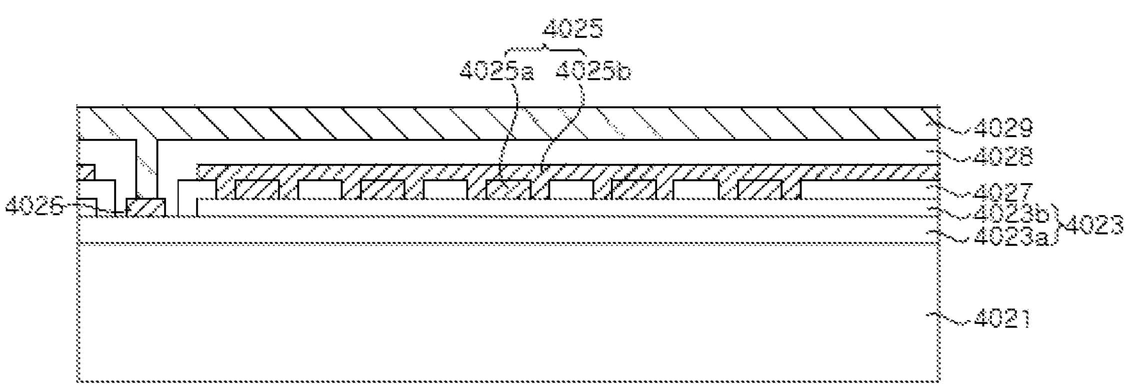
FIGS. 79A, 79B, 79C, 79D, 79E, and 79F are schematic cross-sectional views illustrating a method for manufacturing a light emitting diode stack for a display according to an exemplary embodiment.

Referring to FIG. 79A, a first LED stack 4023 is first grown on a first substrate 4021. The first substrate 4021 may be, for example, a GaAs substrate. The first LED stack 4023 is formed of an AlGaInP based semiconductor layers, and includes a first conductivity type semiconductor layer 4023*a*, an active layer, and a second conductivity type semiconductor layer 4023*b*.

Next, the second conductivity type semiconductor layer 4023*b* is partially removed to expose the first conductivity type semiconductor layer 4023*a*. Although FIG. 79A shows only one pixel region, the first conductivity type semiconductor layer 4023*a* is partially exposed for each of the pixel regions.

A first insulating layer 4027 is formed on the first LED stack 4023 and is patterned to form openings. For example, $SiO_2$ is formed on the first LED stack 4023, a photoresist is applied thereto, and a photoresist pattern is formed through photolithograph and development. Next, the first insulating layer 4027 in which the openings are formed may be formed by patterning $SiO_2$ using the photoresist pattern as an etching mask. One of the openings of the first insulating layer 4027 may be disposed on the first conductivity type semiconductor layer 4023*a*, and other openings may be disposed on the second conductivity type semiconductor layer 4023*b*.

Thereafter, an ohmic contact layer 4025*a* and an ohmic electrode 4026 are formed in the openings of the first insulating layer 4027. The ohmic contact layer 4025*a* and the ohmic electrode 4026 may be formed using a lift-off technique. The ohmic contact layer 4025*a* may be first formed and the ohmic electrode 4026 may be then formed, or vice versa. In addition, according to an exemplary embodiment, the ohmic electrode 4026 and the ohmic contact layer 4025*a* may be simultaneously formed of the same material layer.

After the ohmic contact layer 4025*a* is formed, a reflective layer 4025*b* covering the ohmic contact layer 4025*a* and the first insulating layer 4027 is formed. The reflective layer 4025*b* may be formed using a lift-off technique. The reflective layer 4025*b* may also cover a portion of the ohmic contact layer 4025*a*, and may also cover substantially the entirety of the ohmic contact layer 4025*a* as illustrated. A reflective electrode 4025 is formed by the ohmic contact layer 4025*a* and the reflective layer 4025*b*.

The reflective electrode 4025 may be in ohmic contact with a p-type semiconductor layer of the first LED stack 4023, and may be thus referred to as a first p-type reflective electrode 4025. The reflective electrode 4025 is spaced apart from the ohmic electrode 4026, and is thus electrically insulated from the first conductivity type semiconductor layer 4023*a*.

A second insulating layer 4028 covering the reflective electrode 4025 and having an opening exposing the ohmic electrode 4026 is formed. The second insulating layer 4028 may be formed of, for example, $SiO_2$ or SOG.

Then, a interconnection line 4029 is formed on the second insulating layer 4028. The interconnection line 4029 is connected to the ohmic electrode 4026 through the opening of the second insulating layer 4028, and is thus electrically connected to the first conductivity type semiconductor layer 4023*a*.

Although the interconnection line 4029 is illustrated in FIG. 79A as covering the entire surface of the second insulating layer 4028, the interconnection line 4029 may be partially disposed on the second insulating layer 4028, and an upper surface of the second insulating layer 4028 may be exposed around the interconnection line 4029.

Although the illustrated exemplary embodiment shows one pixel region, the first LED stack 4023 disposed on the substrate 4021 may cover a plurality of pixel regions, and the interconnection line 4029 may be commonly connected to the ohmic electrodes 4026 formed on a plurality of regions. In addition, a plurality of interconnection lines 4029 may be formed on the substrate 4021.

Figure 79B:
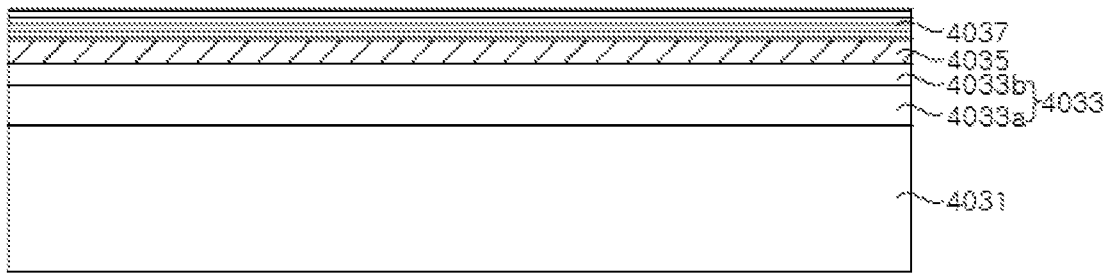

Referring to FIG. 79B, a second LED stack 4033 is grown on a second substrate 4031 and a second-p transparent electrode 4035 and a first color filter 4037 are formed on the second LED stack 4033. The second LED stack 4033 may include a gallium nitride-based first conductivity type semiconductor layer 4033*a*, a second conductivity type semiconductor layer 4033*b*, and an active layer disposed therebetween, and the active layer may include a GaInN well layer. The second substrate 4031 is a substrate on which a gallium nitride-based semiconductor layer may be grown, and is different from the first substrate 4021. A combination ratio of GaInN may be determined so that the second LED stack 4033 may emit green light. The second-p transparent electrode 4035 is in ohmic contact with the second conductivity type semiconductor layer 4033*b*.

The first color filter 4037 may be formed on the second-p transparent electrode 4035, and since details thereof are substantially the same as those described with reference to FIG. 78, detailed descriptions thereof will be omitted in order to avoid redundancy.

Figure 79C:
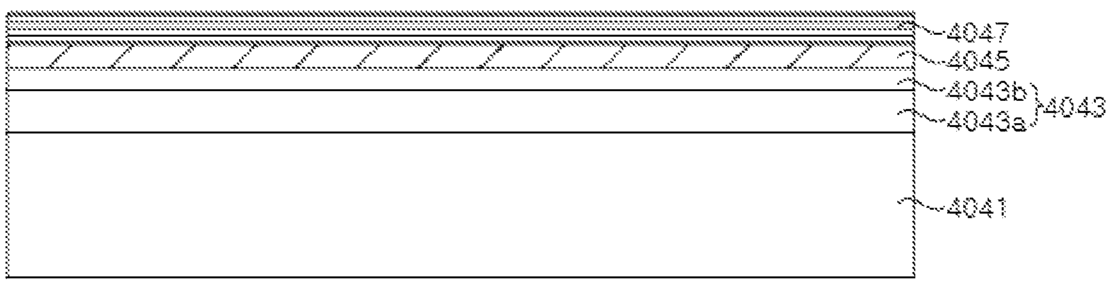

Referring to FIG. 79C, a third LED stack 4043 is grown on a third substrate 4041 and a third-p transparent electrode 4045 and a second color filter 4047 are formed on the third LED stack 4043. The third LED stack 4043 may include a gallium nitride-based first conductivity type semiconductor layer 4043*a*, a second conductivity type semiconductor layer 4043*b*, and an active layer disposed therebetween, and the active layer may include a GaInN well layer. The third substrate 4041 is a substrate on which a gallium nitride-based semiconductor layer may be grown, and is different from the first substrate 4021. A combination ratio of GaInN may be determined so that the third LED stack 4043 emits blue light. The third-p transparent electrode 4045 is in ohmic contact with the second conductivity type semiconductor layer 4043*b*.

Since the second color filter 4047 is substantially the same as that described with reference to FIG. 78, detailed descriptions thereof will be omitted in order to avoid redundancy.

Meanwhile, since the first LED stack 4023, the second LED stack 4033, and the third LED stack 4043 are grown on different substrates, the order of formation thereof is not particularly limited.

Figure 79D:
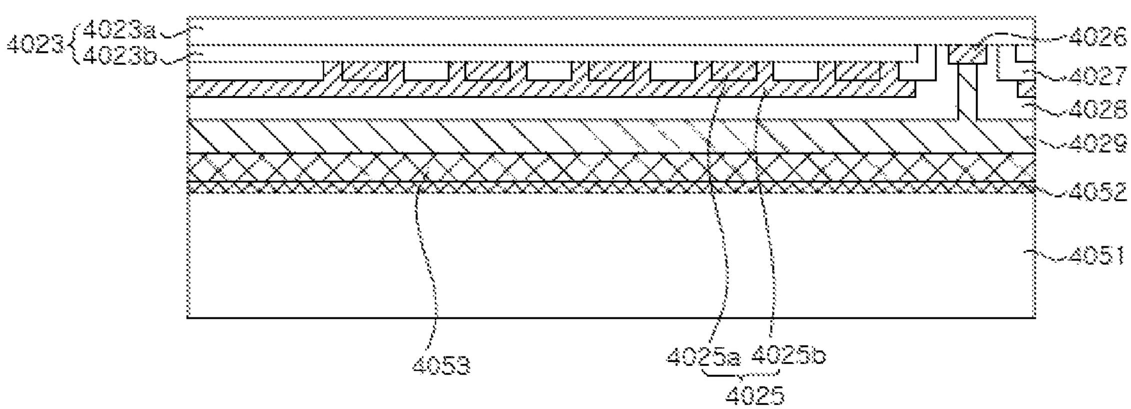

Referring to FIG. 79D, next, the first LED stack 4023 is coupled onto a support substrate 4051 through the first bonding layer 4053. Bonding material layers may be disposed on the support substrate 4051 and the second insulating layer 4028 and may be bonded to each other to form the first bonding layer 4053. The interconnection line 4029 is disposed to face the support substrate 4051.

Meanwhile, in a case in which a surface of the support substrate 4051 has hydrophobic property, a hydrophilic material layer 4052 may be first formed on the support substrate 4051. The hydrophilic material layer 4052 may also be formed by depositing a material layer such as $SiO_2$ on the surface of the support substrate 4051, or treating the surface of the support substrate 4051 with plasma or the like to increase surface energy. The surface of the support substrate 4051 is modified by the plasma treatment, and a surface modified layer having high surface energy may be formed on the surface of the support substrate 4051. The first bonding layer 4053 may be bonded to the hydrophilic material layer 4052, and adhesion of the first bonding layer 4053 is thus improved.

The first substrate 4021 is removed from the first LED stack 4023 using a chemical etching technique. Accordingly, the first conductivity type semiconductor layer of the first LED stack 4023 is exposed on the top surface. The exposed surface of the first conductivity type semiconductor layer 4023*a* may be textured to increase light extraction efficiency, and a light extraction structure, such as a roughened surface or others, may be thus formed on the surface of the first conductivity type semiconductor layer 4023*a*.

Figure 79E:
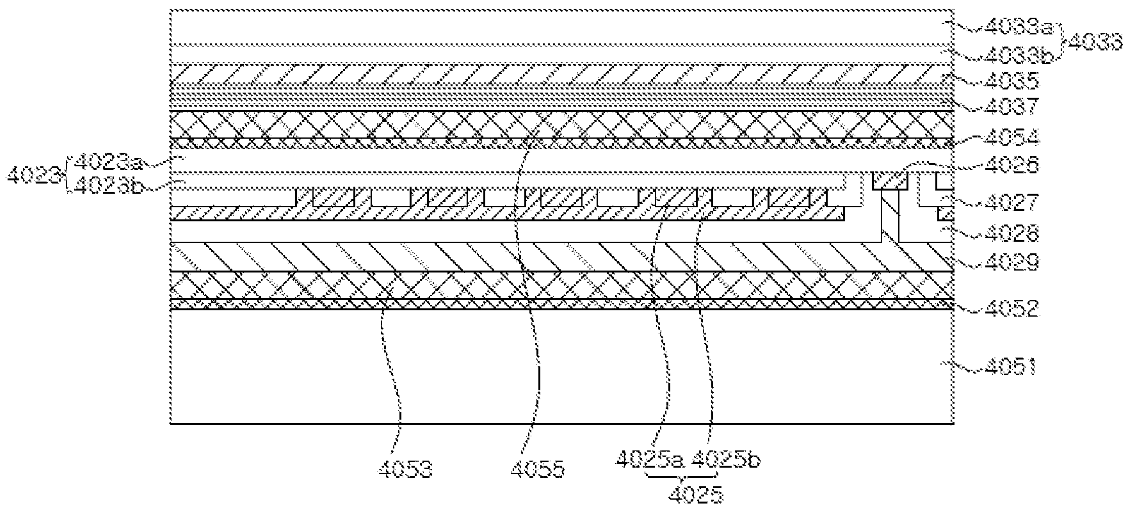

Referring to FIG. 79E, the second LED stack 4033 is coupled to the first LED stack 4023 through the second bonding layer 4055. The first color filter 4037 is disposed to face the first LED stack 4023 and is bonded to the second bonding layer 4055. The bonding material layers are disposed on the first LED stack 4023 and the first color filter 4037 and are bonded to each other to form the second bonding layer 4055.

Meanwhile, before the second bonding layer 4055 is formed, a hydrophilic material layer 4054 may be first formed on the first LED stack 4023. The hydrophilic material layer 4054 changes the surface of the first LED stack 4023 from hydrophobic property to hydrophilic property and thus improves the adhesion of the second bonding layer 4055. The hydrophilic material layer 4054 may also be formed by depositing a material layer such as $SiO_2$, or treating the surface of the first LED stack 4023 with plasma or others to increase surface energy. The surface of the first LED stack 4023 is modified by the plasma treatment, and a surface modified layer having high surface energy may be formed on the surface of the first LED stack 4023. The second bonding layer 4055 may be bonded to the hydrophilic material layer 4054, and adhesion of the second bonding layer 4055 is thus improved.

The second substrate 4031 may be separated from the second LED stack 4033 using a technique such as a laser lift-off or a chemical lift-off. In addition, in order to improve light extraction, a roughened surface may be formed on the exposed surface of the first conductivity type semiconductor layer 4033*a* using a surface texturing.

Figure 79F:
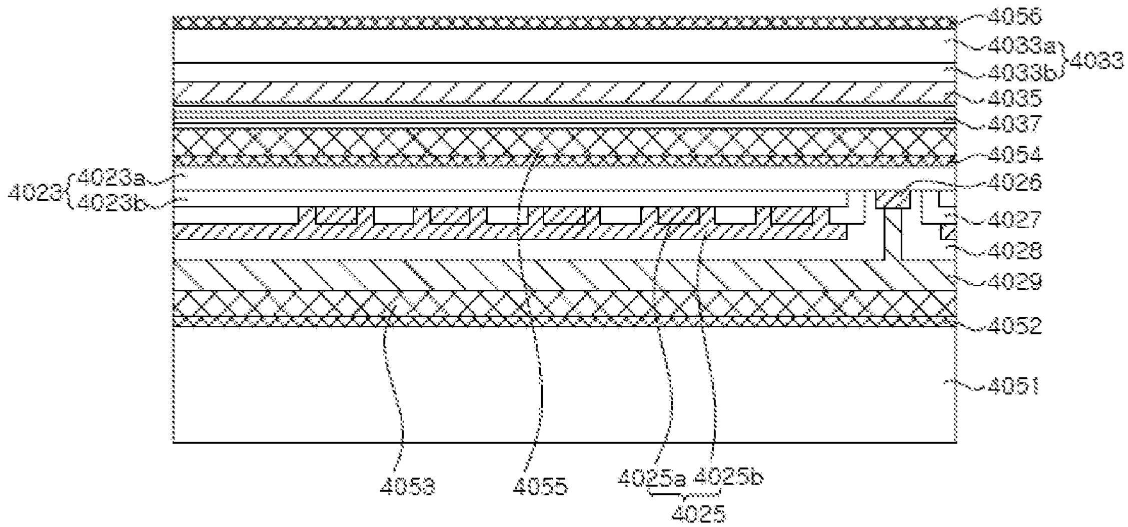

Referring to FIG. 79F, a hydrophilic material layer 4056 may be then formed on the second LED stack 4033. The hydrophilic material layer 4056 changes the surface of the second LED stack 4033 to hydrophilic property and thus improves adhesion of the third bonding layer 4057. The hydrophilic material layer 4056 may also be formed by depositing a material layer such as $SiO_2$, or treating the surface of the second LED stack 4033 with plasma or the like to increase surface energy. However, in a case in which the surface of the second LED stack 4033 has hydrophilic property, the hydrophilic material layer 4056 may be omitted.

Next, referring to FIGS. 78 and 79C, the third LED stack 4043 is coupled onto the second LED stack 4033 through the third bonding layer 4057. The second color filter 4047 is disposed to face the second LED stack 4033 and is bonded to the third bonding layer 4057. The bonding material layers are disposed on the second LED stack 4033 (or the hydrophilic material layer 4056) and the second color filter 4047, and are bonded to each other to form the third bonding layer 4057.

The third substrate 4041 may be separated from the third LED stack 4043 using a technique such as a laser lift-off or a chemical lift-off. Accordingly, as illustrated in FIG. 78, the LED stack for a display in which the first conductive type semiconductor layer 4043*a* of the third LED stack 4043 is exposed is provided. In addition, a roughened surface may be formed on the exposed surface of the first conductivity type semiconductor layer 4043*a* by a surface texturing.

A stack of the first to third LED stacks 4023, 4033, and 4043 disposed on the support substrate 4051 is patterned in a unit of pixel, and the patterned stacks are connected to each other using the interconnection lines, thereby making it possible to provide a display apparatus. Hereinafter, a display apparatus according to exemplary embodiments will be described.

Figure 80:
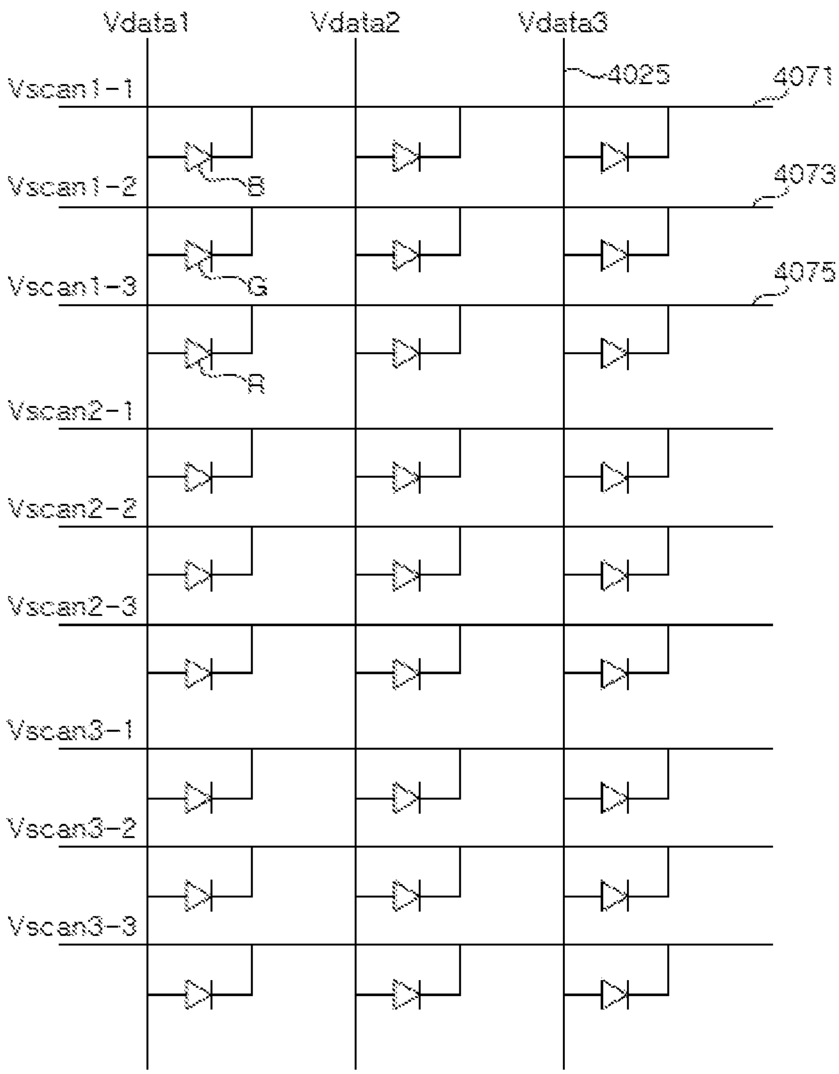
FIG. 80 is a schematic circuit diagram of a display apparatus according to an exemplary embodiment.
Figure 81:
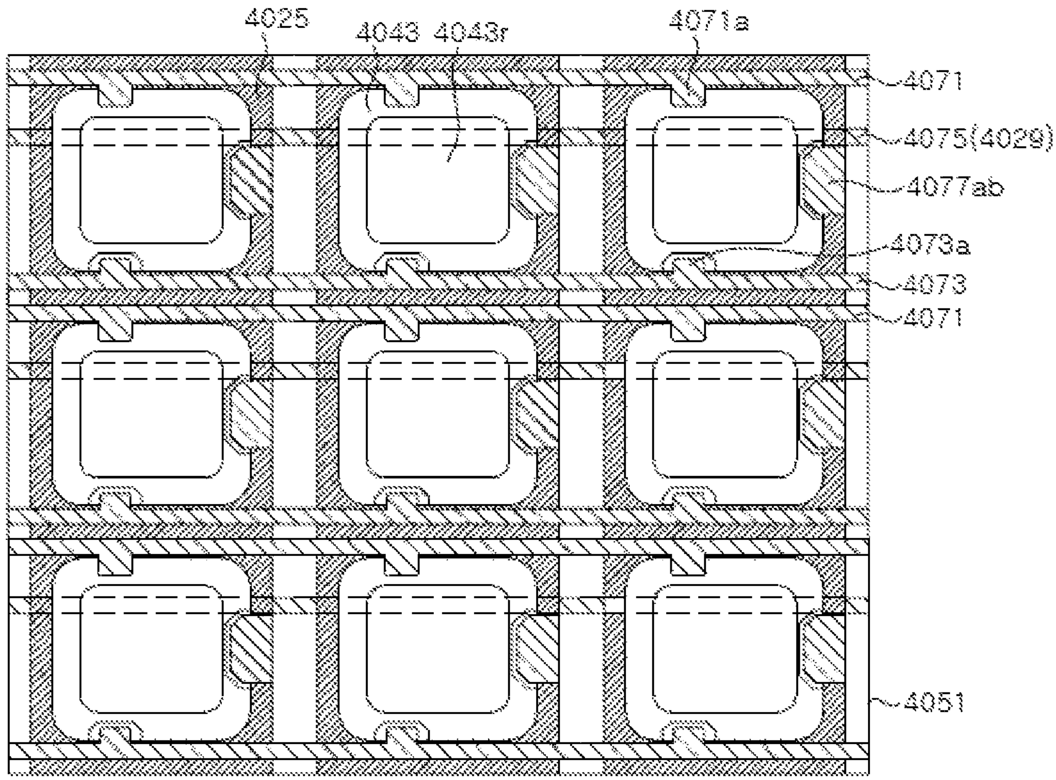
FIG. 81 is a schematic plan view of a display apparatus according to an exemplary embodiment.

FIG. 80 is a schematic circuit diagram of a display apparatus according to an exemplary embodiment, and FIG. 81 is a schematic plan view of a display apparatus according to an exemplary embodiment.

Referring to FIGS. 80 and 81, the display apparatus according to an exemplary embodiment may be implemented to be driven in a passive matrix manner.

For example, since the LED stack for a display described with reference to FIG. 78 has a structure in which the first to third LED stacks 4023, 4033, and 4044 are stacked in a vertical direction, one pixel includes three light emitting diodes R, G, and B. Here, a first light emitting diode R may correspond to the first LED stack 4023, a second light emitting diode G may correspond to the second LED stack 4033, and a third light emitting diode B may correspond to the third LED stack 4043.

In FIGS. 80 and 81, one pixel includes the first to third light emitting diodes R, G, and B, and each light emitting diode corresponds to a sub-pixel. Anodes of the first to third light emitting diodes R, G, and B are connected to a common line, for example, a data line, and cathodes thereof are connected to different lines, for example, scan lines. For a first pixel, as an example, the anodes of the first to third light emitting diodes R, G, and B are commonly connected to a data line Vdata1, and cathodes thereof are connected to scan lines Vscan1-1, Vscan1-2, and Vscan1-3, respectively. Accordingly, the light emitting diodes R, G, and B in the same pixel may be separately driven.

In addition, each of the light emitting diodes R, G, and B may be driven by using pulse width modulation or change current intensity, thereby making it possible to adjust brightness of each sub-pixel.

Referring to again FIG. 81, a plurality of patterns are formed by patterning the stack described with reference to FIG. 78, and the respective pixels are connected to reflective electrodes 4025 and interconnection lines 4071, 4073, and 4075. As illustrated in FIG. 80, the reflective electrode 4025 may be used as a data line Vdata, and the interconnection lines 4071, 4073, and 4075 may be formed as the scan lines. Here, the interconnection line 4075 may be formed by the interconnection line 4029. The reflective electrode 4025 may electrically connect the first conductivity type semiconductor layers 4023*a*, 4033*a*, and 4043*a* of the first to third LED stacks 4023, 4033, and 4043 of the plurality of pixels to one another, and the interconnection line 4029 may be disposed to be substantially perpendicular to the reflective electrode 4025 to electrically connect the first conductivity type semiconductor layers 4023*a* of the plurality of pixels to each other.

The pixels may be arranged in a matrix form, and the anodes of the light emitting diodes R, G, and B of each pixel are commonly connected to the reflective electrode 4025 and the cathodes thereof are each connected to the interconnection lines 4071, 4073, and 4075 which are spaced apart from each other. Here, the interconnection lines 4071, 4073, and 4075 may be used as scan lines Vscan.

Figure 82:
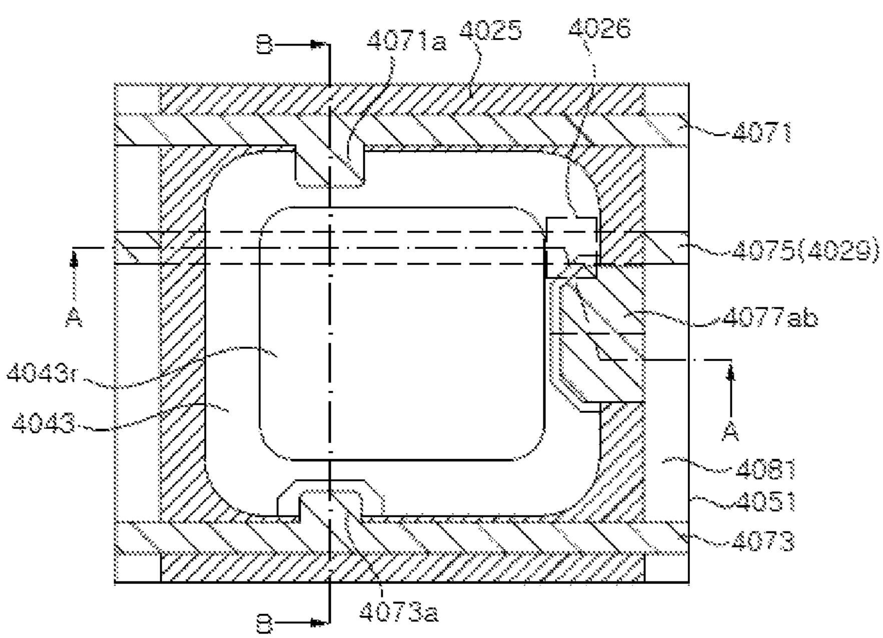
FIG. 82 is an enlarged plan view of one pixel of the display apparatus of FIG. 81.
Figure 83:
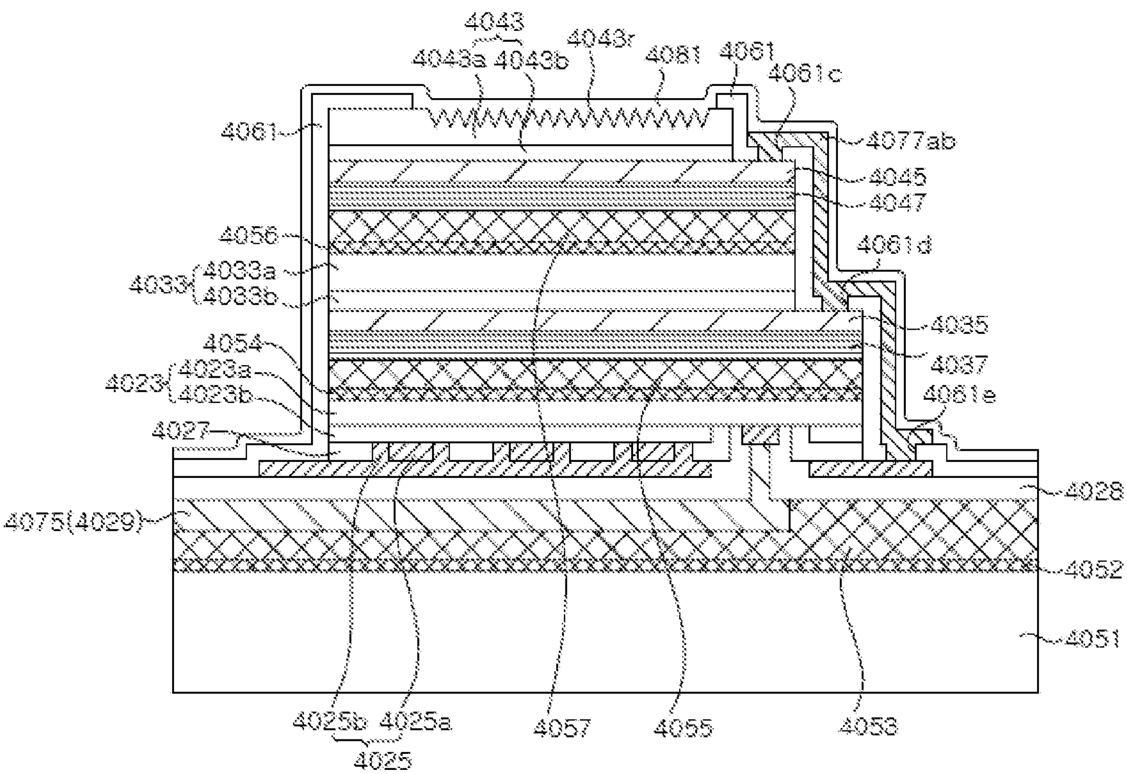
FIG. 83 is a schematic cross-sectional view taken along line A-A of FIG. 82.
Figure 84:
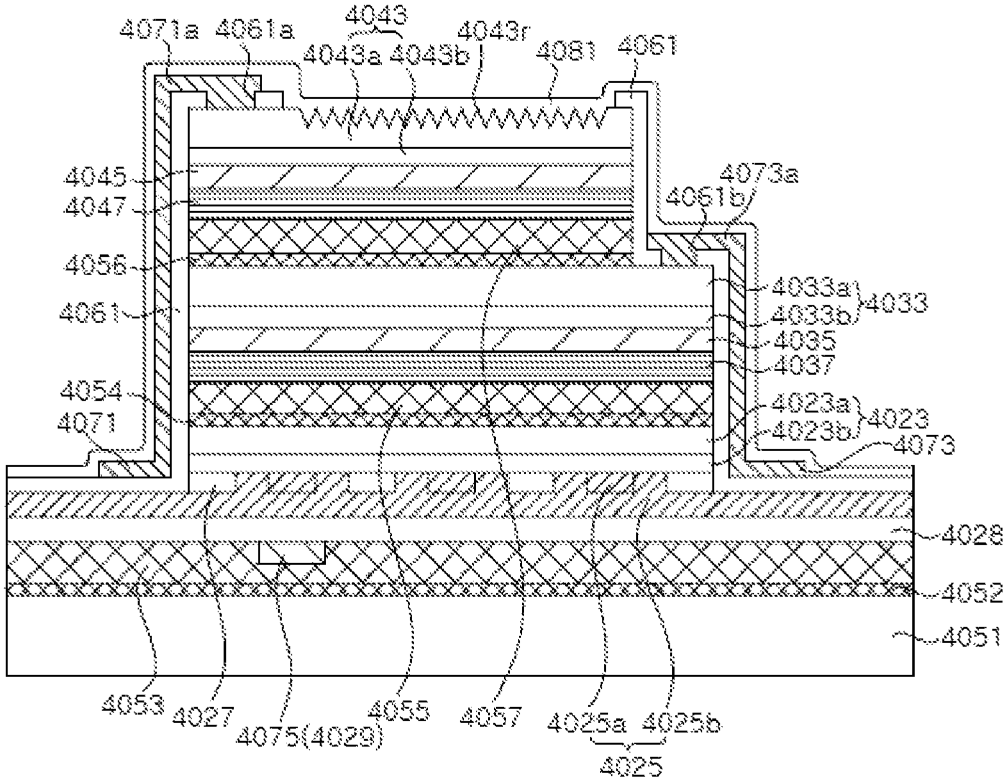
FIG. 84 is a schematic cross-sectional view taken along line B-B of FIG. 82.

FIG. 82 is an enlarged plan view of one pixel of the display apparatus of FIG. 81, FIG. 83 is a schematic cross-sectional view taken along line A-A of FIG. 82, and FIG. 84 is a schematic cross-sectional view taken along line B-B of FIG. 82.

Referring back to FIGS. 81 to 84, in each pixel, a portion of the reflective electrode 4025, a portion of the second-p transparent electrode 4035, a portion of an upper surface of the second LED stack 4033, a portion of the third-p transparent electrode 4045, and an upper surface of the third LED stack 4043 are exposed to the outside.

The third LED stack 4043 may have a roughened surface 4043*r* formed on the upper surface thereof. The roughened surface 4043*r* may also be formed on the entirety of the upper surface of the third LED stack 4043, or on a portion of the upper surface of the third LED stack 4043.

A lower insulating layer 4061 may cover a side surface of each pixel. The lower insulating layer 4061 may be formed of a light transmissive material such as $SiO_2$, and in this case, the lower insulating layer 4061 may also cover substantially the entirety of the upper surface of the third LED stack 4043. Alternatively, the lower insulating layer 4061 according to an exemplary embodiment may include a light reflective layer or a light absorption layer to prevent light traveling from the first to third LED stacks 4023, 4033, and 4043 to the side surface, and in this case, the lower insulating layer 4061 at least partially exposes the upper surface of the third LED stack 4043. The lower insulating layer 4061 may include, for example, a distribution Bragg reflector or a metallic reflective layer, or an organic reflective layer on a transparent insulating layer, and may also include a light absorption layer such as black epoxy. The light absorption layer, such as black epoxy, may prevent light from being emitted to the outside of the pixels, thereby improving a contrast ratio between the pixels in the display apparatus.

The lower insulating layer 4061 may have an opening 4061*a* exposing the upper surface of the third LED stack 4043, an opening 4061*b* exposing the upper surface of the second LED stack 4033, an opening 4061*c* exposing the third-p transparent electrode 4045, an opening 4061*d* exposing the second-p transparent electrode 4035, and an opening 4061*e* exposing the first p-type reflective electrode 4025. The upper surface of the first LED stack 4023 may not be exposed to the outside.

The interconnection line 4071 and the interconnection line 4073 may be formed on the support substrate 4051 in the vicinity of the first to third LED stacks 4023, 4033, and 4043, and may be disposed on the lower insulating layer 4061 to be insulated from the first p-type reflective electrode 4025. A connector 4077*ab* connects the second-p transparent electrode 4035 and the third-p transparent electrode 4045 to the reflective electrode 4025. Accordingly, the anodes of the first LED stack 4023, the second LED stack 4033, and the third LED stack 4043 are commonly connected to the reflective electrode 4025.

The interconnection line 4075 or 4029 may be disposed to be substantially perpendicular to the reflective electrode 4025 below the reflective electrode 4025, and is connected to the ohmic electrode 4026, thereby being electrically connected to the first conductivity type semiconductor layer 4023*a*. The ohmic electrode 4026 is connected to the first conductivity type semiconductor layer 4023*a* below the first LED stack 4023. The ohmic electrode 4026 may be disposed outside a lower region of the roughened surface 4043*r* of the third LED stack 4043 as illustrated in FIG. 82, and light loss may be thus reduced.

The connector 4071*a* connects the upper surface of the third LED stack 4043 to the interconnection line 4071, and the connector 4073*a* connects the upper surface of the second LED stack 4033 to the interconnection line 4073.

An upper insulating layer 4081 may be disposed on the interconnection lines 4071 and 4073 and the lower insulating layer 4061 to protect the interconnection lines 4071, 4073, and 4075. The upper insulating layer 4081 may have openings that expose the interconnection lines 4071, 4073, and 4075, and a bonding wire and the like may be connected thereto through the openings.

According to an exemplary embodiment, the anodes of the first to third LED stacks 4023, 4033, and 4043 are commonly and electrically connected to the reflective electrode 4025, and the cathodes thereof are electrically connected to the interconnection lines 4071, 4073, and 4075, respectively. Accordingly, the first to third LED stacks 4023, 4033, and 4043 may be independently driven. However, the inventive concepts are not limited thereto, and connections of the electrodes and wirings can be variously modified.

FIGS. 85A to 85H are schematic plan views for describing a method for manufacturing a display apparatus according to an exemplary embodiment. Hereinafter, a method for manufacturing the pixel of FIG. 82 will be described.

First, the light emitting diode stack 4000 as described with reference to FIG. 78 is prepared.

Figure 85A:
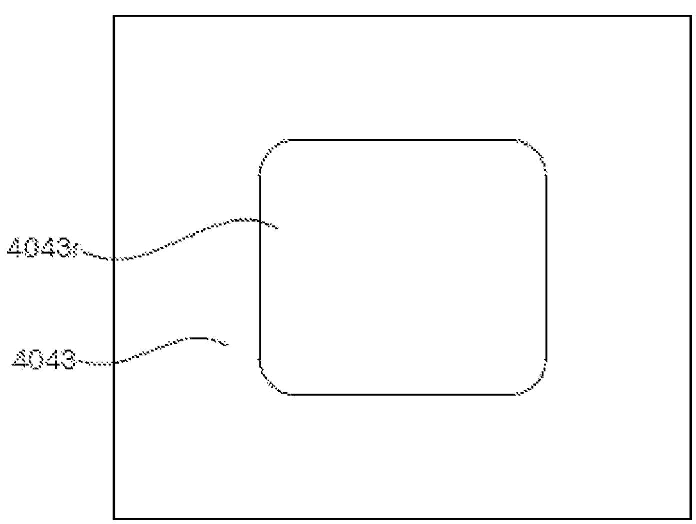
FIGS. 85A, 85B, 85C, 85D, 85E, 85F, 85G, and 85H are schematic plan views illustrating a method for manufacturing a display apparatus according to an exemplary embodiment.

Next, referring to FIG. 85A, the roughened surface 4043*r* may be formed on the upper surface of the third LED stack 4043. The roughened surface 4043*r* may be formed to correspond to each pixel region on the upper surface of the third LED stack 4043. The roughened surface 4043*r* may be formed using a chemical etching technique, for example, using a photo-enhanced chemical etch (PEC) technique.

The roughened surface 4043*r* may be partially formed within each pixel region in consideration of a region in which the third LED stack 4043 is to be etched in the future. In particular, the roughened surface 4043*r* may be formed so that the ohmic electrode 4026 is disposed outside the roughened surface 4043*r*. However, the inventive concepts are not limited thereto, and the roughened surface 4043*r* may also be formed over substantially the entirety of the upper surface of the third LED stack 4043.

Figure 85B:
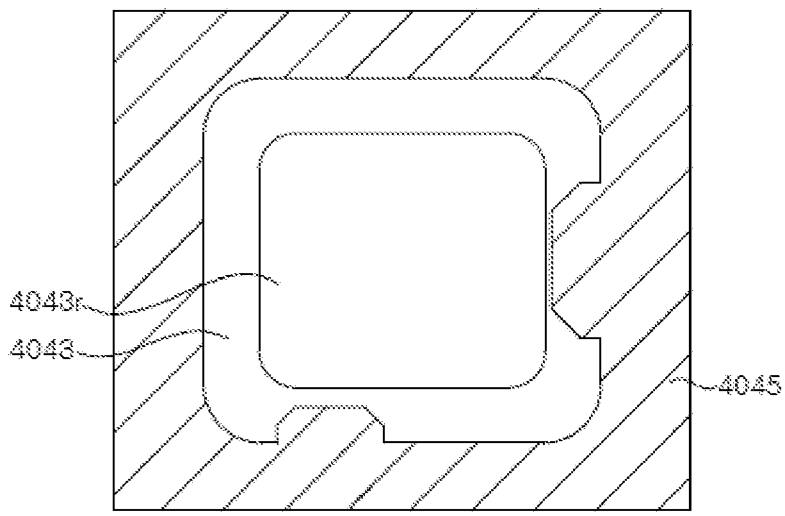

Referring to FIG. 85B, a peripheral region of the third LED stack 4043 is then etched in each pixel region to expose the third-p transparent electrode 4045. The third LED stack 4043 may be left to have substantially a rectangular or square shape as illustrated, but at least two depression parts may be formed along the edges. In addition, as illustrated, one depression part may be formed to be greater than another depression part.

Figure 85C:
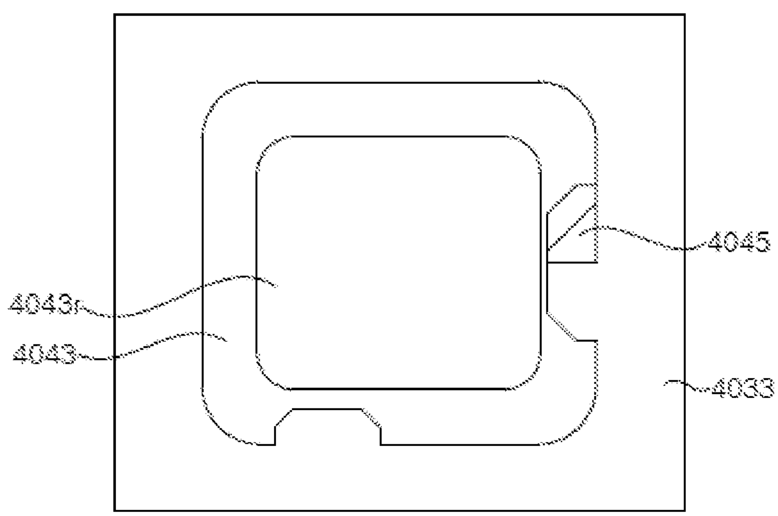

Referring to FIG. 85C, the exposed third-p transparent electrode 4045 is then removed except for a portion of the third-p transparent electrode 4045 exposed in a relatively large depression part, to thereby expose the upper surface of the second LED stack 4033. The upper surface of the second LED stack 4033 is exposed around the third LED stack 4043 and is also exposed in another depression part. A region in which the third-p transparent electrode 4045 is exposed and a region in which the second LED stack 4033 is exposed are formed in the relatively large depression part.

Figure 85D:
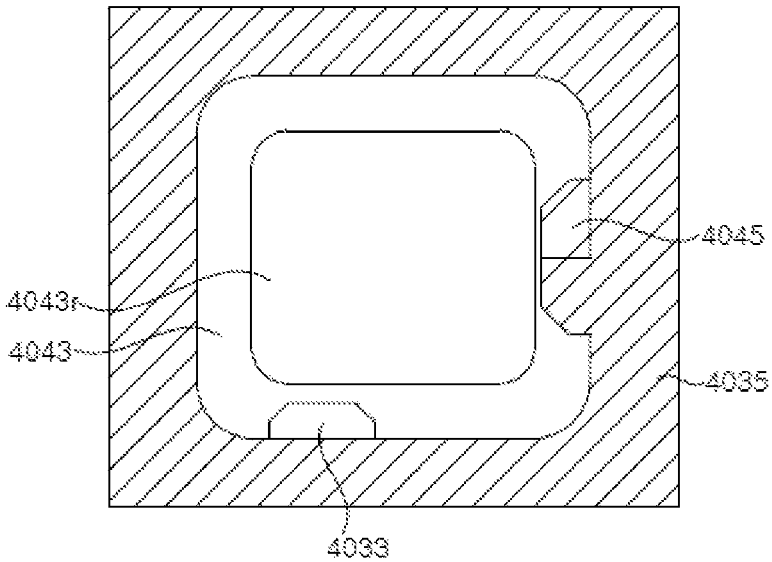

Referring to FIG. 85D, the second LED stack 4033 exposed in the remaining region is removed except for the second LED stack 4033 formed in a relatively small depression part to thereby expose the second-p transparent electrode 4035. The second-p transparent electrode is exposed around the third LED stack 4043 and the second-p transparent electrode 4035 is also exposed in the relatively large depression part.

Figure 85E:
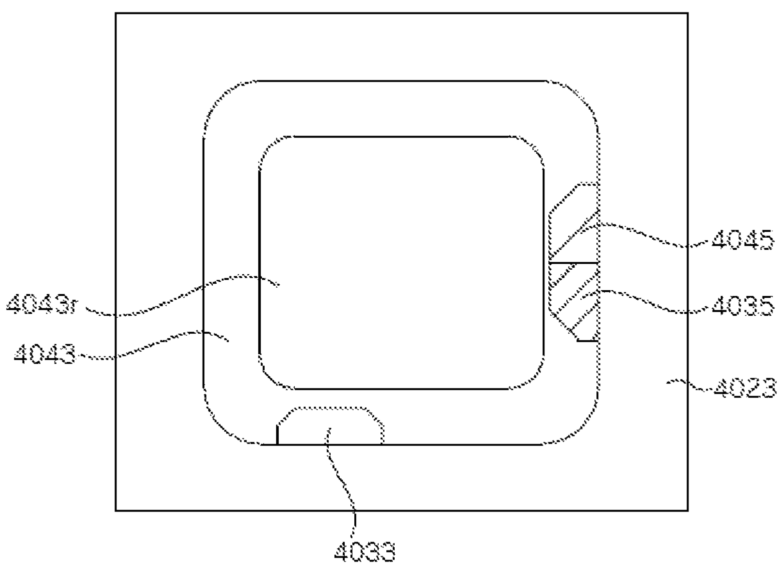

Referring to FIG. 85E, the second-p transparent electrode 4035 exposed around the second LED stack 4043 is then removed except for the second-p transparent electrode 4035 exposed in the relatively large depression part, to thereby expose the upper surface of the first LED stack 4023.

Figure 85F:
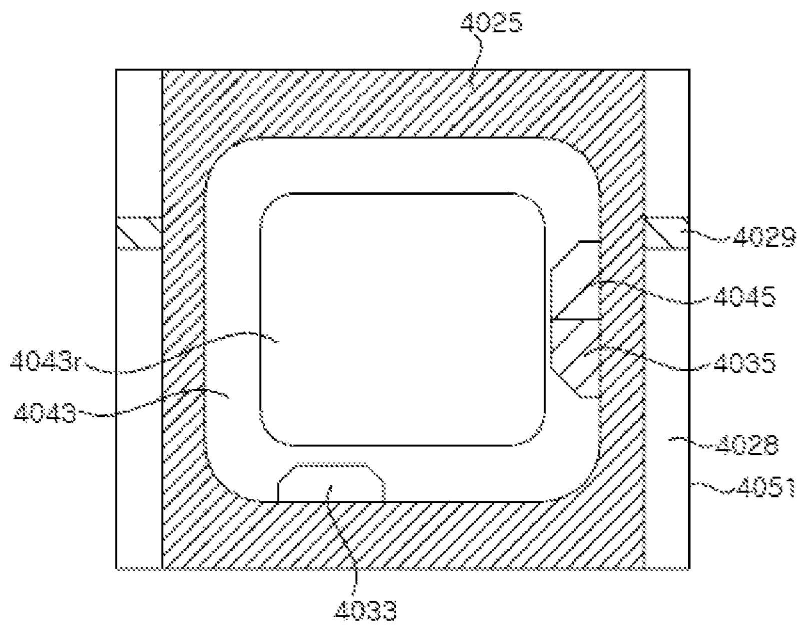

Referring to FIG. 85F, the first LED stack 4023 exposed around the third LED stack 4043 continues to be removed and the first insulating layer 4027 is removed to thereby expose the reflective electrode 4025. Accordingly, the reflective electrode 4025 is exposed around the third LED stack 4043. The exposed reflective electrode 4025 is patterned so as to have substantially an elongated shape in a vertical direction to thereby form a linear interconnection line. The patterned reflective electrode 4025 is disposed over the plurality of pixel regions in the vertical direction and is spaced apart from a neighboring pixel in a horizontal direction.

In the illustrated exemplary embodiment, it is described the reflective electrode 4025 is patterned after removing the first LED stack 4023, but the reflective electrode 4025 may also be formed in advance to have the patterned shape when the reflective electrode 4025 is formed on the substrate 4021. In this case, it is not necessary to pattern the reflective electrode 4025 after removing the first LED stack 4023.

By patterning the reflective electrode 4025, the second insulating layer 4028 may be exposed. The interconnection line 4029 is disposed to be perpendicular to the reflective electrode 4025, and is insulated from the reflective electrode 4025 by the second insulating layer 4028.

Figure 85G:
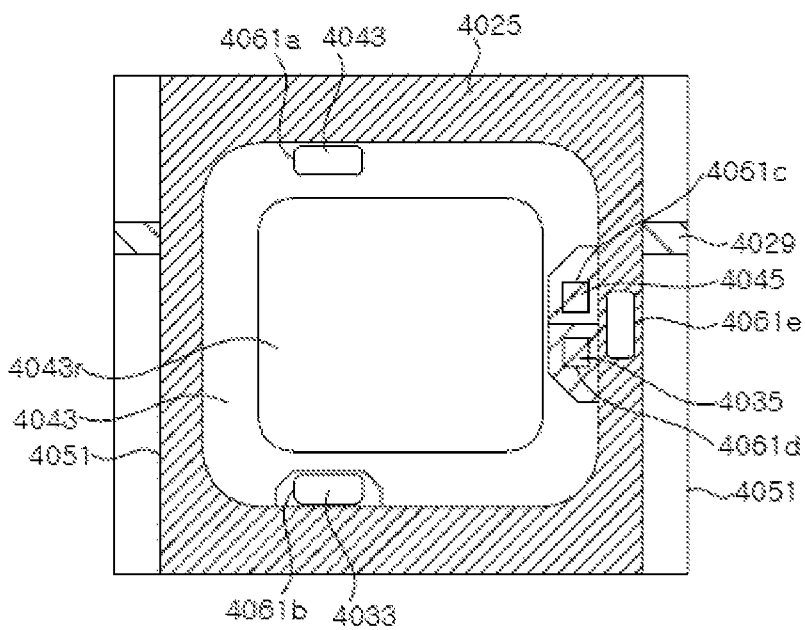

Referring to FIG. 85G, the lower insulating layer 4061 (FIGS. 83 and 84) covering the pixels is then formed. The lower insulating layer 4061 covers the reflective electrode 4025 and covers the side surfaces of the first to third LED stacks 4023, 4033, and 4043. In addition, the lower insulating layer 4061 may at least partially cover the upper surface of the third LED stack 4043. In a case in which the lower insulating layer 4061 is a transparent layer such as $SiO_2$, the lower insulating layer 4061 may also cover substantially the entirety of the upper surface of the third LED stack 4043. Alternatively, the lower insulating layer 4061 may also include a reflective layer or a light absorption layer, and in this case, the lower insulating layer 4061 at least partially exposes the upper surface of the third LED stack 4043 so that light is emitted to the outside.

The lower insulating layer 4061 may have an opening 4061*a* exposing the third LED stack 4043, an opening 4061*b* exposing the second LED stack 4033, an opening 4061*c* exposing the third-p transparent electrode 4045, an opening 4061*d* exposing the second-p transparent electrode 4035, and an opening 4061*e* exposing the reflective electrode 4025. One or a plurality of openings 4061*e* exposing the reflective electrode 4025 may be formed.

Figure 85H:
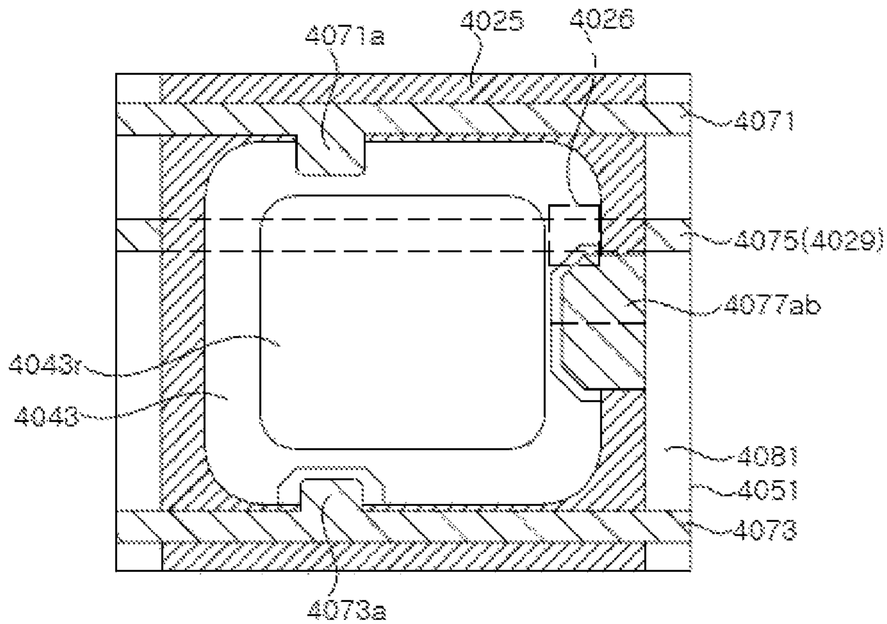

Referring to FIG. 85H, the interconnection lines 4071 and 4073 and the connectors 4071*a*, 4073*a*, and 77*ab* are then formed by a lift-off technique. The interconnection lines 4071 and 4073 are insulated from the reflective electrode 4025 by the lower insulating layer 4061. The connector 4071*a* electrically connects the third LED stack 4043 to the interconnection line 4071 and the connector 4073*a* connects the second LED stack 4033 to the interconnection line 4073. The connector 77*ab* electrically connects the third-p transparent electrode 4045 and the second-p transparent electrode 4035 to the first p-type reflective electrode 4025.

The interconnection lines 4071 and 4073 may be disposed to be substantially perpendicular to the reflective electrode 4025 and may connect the plurality of pixels to each other.

Next, the upper insulating layer 4081 (FIGS. 83 and 84) covers the interconnection lines 4071 and 4073 and the connectors 4071*a*, 4073*a*, and 4077*ab*. The upper insulating layer 4081 may also cover substantially the entirety of the upper surface of the third LED stack 4043. The upper insulating layer 4081 may be formed of, for example, silicon oxide film or silicon nitride film, and may also include a distribution Bragg reflector. In addition, the upper insulating layer 4081 may include a transparent insulating film and a reflective metal layer, or an organic reflective layer of a multilayer structure thereon to reflect light, or may include a light absorption layer such as black based epoxy to thereby shield light.

In a case in which the upper insulating layer 4081 reflects or shields light, in order to emit light to the outside, it is necessary to at least partially expose the upper surface of the third LED stack 4043. Meanwhile, in order to allow an electrical connection from the outside, the upper insulating layer 4081 is partially removed to thereby partially expose the interconnection lines 4071, 4073, and 4075. Further, the upper insulating layer 4081 may also be omitted.

As the upper insulating layer 4081 is formed, the pixel region illustrated in FIG. 82 is completed. In addition, as illustrated in FIG. 81, the plurality of pixels may be formed on the support substrate 4051, and those pixels may be connected to each other by the first p-type reflective electrode 4025 and the interconnection lines 4071, 4073, and 4075, and may be driven in a passive matrix manner.

In the illustrated exemplary embodiment, the method for manufacturing the display apparatus that may be driven in the passive matrix manner is described, but the inventive concepts are not limited thereto, and a display apparatus including the light emitting diode stack illustrated in FIG. 78 may be configured to be driven in various manners.

For example, it is described that the interconnection lines 4071 and 4073 are formed together on the lower insulating layer 4061, but the interconnection line 4071 may be formed on the lower insulating layer 4061 and the interconnection line 4073 may also be formed on the upper insulating layer 4081.

Meanwhile, in FIG. 78, it is described that the reflective electrode 4025, the second-p transparent electrode 4035, and the third-p transparent electrode 4045 are in ohmic contact with the second conductivity type semiconductor layers 4023*b*, 4033*b*, and 4043*b* of the first LED stack 4023, the second LED stack 4033, and the third LED stack 4043, respectively, and it is described that the ohmic electrode 4026 is in ohmic contact with the first conductivity type semiconductor layer 4023*a* of the first LED stack 4023, but the ohmic contact layer is not separately provided to the first conductivity type semiconductor layers 4033*a* and 4033*b* of the second LED stack 4033 and the third LED stack 4043. When a size of a pixel is as small as 200 micrometers or less, according to some exemplary embodiments, there is no difficulty in current dispersion even in a case in which a separate ohmic contact layer is not formed in the first conductivity type semiconductor layers 4033*a* and 4043*a*, which are n-type. However, for current dispersion, transparent electrode layers may be disposed on the n-type semiconductor layers of the second and third LED stacks 4033 and 4043.

According to exemplary embodiments, the plurality of pixels may be formed at a wafer level by using the light emitting diode stack 4000 for a display, and thus the steps of individually mounting the light emitting diodes may be obviated. Furthermore, since the light emitting diode stack has a structure that the first to third LED stacks 4023, 4033, and 4043 are vertically stacked, an area of the sub-pixel may be secured within a limited pixel area. In addition, since light generated in the first LED stack 4023, the second LED stack 4033, and the third LED stack 4043 is transmitted through these LED stacks and emitted to the outside, it is possible to reduce light loss.

However, the inventive concepts are not limited thereto, and light emitting devices in which the respective pixels are separated from each other may also be provided, and those light emitting devices are individually mounted on a circuit board, thereby making it possible to provide the display apparatus.

In addition, it is described that the ohmic electrode 4026 is formed on the first conductivity type semiconductor layer 4023*a* adjacent to the second conductivity type semiconductor layer 4023*b*, but the ohmic electrode 4026 may also be formed on the surface of the first conductivity type semiconductor layer 4023*a* opposite to the second conductivity type semiconductor layer 4023*b*. In this case, the third LED stack 4043 and the second LED stack 4033 are patterned to expose the ohmic electrode 4026, and instead of the interconnection line 4029, a separate interconnection line connecting the ohmic electrode 4026 to the circuit board is provided.

Figure 86:
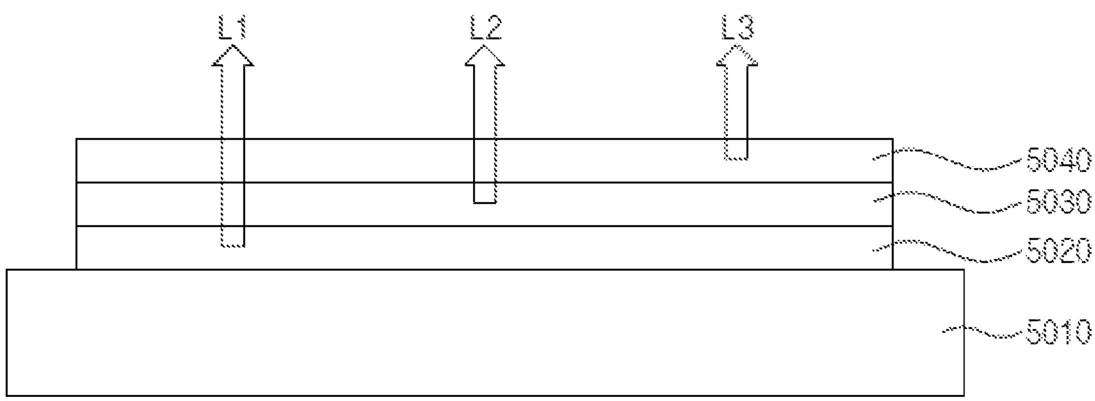
FIG. 86 is a schematic cross-sectional view of a light emitting stacked structure according to an exemplary embodiment.

FIG. 86 is a cross-sectional view of a light emitting stacked structure according to an exemplary embodiment.

Referring to FIG. 86, a light emitting stacked structure according to an exemplary embodiment includes a plurality of sequentially stacked epitaxial stacks. A plurality of epitaxial stacks are provided on the substrate 5010.

The substrate 5010 has a substantially a plate shape having an upper surface and a lower surface.

A plurality of epitaxial stacks can be mounted on the upper surface of the substrate 5010, and the substrate 5010 may be provided in various forms. The substrate 5010 may be formed of an insulating material. Examples of the material of the substrate 5010 include glass, quartz, silicon, organic polymer, organic/inorganic composite, or others. However, the material of the substrate 5010 is not limited thereto, and is not particularly limited as long as it has an insulation property. In an exemplary embodiment, the substrate 5010 may further include a wiring part that may provide a light emitting signal and a common voltage to the respective epitaxial stacks. In an exemplary embodiment, in addition to the wiring part, the substrate 5010 may further include a drive element including a thin film transistor, in which case the respective epitaxial stacks may be driven in the active matrix type. To this end, the substrate 5010 may be provided as a printed circuit board 5010 or as a composite substrate having a wiring part and/or a drive element formed on glass, silicon, quartz, organic polymer, or organic/inorganic composite.

A plurality of epitaxial stacks are sequentially stacked on an upper surface of the substrate 5010, and respectively emit light.

In an exemplary embodiment, two or more epitaxial stacks may be provided, each emitting light of different wavelength bands from each other. That is, a plurality of epitaxial stacks may be provided, respectively having different energy bands from each other. In an exemplary embodiment, the epitaxial stack on the substrate 5010 is illustrated as being provided with three sequentially stacked layers, including first to third epitaxial stacks 5020, 5030, and 5040.

Each of the epitaxial stacks may emit a color light of a visible light band of various wavelength bands. Light emitted from the lowermost epitaxial stack is a color light of the longest wavelength having the lowest energy band, and the wavelength of the emitted color light becomes shorter in the order from lower to upper sides. The light emitted from the epitaxial stack disposed at the top is a color light of the shortest wavelength having the highest energy band. For example, the first epitaxial stack 5020 may emit the first color light L1, the second epitaxial stack 5030 may emit the second color light L2, and the third epitaxial stack 5040 may emit the third color light L3. The first to third color light L1, L2, and L3 correspond to different color light from each other, and the first to third color light L1, L2, and L3 may be color light of different wavelength bands from each other which have sequentially decreasing wavelengths. That is, the first to third color light L1, L2, and L3 may have different wavelength bands from each other, and the color light may be a shorter wavelength band of a higher energy in an order of the first color light L1 to the third color light L3. However, the inventive concepts are not limited thereto, and when the light emitting stacked structure include micro LEDs, the lowermost epitaxial stack may emit a color of light having any energy band, and the epitaxial stacks disposed thereon may emit a color of light having different energy band than that of the lowermost epitaxial stack due to the small form factor of micro LEDs.

In the exemplary embodiment, the first color light L1 may be red light, the second color light L2 may be green light, and the third color light L3 may be blue light, for example.

Each of the epitaxial stacks emits light to a front direction of the substrate 5010. In particular, light emitted from one epitaxial stack is passed through another epitaxial stack located in the light path, and travels to the front direction. The front direction may corresponds to a direction along which the first to third epitaxial stacks 5020, 5030 and 5040 are stacked.

Hereinafter, in addition to the front direction and the back direction mentioned above, the "front" direction of the substrate 5010 will be referred to as the "upper" direction, and "back" direction of the substrate 5010 will be referred to as the "lower" direction. Of course, the terms "upper" or "lower" refer to relative directions, which may vary according to the placement and the direction of the light emitting stacked structure.

Each of the epitaxial stacks emits light in an upper direction, and each of the epitaxial stacks transmits most of light emitted from the underlying epitaxial stacks. In particular, light emitted from the first epitaxial stack 5020 passes through the second epitaxial stack 5030 and the third epitaxial stack 5040 and travels to the front direction, and the light emitted from the second epitaxial stack 5030 passes through the third epitaxial stack 5040 and travels to the front direction. To this end, at least some, or desirably, all of the epitaxial stacks other than the lowermost epitaxial stack may include an optically transmissive material. As used herein, the material being "optically transmissive" not only includes a transparent material that transmits the entire light, but also a material that transmits light of a predetermined wavelength or transmitting a portion of light of a predetermined wavelength. In an exemplary embodiment, each of the epitaxial stacks may transmit about 60% or more of light emitted from the epitaxial stack disposed thereunder, or about 80% or more in another exemplary embodiment, or about 90% or more in yet another exemplary embodiment.

In the light emitting stacked structure according to an exemplary embodiment, the signal lines for applying emitting signals to the respective epitaxial stacks are independently connected, and accordingly, the respective epitaxial stacks can be independently driven and the light emitting stacked structure can implement various colors according to whether light is emitted from each of the epitaxial stacks. In addition, the epitaxial stacks for emitting light of different wavelengths from each other are overlapped vertically on one another, and thus can be formed in a narrow area.

Figure 87A:
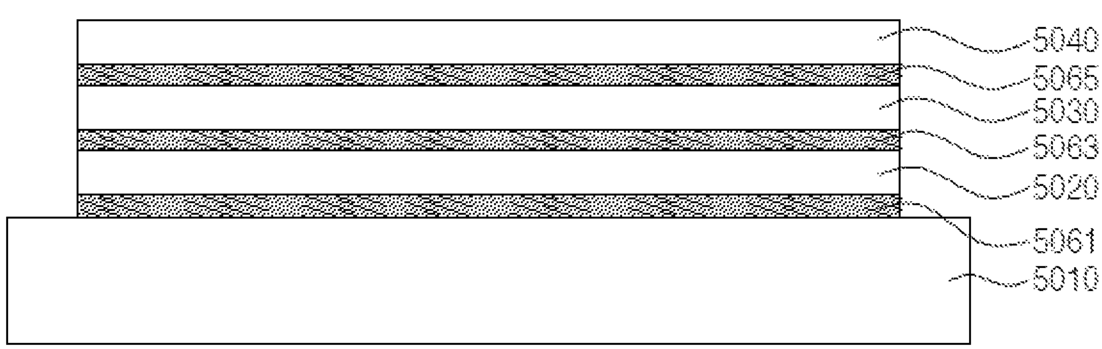
FIGS. 87A and 87B are cross-sectional views of a light emitting stacked structure according to an exemplary embodiment.
Figure 87B:
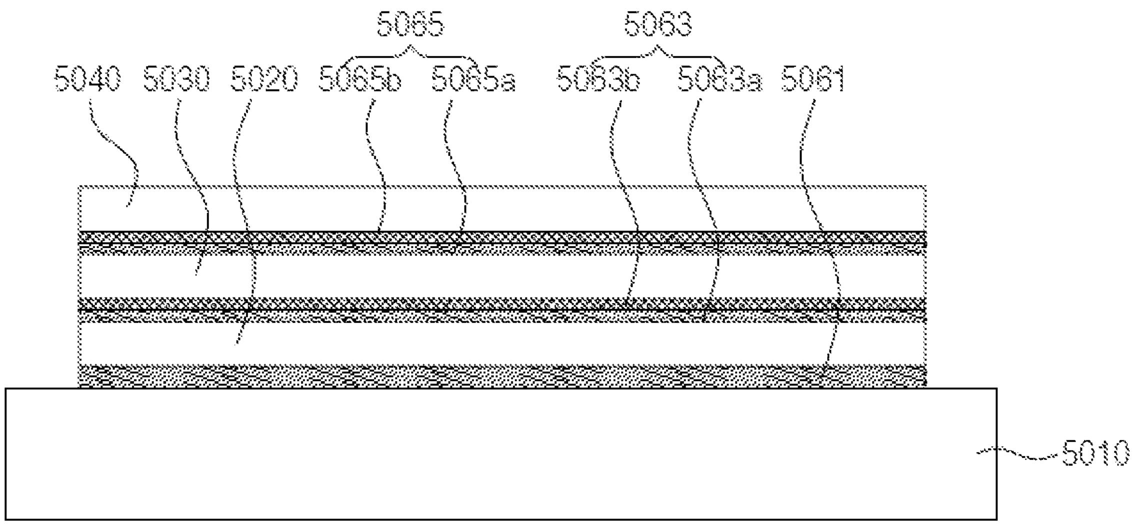

FIGS. 87A and 87B are cross-sectional views illustrating a light emitting stacked structure according to an exemplary embodiment.

Referring to FIG. 87A, in a light emitting stacked structure according to an exemplary embodiment, each of first to third epitaxial stacks 5020, 5030, and 5040 may be provided on a substrate 5010 via an adhesive layer or a buffer layer interposed therebetween.

The adhesive layer 5061 adheres the substrate 5010 and the first epitaxial stack 5020 onto the substrate 5010. The adhesive layer 5061 may include a conductive or non-conductive material. The adhesive layer 5061 may have conductivity in some areas, when it needs to be electrically connected to the substrate 5010 provided thereunder. The adhesive layer 5061 may include a transparent or opaque material. In an exemplary embodiment, when the substrate 5010 is provided with an opaque material and has a wiring part or the like formed thereon, the adhesive layer 5061 may include an opaque material, for example, a light absorbing material. For the light absorbing material that forms the adhesive layer 5061, various polymer adhesives may be used, including, for example, an epoxy-based polymer adhesive.

The buffer layer acts as a component to adhere two adjacent layers to each other, while also serving to relieve the stress or impact between two adjacent layers. The buffer layer is provided between two adjacent epitaxial stacks to adhere the two adjacent epitaxial stacks together, while also serving to relieve the stress or impact that may affect the two adjacent epitaxial stacks.

The buffer layer includes first and second buffer layers 5063 and 5065. The first buffer layer 5063 may be provided between the first and second epitaxial stacks 5020 and 5030, and a second buffer layer 5065 may be provided between the second and third epitaxial stacks 5030 and 5040.

The buffer layer includes a material capable of relieving stress or impact, e.g., a material that is capable of absorbing stress or impact when there is stress or impact from the outside. The buffer layer may have a certain elasticity for this purpose. The buffer layer may also include a material having an adhesive force. In addition, the first and second buffer layers 5063 and 5065 may include a non-conductive material and an optically transmissive material. For example, an optically clear adhesive may be used for the first and second buffer layers 5063 and 5065.

The material for forming the first and second buffer layers 5063 and 5065 is not particularly limited as long as it is optically transparent and is capable of buffering stress or impact while attaching each of the epitaxial stacks stably. For example, the first and second buffer layers 5063 and 5065 may be formed of an organic material including an epoxy-based polymer such as SU-8, various resists, parylene, poly(methyl methacrylate) (PMMA), benzocyclobutene (BCB), spin on glass (SOG), or others, and inorganic material such as silicon oxide, aluminum oxide, or the like. If necessary, a conductive oxide may also be used as a buffer layer, in which case the conductive oxide should be insulated from other components. When an organic material is used as the buffer layer, the organic material may be applied to the adhesive surface and then bonded at a high temperature and a high pressure in a vacuum state. When an inorganic material is used as the buffer layer, the inorganic material may be deposited on the adhesive surface and then planarized by chemical-mechanical planarization (CMP) or the like, after which the surface is subjected to the plasma treatment and then bonded by bonding under a high vacuum.

Referring to FIG. 87B, each of the first and second buffer layers 5063 and 5065 may include an adhesion enhancing layer 5063*a* or 5065*a* for adhering two epitaxial stacks adjacent to each other, and an shock absorbing layer 5063*b* or 5065*b* for relieving stress or impact between the two adjacent epitaxial stacks.

The shock absorbing layer 5063*b* and 5065*b* between two adjacent epitaxial stacks plays a role of absorbing stress or impact when at least one of the two adjacent epitaxial stacks is exposed to stress or impact.

The material that forms the shock absorbing layer 5063*b* and 5065*b* may include, but is not limited to, silicon oxide, silicon nitride, aluminum oxide, or others. In an exemplary embodiment, the shock absorbing layer 5063*b* and 5065*b* may include silicon oxide.

In an exemplary embodiment, in addition to stress or impact absorption, the shock absorbing layer 5063*b* and 5065*b* may have a predetermined adhesion force to adhere two adjacent epitaxial stacks. In particular, the shock absorbing layer 5063*b* and 5065*b* may include a material with surface energy similar or equivalent to the surface energy of the epitaxial stack to facilitate adhesion to the epitaxial stack. For example, when the surface of the epitaxial stack is imparted with hydrophilicity through a plasma treatment or others, a hydrophilic material such as silicon oxide may be used as the shock absorbing layer in order to improve adhesion to the hydrophilic epitaxial stack.

The adhesion enhancing layer 5063*a* or 5065*a* serves to firmly adhere two adjacent epitaxial stacks. Examples of the material for forming the adhesion enhancing layer 5063*a* or 5065*a* include, but are not limited to, epoxy-based polymers such as SOG, SU-8, various resists, parylene, poly(methyl methacrylate) (PMMA), benzocyclobutene (BCB), or others. In an exemplary embodiment, the adhesion enhancing layer 5063*a* or 5065*a* may include SOG.

In an exemplary embodiment, the first buffer layer 5063 may include a first adhesion enhancing layer 5063*a* and a first shock absorbing layer 5063*b*, and the second buffer layer 5065 may include a second adhesion enhancing layer 5065*a* and a second shock absorbing layer 5065*b*. In an exemplary embodiment, each of the adhesion enhancing layer and the shock absorbing layer may be provided as one layer, but are not limited thereto, and in another exemplary embodiment, each of the adhesion enhancing layer and the shock absorbing layer may be provided as a plurality of layers.

In an exemplary embodiment, the order of stacking the adhesion enhancing layer and the shock absorbing layer may be variously changed. For example, the shock absorbing layer may be stacked on the adhesion enhancing layer, or conversely, the adhesion enhancing layer may be stacked on the shock absorbing layer. In addition, the order of stacking the adhesion enhancing layer and the shock absorbing layer in the first buffer layer 5063 and the second buffer layer 5065 may be different. For example, in the first buffer layer 5063, the first shock absorbing 5063*b* layer and the first adhesion enhancing layer 5063*a* may be sequentially stacked, while in the second buffer layer 5065, the first adhesion enhancing layer 5065*a* and the second shock absorbing layer 5065*b* may be stacked sequentially. FIG. 87B shows an exemplary embodiment where the first shock absorbing layer 5063*b* is stacked on the first adhesion enhancing layer 5063*a* in the first buffer layer 5063, and the second shock absorbing layer 5065*b* is stacked on the second adhesion enhancing layer 5065*a* in the second buffer layer 5065.

In an exemplary embodiment, the thicknesses of the first buffer layer 5063 and the second buffer layer 5065 may be substantially the same as each other or different from each other. The thicknesses of the first buffer layer 5063 and the second buffer layer 5065 may be determined in consideration of the amount of impact to the epitaxial stacks in the stacking process of the epitaxial stacks. In an exemplary embodiment, the thickness of the first buffer layer 5063 may be greater than the thickness of the second buffer layer 5065. In particular, the thickness of the first shock absorbing layer 5063*b* in the first buffer layer 5063 may be greater than the thickness of the second shock absorbing layer 5065*b* in the second buffer layer 5065.

The light emitting stacked structure according to an exemplary embodiment may be manufactured through a process in which the first to third epitaxial stacks 5020, 5030, and 5040 are stacked sequentially, and accordingly, the second epitaxial stack 5030 is stacked after the first epitaxial stack 5020 is stacked, and the third epitaxial stack 5040 is stacked after both the first and second epitaxial stacks 5020 and 5030 are stacked. Accordingly, the amount of stress or impact that may be applied to the first epitaxial stack 5020 during a process is greater than the amount of stress or impact that may be applied to the second epitaxial stack 5030, and with an increased frequency. In particular, since the second epitaxial stack 5030 is stacked in a state that the stack thereunder has a shallow thickness, the second epitaxial stack 5030 is subjected to a greater amount of stress or impact than the stress or impact exerted to the third epitaxial stack 5040 that is stacked on the underlying stack of a relatively greater thickness. In an exemplary embodiment, the thickness of the first buffer layer 5063 is greater than the thickness of the second buffer layer 5065 to compensate for the difference in stress or impact mentioned above.

Figure 88:
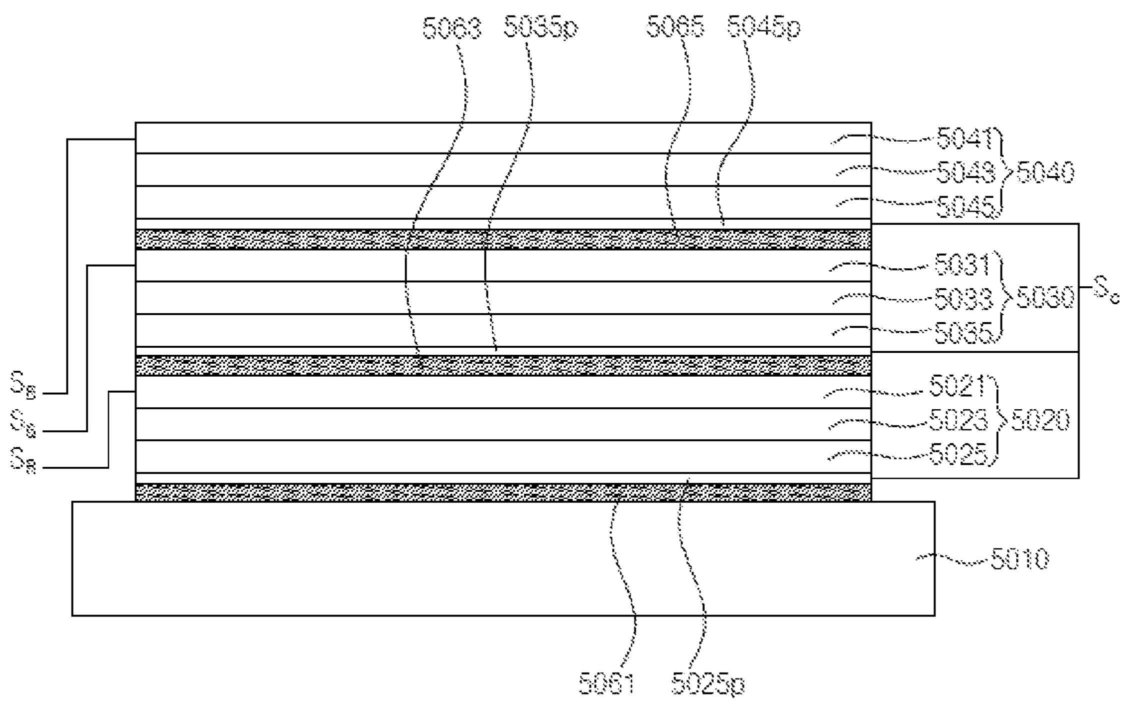
FIG. 88 is a cross-sectional view of a light emitting stacked structure including a wiring part according to an exemplary embodiment.

FIG. 88 is a cross-sectional view of a light emitting stacked structure according to an exemplary embodiment.

Referring to FIG. 88, each of the first to third epitaxial stacks 5020, 5030, and 5040 may be provided on the substrate 5010 via the adhesive layer 5061 and the first and second buffer layers 5063 and 5065 interposed therebetween.

Each of the first to third epitaxial stacks 5020, 5030, and 5040 includes p-type semiconductor layers 5025, 5035, and 5045, active layers 5023, 5033, and 5043, and n-type semiconductor layers 5021, 5031, and 5041, which are sequentially disposed.

The p-type semiconductor layer 5025, the active layer 5023, and the n-type semiconductor layer 5021 of the first epitaxial stack 5020 may include a semiconductor material that emits red light.

Examples of a semiconductor material that emits red light may include aluminum gallium arsenide (AlGaAs), gallium arsenide phosphide (GaAsP), aluminum gallium indium phosphide (AlGaInP), gallium phosphide (GaP), or others. However, the semiconductor material that emits red light is not limited thereto, and various other materials may be used.

A first p-type contact electrode 5025*p* may be provided under the p-type semiconductor layer 5025 of the first epitaxial stack 5020. The first p-type contact electrode 5025*p* of the first epitaxial stack 5020 may be a single layer or a multi-layer metal. For example, the first p-type contact electrode 5025*p* may include various materials including metals such as Al, Ti, Cr, Ni, Au, Ag, Ti, Sn, Ni, Cr, W, Cu, or others, or alloys thereof. The first p-type contact electrode 5025*p* may include metal having a high reflectivity, and accordingly, since the first p-type contact electrode 5025*p* is formed of metal having a high reflectivity, it is possible to increase the emission efficiency of light emitted from the first epitaxial stack 5020 in the upper direction.

A first n-type contact electrode 5021*n* may be provided on an upper portion of the n-type semiconductor layer of the first epitaxial stack 5020. The first n-type contact electrode 5021*n* of the first epitaxial stack 5020 may be a single layer or a multi-layer metal. For example, the first n-type contact electrode 5021*n* may be formed of various materials including metals such as Al, Ti, Cr, Ni, Au, Ag, Ti, Sn, Ni, Cr, W, Cu, or others, or alloys thereof. However, the material of the first n-type contact electrode 5021*n* is not limited to those mentioned above, and accordingly, other conductive materials may be used.

The second epitaxial stack 5030 includes an n-type semiconductor layer 5031, an active layer 5033, and a p-type semiconductor layer 5035, which are sequentially disposed. The n-type semiconductor layer 5031, the active layer 5033, and the p-type semiconductor layer 5035 may include a semiconductor material that emits green light. Examples of materials for emitting green light include indium gallium nitride (InGaN), gallium nitride (GaN), gallium phosphide (GaP), aluminum gallium indium phosphide (AlGaInP), and aluminum gallium phosphide (AlGaP). However, the semiconductor material that emits green light is not limited thereto, and various other materials may be used.

A second p-type contact electrode 5035*p* is provided under the p-type semiconductor layer 5035 of the second epitaxial stack 5030. The second p-type contact electrode 5035*p* is provided between the first epitaxial stack 5020 and the second epitaxial stack 5030, or specifically, between the first buffer layer 5063 and the second epitaxial stack 5030.

Each of the second p-type contact electrodes 5035*p* may include a transparent conductive oxide (TCO). The transparent conductive oxide may include tin oxide (SnO), indium oxide (InO2), zinc oxide (ZnO), indium tin oxide (ITO), indium tin zinc oxide (ITZO) or others. The transparent conductive compound may be deposited by the chemical vapor deposition (CVD), the physical vapor deposition (PVD), such as an evaporator, a sputter, or others. The second p-type contact electrode 5035*p* may be provided with a sufficient thickness to serve as an etch stopper in the fabrication process to be described below, for example, with a thickness of about 5001 angstroms to about 2 micrometers to the extent that the transparency is satisfied.

The third epitaxial stack 5040 includes a p-type semiconductor layer 5045, an active layer 5043, and an n-type semiconductor layer 5041, which are sequentially disposed. The p-type semiconductor layer 5045, the active layer 5043, and the n-type semiconductor layer 5041 may include a semiconductor material that emits blue light. The examples of the materials that emit blue light may include gallium nitride (GaN), indium gallium nitride (InGaN), zinc selenide (ZnSe), or others. However, the semiconductor material that emits blue light is not limited thereto, and various other materials may be used.

A third p-type contact electrode **5045*p* is provided under the p-type semiconductor layer 5045 of the third epitaxial stack 5040. The third p-type contact electrode 5045*p* is provided between the second epitaxial stack 5030 and the third epitaxial stack 5040, or specifically, between the second buffer layer 5065 and the third epitaxial stack 5040**.

The second p-type contact electrode **5035*p* and the third p-type contact electrode 5045*p* between the p-type semiconductor layer 5035 of the second epitaxial stack 5030, and the p-type semiconductor layer 5045 of the third epitaxial stack 5040 are shared electrodes shared by the second epitaxial stack 5030 and the third epitaxial stack 5040**.

Since the second p-type contact electrode **5035*p* and the third p-type contact electrode 5045*p* are at least partially in contact with each other, and physically and electrically connected to each other, when a signal is applied to at least a portion of the second p-type contact electrode 5035*p* or the third p-type contact electrode 5045*p*, the same signal can be applied to the p-type semiconductor layer 5035 of the second epitaxial stack 5030 and the p-type semiconductor layer 5045 of the third epitaxial stack 5040 at the same time. For example, when a common voltage is applied to one of the second p-type contact electrode 5035*p* and the third p-type contact electrode 5045*p*, the common voltage is applied to the p-type semiconductor layers of each of the second and third epitaxial stacks 5030 and 5040 through both the second p-type contact electrode 5035*p* and the third p-type contact electrode 5045*p***.

In the illustrated exemplary embodiment, although the n-type semiconductor layers 5021, 5031, and 5041 and the p-type semiconductor layers 5025, 5035, and 5045 of the first to third epitaxial stacks 5020, 5030, and 5040 are each shown as a single layer, these layers may be multilayers and may also include superlattice layers. In addition, the active layers 5023, 5033, and 5043 of the first to third epitaxial stacks 5020, 5030, and 5040 may include a single quantum well structure or a multi-quantum well structure.

In an exemplary embodiment, the second and third p-type contact electrodes **5035*p* and 5045*p*, which are shared electrodes, substantially cover the second and third epitaxial stacks 5030 and 5040. The second and third p-type contact electrodes 5035*p* and 5045*p* may include a transparent conductive material to transmit light from the epitaxial stack below. For example, each of the second and third p-type contact electrodes 5035*p* and 5045*p* may include a transparent conductive oxide (TCO). The transparent conductive oxide may include tin oxide (SnO), indium oxide (InO2), zinc oxide (ZnO), indium tin oxide (ITO), indium tin zinc oxide (ITZO) or others. The transparent conductive compound may be deposited by the chemical vapor deposition (CVD), the physical vapor deposition (PVD), such as an evaporator, a sputter, or others. The second and third p-type contact electrodes 5035*p* and 5045*p*** may be provided with a sufficient thickness to serve as an etch stopper in the fabrication process to be described below, for example, with a thickness of about 5001 angstroms to about 2 micrometers to the extent that the transparency is satisfied.

In an exemplary embodiment, common lines may be connected to the first to third p-type contact electrodes **5025*p*, 5035*p*, and 5045*p*. In this case, the common line is a line to which the common voltage is applied. In addition, the light emitting signal lines may be connected to the n-type semiconductor layers 5021, 5031, and 5041 of the first to third epitaxial stacks 5020, 5030, and 5040, respectively. A common voltage SC is applied to the first p-type contact electrode 5025*p*, the second p-type contact electrode 5035*p*, and the third p-type contact electrode 5045*p* through the common line, and the light emitting signal is applied to the n-type semiconductor layer 5021 of the first epitaxial stack 5020, the n-type semiconductor layer 5031 of the second epitaxial stack 5030, and the n-type semiconductor layer 5041 of the third epitaxial stack 5040 through the light emitting signal line, thereby controlling the light emission of the first to third epitaxial stacks 5020, 5030, and 5040. The light emitting signal includes first to third light emitting signals SR, SG, and SB corresponding to the first to third epitaxial stacks 5020, 5030, and 5040**, respectively. In an exemplary embodiment, the first light emitting signal SR may be a signal corresponding to red light, the second light emitting signal SG may be a signal corresponding to green light, and the third light emitting signal SB may be a signal corresponding to an emission of blue light.

In the illustrated exemplary embodiment described above, it is described that a common voltage is applied to the p-type semiconductor layers 5025, 5035, and 5045 of the first to third epitaxial stacks 5020, 5030, and 5040, and the light emitting signal is applied to the n-type semiconductor layers 5021, 5031, and 5041 of the first to third epitaxial stacks 5020, 5030, and 5040, but the inventive concepts are not limited thereto. In another exemplary embodiment, a common voltage may be applied to the n-type semiconductor layers 5021, 5031, and 5041 of the first to third epitaxial stacks 5020, 5030, and 5040, and light emitting signals may be applied to the p-type semiconductor layers 5025, 5035, and 5045 of the first to third epitaxial stacks 5020, 5030, and 5040.

In this manner, the first to third epitaxial stacks 5020, 5030, and 5040 are driven according to a light emitting signal applied to each of the epitaxial stacks. In particular, the first epitaxial stack 5020 is driven according to a first light emitting signal SR, the second epitaxial stack 5030 is driven according to a second light emitting signal SG, and the third epitaxial stack 5040 is driven according to the third light emitting signal SB. In this case, the first, second, and third driving signals SR, SG, and SB are independently applied to the first to third epitaxial stacks 5020, 5030, and 5040, and as a result, each of the first to third epitaxial stacks 5020, 5030 and 5040 is independently driven. The light emitting stacked structure may finally provide light of various colors by combining the first to third color light emitted upward from the first to third epitaxial stacks 5020, 5030, and 5040.

The light emitting stacked structure according to an exemplary embodiment may implement a color in a manner such that portions of different color light are provided on the overlapped region, rather than implementing different color light on different planes spaced apart from each other, thereby advantageously providing compactness and integration of the light emitting element. In a conventional light emitting element, in order to realize full color, light emitting elements that emit different colors, such as red, green, and blue light are generally placed apart from each other on a plane, which would occupy a relatively large area as each of the light emitting elements is arranged on a plane. However, in the light emitting stacked structure according to an exemplary embodiment, it is possible to realize a full color in a remarkably smaller area compared to the conventional light emitting element, by providing a stacked structure having the portions of the light emitting elements that emit different color light overlapped in one region. Accordingly, it is possible to manufacture a high-resolution device even in a small area.

In addition, the light emitting stacked structure according to an exemplary embodiment significantly reduces defects that may occur during manufacture. In particular, the light emitting stacked structure can be manufactured by stacking in the order of the first to third epitaxial stacks, in which case the second epitaxial stack is stacked in a state that the first epitaxial stack is stacked, and the third epitaxial stack is stacked in a state that both the first and second epitaxial stacks are stacked. However, since the first to third epitaxial stacks are first manufactured on a separate temporary substrate, and then stacked by being transferred onto the substrate, defects may occur during the step of transferring onto the substrate and removing the temporary substrate, the first to third epitaxial stacks and other components on the first to third epitaxial stacks may be exposed to stress or impact. However, since the light emitting stacked structure according to an exemplary embodiment includes a buffer layer, or a stress or shock absorbing layer, between adjacent epitaxial stacks, defects that may occur during processing may be reduced.

In addition, the conventional light emitting device has a complex structure and thus require a complicated manufacturing process, as it would require separately preparing respective light emitting elements and then forming separate contacts such as connecting by interconnection lines, or others, for each of the light emitting elements. However, according to an exemplary embodiment, the light emitting stacked structure is formed by stacking multi-layers of epitaxial stacks sequentially on a single substrate 5010, and then forming contacts on the multi-layered epitaxial stacks and connecting by lines through a minimum process. In addition, since light emitting elements of individual colors are separately manufactured and mounted separately, only a single light emitting stacked structure is mounted according to an exemplary embodiment, instead of a plurality of light emitting elements. Accordingly, the manufacturing method is simplified significantly.

The light emitting stacked structure according to an exemplary embodiment may additionally employ various components to provide high purity and color light of high efficiency. For example, a light emitting stacked structure according to an exemplary embodiment may include a wavelength pass filter to block short wavelength light from proceeding toward the epitaxial stack that emits relatively long wavelength light.

In the following exemplary embodiments, in order to avoid redundant descriptions, differences from the exemplary embodiments described above will be mainly described.

Figure 89:
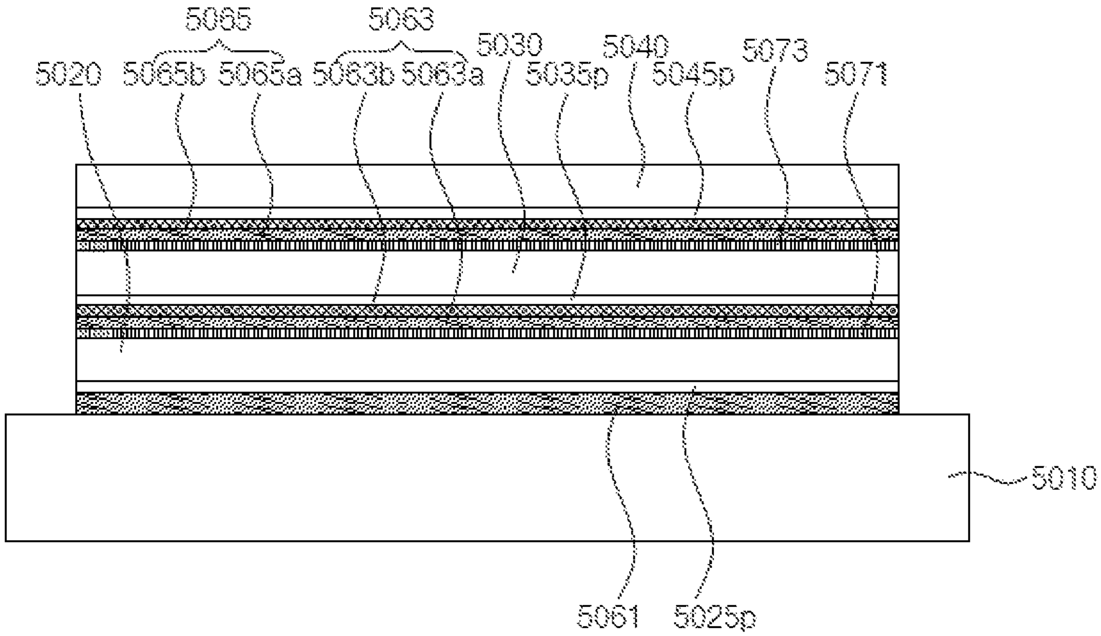
FIG. 89 is a cross-sectional view illustrating a light emitting stacked structure according to an exemplary embodiment.

FIG. 89 is a cross-sectional view of a light emitting stacked structure including a predetermined wavelength pass filter according to an exemplary embodiment.

Referring to FIG. 89, a first wavelength pass filter 5071 may be provided between the first epitaxial stack 5020 and the second epitaxial stack 5030 in a light emitting stacked structure according to an exemplary embodiment.

The first wavelength pass filter 5071 selectively transmits a certain wavelength light, and may transmit a first color light emitted from the first epitaxial stack 5020 while blocks or reflects light other than the first color light. Accordingly, the first color light emitted from the first epitaxial stack 5020 may travel in an upper direction, while the second and third color light emitted from the second and third epitaxial stacks 5030 and 5040 are blocked from traveling toward the first epitaxial stack 5020, and may be reflected or blocked by the first wavelength pass filter 5071.

The second and third color light are high-energy light that may have a relatively shorter wavelength than the first color light, which may additional light emission in the first epitaxial stack 5020 when entering the first epitaxial stack 5020. In an exemplary embodiment, the second and the third color light may be blocked from entering the first epitaxial stack 5020 by the first wavelength pass filter 5071.

In an exemplary embodiment, a second wavelength pass filter 5073 may be provided between the second epitaxial stack 5030 and the third epitaxial stack 5040. The second wavelength pass filter 5073 transmits the first color light and the second color light emitted from the first and second epitaxial stacks 5020 and 5030, while blocking or reflecting light other than the first and second color light. Accordingly, the first and second color light emitted from the first and second epitaxial stacks 5020 and 5030 may travel in the upper direction, while the third color light emitted from the third epitaxial stack 5040 is not allowed to travel in a direction toward the first and second epitaxial stacks 5020 and 5030, but reflected or blocked by the second wavelength pass filter 5073.

As described above, the third color light is a relatively high-energy light having a shorter wavelength than the first and second color light, and when entering the first and second epitaxial stacks 5020 and 5030, the third color light may induce additional emission in the first and second epitaxial stacks 5020 and 5030. In an exemplary embodiment, the second wavelength pass filter 5073 prevents the third light from entering the first and second epitaxial stacks 5020 and 5030.

The first and second wavelength pass filters 5071 and 5073 may be formed in various shapes, and may be formed by alternately stacking insulating films having different refractive indices. For example, the wavelength of transmitted light may be determined by alternately stacking $SiO_2$ and $TiO_2$, and adjusting the thickness and number of stacking of $SiO_2$ and $TiO_2$. The insulating films having different refractive indices may include $SiO_2$, $TiO_2$, $HfO_2$, $Nb_2O_5$, $ZrO_2$, $Ta_2O_5$, or others.

When the first and second wavelength pass filters 5071 and 5073 are formed by stacking inorganic insulating films having different refractive indices from each other, defects due to stress or impact during the manufacturing process, for example, peel-off or cracks may occur. However, according to an exemplary embodiment, such defects may be significantly reduced by providing a buffer layer to relieve the impact.

The light emitting stacked structure according to an exemplary embodiment may additionally employ various components to provide uniform light of high efficiency. For example, a light emitting stacked structure according to an exemplary embodiment may have various irregularities (or roughened surface) on the light exit surface. For example, a light emitting stacked structure according to an exemplary embodiment may have irregularities formed on an upper surface of at least one n-type semiconductor layer of the first to third epitaxial stacks 5020, 5030, and 5040.

In an exemplary embodiment, the irregularities of each of the epitaxial stacks may be selectively formed. For example, irregularities may be provided on the first epitaxial stack 5020, irregularities may be provided on the first and third epitaxial stacks 5020 and 5040, or irregularities may be provided on the first to third epitaxial stacks 5020, 5030 and 5040. The irregularities of each of the epitaxial stacks may be provided on an n-type semiconductor layer corresponding to the emission surface of each of the epitaxial stacks.

The irregularities are provided to increase light emission efficiency, and may be provided in various forms such as a polygonal pyramid, a hemisphere, or planes with a surface roughness in a random arrangement. The irregularities may be textured through various etching processes or by using a patterned sapphire substrate.

In an exemplary embodiment, the first to third color light from the first to third epitaxial stacks 5020, 5030, and 5040 may have different light intensities, and this difference in intensity may lead to differences in visibility. The light emission efficiency may be improved by selectively forming irregularities on the light exit surface of the first to third epitaxial stacks 5020, 5030 and 5040, which results in reduction of the visibility differences between the first to third color light. The color light corresponding to red and/or blue color may have lower visibility than the green color, in which case the first epitaxial stack 5020 and/or the third epitaxial stack 5040 may be textured to decrease the difference of visibility. In particularly, when the lowermost of the light emitting stacks emits red color light, the light intensity may be small. As such, the light efficiency may be increased by forming irregularities on the upper surface thereof.

The light emitting stacked structure having the structure described above is a light emitting element capable of expressing various colors, and thus may be employed as a pixel in a display device. In the following exemplary embodiment, a display device will be described as including the light emitting stacked structure according to exemplary embodiments.

Figure 90:
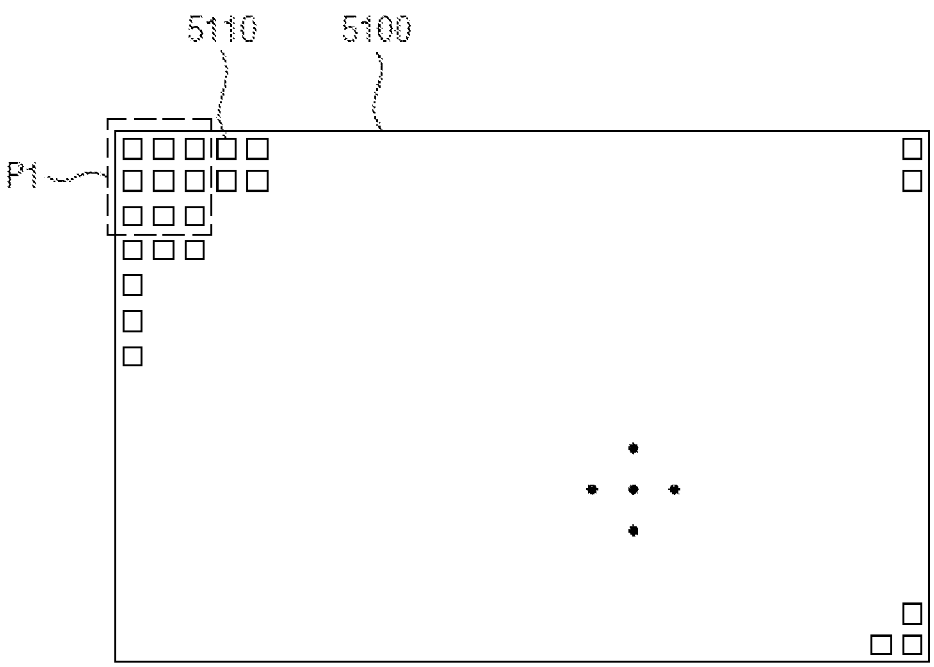
FIG. 90 is a plan view of a display device according to an exemplary embodiment.
Figure 91:
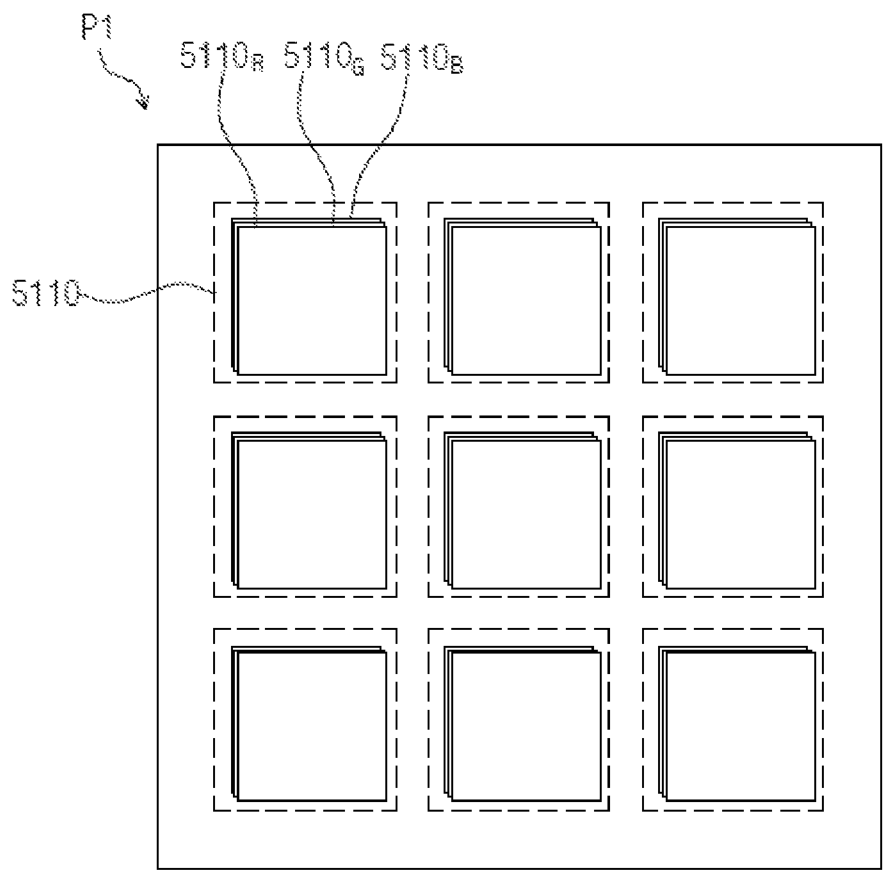
FIG. 91 is an enlarged plan view of portion P1 of FIG. 90.

FIG. 90 is a plan view of a display device according to an exemplary embodiment, and FIG. 91 is an enlarged plan view illustrating portion P1 of FIG. 90.

Referring to FIGS. 90 and 91, the display device 5110 according to an exemplary embodiment may display any visual information such as text, video, photographs, two or three-dimensional images, or others.

The display device 5110 may be provided in various shapes including a closed polygon that includes a straight side, such as a rectangle, or a circle, an ellipse, or the like, that includes a curved side, a semi-circle, or semi-ellipse that includes a combination of straight and curved sides. In an exemplary embodiment, the display device will be described as having substantially a rectangular shape.

The display device 5110 has a plurality of pixels 5110 for displaying images. Each of the pixels 5110 may be a minimum unit for displaying an image. Each pixel 5110 includes the light emitting stacked structure having the structure described above, and may emit white light and/or color light.

In an exemplary embodiment, each pixel includes a first pixel 5110R that emits red light, a second pixel 5110G that emits green light, and a third pixel 5110B that emits blue light. The first to third pixels 5110R, 5110G, and 5110B may correspond to the first to third epitaxial stacks 5020, 5030, and 5040 of the light emitting stacked structure described above, respectively.

The pixels 5110 are arranged in a matrix. As used herein, pixels arranged in "a matrix" may not only refer to when the pixels 5110 are arranged in a line along the row or column, but also to when the pixels 5110 are arranged in any repeating pattern, such as generally along the rows and columns, with certain modifications in details, such as the pixels 5110 being arranged in a zigzag shape, for example.

Figure 92:
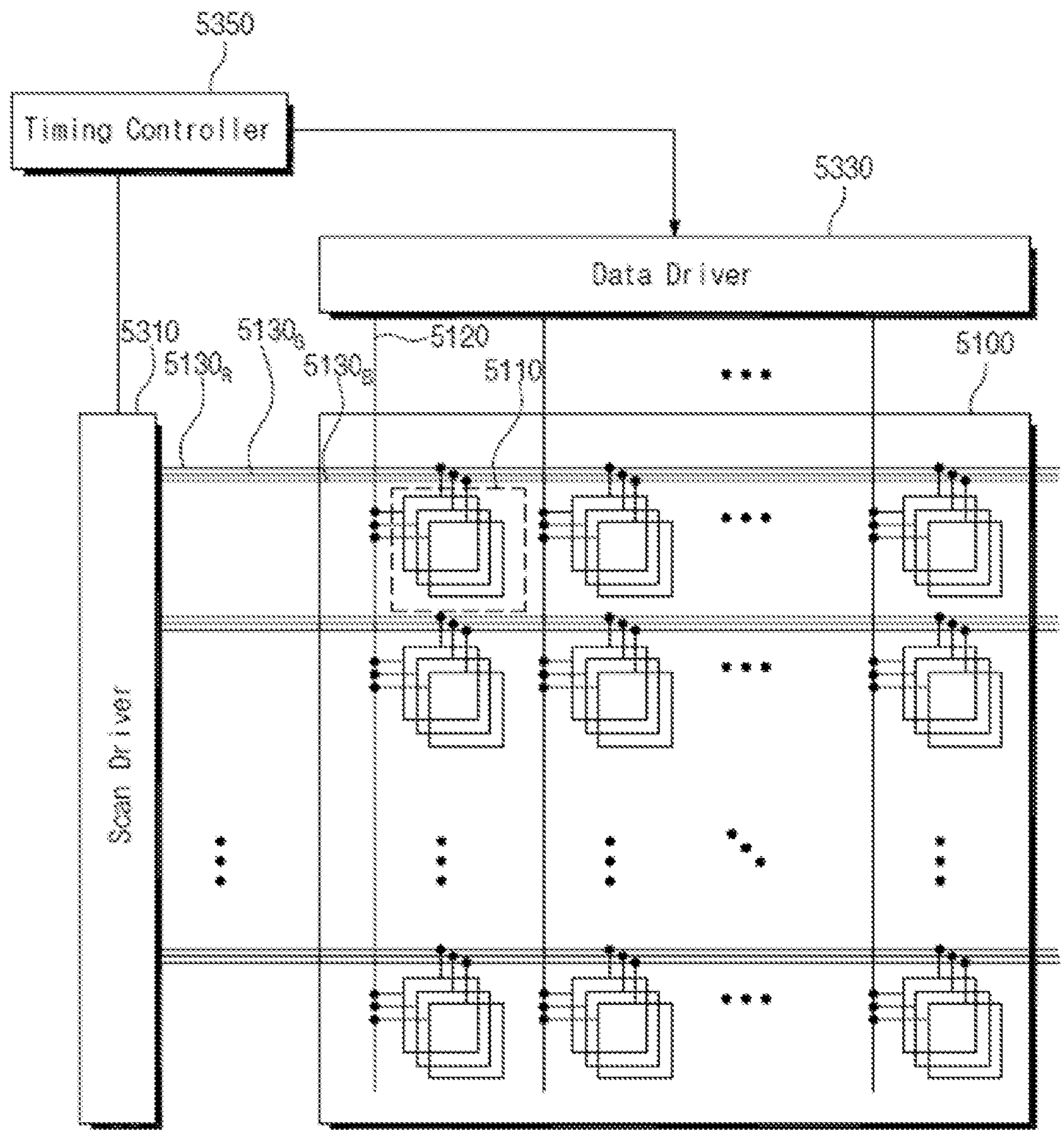
FIG. 92 is a structural diagram of a display device according to an exemplary embodiment.

FIG. 92 is a structural diagram of a display device according to an exemplary embodiment.

Referring to FIG. 92, a display device 5110 according to an exemplary embodiment includes a timing controller 5350, a scan driver 5310, a data driver 5330, a wiring part, and pixels. When the pixels include a plurality of pixels, each of the pixels is individually connected to the scan driver 5310, the data driver 5330, or the like through a wiring part.

The timing controller 5350 receives various control signals and image data necessary for driving a display device from outside (e.g., from a system for transmitting image data). The timing controller 5350 rearranges the received image data and transmits the image data to the data driver 5330. In addition, the timing controller 5350 generates scan control signals and data control signals necessary for driving the scan driver 5310 and the data driver 5330, and outputs the generated scan control signals and data control signals to the scan driver 5310 and the data driver 5330.

The scan driver 5310 receives scan control signals from the timing controller 5350 and generates corresponding scan signals. The data driver 5330 receives data control signals and image data from the timing controller 5350, and generates corresponding data signals.

The wiring part includes a plurality of signal lines. The wiring part includes scan lines 5130 connecting the scan driver 5310 and the pixels, and data lines 5120 connecting the data driver 5330 and the pixels. The scan lines 5130 may be connected to respective pixels, and accordingly, the scan lines 5130 that correspond to the respective pixels are marked as first to third scan lines 5130R, 5130G, and 5130B (hereinafter, collectively referred to by '5130').

In addition, the wiring part further includes lines connecting between the timing controller 5350 and the scan driver 5310, the timing controller 5350 and the data driver 5330, or other components, and transmitting the signals.

The scan lines 5130 provide the scan signals generated at the scan driver 5310 to the pixels. The data signals generated at the data driver 5330 is outputted to the data lines 5120.

The pixels are connected to the scan lines 5130 and data lines 5120. The pixels selectively emit light in response to the data signals inputted from the data lines 5120 when the scan signals are supplied from scan lines 5130. For example, during each frame period, each of the pixels emits light with the luminance corresponding to the input data signals. The pixels supplied with data signals corresponding to black luminance display black by emitting no light during the corresponding frame period.

In an exemplary embodiment, the pixels may be driven as either passive or active type. When the display device is driven as the active type, the display device may be supplied with the first and second pixel powers in addition to the scan signals and the data signals.

Figure 93:
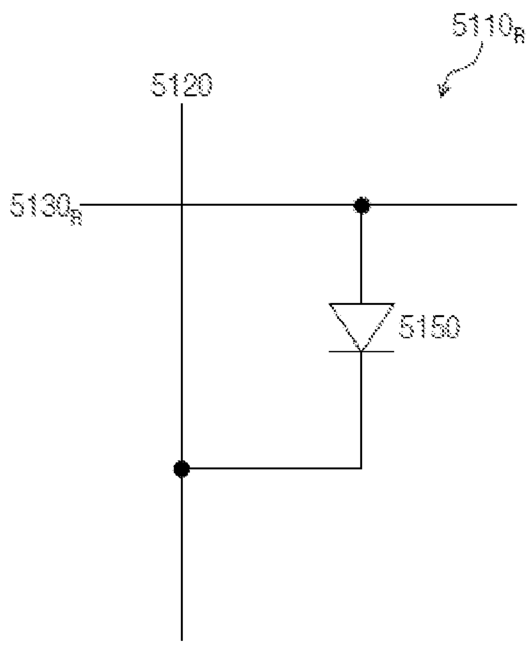
FIG. 93 is a circuit diagram of one pixel of a passive type display device.

FIG. 93 is a circuit diagram of one pixel of a passive type display device. The pixel may be one of R, G, B pixels, and the first pixel 5110R is illustrated as an example. Since the second and third pixels may be driven in substantially the same manner as the first pixel, the circuit diagrams for the second and third pixels will be omitted.

Referring to FIG. 93, a first pixel 5110R includes a light emitting element 150 connected between a scan line 5130 and a data line 5120. The light emitting element 150 may correspond to the first epitaxial stack 5020. The first epitaxial stack 5020 emits light with a luminance corresponding to a magnitude of the applied voltage when a voltage equal to or greater than a threshold voltage is applied between the p-type semiconductor layer and the n-type semiconductor layer. In particular, the emission of the first pixel 5110R may be controlled by controlling the voltages of the scan signal applied to the first scan line 5130R and/or the data signal applied to the data line 5120.

Figure 94:
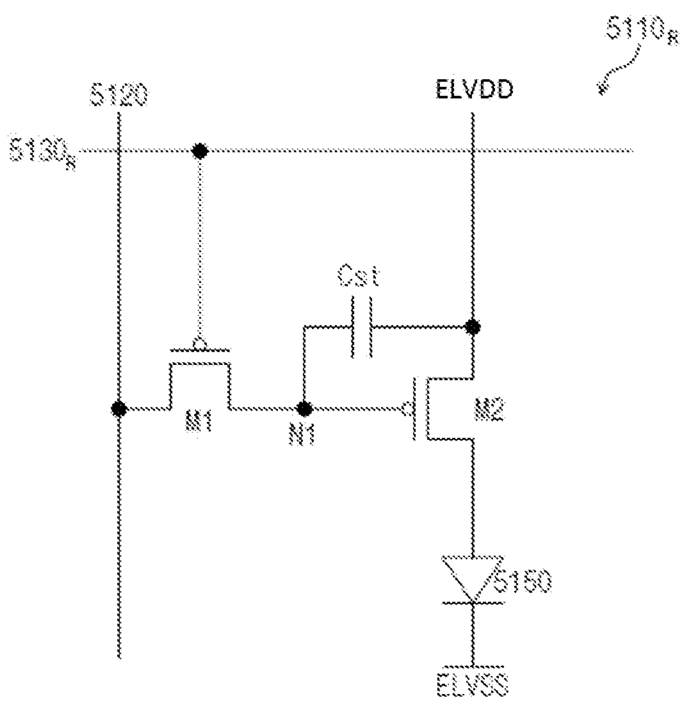
FIG. 94 is a circuit diagram of one pixel of an active type display device.

FIG. 94 is a circuit diagram of a first pixel of an active type display device.

When the display device is the active type, the first pixel 5110R may be further supplied with the first and second pixel powers (ELVDD and ELVSS) in addition to the scan signal and the data signal.

Referring to FIG. 94, the first pixel 5110R includes a light emitting element 150 and a transistor part connected thereto. The light emitting element 150 may correspond to the first epitaxial stack 5020, and the p-type semiconductor layer of the light emitting element 150 may be connected to the first pixel power ELVDD via the transistor part, and the n-type semiconductor layer may be connected to a second pixel power ELVSS. The first pixel power ELVDD and the second pixel power ELVSS may have different potentials from each other. For example, the second pixel power ELVSS may have potential lower than that of the first pixel power ELVDD, by at least the threshold voltage of the light emitting element. Each of these light emitting elements emits light with a luminance corresponding to the driving current controlled by the transistor part.

According to an exemplary embodiment, the transistor part includes first and a second transistors M1 and M2 and a storage capacitor Cst. However, the inventive concepts are not limited thereto, and the structure of the transistor part may be varied.

The source electrode of the first transistor M1 (e.g., switching transistor) is connected to the data line 5120, and the drain electrode is connected to the first node N1. Further, the gate electrode of the first transistor is connected to the first scan line 5130R. The first transistor is turned on when a scan signal of a voltage capable of turning on the first transistor M1 is supplied from the first scan line 5130R to the data line 5120, to electrically connect the first node N1. The data signal of the corresponding frame is supplied to the data line 5120, and accordingly, the data signal is transmitted to the first node N1. The data signal transmitted to the first node N1 is charged in the storage capacitor Cst.

The source electrode of the second transistor M2 is connected to the first pixel power ELVDD, and the drain electrode is connected to the n-type semiconductor layer of the light emitting element. The gate electrode of the second transistor M2 is connected to the first node N1. The second transistor M2 controls an amount of driving current supplied to the light emitting element corresponding to the voltage of the first node N1.

One electrode of the storage capacitor Cst is connected to the first pixel power ELVDD, and the other electrode is connected to the first node N1. The storage capacitor Cst charges the voltage corresponding to the data signal supplied to the first node N1 and maintains the charged voltage until the data signal of the next frame is supplied.

FIG. 94 shows a transistor part including two transistors. However, the inventive concepts are not limited thereto, and various modifications are applicable to the structure of the transistor part. For example, the transistor part may include more transistors, capacitors, or the like. In addition, although the specific structures of the first and second transistors, storage capacitors, and lines are not shown, the first and second transistors, storage capacitors, and lines are not particularly limited and can be variously provided.

The pixels may be implemented in various structures within the scope of the inventive concepts. Hereinafter, a pixel according to an exemplary embodiment will be described with reference to a passive matrix type pixel.

Figure 95:
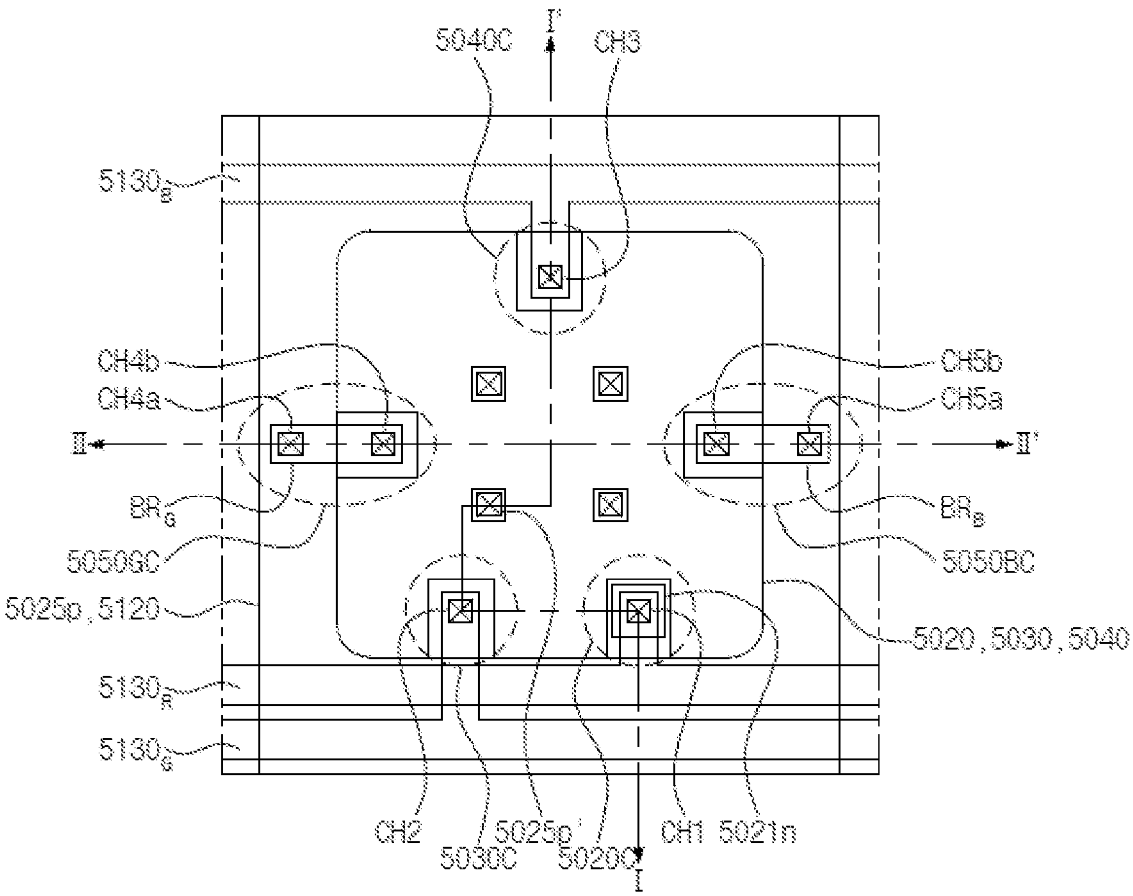
FIG. 95 is a plan view of a pixel according to an exemplary embodiment.
Figure 96A:
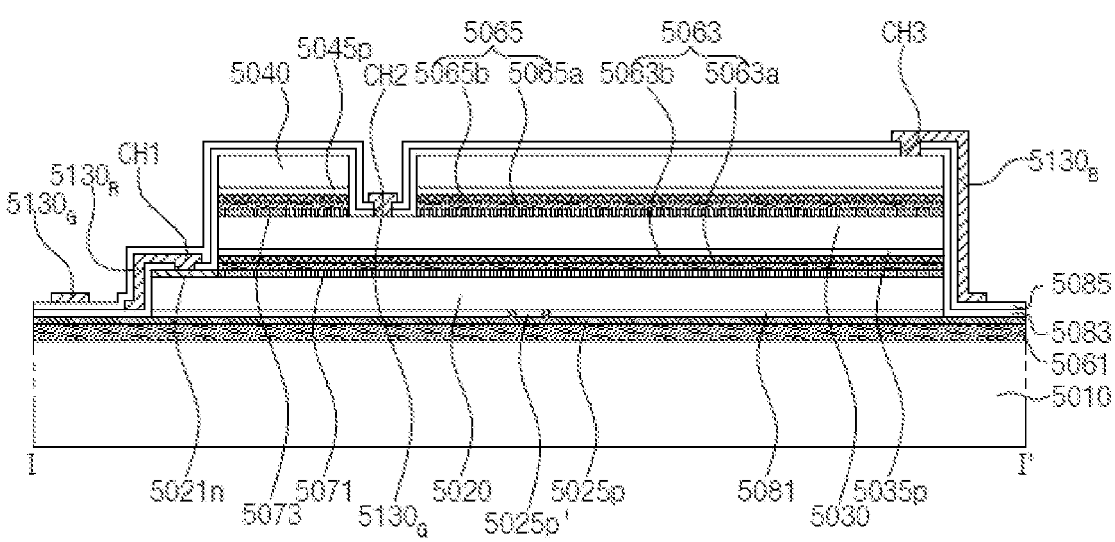
FIGS. 96A and 96B are cross-sectional views taken along lines I-I' and of FIG. 95, respectively.
Figure 96B:
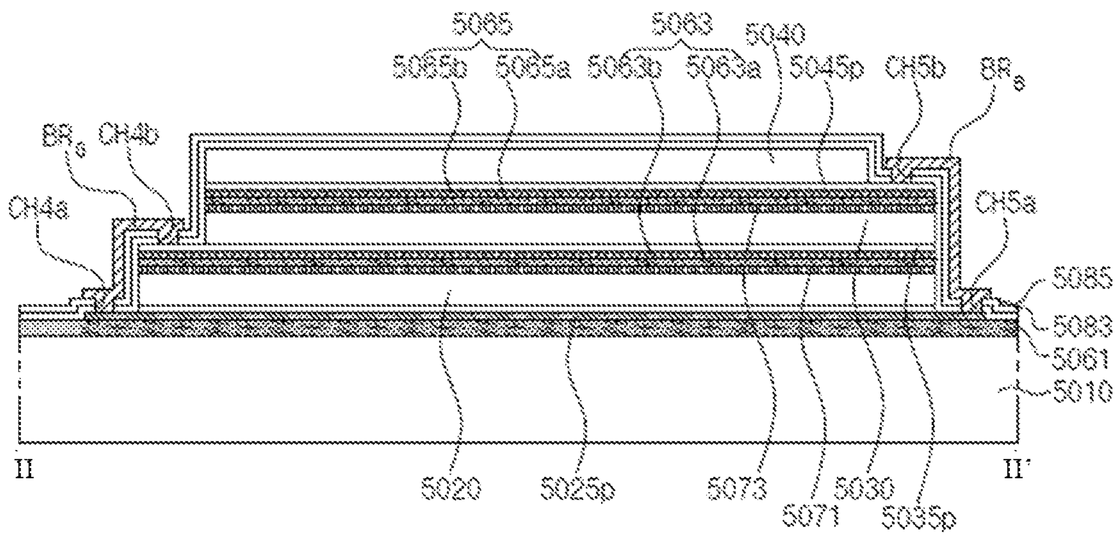

FIG. 95 is a plan view of a pixel according to an exemplary embodiment, and FIGS. 96A and 96B are cross-sectional views taken along lines I-I' and of FIG. 95, respectively.

Referring to FIGS. 95, 96A and 96B, viewing from a plan view, a pixel according to an exemplary embodiment includes a light emitting region in which a plurality of epitaxial stacks are stacked, and a peripheral region surrounding the light emitting region. The plurality of epitaxial stacks include first to third epitaxial stacks 5020, 5030, and 5040.

When viewed from a plan view, the pixel according to an exemplary embodiment has a light emitting region in which a plurality of epitaxial stacks are stacked. At least one side of the light emitting region is provided with a contact for connecting the wiring part to the first to third epitaxial stacks 5020, 5030, and 5040. The contact includes first and second common contacts 5050GC and 5050BC for applying a common voltage to the first to third epitaxial stacks 5020, 5030, and 5040, a first contact 5020C for providing a light emitting signal to the first epitaxial stack 5020, a second contact 5030C for providing a light emitting signal to the second epitaxial stack 5030, and a third contact 5040C for providing a light emitting signal to the third epitaxial stack 5040.

In an exemplary embodiment, the stacked structure may vary depending on the polarity of the semiconductor layers of the first to third epitaxial stacks 5020, 5030, and 5040 to which the common voltage is applied. That is, regarding the first and second common contacts 5050GC and 5050BC, when there are contact electrodes provided for applying a common voltage to each of the first to third epitaxial stacks 5020, 5030, and 5040, such contact electrodes may be referred to as the "first to third common contact electrodes", and the first to third contact electrodes may be the "first to third p-type contact electrodes", respectively, when the common voltage is applied to the p-type semiconductor layer. In an exemplary embodiment where a common voltage is applied to the n-type semiconductor layer, the first to third common contact electrodes may be first to third n-type contact electrodes, respectively. Hereinafter, a common voltage will be described as being applied to a p-type semiconductor layer, and thus, the first to third common contact electrodes will be described as corresponding to first to third p-type contact electrodes, respectively.

In an exemplary embodiment, when viewed from a plan view, the first and second common contacts 5050GC and 5050BC and the first to third contacts 5020C, 5030C, and 5040C may be provided at various positions. For example, when the light emitting stacked structure has substantially a square shape, the first and second common contacts 5050GC and 5050BC and the first to third contacts 5020C, 5030C, and 5040C may be disposed in regions corresponding to respective corners of the square. However, the positions of the first and second common contacts 550GC and 550BC and the first to third contacts 5020C, 5030C and 5040C are not limited thereto, and various modifications are applicable according to the shape of the light emitting stacked structure.

The plurality of epitaxial stacks include first to third epitaxial stacks 5020, 5030, and 5040. The first to third epitaxial stacks 5020, 5030, and 5040 are connected with first to third light emitting signal lines for providing light emitting signals to each of the first to third epitaxial stacks 5020, 5030, and 5040, and a common line for providing a common voltage to each of the first to third epitaxial stacks 5020, 5030, and 5040. In an exemplary embodiment, the first to third light emitting signal lines may correspond to the first to third scan lines 5130R, 5130G, and 5130B, and the common line may correspond to the data line 5120. Accordingly, the first to third scan lines 5130R, 5130G, and 5130B and the data line 5120 are connected to the first to third epitaxial stacks 5020, 5030, and 5040, respectively.

In an exemplary embodiment, the first to third scan lines 5130R, 5130G, and 5130B may extend substantially in a first direction (e.g., in a transverse direction as shown in the drawing). The data line 5120 may extend substantially in a second direction intersecting with the first to third scan lines 5130R, 5130G, and 5130B (e.g., in a longitudinal direction as shown in the drawing). However, the extending directions of the first to third scan lines 5130R, 5130G, and 5130B and the data line 5120 are not limited thereto, and various modifications are applicable according to the arrangement of the pixels.

The data line 5120 and the first p-type contact electrode 5025*p* extend substantially in a second direction intersecting the first direction, while concurrently providing a common voltage to the p-type semiconductor layer of the first epitaxial stack 5020. Accordingly, the data line 5120 and the first p-type contact electrode 5025*p* may be substantially the same component. Hereinafter, the first p-type contact electrode 5025*p* may be referred to as the data line 5120 or vice versa.

An ohmic electrode 5025*p*' for ohmic contact between the first p-type contact electrode 5025*p* and the first epitaxial stack 5020 is provided on the light emitting region provided with the first p-type contact electrode 5025*p*.

The first scan line 5130R is connected to the first epitaxial stack 5020 through the first contact hole CH1, and the data line 5120 is connected via the ohmic electrode 5025*p*'. The second scan line 5130G is connected to the second epitaxial stack 5030 through the second contact hole CH2 and the data line 5120 is connected through the $4a^{th}$ and $4b^{th}$ contact holes CH4*a* and CH4*b*. The third scan line 5130B is connected to the third epitaxial stack 5040 through the third contact hole CH3 and the data line 5120 is connected through the $5a^{th}$ and $5b^{th}$ contact holes CH5*a* and CH5*b*.

A buffer layer, a contact electrode, a wavelength pass filter, or the like are provided between the substrate 5010 and the first to third epitaxial stacks 5020, 5030, and 5040, respectively. Hereinafter, the pixel according to an exemplary embodiment will be described in the order of stacking.

According to an exemplary embodiment, a first epitaxial stack 5020 is provided on the substrate 5010 via an adhesive layer 5061 interposed therebetween. In the first epitaxial stack 5020, a p-type semiconductor layer, an active layer, and an n-type semiconductor layer are sequentially disposed from lower to upper sides.

A first insulating film 5081 is stacked on a lower surface of the first epitaxial stack 5020, that is, on the surface facing the substrate 5010. A plurality of contact holes are formed in the first insulating film 5081. The contact holes are provided with an ohmic electrode 5025*p*' in contact with the p-type semiconductor layer of the first epitaxial stack 5020. The ohmic electrode 5025*p*' may include a variety of materials. In an exemplary embodiment, the ohmic electrode 5025*p*' corresponding to the p-type ohmic electrode 5025*p*' may include an Au/Zn alloy or an Au/Be alloy. In this case, since the material of the ohmic electrode 5025*p*' is lower in reflectivity than Ag, Al, Au, or the like, additional reflective electrodes may be further disposed. As an additional reflective electrode, Ag, Au, or the like may be used, and Ti, Ni, Cr, Ta, or the like may be disposed as an adhesive layer for adhesion to adjacent components. In this case, the adhesive layer may be thinly deposited on the upper and lower surfaces of the reflective electrode including Ag, Au, or the like.

The first p-type contact electrode 5025*p* and the data line 5120 are in contact with the ohmic electrode 5025*p*'. The first p-type contact electrode 5025*p* (also serving as the data line 5120) is provided between the first insulating film 5081 and the adhesive layer 5061.

When viewed from a plan view, the first p-type contact electrode 5025*p* may be provided in a form such that the first p-type contact electrode 5025*p* overlaps the first epitaxial stack 5020, or more particularly, overlaps the light emitting region of the first epitaxial stack 5020, while covering most, or all of the light emitting region. The first p-type contact electrode 5025*p* may include a reflective material so that the first p-type contact electrode 5025*p* may reflect light from the first epitaxial stack 5020. The first insulating film 81 may also be formed to have a reflective property to facilitate the reflection of light from the first epitaxial stack 5020. For example, the first insulating film 81 may have an omni-directional reflector (ODR) structure.

In addition, the material of the first p-type contact electrode layer 5025*p* is selected from metals having high reflectivity to light emitted from the first epitaxial stack 5020, to maximize the reflectivity of light emitted from the first epitaxial stack 5020. For example, when the first epitaxial stack 5020 emits red light, metal having a high reflectivity to red light, for example, Au, Al, Ag, or the like may be used as the material of the first p-type contact electrode layer 5025*p*. Au does not have a high reflectivity to light emitted from the second and third epitaxial stacks 5030 and 5040 (e.g., green light and blue light), and thus can reduce a mixture of colors by light emitted from the second and third epitaxial stacks 5030 and 5040.

The first wavelength pass filter 5071 and the first n-type contact electrode 5021*n* are provided on an upper surface of the first epitaxial stack 5020. In an exemplary embodiment, the first n-type contact electrode 5021*n* may include various metals and metal alloys, including Au/Te alloy or Au/Ge alloy, for example.

The first wavelength pass filter 5071 is provided on the upper surface of the first epitaxial stack 5020 to cover substantially all the light emitting region of the first epitaxial stack 5020.

The first n-type contact electrode 5021*n* is provided in a region corresponding to the first contact 5020C and may include a conductive material. The first wavelength pass filter 5071 is provided with a contact hole through which the first n-type contact electrode 5021*n* is brought into contact with the n-type semiconductor layer on the upper surface of the first epitaxial stack 5020.

The first buffer layer 5063 is provided on the first epitaxial stack 5020, and the second p-type contact electrode 5035*p* and the second epitaxial stack 5030 are sequentially provided on the first buffer layer 5063. In the second epitaxial stack 5030, a p-type semiconductor layer, an active layer, and an n-type semiconductor layer are sequentially disposed from lower to upper sides.

In an exemplary embodiment, the region corresponding to the first contact 5020C of the second epitaxial stack 5030 is removed, thereby exposing a portion of the upper surface of the first n-type contact electrode 5021*n*. In addition, the second epitaxial stack 5030 may have a smaller area than the second p-type contact electrode 5035*p*. The region corresponding to the first common contact 550GC is removed from the second epitaxial stack 5030, thereby exposing a portion of the upper surface of the second p-type contact electrode 5035*p*.

The second wavelength pass filter 5073, the second buffer layer 5065, and the third p-type contact electrode 5045*p* are sequentially provided on the second epitaxial stack 5030. The third epitaxial stack 5040 is provided on the third p-type contact electrode 5045*p*. In the third epitaxial stack 5040, an n-type semiconductor layer, an active layer, and a p-type semiconductor layer are sequentially disposed from lower to upper sides.

The third epitaxial stack 5040 may have a smaller area than the second epitaxial stack 5030. The third epitaxial stack 5040 may have a smaller area than the third p-type contact electrode 5045*p*. The region corresponding to the second common contact 5050BC is removed from the third epitaxial stack 5040, thereby exposing a portion of the upper surface of the third p-type contact electrode 5045*p*.

The second insulating film 5083 covering the stacked structure of the first to third epitaxial stacks 5020, 5030, and 5040 is provided on the third epitaxial stack 5040. The second insulating film 5083 may include various organic/inorganic insulating materials, but is not limited thereto. For example, the second insulating film 5083 may include inorganic insulating material including silicon nitride and silicon oxide, or organic insulating material including polyimide.

The first contact hole CH1 is formed in the second insulating film 5083 to expose an upper surface of the first n-type contact electrode 5021*n* provided in the first contact 5020C. The first scan line is connected to the first n-type contact electrode 5021*n* through the first contact hole CH1.

A third insulating film 5085 is provided on the second insulating film 5083. The third insulating film 5085 may include a material substantially the same as or different from the second insulating film 5083. The third insulating film 5085 may include various organic/inorganic insulating materials, but is not limited thereto.

The second and third scan lines 5130G and 5130B and the first and second bridge electrodes $BR_G$ and $BR_B$ are provided on the third insulating film 5085.

The third insulating film 5085 is provided with a second contact hole CH2 for exposing an upper surface of the second epitaxial stack 5030 at the second contact 5030C, that is, exposing the n-type semiconductor layer of the second epitaxial stack 5030, a third contact hole CH3 for exposing an upper surface of the third epitaxial stack 5040 at the third contact 5040C, that is, exposing an n-type semiconductor layer of the third epitaxial stack 5040, $4a^{th}$ and $4b^{th}$ contact holes CH4*a* and CH4*b* for exposing an upper surface of the first p-type contact electrode 5025*p* and an upper surface of the second p-type contact electrode 5035*p*, at the first common contact 5050GC, and $5a^{th}$ and $5b^{th}$ contact holes CH5*a* and CH5*b* for exposing an upper surface of the first p-type contact electrode 5025*p* and an upper surface of the third p-type contact electrode 5045*p*, at the second common contact 5050BC.

The second scan line 5130G is connected to the n-type semiconductor layer of the second epitaxial stack 5030 through the second contact hole CH2. The third scan line 5130B is connected to the n-type semiconductor layer of the third epitaxial stack 5040 through the third contact hole CH3.

The data line 5120 is connected to the second p-type contact electrode 5035*p* through the $4a^{th}$ and $4b^{th}$ contact holes CH4*a* and CH4*b* and the first bridge electrode $BR_G$. The data line 5120 is also connected to the third p-type contact electrode 5045*p* through the $5a^{th}$ and $5b^{th}$ contact holes CH5*a* and CH5*b* and the second bridge electrode $BR_B$.

It is illustrated herein that the second and third scan lines 5130G and 5130B in an exemplary embodiment are electrically connected to the n-type semiconductor layer of the second and third epitaxial stacks 5030 and 5040 in direct contact with each other. However, in another exemplary embodiment, the second and third n-type contact electrodes may be further provided between the second and third scan lines 5130G and 5130B and the n-type semiconductor layers of the second and third epitaxial stacks 5030 and 5040.

According to an exemplary embodiment, irregularities may be selectively provided on the upper surfaces of the first to third epitaxial stacks 5020, 5030, and 5040, that is, on an upper surface of the n-type semiconductor of the first to third epitaxial stacks. Each of the irregularities may be provided only at a portion corresponding to the light emitting region, or may be provided over the entire upper surface of the respective semiconductor layers.

In addition, in an exemplary embodiment, a substantially, non-transmissive film may be further provided on sides of the second and/or third insulating films 5083 and 5085 that correspond to the sides of the pixel. The non-transmissive film is a light blocking film that includes a light absorbing or reflective material, which is provided to prevent light from the first to third epitaxial stacks 5020, 5030, and 5040 from emerging through the sides of the pixel.

In an exemplary embodiment, the optically non-transmissive film may be formed as a single or multi-layered metal. For example, the optically non-transmissive film may be formed of a variety of materials including metals such as Al, Ti, Cr, Ni, Au, Ag, Ti, Sn, Ni, Cr, W, Cu or others, or alloys thereof.

The optically non-transmissive film may be provided on the side of the second insulating film 5083 as a separate layer formed of a material such as metal or alloy thereof.

The optically non-transmissive film may be provided in such a form that is laterally extending from at least one of the first to third scan lines 5130R, 5130G, and 5130B and the first and second bridge electrodes $BR_G$ and $BR_B$. In this case, the optically non-transmissive film extending from one of the first to third scan lines 5130R, 5130G, and 5130B and the first and second bridge electrodes $BR_G$ and $BR_B$ is provided within a limit such that it is not electrically connected to other conductive components.

In addition, a substantially, non-transmissive film may be provided, which is formed separately from the first to third scan lines 5130R, 5130G, and 5130B and the first and second bridge electrodes $BR_G$ and $BR_B$, on the same layer and using substantially the same material during the same process of forming at least one of the first to third scan lines 5130R, 5130G, and 5130B and the first and second bridge electrodes $BR_G$ and $BR_B$. In this case, the non-transmissive film may be electrically insulated from the first to third scan lines 5130R, 5130G, and 5130B and the first and second bridge electrodes $BR_G$ and $BR_B$.

Alternatively, when no optically non-transmissive film is separately provided, the second and third insulating films 5083 and 5085 may serve as optically non-transmissive films. When the second and third insulating films 5083 and

5085 are used as an optically non-transmissive film, the second and third insulating films 5083 and 5085 may not be provided in a region corresponding to an upper portion (front direction) of the first to third epitaxial stacks 5020, 5030, and 5040 to allow light emitted from the first to third epitaxial stacks 5020, 5030, and 5040 to travel to the front direction.

The substantially, non-transmissive film is not particularly limited as long as it blocks transmission of light by absorbing or reflecting light. In an exemplary embodiment, the non-transmissive film may be a distributed Bragg reflector (DBR) dielectric mirror, a metal reflective film formed on an insulating film, or an organic polymer film in black color. When a metal reflective film is used as the non-transmissive film, the metal reflective film may be in a floating state that is electrically isolated from the components within other pixels.

By providing the non-transmissive film on the sides of the pixels, it is possible to prevent the phenomenon in which light emitted from a certain pixel affects adjacent pixels, or in which color is mixed with light emitted from the adjacent pixels.

The pixel having the structure described above may be manufactured by sequentially stacking the first to third epitaxial stacks 5020, 5030, and 5040 on the substrate 5010 sequentially and patterning the same, which will be described in detail below.

Figure 97A:
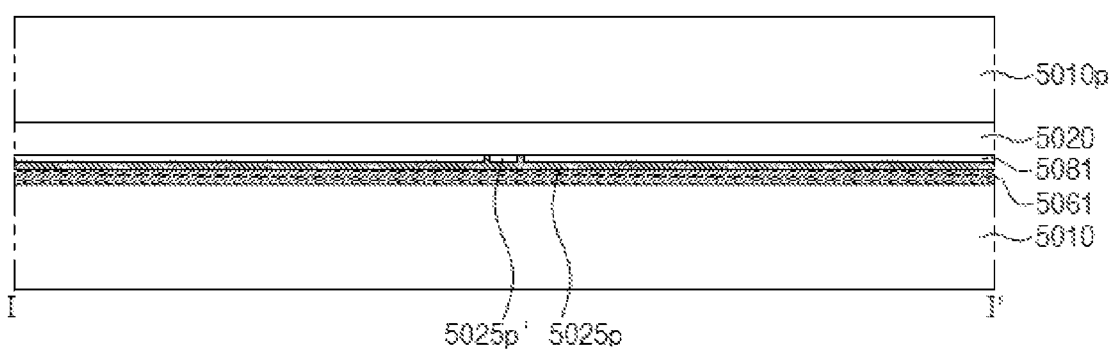
FIGS. 97A, 97B, and 97C are cross-sectional views taken along line I-I' of FIG. 95, illustrating a process of stacking first to third epitaxial stacks on a substrate.
Figure 97B:
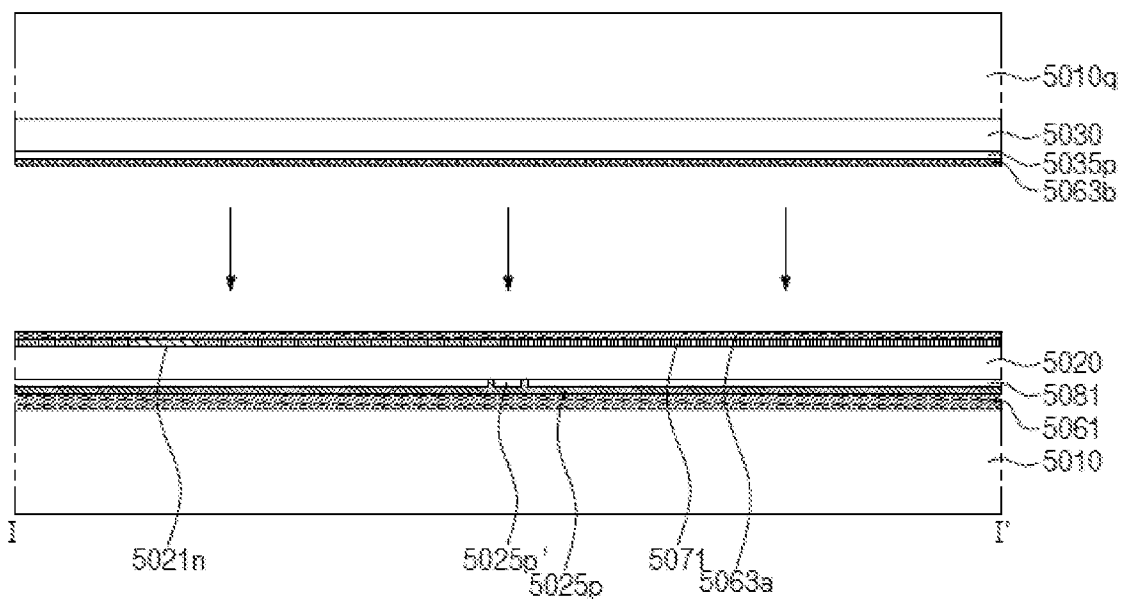
Figure 97C:
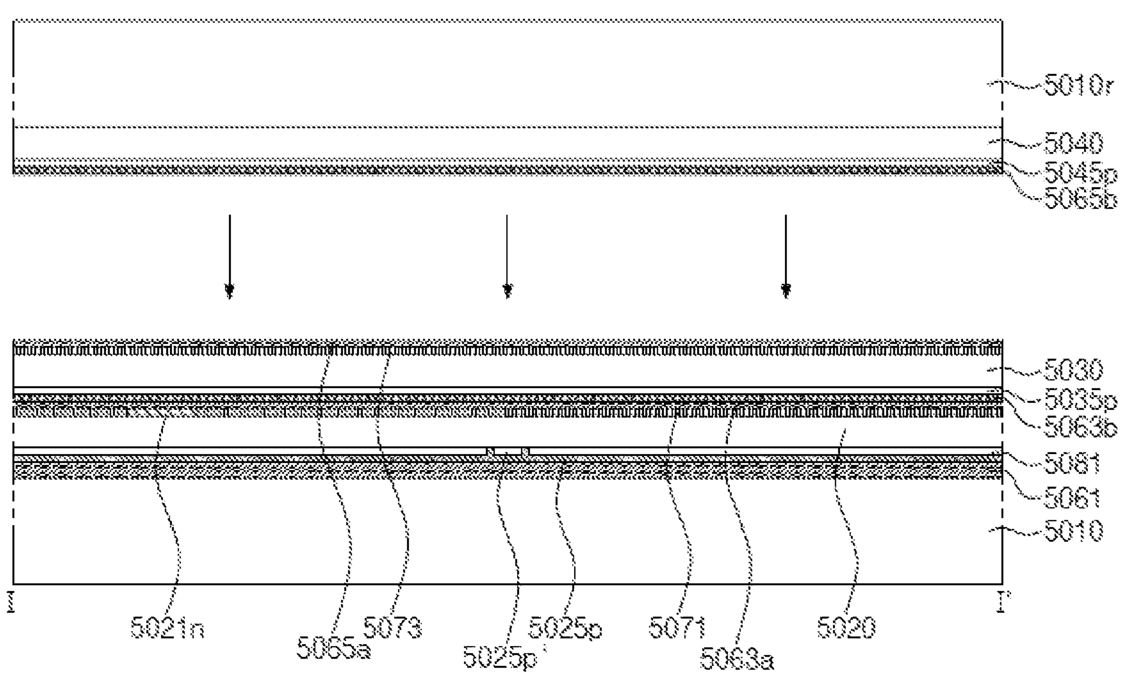

FIGS. 97A to 97C are cross-sectional views of line I-I' in FIG. 95, illustrating a process of stacking first to third epitaxial stacks on a substrate.

Referring to FIG. 97A, the first epitaxial stack 5020 is formed on the substrate 5010.

The first epitaxial stack 5020 and the ohmic electrode 5025*p*' are formed on a first temporary substrate 5010*p*. In an exemplary embodiment, the first temporary substrate 5010*p* may be a semiconductor substrate such as a GaAs substrate for forming the first epitaxial stack 5020. The first epitaxial stack 5020 is fabricated in a manner of stacking the n-type semiconductor layer, the active layer, and the p-type semiconductor layer on the first temporary substrate 5010*p*. The first insulating film 5081 having a contact hole formed thereon is formed on the first temporary substrate 5010*p*, and the ohmic electrode 5025*p*' is formed within the contact hole of the first insulating film 5081.

The ohmic electrode 5025*p*' is formed by forming the first insulating film 81 on the first temporary substrate 5010*p*, applying photoresist, patterning the photoresist, depositing an ohmic electrode 5025*p*' material on the patterned photoresist, and then lifting off the photoresist pattern. However, the method of forming the ohmic electrode 5025*p*' is not limited thereto. For example, the first insulating film 81 may be formed by forming the first insulating film 81, patterning the first insulating film 81 by photolithography, forming the ohmic electrode film 5025*p*' with the ohmic electrode film 5025*p*' material and then patterning the ohmic electrode film 5025*p*' by photolithography.

The first p-type contact electrode layer 5025*p* (also serving as the data line 5120) is formed on the first temporary substrate 5010*p* on which the ohmic electrode 5025*p*' is formed. The first p-type contact electrode layer 5025*p* may include a reflective material. The first p-type contact electrode layer 5025*p* may be formed by, for example, depositing a metallic material and then patterning the same using photolithography.

The first epitaxial stack 5020 formed on the first temporary substrate 5010*p* is inverted and attached to the substrate 5010 via the adhesive layer 5061 interposed therebetween.

After the first epitaxial stack 5020 is attached to the substrate 5010, the first temporary substrate 5010*p* is removed. The first temporary substrate 5010*p* may be removed by various methods such as wet etching, dry etching, physical removal, laser lift-off, or the like.

Referring to FIG. 97B, after the first temporary substrate 5010*p* is removed, the first n-type contact electrode 5021*n*, the first wavelength pass filter 5071, and the first adhesion enhancing layer 5063*a* are formed on the first epitaxial stack 5020. The first n-type contact electrode 5021*n* may be formed by depositing a conductive material and then patterning by the photolithography process. The first wavelength pass filter 5071 may be formed by alternately stacking insulating films having different refractive indices from each other.

After the removal of the first temporary substrate 5010*p*, irregularities may be formed on an upper surface (n-type semiconductor layer) of the first epitaxial stack 5020. The irregularities may be formed by texturing with various etching processes. For example, the irregularities may be formed by various methods such as dry etching using a micro photo process, wet etching using a crystal characteristic, texturing using a physical method such as sand blasting, ion beam etching, texturing based on difference in etching rates of block copolymers, or the like.

The second epitaxial stack 5030, the second p-type contact electrode layer 5035*p*, and the first shock absorbing layer 5063*b* are formed on a separate second temporary substrate 5010*q*.

The second temporary substrate 5010*q* may be a sapphire substrate. The second epitaxial stack 5030 may be fabricated by forming the n-type semiconductor layer, the active layer, and the p-type semiconductor layer on the second temporary substrate 5010*q*.

The second epitaxial stack 5030 formed on the second temporary substrate 5010*q* is inverted and attached onto the first epitaxial stack 5020. In this case, the first adhesion enhancing layer 5063*a* and the second shock absorbing layer 5063*b* may be disposed to face each other and then joined. In an exemplary embodiment, the first adhesion enhancing layer 5063*a* and the first shock absorbing layer 5063*b* may include various materials, such as SOG and silicon oxide, respectively.

After attachment, the second temporary substrate 5010*q* is removed. The second temporary substrate 5010*q* may be removed by various methods such as wet etching, dry etching, physical removal, laser lift-off, or the like.

According to an exemplary embodiment, in the process of attaching the second epitaxial stack 5030 formed on the second temporary substrate 5010*q* onto the substrate 5010, and in the process of removing the second temporary substrate 5010*q* from the second epitaxial stack 5030, the impact applied to the first epitaxial stack 5020, the second epitaxial stack 5030, the first wavelength pass filter 5071, and the second p-type contact electrode 5035*p*, is absorbed and/or relieved by the first buffer layer 5063, more particularly, by the first shock absorbing layer 5063*b* within the first buffer layer 5063. This minimizes cracking and peel-off that may otherwise occur in the first epitaxial stack 5020, the second epitaxial stack 5030, the first wavelength pass filter 5071, and the second p-type contact electrode 5035*p*. More particularly, when the first wavelength pass filter 5071 is formed on the upper surface of the first epitaxial stack 5020, the possibility of having peel-off is remarkably reduced as compared to when the first wavelength pass filter 5071 is formed on the second epitaxial stack 5030 side. When the first wavelength pass filter 5071 is formed on the upper surface of the second epitaxial stack 5030 and then attached to the first epitaxial stack 5020 side, due to impact generated in the process of removing the second temporary substrate 5010*q*, there may be a peel-off defect of the first wavelength pass filter 5071. However, according to an exemplary embodiment, in addition to the first wavelength pass filter 5071 being formed on the first epitaxial stack 5020 side, the shock absorbing effect by the first shock absorbing layer 5063*b* may prevent the occurrence of defects, such as peel-off.

Referring to FIG. 97C, the second wavelength pass filter 5073 and the second adhesion enhancing layer 5065*a* are formed on the second epitaxial stack 5030 from which the second temporary substrate 5010*q* has been removed.

The second wavelength pass filter 5073 may be formed by alternately stacking insulating films having different refractive indices from each other.

Irregularities may be formed on an upper surface (n-type semiconductor layer) of the second epitaxial stack 5030 after the removal of the second temporary substrate. The irregularities may be textured through various etching processes, or may be formed by using a patterned sapphire substrate for the second temporary substrate.

The third epitaxial stack 5040, the third p-type contact electrode layer 5045*p*, and the second shock absorbing layer 5065*b* are formed on a separate third temporary substrate 5010*r*.

The third temporary substrate 5010*r* may be a sapphire substrate. The third epitaxial stack 5040 may be fabricated by forming the n-type semiconductor layer, the active layer, and the p-type semiconductor layer on the third temporary substrate 5010*r*.

The third epitaxial stack 5040 formed on the third temporary substrate 5010*r* is inverted and attached onto the second epitaxial stack 5030. In this case, the second adhesion enhancing layer 5065*a* and the second shock absorbing layer 5065*b* may be disposed to face each other and then joined. In an exemplary embodiment, the second adhesion enhancing layer 5065*a* and the second shock absorbing layer 5065*b* may include various materials, such as SOG and silicon oxide, respectively.

After attachment, the third temporary substrate 5010*r* is removed. The third temporary substrate 5010*r* may be removed by various methods such as wet etching, dry etching, physical removal, laser lift-off, or the like.

According to an exemplary embodiment, in the process of attaching the third epitaxial stack 5040 formed on the third temporary substrate 5010*r* onto the substrate 5010, and in the process of removing the third temporary substrate 5010*r* from the third epitaxial stack 5040, the impact applied to the second and third epitaxial stacks 5030 and 5040, the second wavelength pass filter 5073, and the third p-type contact electrode 5045*p* is absorbed and/or relieved by the second buffer layer 5065, in particular, by the second shock absorbing layer 5065*b* within the second buffer layer 5065.

Accordingly, all of the first to third epitaxial stacks 5020, 5030, and 5040 are stacked on the substrate 5010.

Irregularities may be formed on an upper surface (n-type semiconductor layer) of the third epitaxial stack 5040 after the removal of the second temporary substrate. The irregularities may be textured through various etching processes or may be formed by using a patterned sapphire substrate for the second temporary substrate 5010*q*.

Hereinafter, a method of manufacturing a pixel by patterning stacked epitaxial stacks according to an exemplary embodiment will be described.

FIGS. 98, 100, 102, 104, 106, 108, and 110 are plan views sequentially showing a method of manufacturing a pixel on a substrate according to an exemplary embodiment.

FIGS. 99A, 99B, 101A, 101B, 103A, 103B, 103C, 103D, 105A, 105B, 107A, 107B, 109A, 109B, 109C, 109D, 111A, and 111B are views taken along line I-I' and line II-II' of corresponding figures, respectively.

Figure 98:
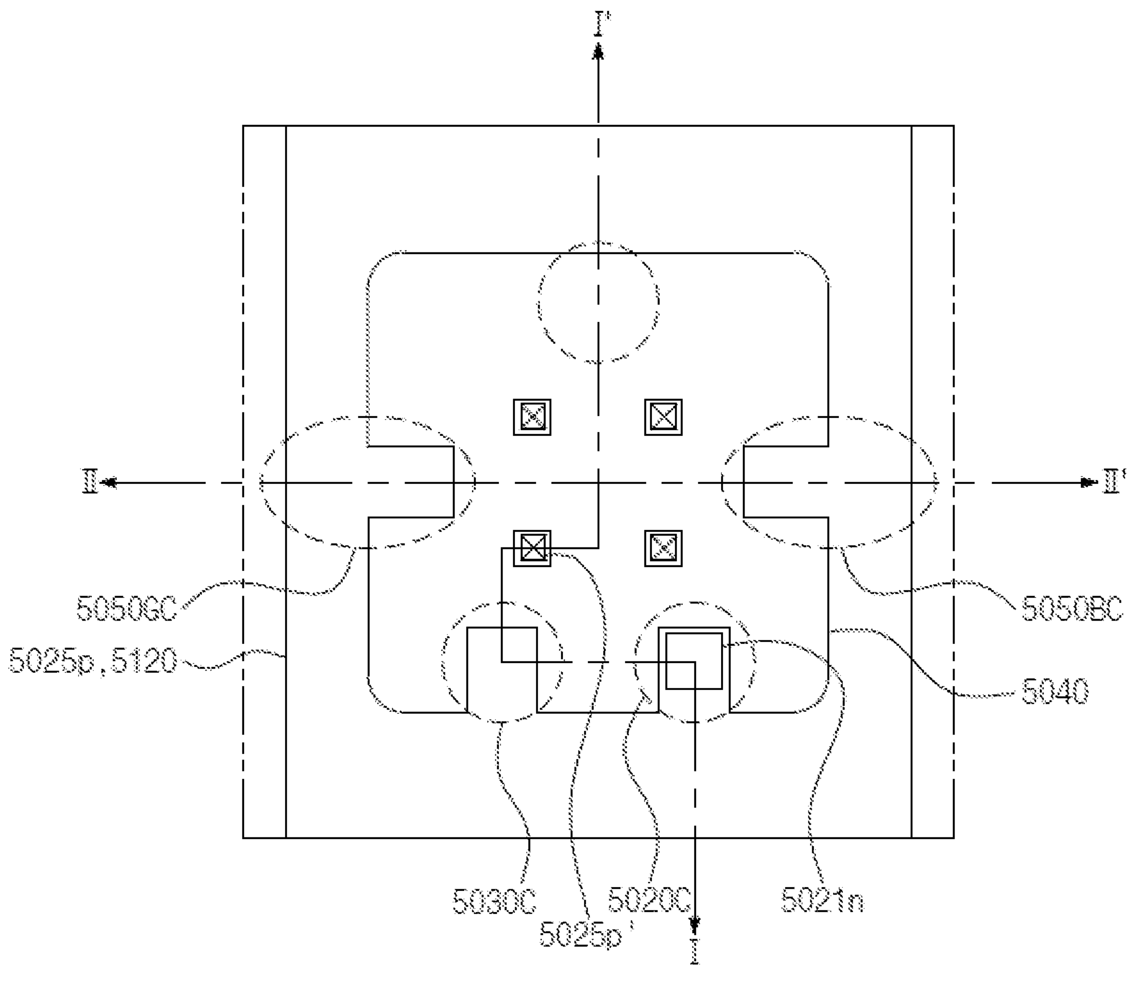
FIGS. 98, 100, 102, 104, 106, 108, and 110 are plan views illustrating a method of manufacturing a pixel on a substrate according to an exemplary embodiment.
Figure 99A:
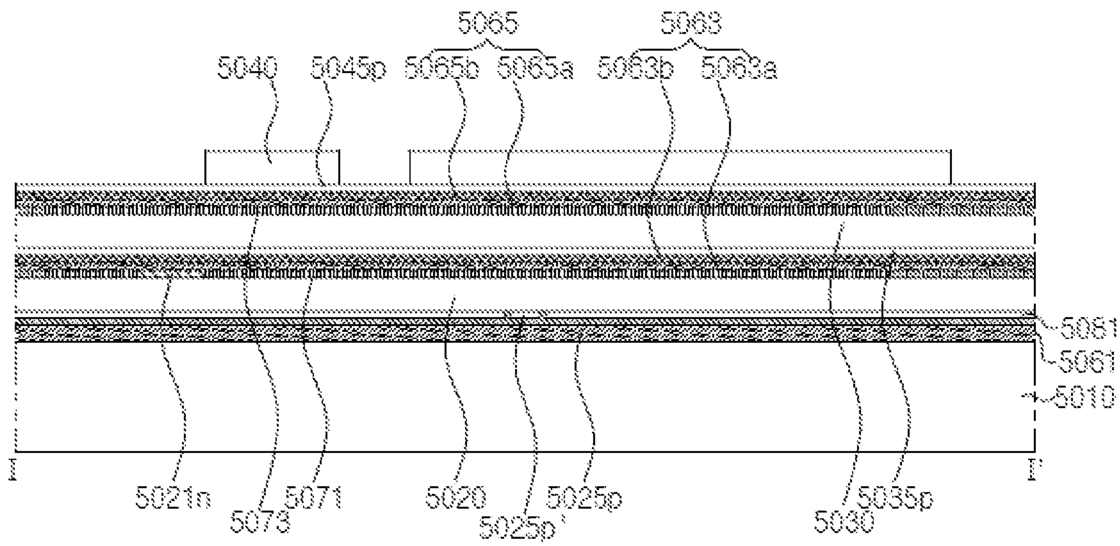
FIGS. 99A and 99B are cross-sectional views taken along line I-I' and line II-II' of FIG. 98, respectively.
Figure 99B:
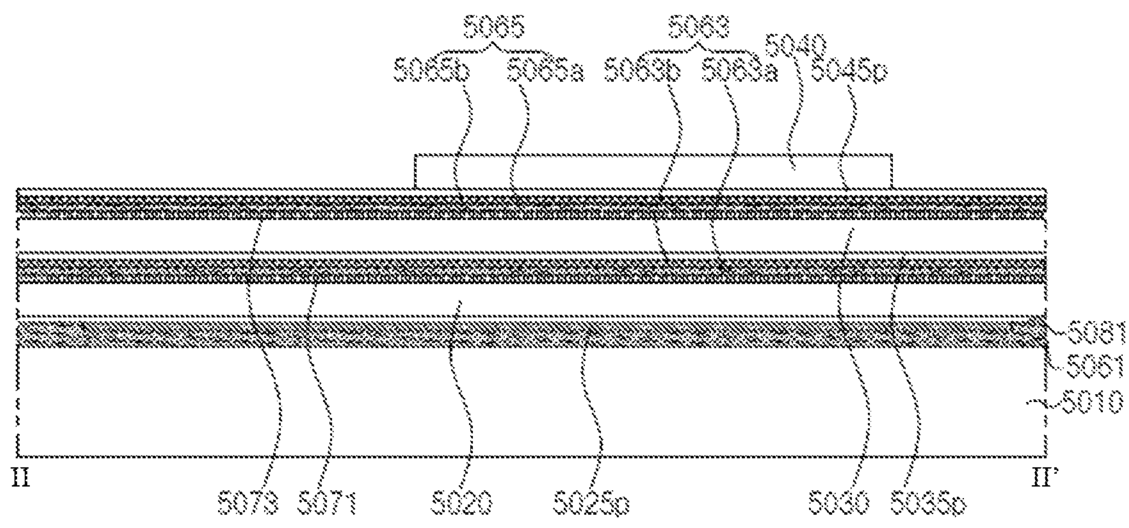

Referring to FIGS. 98, 99A and 99B, first, the third epitaxial stack 5040 is patterned. Most of the third epitaxial stack 5040 except for the light emitting region is removed and in particular, the portions corresponding to the first and second contacts 5030C and the first and second common contacts 5050GC and 5050BC are removed. The third epitaxial stack 5040 may be removed by various methods such as wet etching or dry etching using photolithography, and the third p-type contact electrode 5045*p* may function as an etch stopper.

Figure 100:
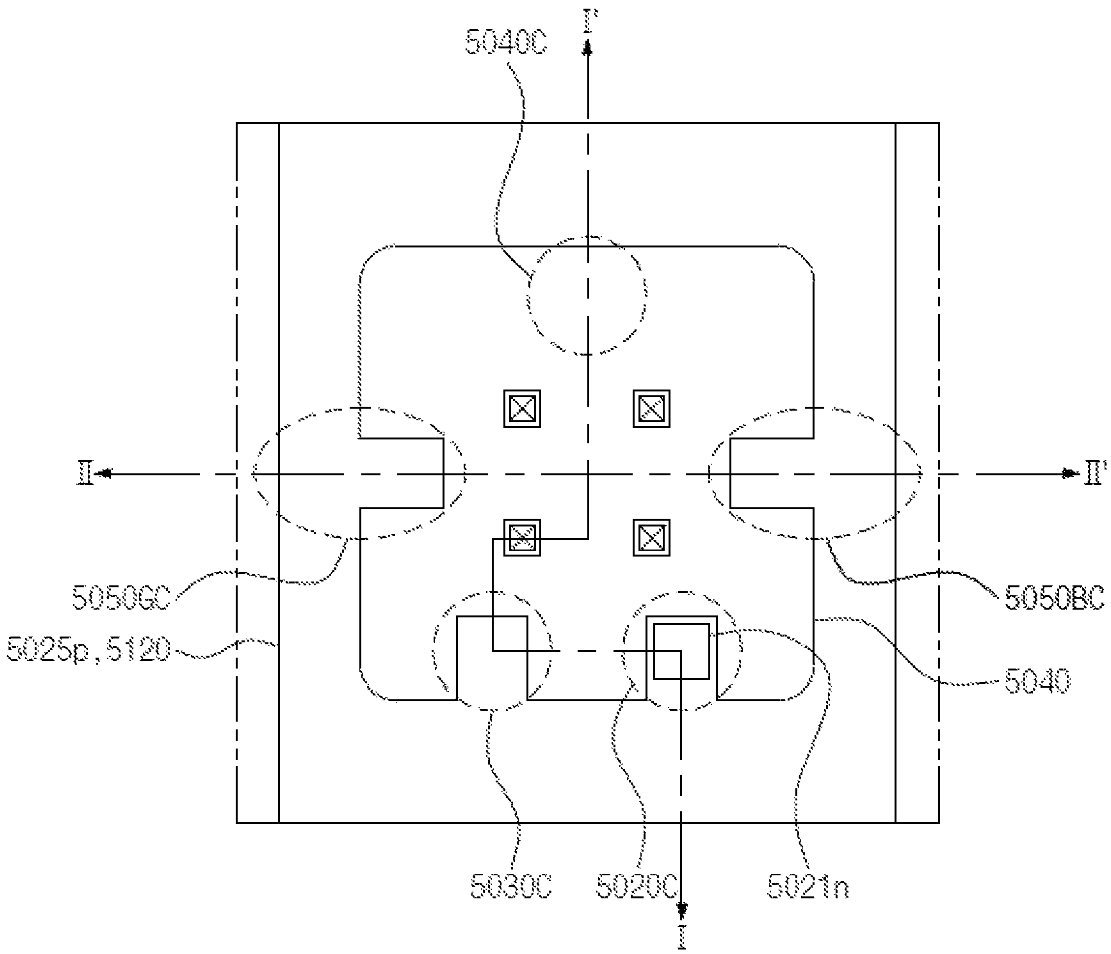
Figure 101A:
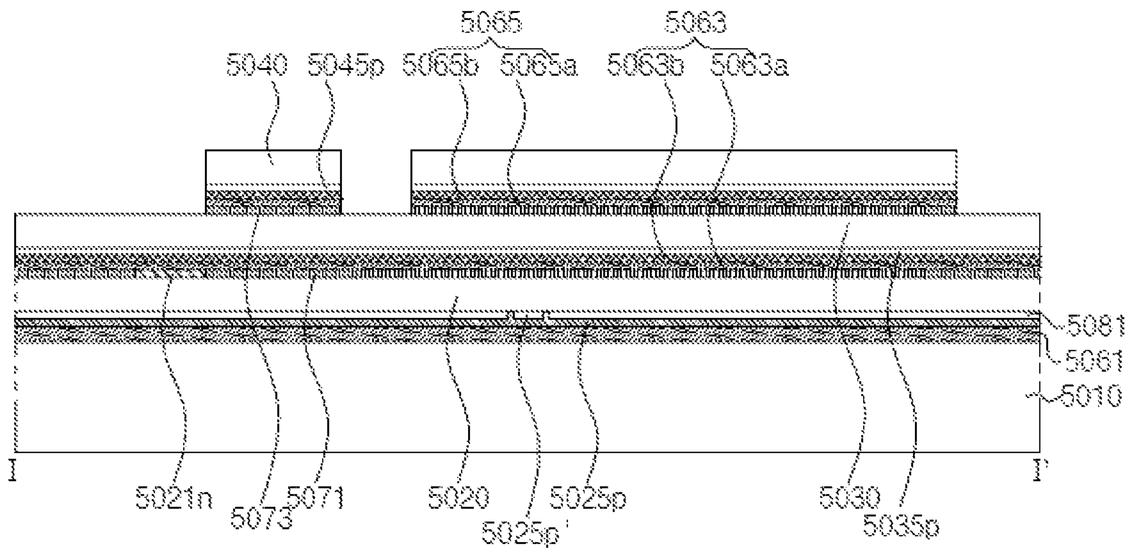
FIGS. 101A and 101B are cross-sectional views taken along line I-I' and line II-II' of FIG. 100, respectively.
Figure 101B:
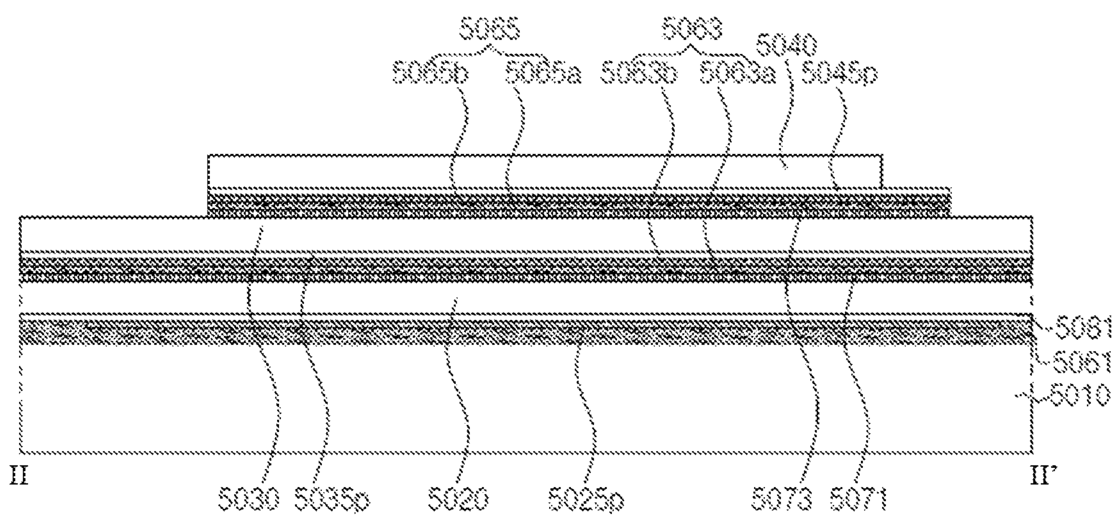
Figure 102:
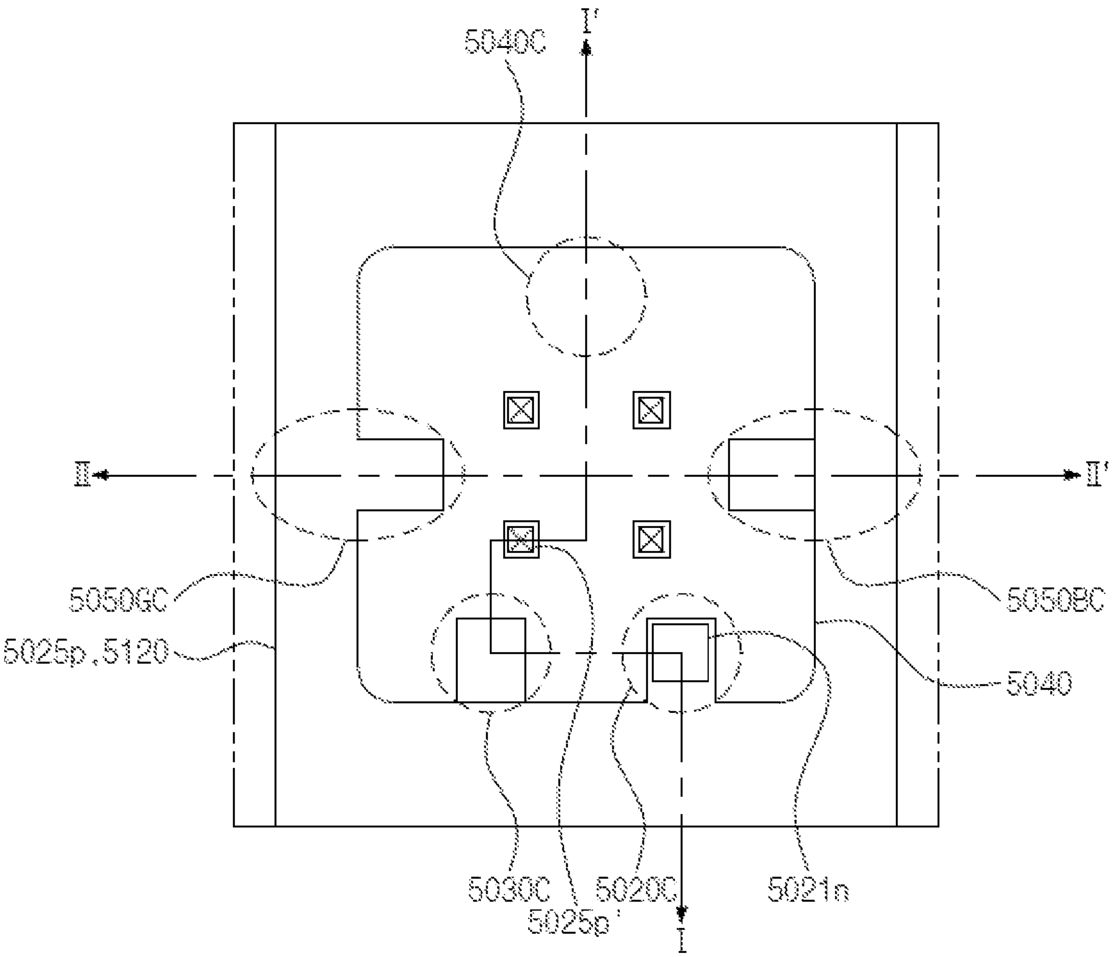
Figure 103A:
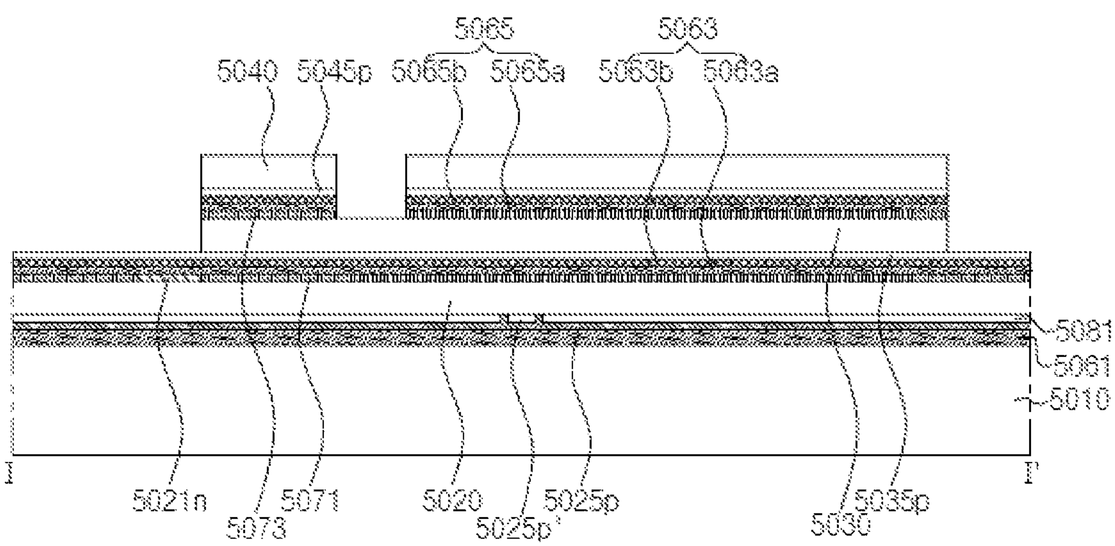
FIGS. 103A, 103B, 103C, and 103D are cross-sectional views taken along line I-I' and line II-II' of FIG. 102, respectively.
Figure 103B:
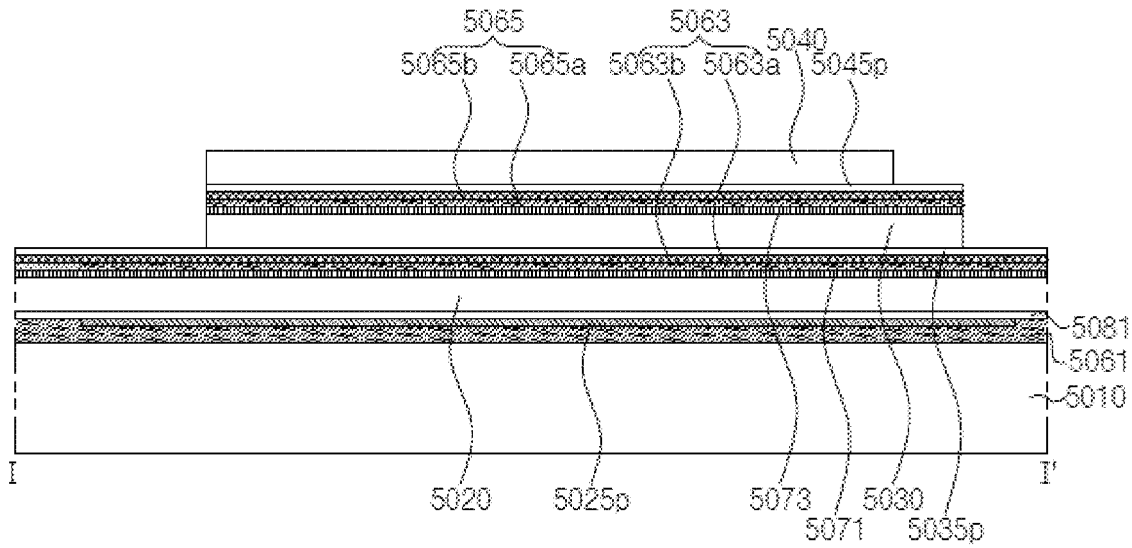
Figure 103C:
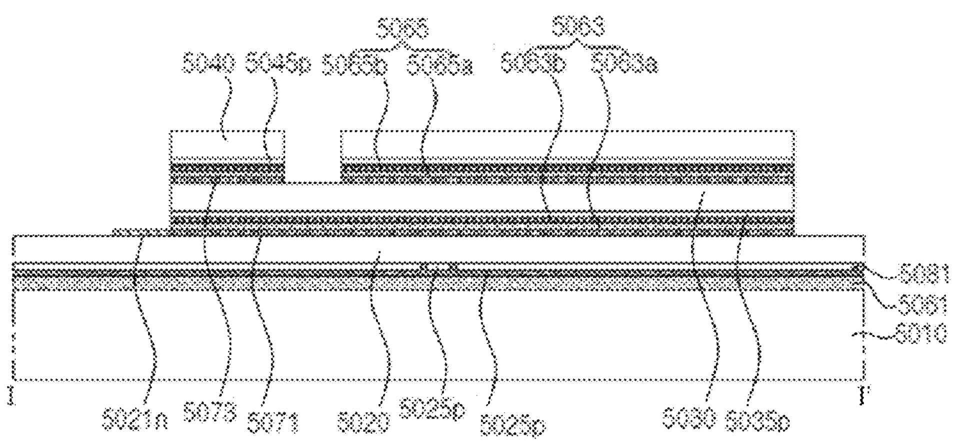
Figure 103D:
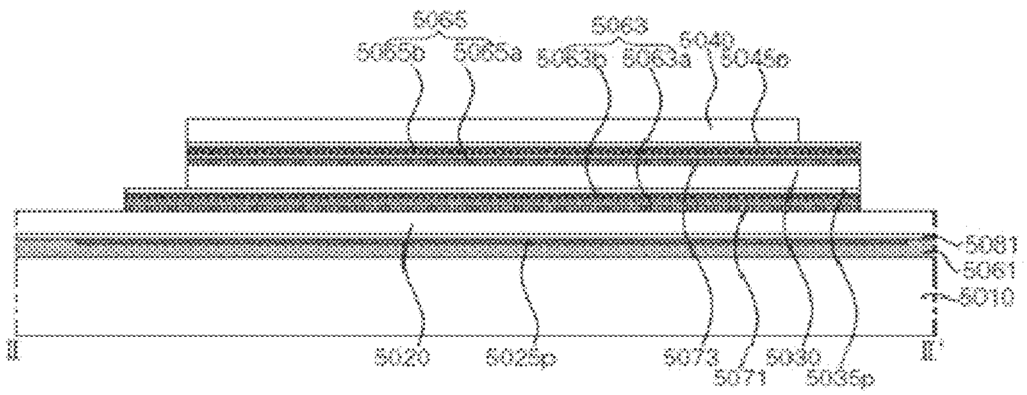

Referring to FIGS. 100, 101A, and 101B, the third p-type contact electrode 5045*p*, the second buffer layer 5065, and the second wavelength pass filter 5073 are removed from the region excluding the light emitting region. As such, a portion of the upper surface of the second epitaxial stack 5030 is exposed at the second contact 5030C.

The third p-type contact electrode 5045*p*, the second buffer layer 5065, and the second wavelength pass filter 5073 may be removed by various methods such as wet etching or dry etching using photolithography.

Referring to FIGS. 102, 103A, 103B, 103C, and 103D, a portion of the second epitaxial stack 5030 is removed, exposing a portion of the upper surface of the second p-type contact electrode 5035*p* at the second common contact 5050GC to the outside. The third p-type contact electrode 5045*p* serves as an etch stopper during etching.

Next, portions of the second p-type contact electrode 5035*p*, the first buffer layer 5063, and the first wavelength pass filter 5071 are etched. Accordingly, the upper surface of the first n-type contact electrode 5021*n* is exposed at the first contact 5020C, and the upper surface of the first epitaxial stack 5020 is exposed at the portions other than the light emitting region.

The second epitaxial stack 5030, the second p-type contact electrode 5035*p*, the first buffer layer 5063, and the first wavelength pass filter 5071 may be removed by various methods such as wet etching or dry etching using photolithography.

Figure 104:
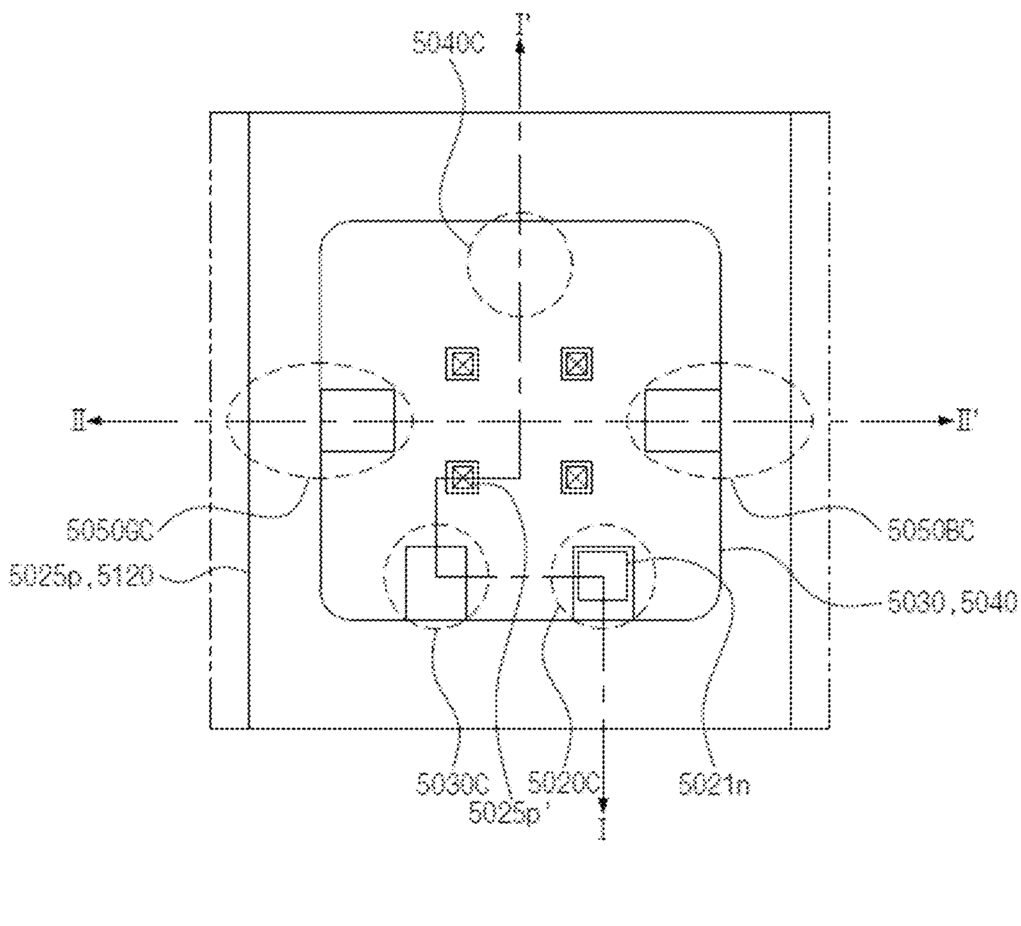
Figure 105A:
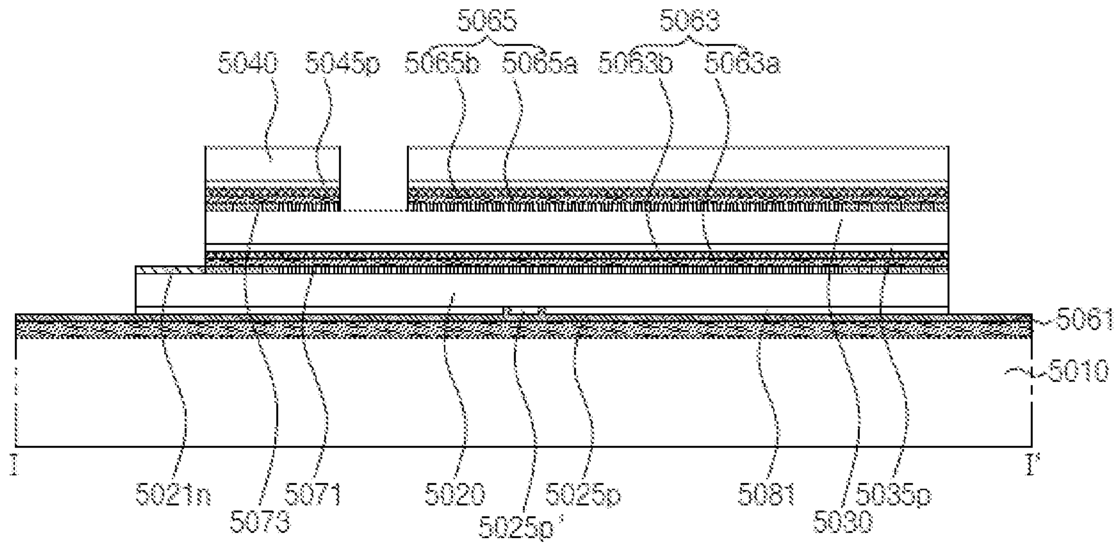
FIGS. 105A and 105B are cross-sectional views taken along line I-I' and line II-II' of FIG. 104, respectively.
Figure 105B:
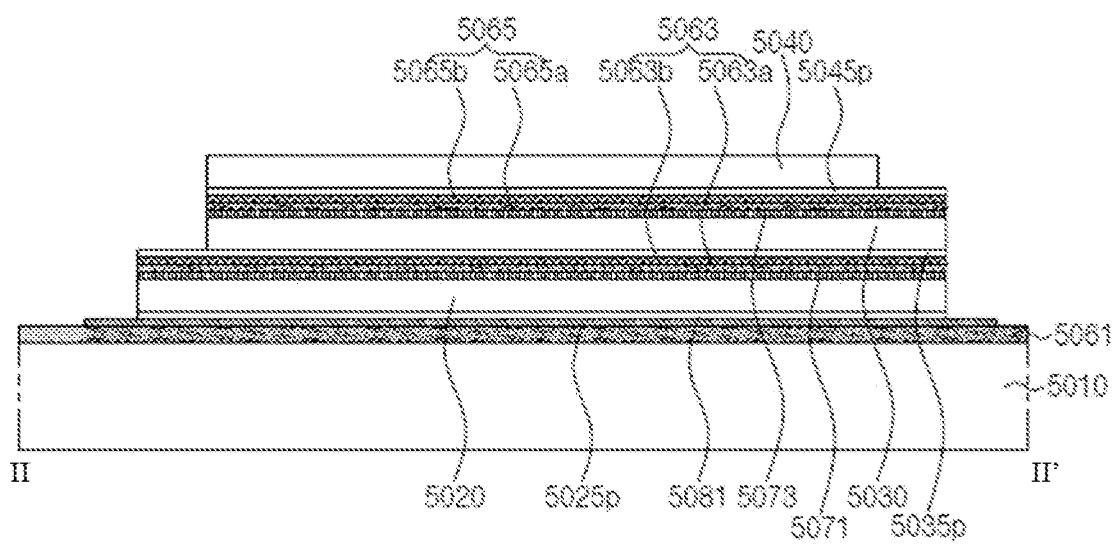

Referring to FIGS. 104, 105A, and 105B, the first epitaxial stack 5020 and the first insulating film 5081 are etched in the region excluding the light emitting region. The upper surface of the first p-type contact electrode 5025*p* is exposed at the first and second common contacts 5050GC and 5050BC.

Figure 106:
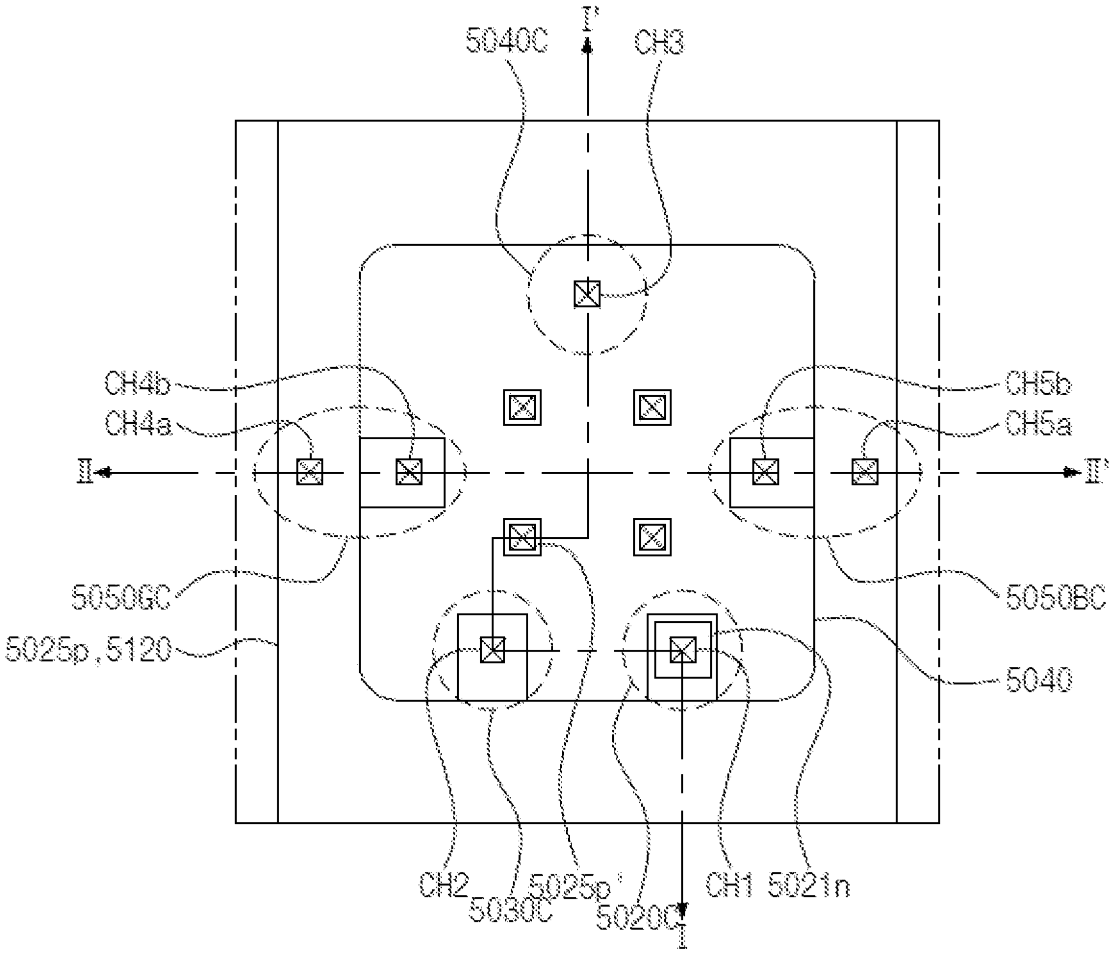
Figure 107A:
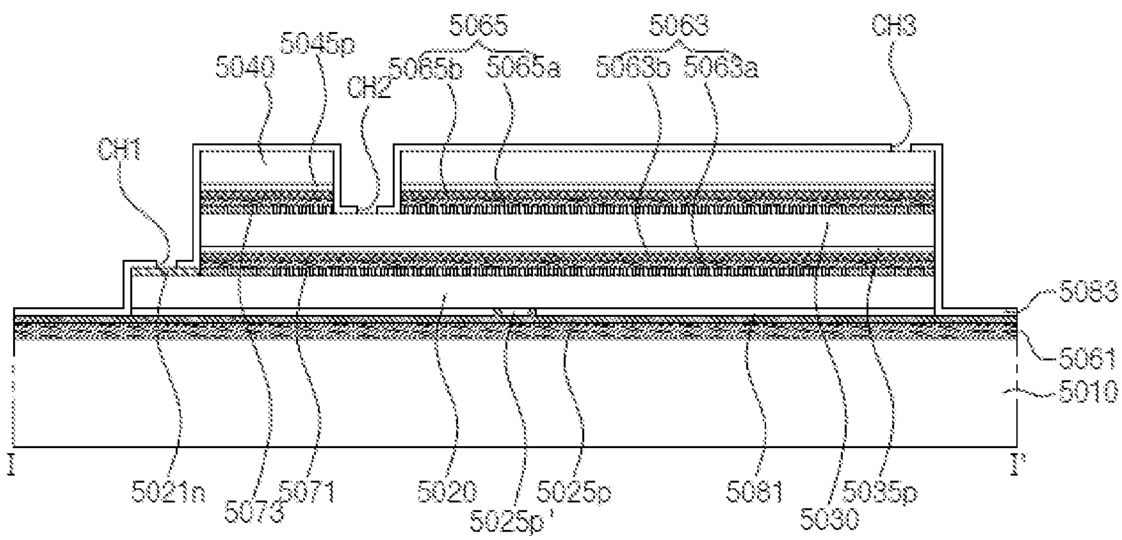
FIGS. 107A and 107B are cross-sectional views taken along line I-I' and line II-II' of FIG. 106, respectively.
Figure 107B:
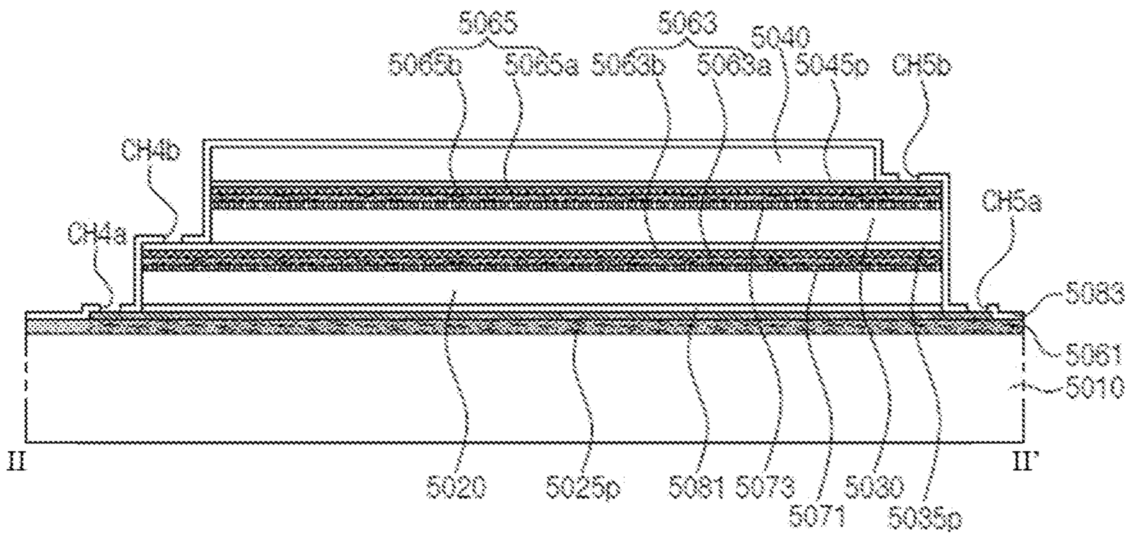
Figure 108:
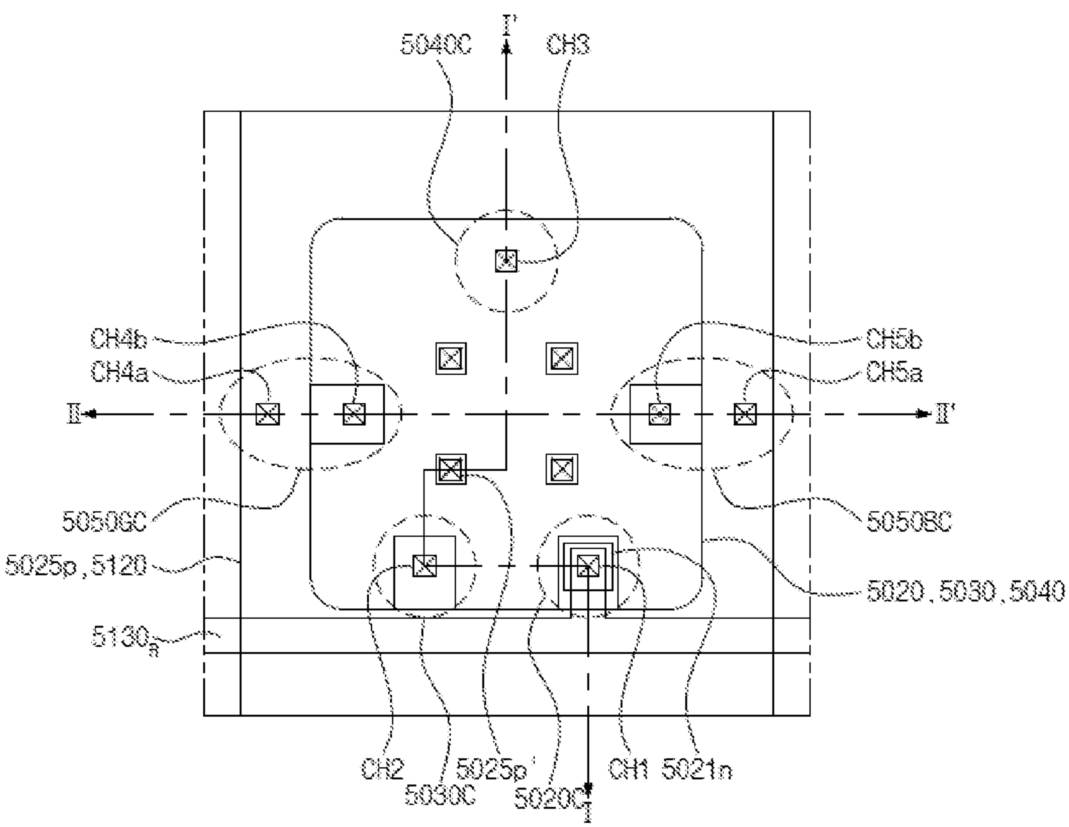
Figure 109A:
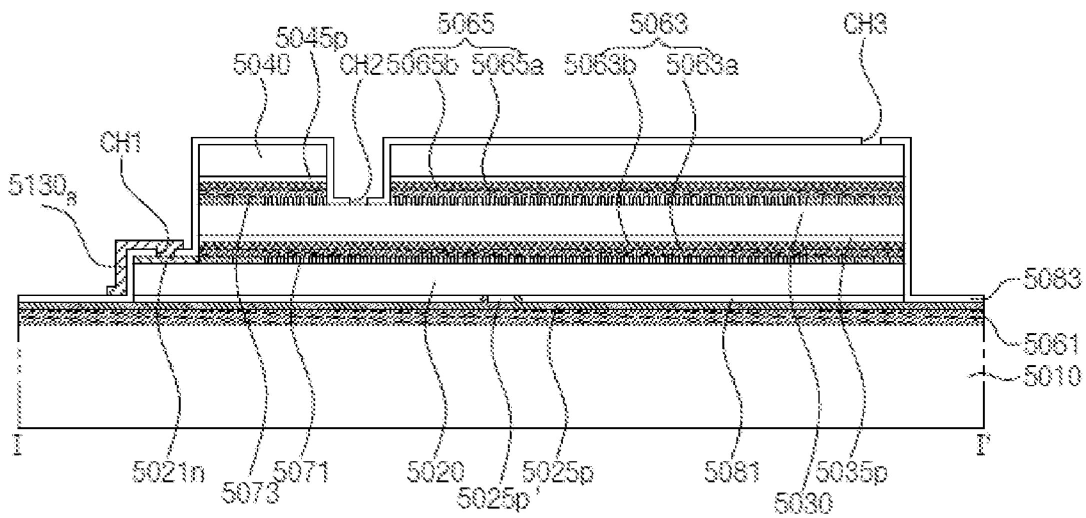
FIGS. 109A, 109B, 109C, and 109D are cross-sectional views taken along line I-I' and line II-II' of FIG. 108, respectively.
Figure 109B:
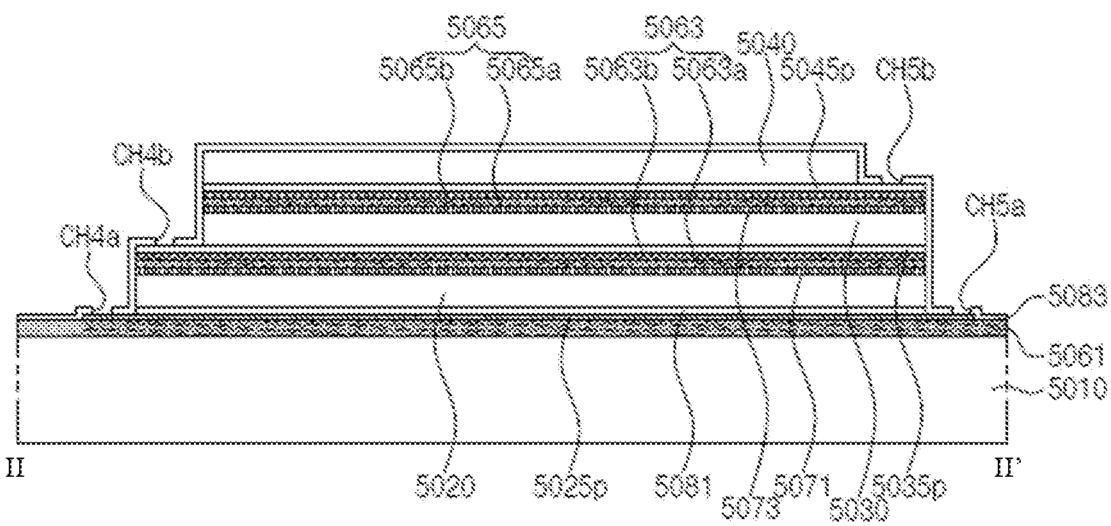
Figure 109C:
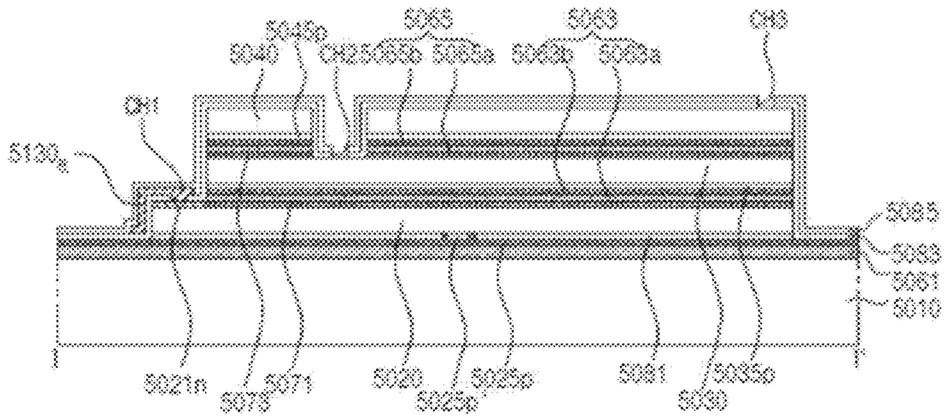
Figure 109D:
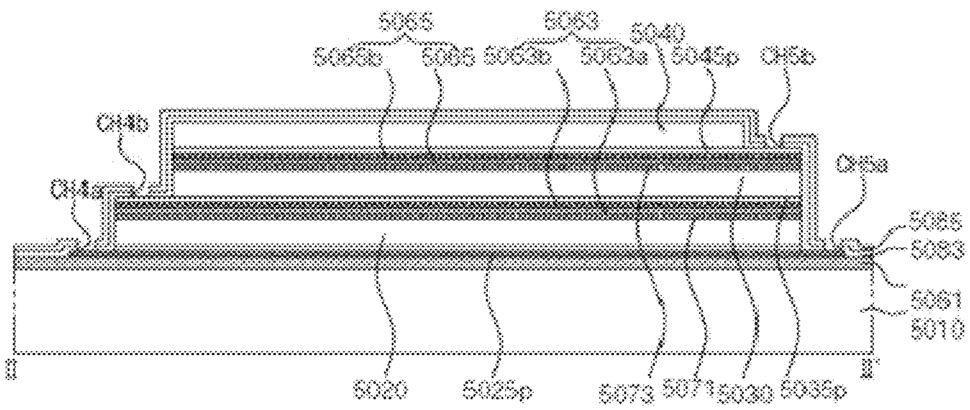

Referring to FIGS. 106, 107A, and 107B, the second insulating film 5083 is formed on the front side of the substrate 5010, and first to third contact holes CH1, CH2, CH3, the 4a$^{th}$ and 4b$^{th}$ contact holes CH4*a* and CH4*b*, and the 5a$^{th}$ and 5b$^{th}$ contact holes CH5*a* and CH5*b* are formed.

After deposition, the second insulating film 5083 may be patterned by various methods such as wet etching or dry etching using photolithography.

Referring to FIGS. 108, 109A, 109B, 109C, and 109D, the first scan line 5130R is formed on the patterned second insulating film 5083. The first scan line 5130R is connected to the first n-type contact electrode 5021*n* through the first contact hole CH1 at the first contact 5020C.

The first scan line 5130R may be formed in various ways. For example, the first scan line 5130R may be formed by photolithography using a plurality of sheets of masks.

Next, the third insulating film 5085 is formed on the front side of the substrate 5010, and the second and third contact holes CH2 and CH3, the $4a^{th}$ and $4b^{th}$ contact holes CH4*a* and CH4*b*, and the $5a^{th}$ and $5b^{th}$ contact holes CH5*a* and CH5*b* are formed.

After deposition, the third insulating film 5085 may be patterned by various methods such as wet etching or dry etching using photolithography.

Figure 110:
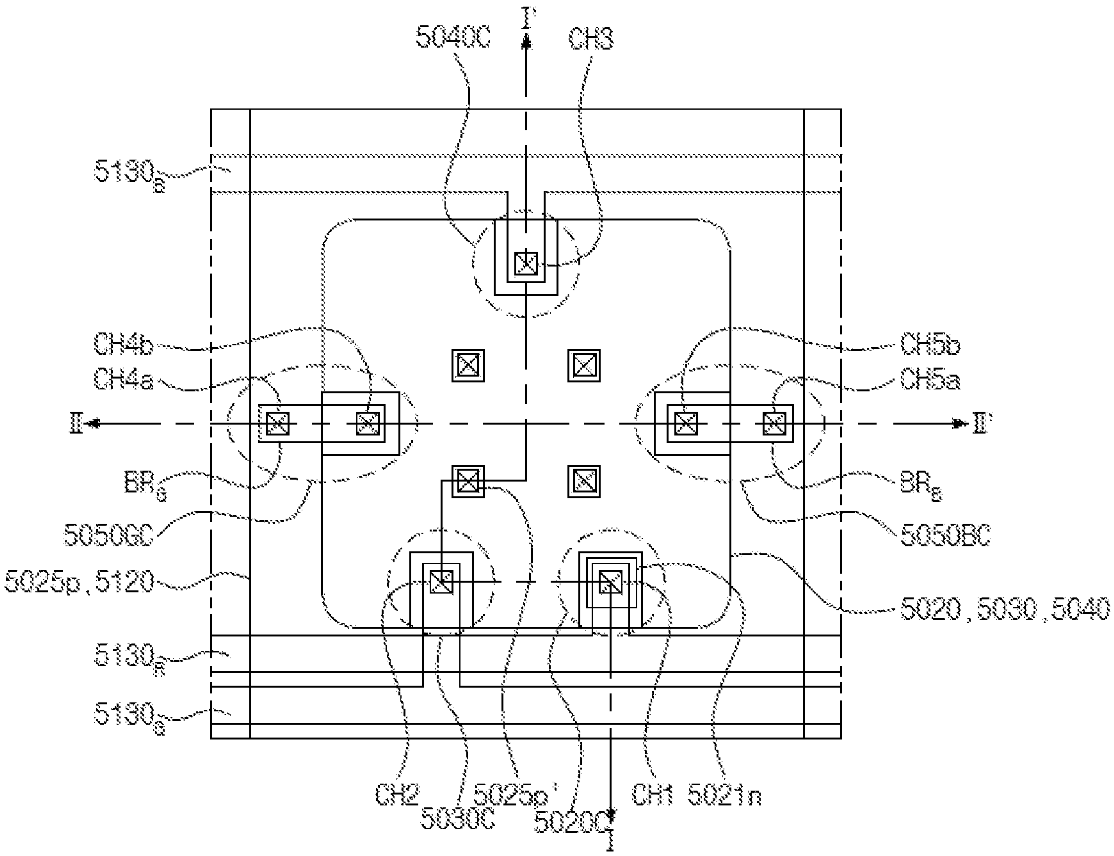
Figure 111A:
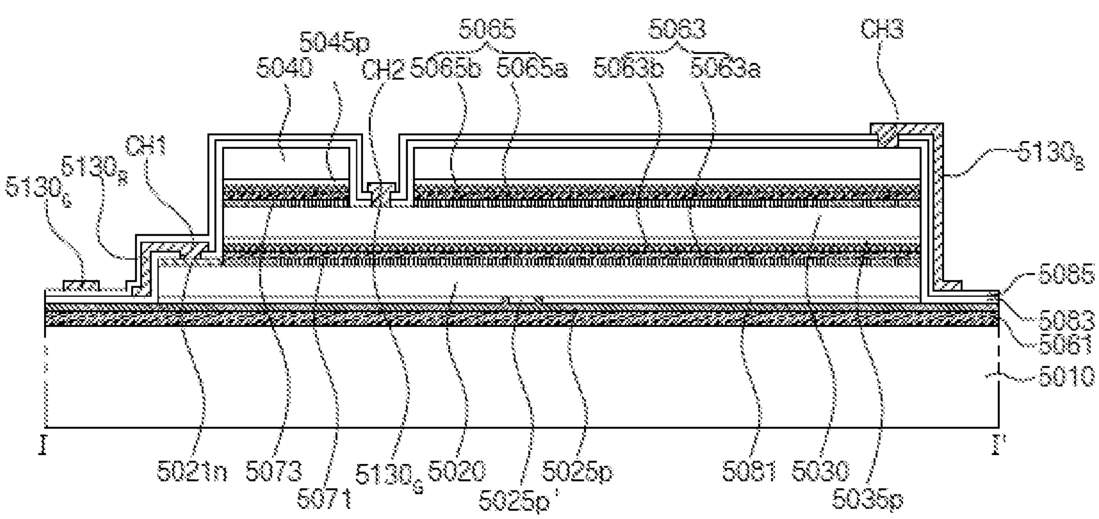
FIGS. 111A and 111B are cross-sectional views taken along line I-I' and line II-II' of FIG. 110, respectively.
Figure 111B:
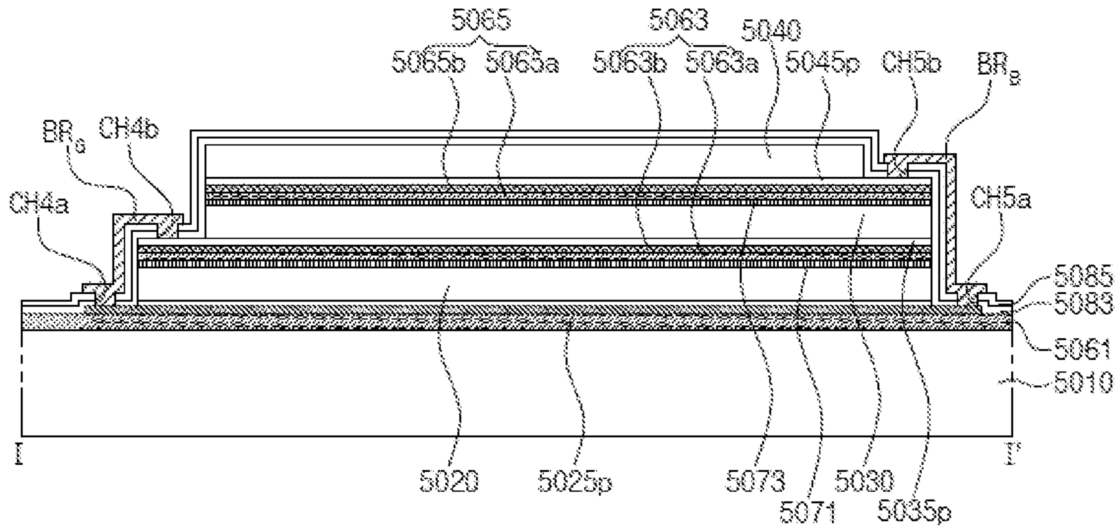

Referring to FIGS. 110, 111A, and 111B, the second scan line 5130G, the third scan line 5130B, the first bridge electrode $BR_G$, and the second bridge electrode $BR_B$ are formed on a patterned third insulating film 5085.

The second scan line 5130G is connected to the n-type semiconductor layer of the second epitaxial stack 5030 through the second contact hole CH2 at the second contact 5030C. The third scan line 5130B is connected to the n-type semiconductor layer of the fourth epitaxial stack 5040 through a third contact hole CH3 at the third contact 5040C. The first bridge electrode $BR_G$ is connected to the first p-type contact electrode 5025*p* through the $4a^{th}$ and $4b^{th}$ contact holes CH4*a* and CH4*b* at the first common contact 5050GC. The second bridge electrode $BR_B$ is connected to the first p-type contact electrode 5025*p* through the $5a^{th}$ and $5b^{th}$ contact holes CH5*a* and CH5*b* at the second common contact 5050BC.

The second scan line 5130G, the third scan line 5130B and the bridge electrode 5120*b* may be formed on the third insulating film 5085 in various ways, for example, by photolithography using a plurality of sheets of masks.

The second scan line 5130G, the third scan line 5130B and the first and second bridge electrodes $BR_G$ and $BR_B$ may be formed by applying photoresist on the substrate 5010 on which the third insulating film 5085 is formed, and then patterning the photoresist, and depositing materials of the second scan line, the third scan line, and the bridge electrode on the patterned photoresist and then lifting off the photoresist pattern.

According to an exemplary embodiment, the order of forming the first to third scan lines 5130R, 5130G, and 5130B and the first and second bridge electrodes $BR_G$ and $BR_B$ of the wiring part is not particularly limited, and may be formed in various sequences. For example, it is illustrated that the second scan line 5130G, the third scan line 5130B, and the first and second bridge electrodes $BR_G$ and $BR_B$ are formed on the third insulating film 5085 in the same stage, but they may be formed in a different order. For example, the first scan line 5130R and the second scan line 5130G may be first formed in the same step, followed by the formation of the additional insulating film and then the third scan line 5130B. Alternatively, the first scan line 5130R and the third scan line 5130B may be formed first in the same step, followed by the formation of the additional insulating film, and then the formation of the second scan line 5130G. In addition, the first and second bridge electrodes $BR_G$ and $BR_B$ may be formed together at any of the steps of forming the first to third scan lines 5130R, 5130G, and 5130B.

In addition, in an exemplary embodiment, the positions of the contacts of the respective epitaxial stacks 5020, 5030, and 5040 may be formed differently, in which case the positions of the first to third scan lines 5130R, 5130G, and 5130B and the first and second bridge electrodes $BR_G$ and $BR_B$ may also be changed.

In an exemplary embodiment, an optically non-transmissive film may be further provided on the second insulating film 5083 or the third insulating film 5085, on the fourth insulating film corresponding to the side of the pixel. The optically non-transmissive film may be formed of a DBR dielectric mirror, a metal reflective film on an insulating film, or an organic polymer film. When a metal reflective film is used as the optically non-transmissive film, it is manufactured in a floating state that is electrically insulated from the components in other pixels. In an exemplary embodiment, the optically non-transmissive film may be formed by depositing two or more insulating films with refractive indices different from each other. For example, the optically non-transmissive film may be formed by stacking a material having a low refractive index and a material having a high refractive index in sequence, or alternatively, formed by alternately stacking insulating films having different refractive indices from each other. Materials having different refractive indices are not particularly limited, but examples thereof include $SiO_2$ and $SiN_x$.

As described above, in a display device according to an exemplary embodiment, it is possible to sequentially stack a plurality of epitaxial stacks and then form contacts with a wiring part at a plurality of epitaxial stacks at the same time.

Figure 112:
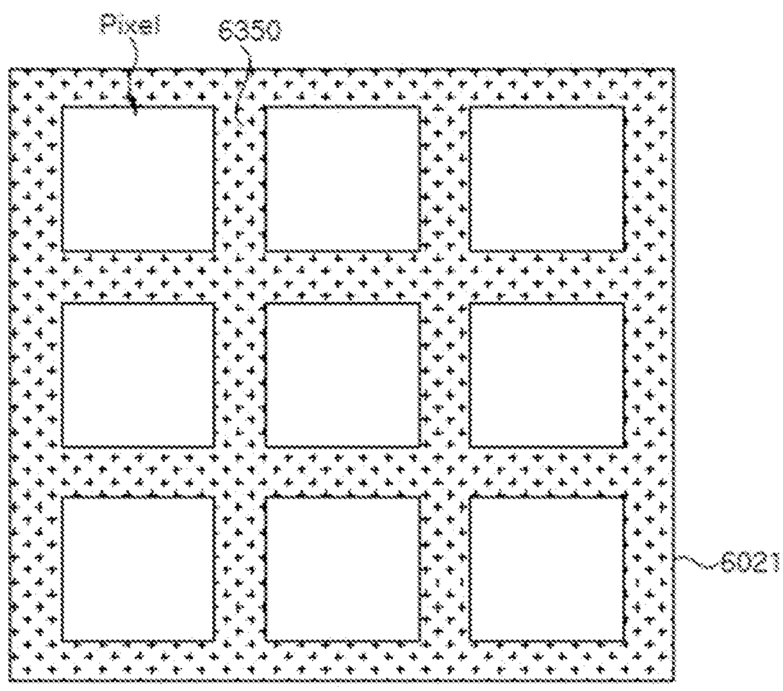
FIG. 112 is a schematic plan view of a display apparatus according to an embodiment.
Figure 113A:
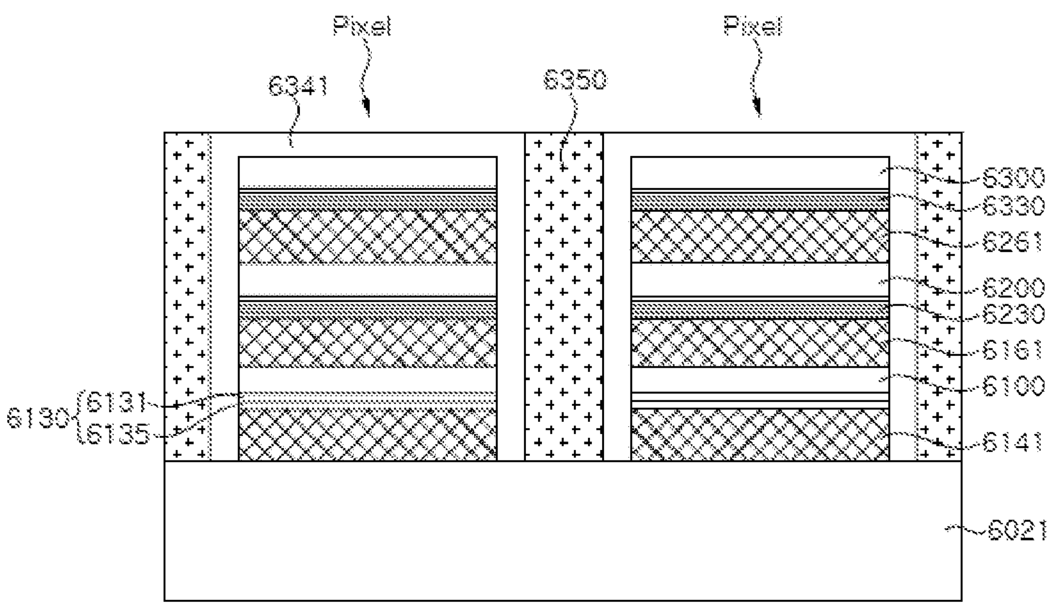
FIG. 113A is a partial cross-sectional view of the display apparatus of FIG. 112.
Figure 113B:
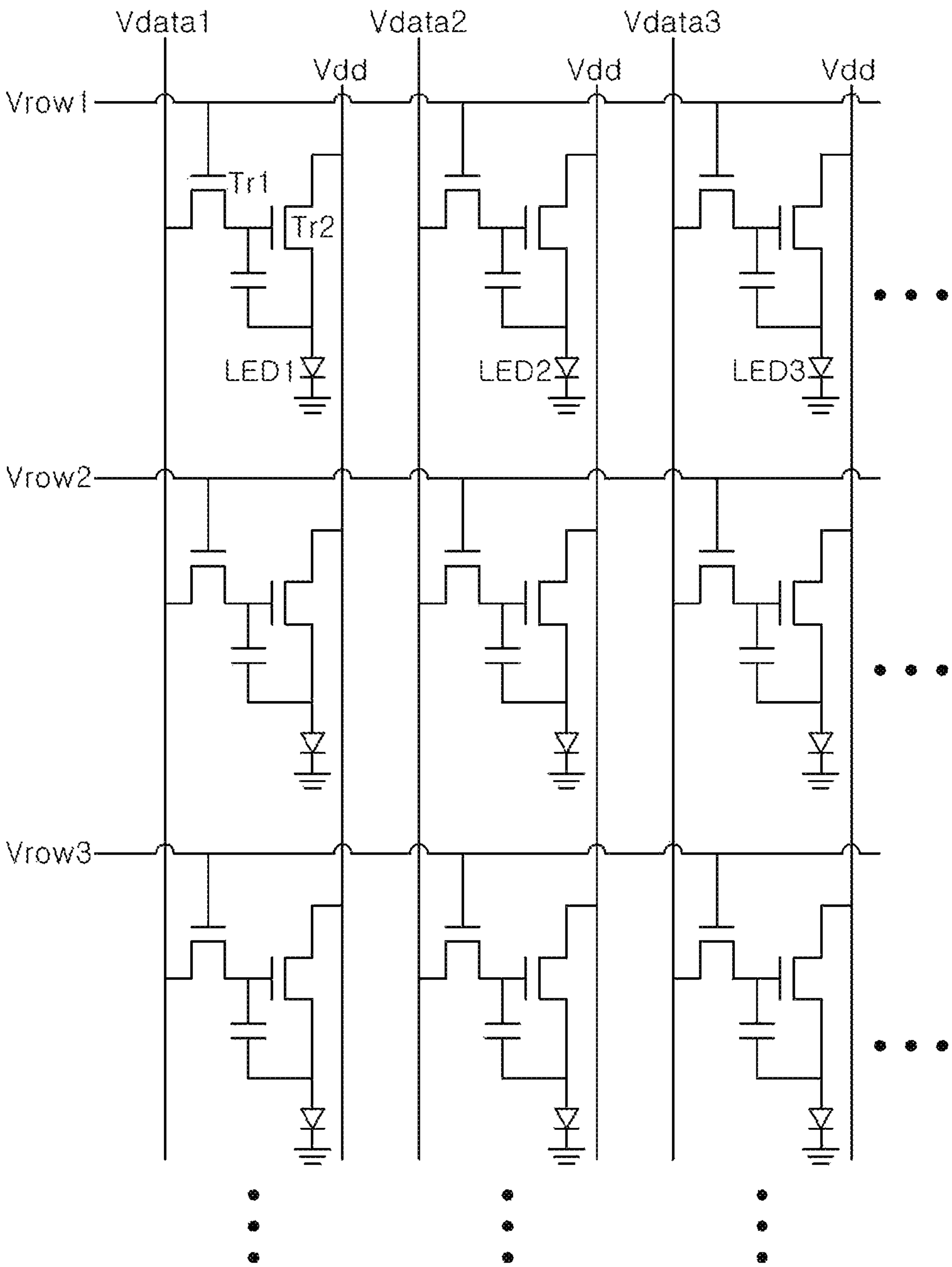
FIG. 113B is a schematic circuit diagram of a display apparatus according to an exemplary embodiment.

FIG. 112 is a schematic plan view of a display apparatus according to an embodiment, FIG. 113A is a partial cross-sectional view of FIG. 112, and FIG. 113B is a schematic circuit diagram.

Referring to FIGS. 112 and 113A, the display apparatus may include a substrate 6021, a plurality of pixels, a first LED stack 6100, a second LED stack 6200, a third LED stack 6300, an insulating layer (or a buffer layer) 6130 having a multilayer structure, a first color filter 6230, a second color filter 6330, a first adhesive layer 6141, a second adhesive layer 6161, a third adhesive layer 6261, and a barrier 6350. In addition, the display apparatus may include various electrode pads and connectors.

The substrate 6021 supports LED stacks 6100, 6200, and 6300. Further, the substrate 6021 may have a circuit therein. For example, the substrate 6021 may be a silicon substrate in which thin film transistors are formed therein. TFT substrates are widely used for active matrix driving of a display field, such as in an LCD display field, or the like. Since a configuration of a TFT substrate is well known in the art, detailed descriptions thereof will be omitted. A plurality of pixels may be driven in an active matrix manner, but the inventive concepts are not limited thereto. In another exemplary embodiment, the substrate 6021 may include a passive circuit including data lines and scan lines, and thus, the plurality of pixels may be driven in a passive matrix manner.

A plurality of pixels may be arranged on the substrate 6021. The pixels may be spaced apart from each other by a barrier 6350. The barrier 6350 may be formed of a light reflecting material or a light absorbing material. The barrier 6350 may block light traveling toward a neighboring pixel region by reflection or absorption, thereby preventing light interference between pixels. Examples of the light reflecting material may include a light reflecting material, such as a white photo sensitive solder resistor (PSR), and examples of the light absorbing material may include black epoxy, or others.

Each pixel includes the first to third LED stacks 6100, 6200, and 6300. The second LED stack 6200 is disposed on the first LED stack 6100 and the third LED stack 6300 is disposed on the second LED stack 6200.

The first LED stack 6100 includes an n-type semiconductor layer 6123 and a p-type semiconductor layer 6125, the second LED stack 6200 includes an n-type semiconductor layer 6223 and a p-type semiconductor layer 6225, and the third LED stack 6300 includes an n-type semiconductor layer 6323 and a p-type semiconductor layer 6325. In addition, the first to third LED stacks 6100, 6200, and 6300 each include an active layer interposed between the n-type semiconductor layer 6123, 6223, or 6323 and the p-type semiconductor layer 6125, 6225 or 6325. The active layer may have, in particular, a multiple quantum well structure.

As an LED stack is positioned closer to the substrate 6021, the LED stack may emit light with a longer wavelength. For example, the first LED stack 6100 may be an inorganic light emitting diode that emits red light, the second LED stack 6200 may be an inorganic light emitting diode that emits green light, and the third LED stack 6300 may be an inorganic light emitting diode that emits blue light. For example, the first LED stack 6100 may include an AlGaInP-based well layer, the second LED stack 6200 may include an AlGaInP-based or AlGaInN-based well layer, and the third LED stack 6300 may include an AlGaInN-based well layer. However, the inventive concepts are not limited thereto. In particular, when LED stacks include micro LEDs, an LED stack disposed closer to the substrate 6021 may emit light with a shorter wavelength, and LED stacks disposed thereon may emit light with a longer wavelength without adversely affection operation or requiring color filters due to the small form factor of a micro LED.

An upper surface of each of the first to third LED stacks 6100, 6200, and 6300 may be n-type and a lower surface thereof may be p-type. According to some exemplary embodiments, however, that the semiconductor types of the upper surface and the lower surface of each of the LED stacks may be reversed.

When the upper surface of the third LED stack 6300 is n-type, the upper surface of the third LED stack 6300 may be surface textured through chemical etching to form a roughened surface (or irregularities). The upper surface of the first LED stack 6100 and the second LED stack 6200 may also be roughened by surface texturing. Meanwhile, when the second LED stack 6200 emits green light, since the green light has higher visibility than the red light or the blue light, it is preferable to increase light emitting efficiency of the first LED stack 6100 and the third LED stack 6300 as compared to that of the second LED stack 6200. Thus, surface texturing may be applied to the first LED stack 6100 and the third LED stack 6300 to improve light extraction efficiency, and the second LED stack 6200 may be used without surface texturing to adjust the intensity of red, green, and blue light to similar levels.

Light generated in the first LED stack 6100 may be transmitted through the second and third LED stacks 6200 and 6300 and emitted to the outside. In addition, since the second LED stack 6200 emits light at a longer wavelength than the third LED stack 6300, light generated in the second LED stack 6200 may be transmitted through the third LED stack 6300 and emitted to the outside.

The first color filter 6230 may be disposed between the first LED stack 6100 and the second LED stack 6200. In addition, the second color filter 6330 may be disposed between the second LED stack 6200 and the third LED stack 6300. The first color filter 6230 transmits light generated in the first LED stack 6100 and reflects light generated in the second LED stack 6200. The second color filter 6330 transmits light generated in the first and second LED stacks 6100 and 6200 and reflects light generated in the third LED stack 6300. Thus, light generated in the first LED stack 6100 may be emitted to the outside through the second LED stack 6200 and the third LED stack 6300, and light generated in the second LED stack 6200 may be emitted to the outside through the third LED stack 6300. Further, it is possible to prevent light generated in the second LED stack 6200 from being incident on the first LED stack 6100 and lost, or light generated in the third LED stack 6300 from being incident on the second LED stack 6200 and lost.

In some exemplary embodiments, the first color filter 6230 may reflect light generated in the third LED stack 6300.

The first and second color filters 6230 and 6330 may be, for example, a low pass filter that passes through only a low frequency region, that is, a long wavelength region, a band pass filter that passes through only a predetermined wavelength band, or a band stop filter that blocks only the predetermined wavelength band. In particular, the first and second color filters 6200 and 6300 may be formed by alternately stacking the insulating layers having different refractive indices. For example, the first and second color filters 6200 and 6300 may be formed by alternately stacking $TiO_2$ and $SiO_2$. In particular, the first and second color filters 6200 and 6300 may include a distributed Bragg reflector (DBR). The stop band of the distributed Bragg reflector may be controlled by adjusting a thickness of $TiO_2$ and $SiO_2$. The low pass filter and the band pass filter may also be formed by alternately stacking the insulating layers having different refractive indices.

The first adhesive layer 6141 is disposed between the substrate 6021 and the first LED stack 6100 and bonds the first LED stack 6100 to the substrate 6021. The second adhesive layer 6161 is disposed between the first LED stack 6100 and the second LED stack 6200 and bonds the second LED stack 6200 to the first LED stack 6100. Further, the third adhesive layer 6261 is disposed between the second LED stack 6200 and the third LED stack 6300 and bonds the third LED stack 6300 to the second LED stack 6200.

As shown, the second adhesive layer 6161 may be disposed between the first LED stack 6100 and the first color filter 6230, and may contact the first color filter 6230. The second adhesive layer 6161 transmits light generated in the first LED stack 6100.

The third adhesive layer 6261 may be disposed between the second LED stack 6200 and the second color filter 6330, and may contact the second color filter 6330. The second adhesive layer 6161 transmits light generated in the first LED stack 6100 and the second LED stack 6200.

Each of the first to third adhesive layers 6141, 6161, and 6261 is formed of an adhesive material that may be patterned. These adhesive layers 6141, 6161, and 6261 may include, for example, epoxy, polyimide, SU8, spin-on glass (SOG), benzocyclobutene (BCB), or others, but are not limited thereto.

A metal bonding material may be disposed in each of the adhesive layers 6141, 6161, and 6261, which is described in more detail below.

The insulating layer 6130 is disposed between the first adhesive layer 6141 and the first LED stack 6100. The insulating layer 6130 has a multilayer structure and may include a first insulating layer 6131 in contact with the first LED stack 6100 and a second insulating layer 6135 in contact with the first adhesive layer 6141. The first insulating layer 6131 may be formed of a silicon nitride film ($SiN_x$ layer), and the second insulating layer 6135 may be formed of a silicon oxide film ($SiO_2$ layer). Since the silicon nitride film has strong adhesive force to the GaP-based semiconductor layer and the $SiO_2$ layer has strong adhesive force to the first adhesive layer 6141, the first LED stack 6100 may be stably fixed on the substrate 6021 by stacking the silicon nitride film and the $SiO_2$ layer.

According to an exemplary embodiment, a distributed Bragg reflector may be further disposed between the first insulating layer 6131 and the second insulating layer 6135.

The distributed Bragg reflector prevents light generated in the first LED stack 6100 from being absorbed into the substrate 6021, thereby improving light efficiency.

In FIG. 113A, while the first adhesive layer 6141 is shown and described as being divided into each pixel unit by the barrier 6350, the first adhesive layer 6141 may be continuous over a plurality of pixels in some exemplary embodiments. The insulating layer 6130 may also be continuous over a plurality of pixels.

The first to third LED stacks 6100, 6200, and 6300 may be electrically connected to a circuit in the substrate 6021 using electrode pads, connectors, and ohmic electrodes, and thus, for example, a circuit as shown in FIG. 113B may be implemented. The electrode pads, connectors, and ohmic electrodes are described in more detail below.

FIG. 113B is a schematic circuit diagram of a display apparatus according to an exemplary embodiment.

Referring to FIG. 113B, a driving circuit according to an exemplary embodiment may include two or more transistors Tr1 and Tr2 and a capacitor. When power supply is connected to selection lines Vrow1 to Vrow3 and a data voltage is applied to the data lines Vdata1 to Vdata3, a voltage is applied to the corresponding light emitting diode. Further, charges are charged in the corresponding capacitor in accordance with the values of Vdata1 to Vdata3. A turn-on state of the transistor Tr2 may be maintained by the charged voltage of the capacitor, and thus even when power is cut off to the selection line Vrow1, voltage of the capacitor may be maintained and the voltage may be applied to the light emitting diodes LED1 to LED3. Further, currents flowing through the LED1 to the LED3 may be changed according to values of Vdata1 to Vdata3. The current may always be supplied through Vdd, and thus, continuous light emission is possible.

The transistors Tr1 and Tr2 and the capacitor may be formed in the substrate 6021. Here, the light emitting diodes LED1 to LED3 may correspond to the first to third LED stacks 6100, 6200 and 6300 stacked in one pixel, respectively. Anodes of the first to third LED stacks 6100, 6200 and 6300 are connected to the transistor Tr2, and cathodes thereof are grounded. The first to third LED stacks 6100, 6200, and 6300 may be electrically grounded in common.

FIG. 113B exemplarily shows for a circuit diagram for an active matrix driving, but other circuits for the active matrix driving may be used. In addition, according to an exemplary embodiment, passive matrix driving may also be implemented.

Hereinafter, a manufacturing method of a display apparatus will be described in detail.

FIGS. 114A to 120 are schematic plan views and cross-sectional views illustrating a method of manufacturing a display apparatus according to an exemplary embodiment. In each of the drawings, the cross-sectional view is taken along line shown in the corresponding plan view.

Figure 114A:
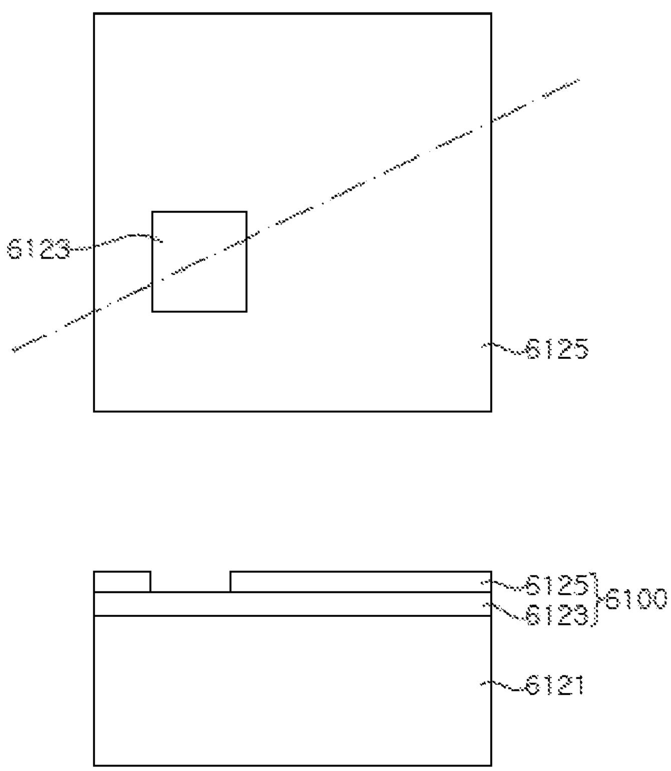
FIGS. 114A, 114B, 114C, 114D, 114E, 115A, 115B, 115C, 115D, 115E, 116A, 116B, 116C, 116D, 117A, 117B, 117C, 117D, 118A, 118B, 118C, 118D, 119A, 119B, and 120 are schematic plan views and cross-sectional views illustrating a manufacturing method of a display apparatus according to an exemplary embodiment.

First, referring to FIG. 114A, the first LED stack 6100 is grown on the first substrate 6121. The first substrate 6121 may be, for example, a GaAs substrate. The first LED stack 6100 is formed of AlGaInP-based semiconductor layers, and includes an n-type semiconductor layer 6123, an active layer, and a p-type semiconductor layer 6125. The first LED stack 6100 may have, for example, a composition of Al, Ga, and In to emit red light.

The p-type semiconductor layer 6125 and the active layer are etched to expose the n-type semiconductor layer 6123. The p-type semiconductor layer 6125 and the active layer may be patterned using photolithography and etching techniques. In FIG. 114A, although a portion corresponding to one pixel region is shown, the first LED stack 6100 may be formed over the plurality of pixel regions on the substrate 6121, and the n-type semiconductor layer 6123 will be exposed corresponding to each pixel region.

Figure 114B:
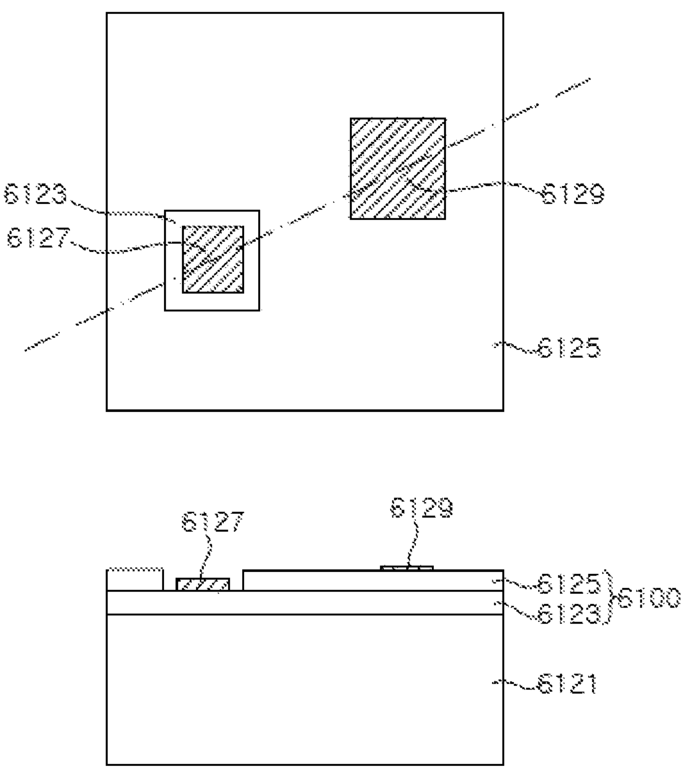

Referring to FIG. 114B, ohmic contact layers 6127 and 6129 are formed. The ohmic contact layers 6127 and 6129 may be formed for each pixel region. The ohmic contact layer 6127 is in ohmic contact with the n-type semiconductor layer 6123, and the ohmic contact layer 6129 is in ohmic contact with the p-type semiconductor layer 6125. For example, the ohmic contact layer 6127 may include AuTe or AuGe, and the ohmic contact layer 6129 may include AuBe or AuZn.

Figure 114C:
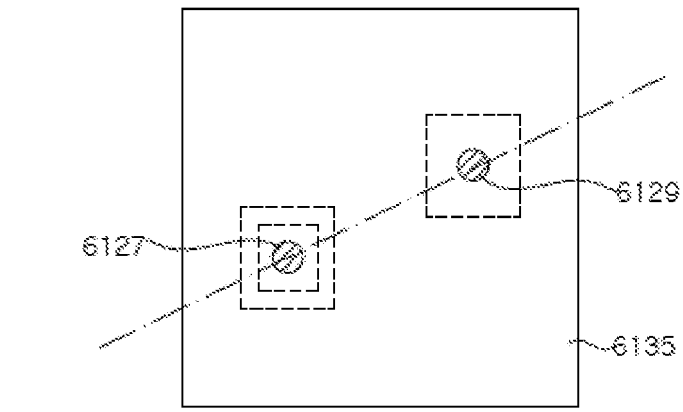
Figure 114C:
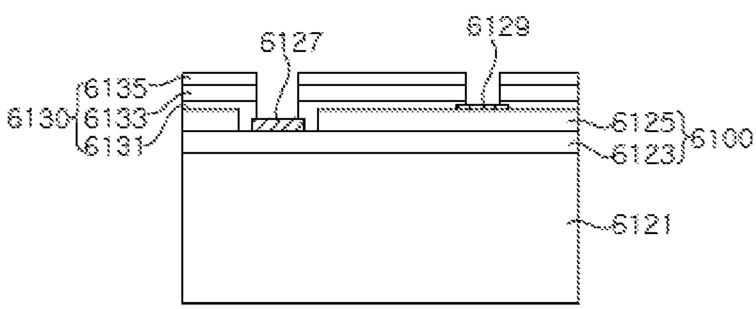

Referring to FIG. 114C, an insulating layer 6130 is formed on the first LED stack 6100. The insulating layer 6130 has a multilayer structure and is patterned to have openings that expose the ohmic contact layers 6127 and 6129. The insulating layer 6130 may include a first insulating layer 6131 and a second insulating layer 6135, and may also include a distributed Bragg reflector 6133. The second insulating layer 6135 may be incorporated into the distributed Bragg reflector 6133 as a part of the distributed Bragg reflector 6133.

The first insulating layer 6131 may include, for example, a silicon nitride film, and the second insulating layer 6135 may include a silicon oxide film. The silicon nitride film exhibits good adhesion properties to the AlGaInP-based semiconductor layer, but the silicon oxide film has poor adhesion properties to the AlGaInP-based semiconductor layer. The silicon oxide film has good adhesion to the first adhesive layer 6141, which will be described below, while the silicon nitride film has poor adhesion properties to the first adhesive layer 6141. Since the silicon nitride film and the silicon oxide film exhibit mutually complementary stress characteristics, it is possible to improve process stability by using the silicon nitride film and the silicon oxide film together, thereby preventing occurrence of defects.

While the ohmic contact layers 6127 and 6129 are described as being formed first, and the insulating layer 6130 is formed thereafter, according to some exemplary embodiments, the insulating layer 6130 may be formed first, and the ohmic contact layers 6127 and 6129 may be formed in the openings of the insulating layer 6130 that expose the n-type semiconductor layer 6123 and the p-type semiconductor layer 6125.

Figure 114D:
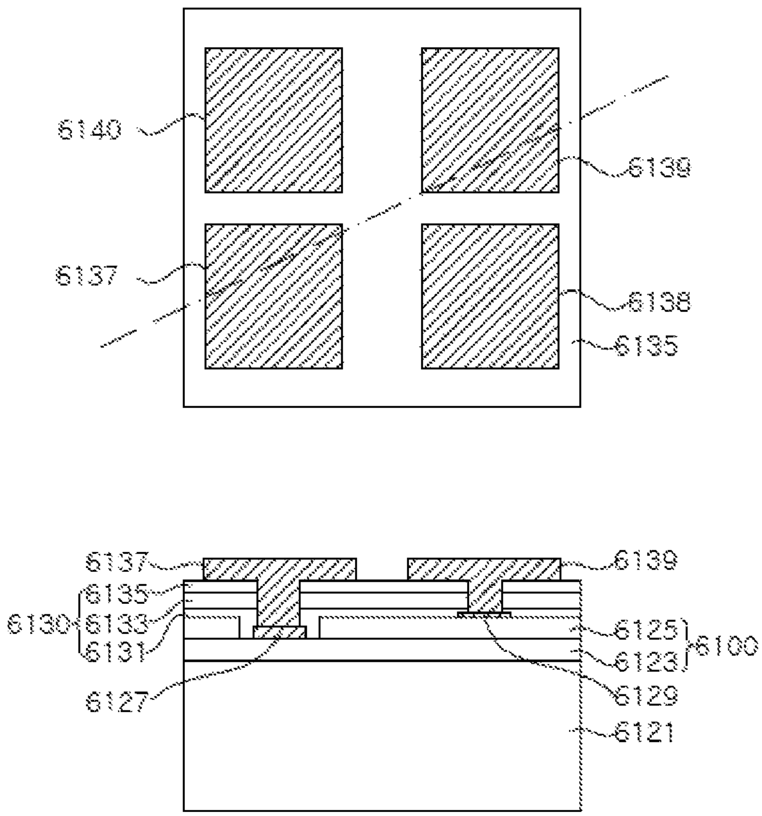

Referring to FIG. 114D, subsequently, first electrode pads 6137, 6138, 6139, and 6140 are formed. The first electrode pads 6137 and 6139 are connected to the ohmic contact layers 6127 and 6129 through the openings of the insulating layer 6130, respectively. The first electrode pads 6138 and 6140 are disposed on the insulating layer 6130 and are insulated from the first LED stack 6100. As described below, the first electrode pads 6138 and 6140 will be electrically connected to the p-type semiconductor layers 6225 and 6325 of the second LED stack 6200 and the third LED stack 6300, respectively. The first electrode pads 6137, 6138, 6139, and 6140 may have a multilayer structure, and particularly, may include a barrier metal layer on an upper surface thereof.

Figure 114E:
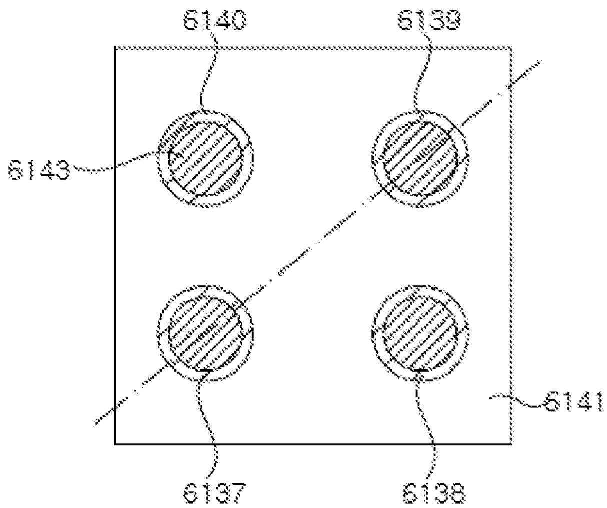
Figure 114E:
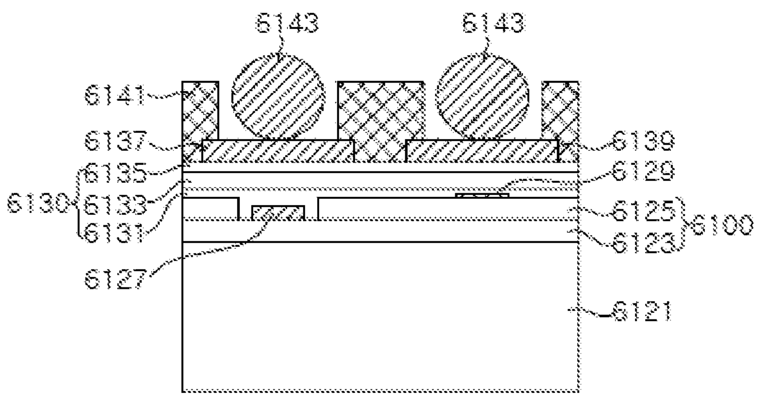

Referring to FIG. 114E, a first adhesive layer 6141 is then formed on the first electrode pads 6137, 6138, 6139, and 6140. The first adhesive layer 6141 may contact the second insulating layer 6135.

The first adhesive layer 6141 is patterned to have openings that expose the first electrode pads 6137, 6138, 6139, and 6140. As such, the first adhesive layer 6141 is formed of a material that may be patterned, and may be formed of, for example, epoxy, polyimide, SU8, SOG, BCB, or others.

Metal bonding materials 6143 having substantially a ball shape are formed in the openings of the first adhesive layer 6141. The metal bonding material 6143 may be formed of, for example, an indium ball or a solder ball, such as AuSn, Sn, or the like. The metal bonding materials 6143 having substantially a ball shape may have substantially the same height as a surface of the first adhesive layer 6141 or higher height than the surface of the first adhesive layer 6141. However, a volume of each metal bonding material may be smaller than a volume of the opening in the first adhesive layer 6141.

Figure 115A:
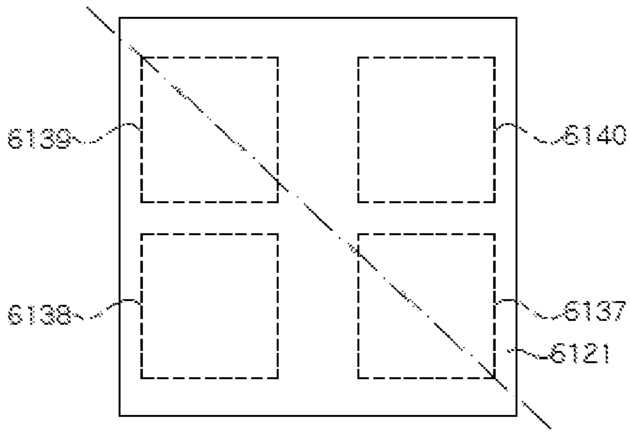
Figure 115A:
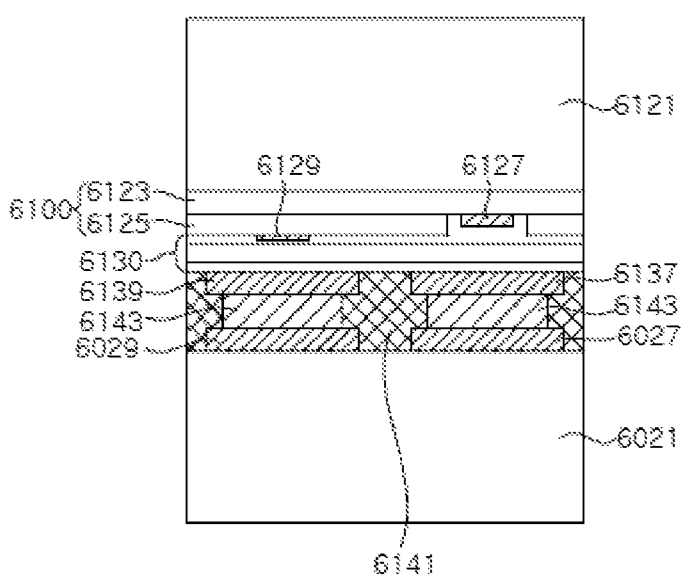

Referring to FIG. 115A, subsequently, the substrate 6021 and the first LED stack 6100 are bonded. The electrode pads 6027, 6028, 6029 and 6030 are disposed on the substrate 6021 in correspondence with the first electrode pads 6137, 6138, 6139 and 6140, and the metal bonding materials 6143 bond the first electrode pads 6137, 6138, 6139, and 6140 with the electrode pads 6027, 6028, 6029, and 6030. Further, the first adhesive layer 6141 bonds the substrate 6021 and the insulating layer 6130.

The substrate 6021 may be a glass substrate on which a thin film transistor is formed, a Si substrate on which a CMOS transistor is formed, or others, for active matrix driving.

While the first electrode pads 6137 and 6139 are shown as being spaced apart from the ohmic contact layers 6127 and 6129, the first electrode pads 6137 and 6139 are electrically connected to the ohmic contact layers 6127 and 6129 through the insulating layer 6130, respectively.

Although the first adhesive layer 6141 and the metal bonding materials 6143 are described as being formed at the first substrate 6121 side, the first adhesive layer 6141 and the metal bonding materials 6143 may be formed at the substrate 6021 side, or adhesive layers may be formed at the first substrate 6121 side and the substrate 6021 side, respectively, and these adhesive layers may be bonded to each other.

The metal bonding materials 6143 are pressed by these pads between the first electrode pads 6137, 6138, 6139, and 6140, and the electrode pads 6027, 6028, 6029, and 6030 on the substrate 6021, and thus, upper and lower surfaces are deformed to have a flat shape according to the shape of the electrode pads. Since the metal bonding materials 6143 are deformed in the openings of the first adhesive layer 6141, the metal bonding materials 6143 may substantially completely fill the openings of the first adhesive layer 6141 to be in close contact with the first adhesive layer 6141, or an empty space may be formed in the openings of the first adhesive layer 6141. The first adhesive layer 6141 may contract in a vertical direction and may expand in a horizontal direction under heating and pressurizing condition, and thus a shape of an inner wall of the openings may be deformed.

The shapes of the metal bonding 6143 and the first adhesive layer 6141 are described below with reference to FIGS. 121A, 121B, and 121C.

Figure 115B:
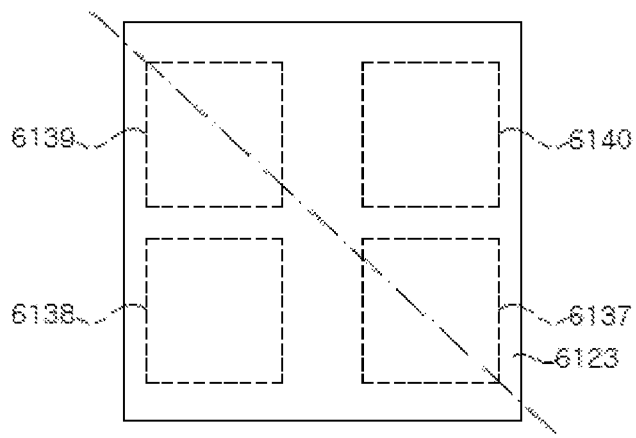
Figure 115B:
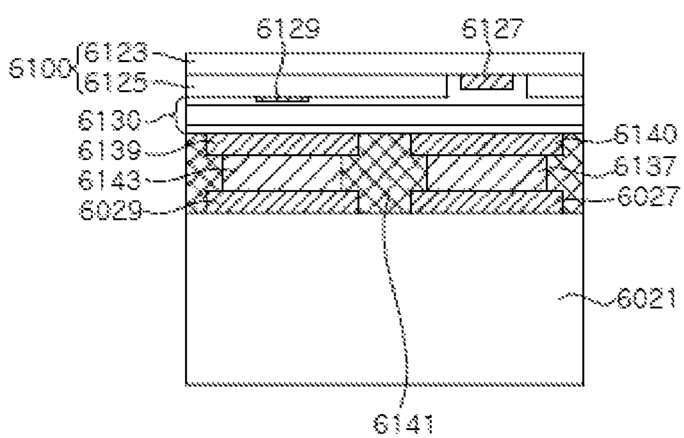

Referring to FIG. 115B, the first substrate 6121 is removed, and the n-type semiconductor layer 6123 is exposed. The first substrate 6121 may be removed using a wet etching technique or the like. A surface roughened by surface texturing may be formed on the surface of the exposed n-type semiconductor layer 6123.

Figure 115C:
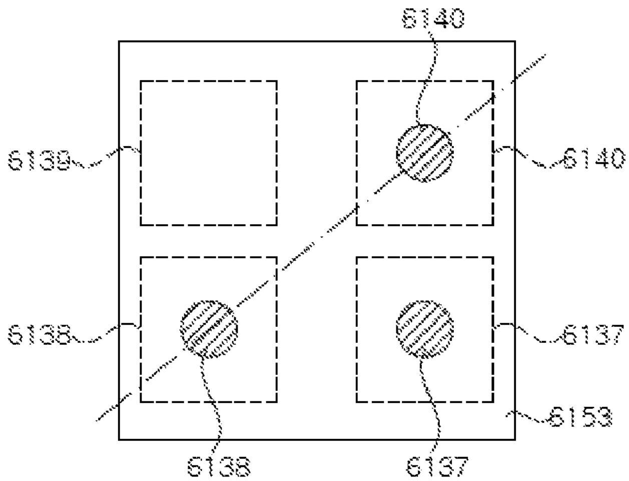
Figure 115C:
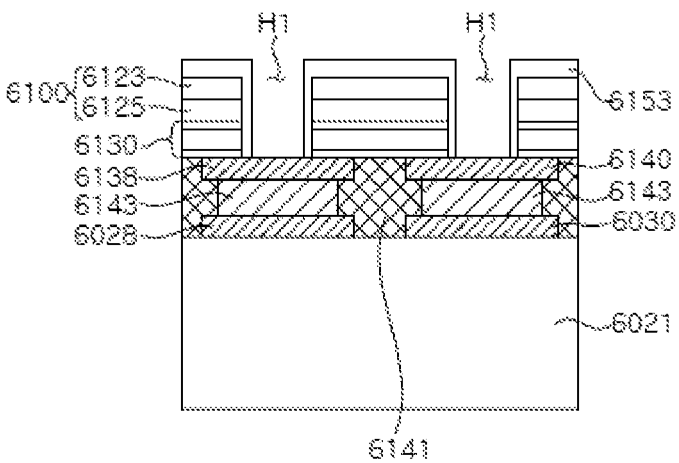

Referring to FIG. 115C, holes H1 passing through the first LED stack 6100 and the insulating layer 6130 may be formed using a hard mask or the like. The holes H1 may expose the first electrode pads 6137, 6138, and 6140, respectively. The hole H1 is not formed on the first electrode pad 6139, and thus the first electrode pad 6139 is not exposed through the first LED stack 6100.

Then, an insulating layer 6153 is formed to cover the surface of the first LED stack 6100 and side walls of the holes H1. The insulating layer 6153 is patterned to expose the first electrode pads 6137, 6138, 6139, and 6140 in the holes H1. The insulating layer 6153 may include a silicon nitride film or a silicon oxide film.

Figure 115D:
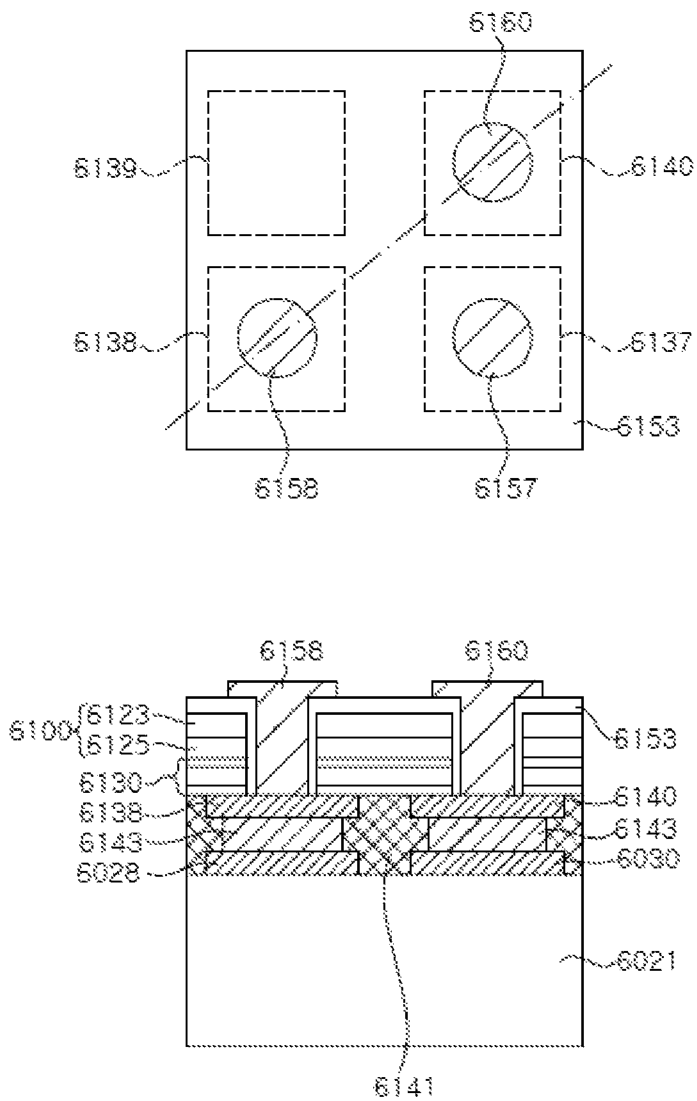

Referring to FIG. 115D, first connectors 6157, 6158, and 6160 that are electrically connected to the first electrode pads 6137, 6138, and 6140 through the holes H1, respectively, are formed.

The first-1 connector 6157 is connected to the first electrode pad 6137, the first-2 connector 6158 is connected to the first electrode pad 6138, and the first-3 connector 6160 is connected to the first electrode pad 6140. The first electrode pad 6140 is electrically connected to the n-type semiconductor layer 6123 of the first LED stack 6100, and thus the first connector 6157 is also electrically connected to the n-type semiconductor layer 6123. The first-2 connector 6158 and the first-3 connector 6160 are electrically insulated from the first LED stack 6100.

Figure 115E:
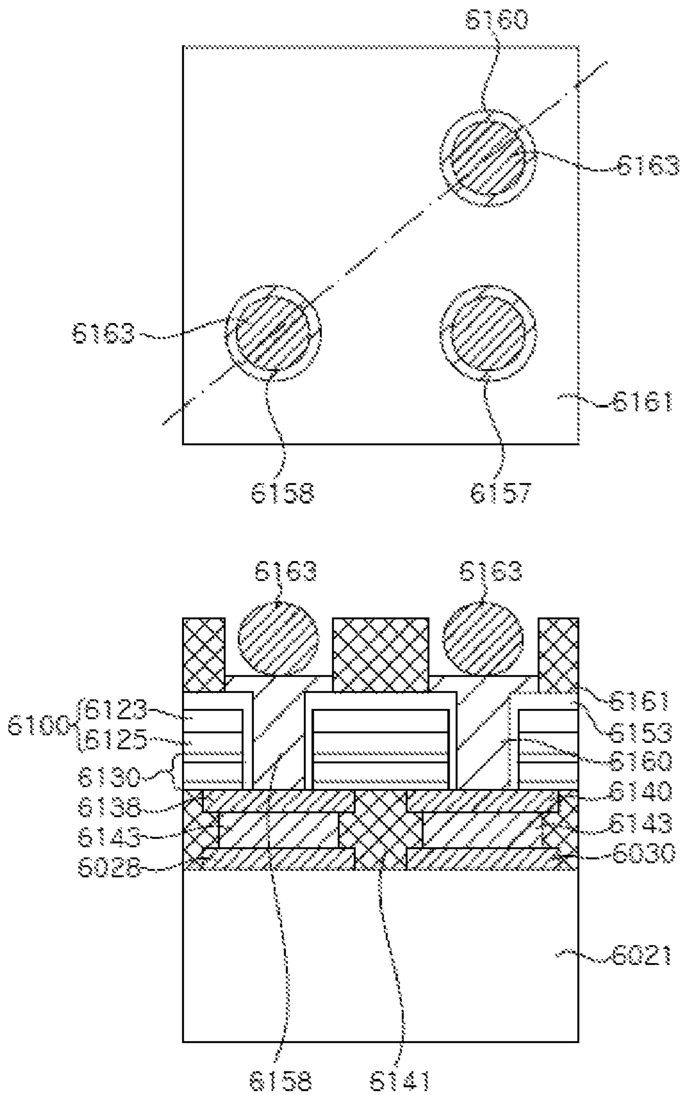

Referring to FIG. 115E, a second adhesive layer 6161 is then formed on the first connectors 6157, 6158, and 6160. The second adhesive layer 6161 may contact the insulating layer 6153.

The second adhesive layer 6161 is patterned to have openings that expose the first connectors 6157, 6158, and 6160. As such, the second adhesive layer 6161 is formed of a material that may be patterned similarly to the first adhesive layer 6141, and may be formed of, for example, epoxy, polyimide, SU8, SOG, BCB, or others.

Metal bonding materials 6163 having substantially a ball shape are formed in the openings of the second adhesive layer 6161. The material and shape of the metal bonding material 6163 are similar to those of the metal bonding material 6143 described above, and thus, detailed descriptions thereof are omitted.

Figure 116A:
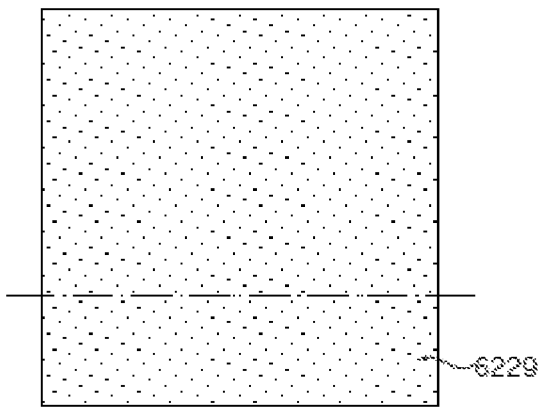
Figure 116A:
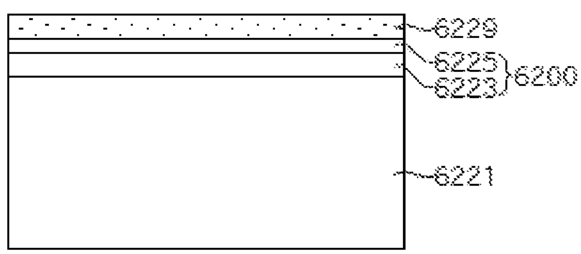

Referring to FIG. 116A, the second LED stack 6200 is grown on a second substrate 6221, and a second transparent electrode 6229 is formed on the second LED stack 6200.

The second substrate 6221 may be a substrate capable of growing the second LED stack 6200, for example, a sapphire substrate or a GaAs substrate.

The second LED stack 6200 may be formed of AlGaInP-based semiconductor layers or AlGaInN-based semiconductor layers. The second LED stack 6200 may include an n-type semiconductor layer 6223, a p-type semiconductor layer 6225, and an active layer, and the active layer may have a multiple quantum well structure. A composition ratio of the well layer in the active layer may be determined so that the second LED stack 6200 emits green light, for example.

The second transparent electrode 6229 is in ohmic contact with the p-type semiconductor layer. The second transparent electrode 6229 may be formed of a metal layer or a conductive oxide layer which is transparent to red light and green light. Examples of the conductive oxide layer may include $SnO_2$, $InO_2$, ITO, ZnO, IZO, or others.

Figure 116B:
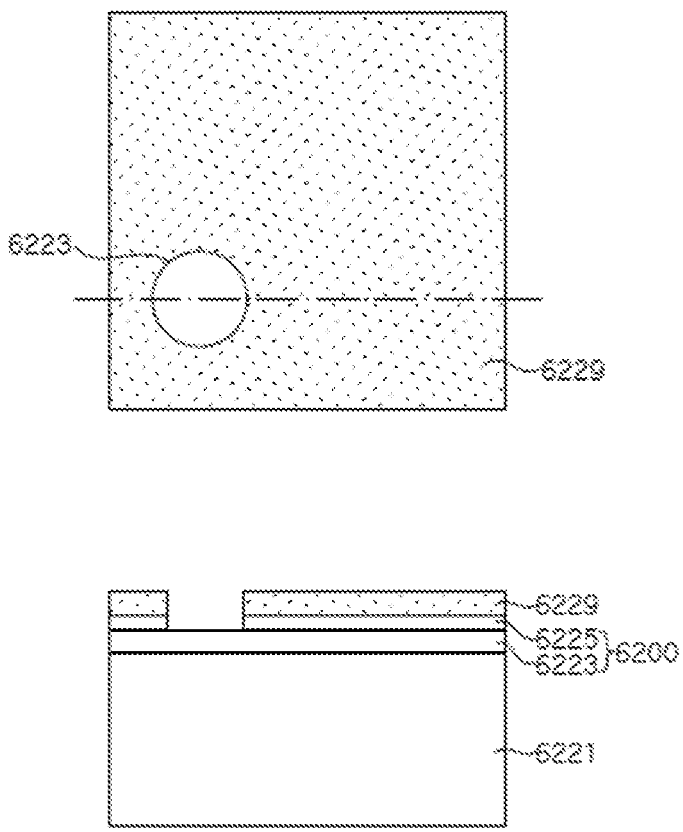

Referring to FIG. 116B, the second transparent electrode 6229, the p-type semiconductor layer 6225, and the active layer are patterned to partially expose the n-type semiconductor layer 6223. The n-type semiconductor layer 6223 will be exposed in a plurality of regions corresponding to a plurality of pixel regions on the second substrate 6221.

Although the n-type semiconductor layer 6223 is described as being exposed after the second transparent electrode 6229 is formed, in some exemplary embodiments, the n-type semiconductor layer 6223 may be exposed first and the second transparent electrode 6229 may be formed thereafter.

Figure 116C:
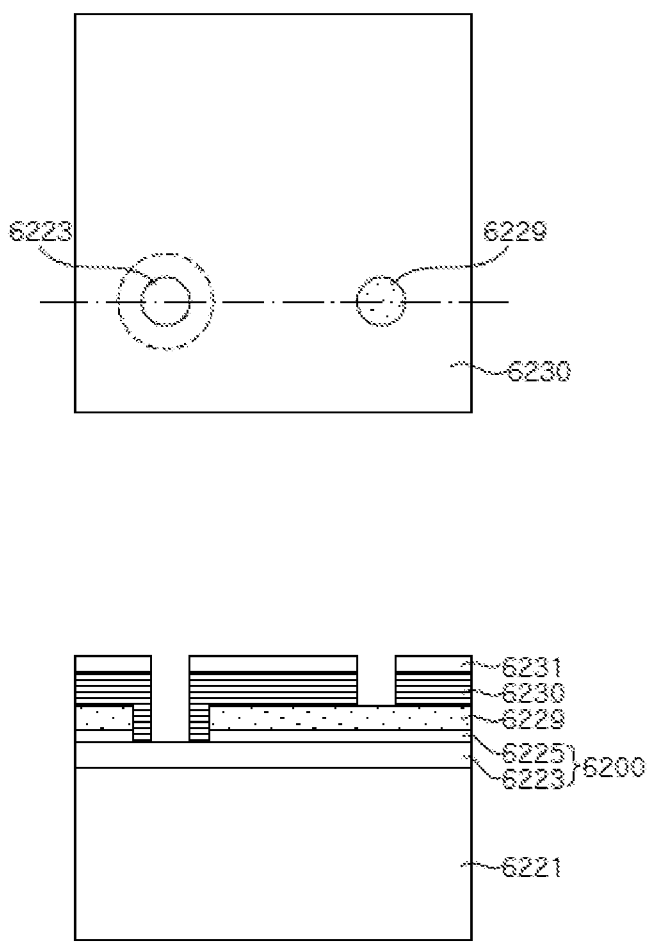

Referring to FIG. 116C, a first color filter 6230 is formed on the second transparent electrode 6229. The first color filter 6230 is formed to transmit light generated in the first LED stack 6100 and to reflect light generated in the second LED stack 6200.

Then, an insulating layer 6231 may be formed on the first color filter 6230. The insulating layer 6231 may be formed to control stress and may be formed of, for example, a silicon nitride film ($SiN_x$) or a silicon oxide film ($SiO_2$). The insulating layer 6231 may be formed first before the first color filter 6230 is formed.

Openings exposing the n-type semiconductor layer 6223 and the second transparent electrode 6229 are formed by patterning the insulating layer 6231 and the first color filter 6230.

Although the first color filter 6230 is described as being formed after the n-type semiconductor layer 6223 is exposed, according to some exemplary embodiments, the first color filter 6230 may be formed first, and then, the first color filter 6230, the second transparent electrode 6229, the p-type semiconductor layer 6225, and the active layer may be patterned to expose the n-type semiconductor layer 6223. Then, the insulating layer 6231 may be formed to cover side surfaces of the p-type semiconductor layer 6225 and the active layer.

Figure 116D:
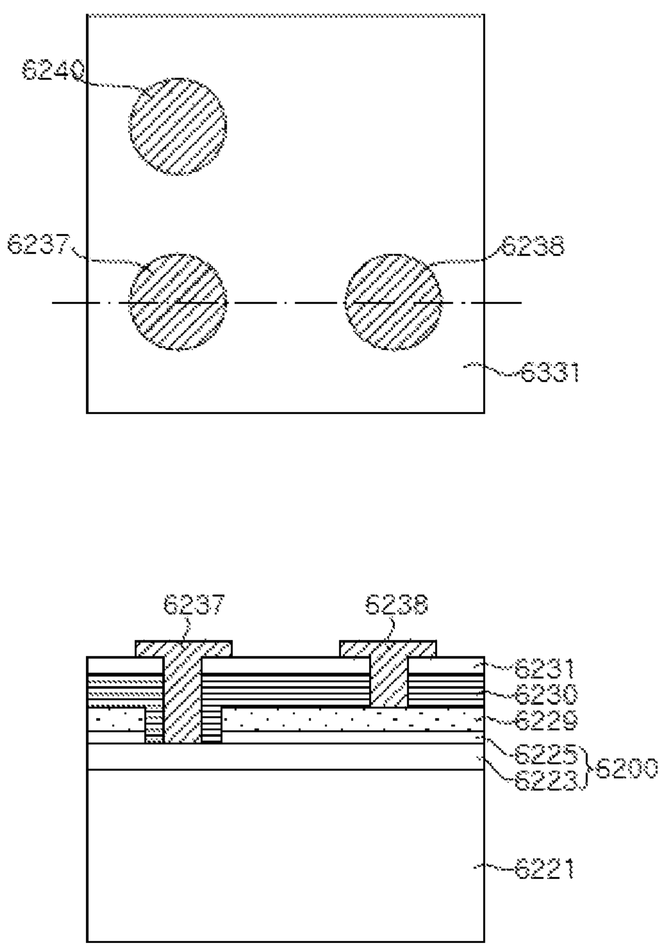

Referring to FIG. 116D, subsequently, the second electrode pads 6237, 6238, and 6240 are formed on the first color filter 6230 or the insulating layer 6231. The second electrode pad 6237 may be electrically connected to the n-type semiconductor layer 6223 through the opening of the first color filter 6230, and the second electrode pad 6238 may be electrically connected to the second transparent electrode 6229 through the opening of the first color filter 6230. The second electrode pad 6240 is disposed on the first color filter 6230 and is insulated from the second LED stack 6200.

Figure 117A:
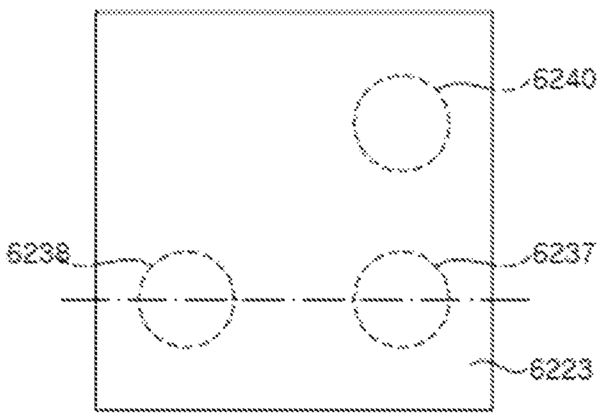
Figure 117A:
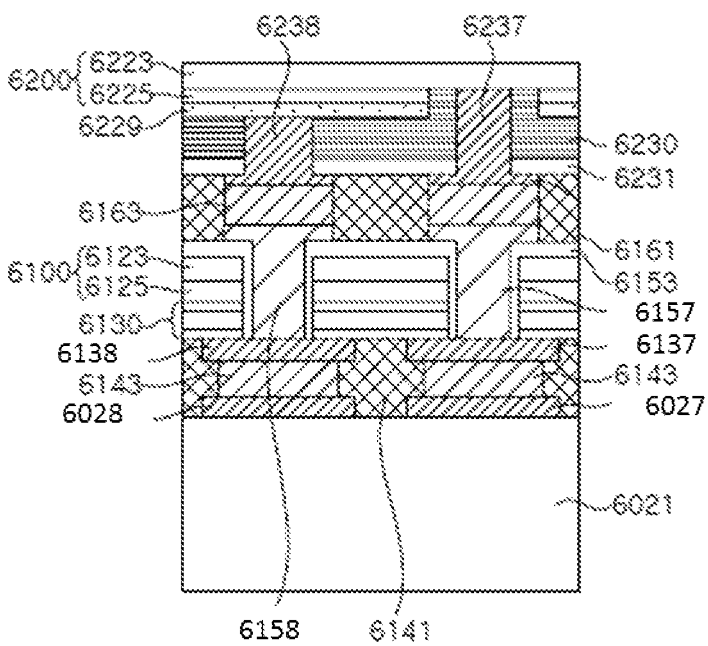

Referring to FIG. 117A, the second LED stack 6200 and the second electrode pads 6237, 6238, and 6240 that are described with reference to FIG. 116D, are coupled on the second adhesive layer 6161 and the metal bonding materials 6163 that are described with reference to FIG. 115E. The metal bonding materials 6163 may bond the first connectors 6157, 6158, and 6160 and the second electrode pads 6237, 6238, and 6240, respectively, and the second adhesive layer 6161 may bond the insulating layer 6231 and the insulating layer 6153. The bonding using the second adhesive layer 6161 and the metal bonding materials 6163 is similar to that described with reference to FIG. 115A, and thus, detailed description thereof are omitted.

The second substrate 6221 is separated from the second LED stack 6200, and the surface of the second LED stack 6200 is exposed. The second substrate 6221 may be separated using a technique such as etching, laser lift-off, or the like. A surface roughened by surface texturing may be formed on the surface of the exposed second LED stack 6200, that is, the surface of the n-type semiconductor layer 6223.

Although the second adhesive layer 6161 and the metal bonding materials 6163 are described as being formed on the first LED stack 6100 to bond the second LED stack 6200, according to some exemplary embodiments, the second adhesive layer 6161 and the metal bonding materials 6163 may be formed at the second LED stack 6200 side. Further, an adhesive layer may be formed on the first LED stack 6100 and the second LED stack 6200, respectively, and these adhesive layers may be bonded to each other.

Figure 117B:
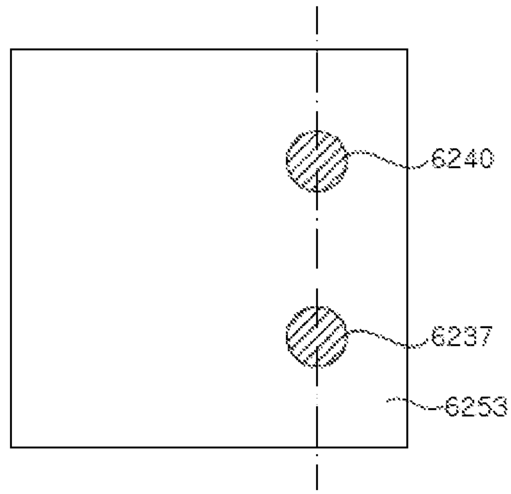
Figure 117B:
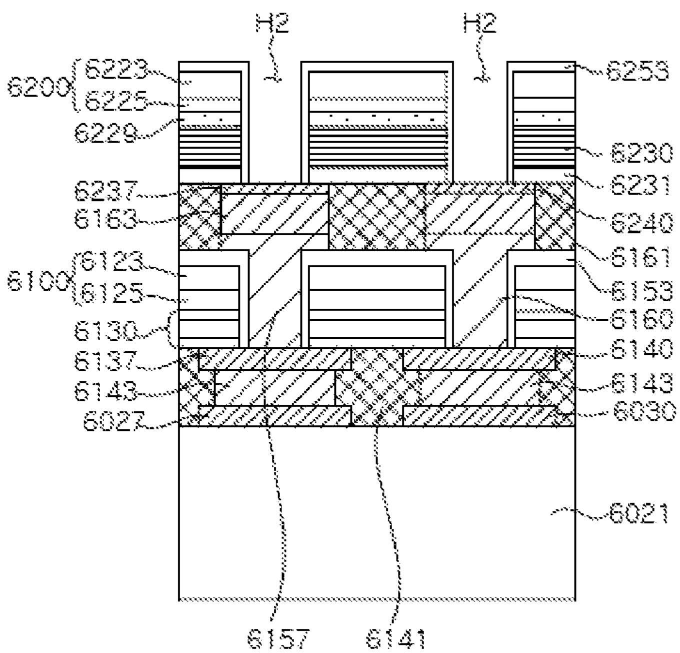

Referring to FIG. 117B, holes H2 passing through the second LED stack 6200, the second transparent electrode 6229, the first color filter 6230, and the insulating layer 6231 may be formed using a hard mask or the like. The holes H2 may expose the second electrode pads 6237 and 6240, respectively. The hole H2 is not formed on the second electrode pad 238, and thus, the second electrode pad 238 is not exposed through the second LED stack 6200.

Then, an insulating layer 6253 is formed to cover the surface of the second LED stack 6200 and side walls of the holes H2. The insulating layer 6253 is patterned to expose the second electrode pads 6237 and 6240 in the holes H2. The insulating layer 6253 may include a silicon nitride film or a silicon oxide film.

Figure 117C:
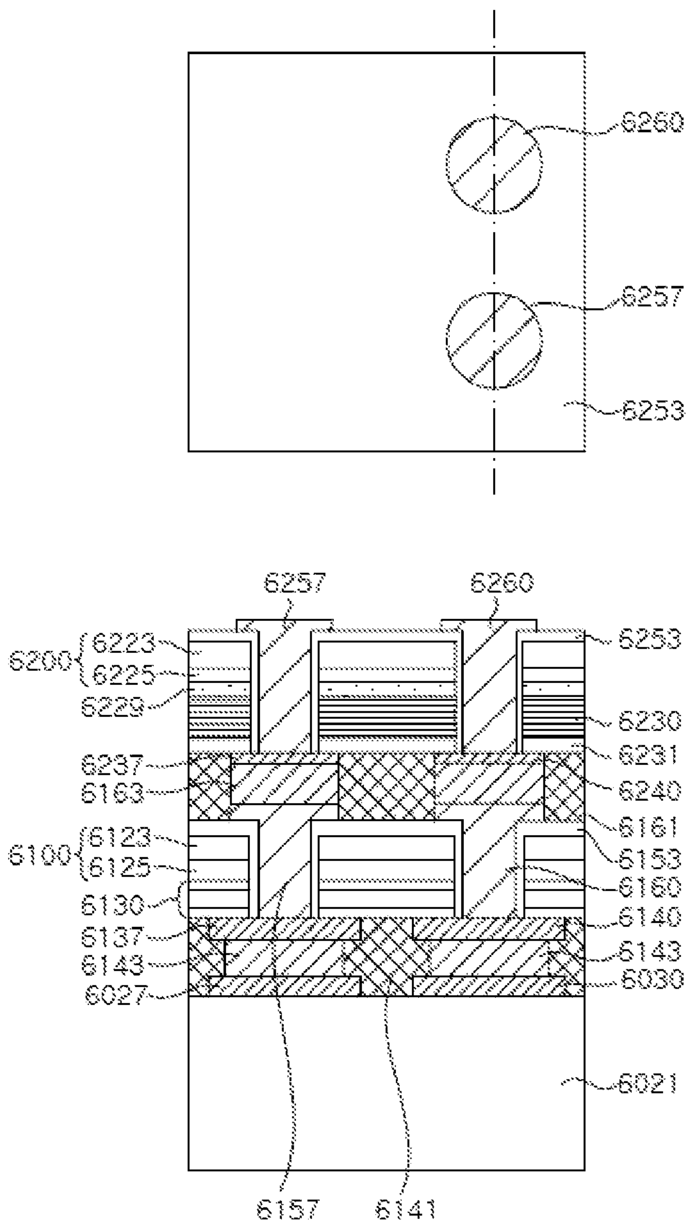

Referring to FIG. 117C, second connectors 6257 and 6260 that are electrically connected to the second electrode pads 6237 and 6240 through the holes H2, respectively, are formed. The second-1 connector 6257 is connected to the second electrode pad 6237 and thus electrically connected to the n-type semiconductor layer 6223. The second-2 connector 6260 is insulated from the second LED stack 6200 and insulated from the first LED stack 6100.

Further, the second-1 connector 6257 is electrically connected to the electrode pad 6027 through the first-1 connector 6157, and the second-2 connector 6260 is electrically connected to the electrode pad 6030 through the first-3 connector 6160. The second-1 connector 6257 may be stacked in a vertical direction to the first-1 connector 6157, and the second-2 connector 6260 may be stacked in a vertical direction to the first-3 connector 6160. However, the inventive concepts are not limited thereto.

Figure 117D:
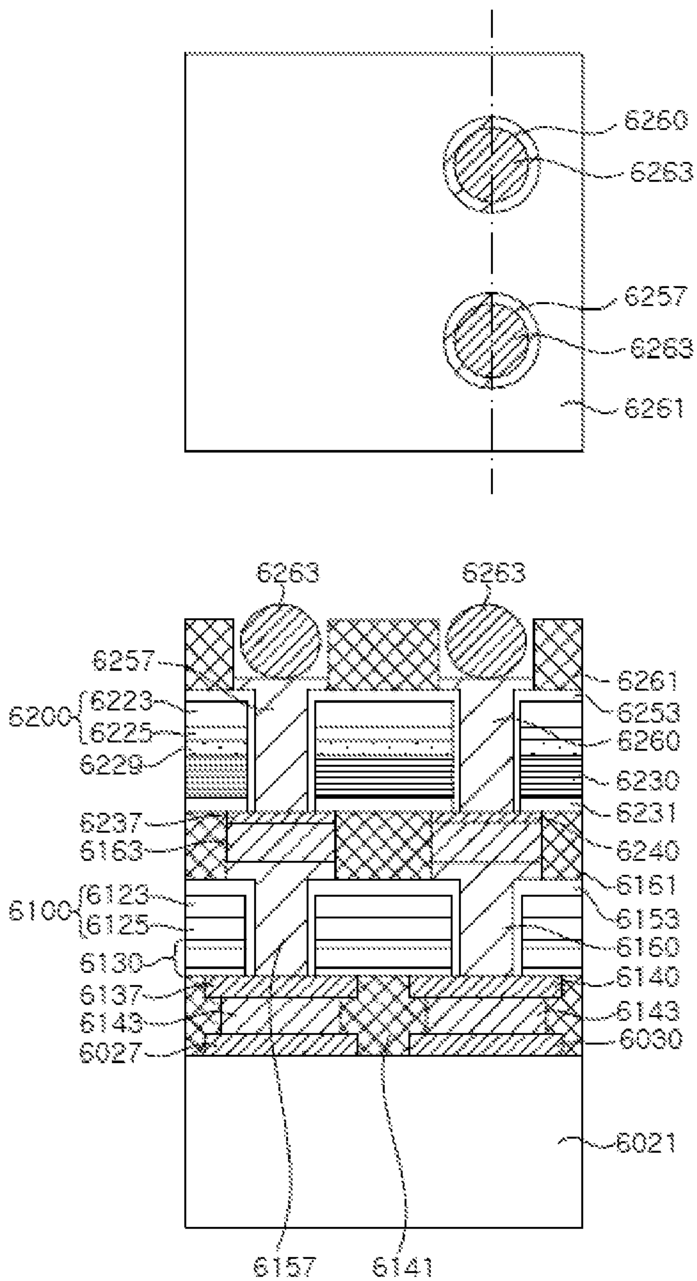

Referring to FIG. 117D, a third adhesive layer 6261 is then formed on the second connectors 6257 and 6260. The third adhesive layer 6261 may contact the insulating layer 6253.

The third adhesive layer 6261 is patterned to have openings that expose the second connectors 6257 and 6260. As such, the third adhesive layer 6261 is formed of a material that may be patterned similarly to the first adhesive layer 6141, and may be formed of, for example, epoxy, polyimide, SU8, SOG, BCB, or others.

Metal bonding materials 6263 having substantially a ball shape are formed in the openings of the third adhesive layer 6261. The material and shape of the metal bonding material 6263 are similar to those of the metal bonding material 6143 described above, and thus, detailed descriptions thereof are omitted.

Figure 118A:
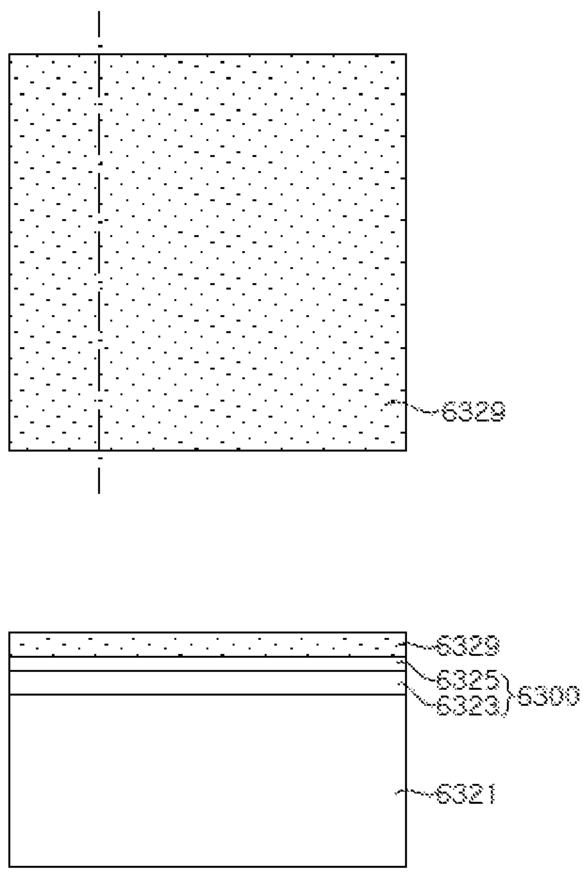

Referring to FIG. 118A, the third LED stack 6300 is grown on a third substrate 6321, and a third transparent electrode 6329 is formed on the third LED stack 6300.

The third substrate 6321 may be a substrate capable of growing the third LED stack 6300, for example, a sapphire substrate. The third LED stack 6300 may be formed of AlGaInN-based semiconductor layers. The third LED stack 6300 may include an n-type semiconductor layer 6323, a p-type semiconductor layer 6325, and an active layer, and the active layer may have a multiple quantum well structure. A composition ratio of the well layer in the active layer may be determined so that the third LED stack 6300 emits blue light, for example.

The third transparent electrode 6329 is in ohmic contact with the p-type semiconductor layer 6325. The third transparent electrode 6329 may be formed of a metal layer or a conductive oxide layer which is transparent to red light, green light, and blue light. Examples of the conductive oxide layer may include $SnO_2$, $InO_2$, ITO, ZnO, IZO, or others.

Figure 118B:
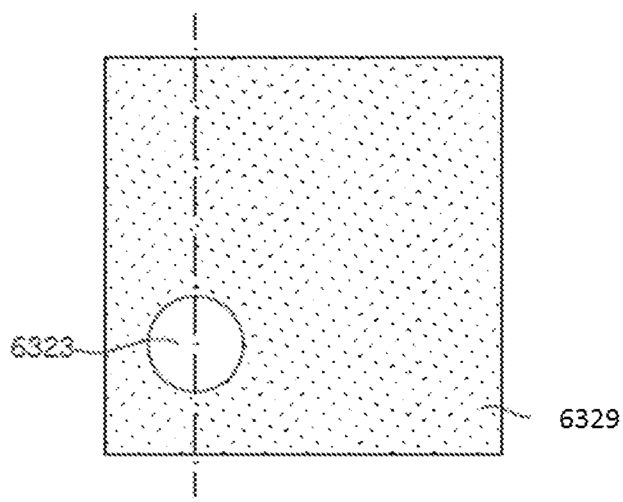
Figure 118B:
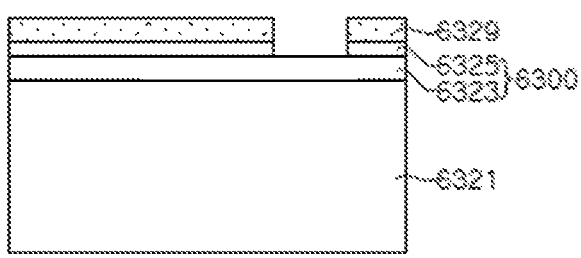

Referring to FIG. 118B, the third transparent electrode 6329, the p-type semiconductor layer 6325, and the active layer are patterned to partially expose the n-type semiconductor layer 6323. The n-type semiconductor layer 6323 will be exposed in a plurality of regions corresponding to a plurality of pixel regions on the third substrate 6321.

Although the n-type semiconductor layer 6323 is described as being exposed after the third transparent electrode 6329 is formed, according to some exemplary embodiments, the n-type semiconductor layer 6323 may be exposed before the first and the third transparent electrode 6329 may be formed.

Figure 118C:
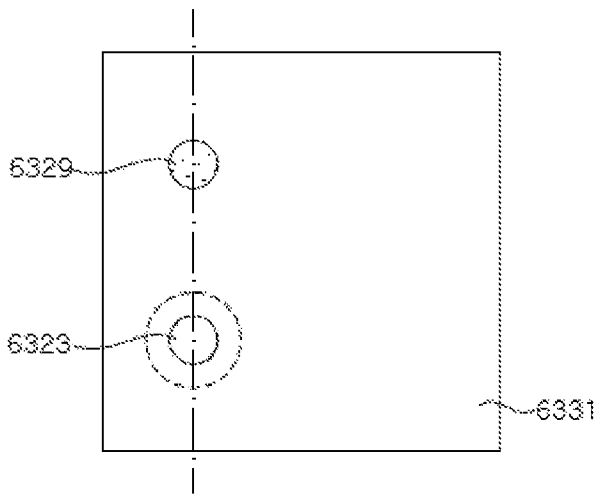
Figure 118C:
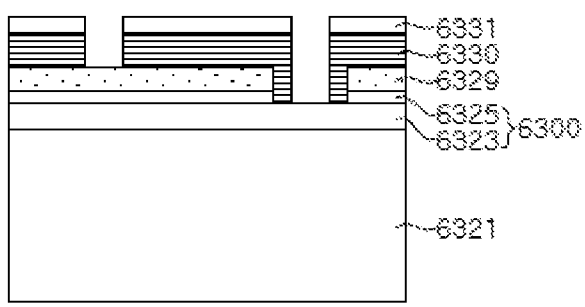

Referring to FIG. 118C, a second color filter 6330 is formed on the third transparent electrode 6329. The second color filter 6330 is formed to transmit light generated in the first LED stack 6100 and the second LED stack 6200, and to reflect light generated in the third LED stack 6300.

Then, an insulating layer 6331 may be formed on the second color filter 6330. The insulating layer 6331 may be formed to control stress and may be formed of, for example, a silicon nitride film ($SiN_x$) or a silicon oxide film ($SiO_2$). The insulating layer 6331 may be formed first before the second color filter 6330 is formed. Meanwhile, openings exposing the n-type semiconductor layer 6323 and the second transparent electrode 6329 are formed by patterning the insulating layer 6331 and the second color filter 6330.

Although the second color filter 6330 is described as being formed after the n-type semiconductor layer 6323 is exposed, according to some exemplary embodiments, the second color filter 6330 may be formed first, and the second color filter 6330, the third transparent electrode 6329, the p-type semiconductor layer 6325, and the active layer may be patterned to expose the n-type semiconductor layer 6323 thereafter. Then, the insulating layer 6331 may be formed to cover side surfaces of the p-type semiconductor layer 6325 and the active layer.

Figure 118D:
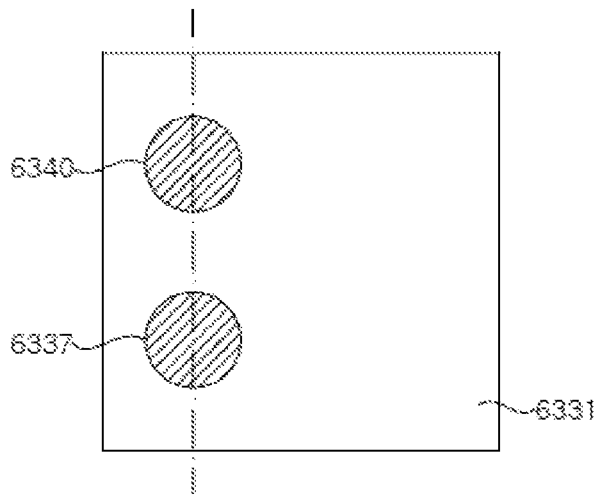
Figure 118D:
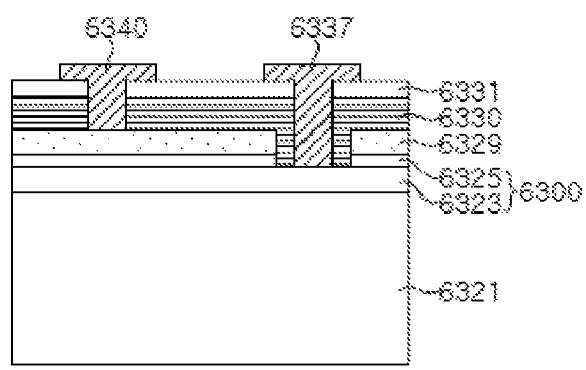

Referring to FIG. 118D, subsequently, the third electrode pads 6337 and 6340 are formed on the second color filter 6330 or the insulating layer 6331. The third electrode pad 6337 may be electrically connected to the n-type semiconductor layer 6323 through the opening of the second color filter 6330, and the third electrode pad 6340 may be electrically connected to the third transparent electrode 6329 through the opening of the second color filter 6330.

Figure 119A:
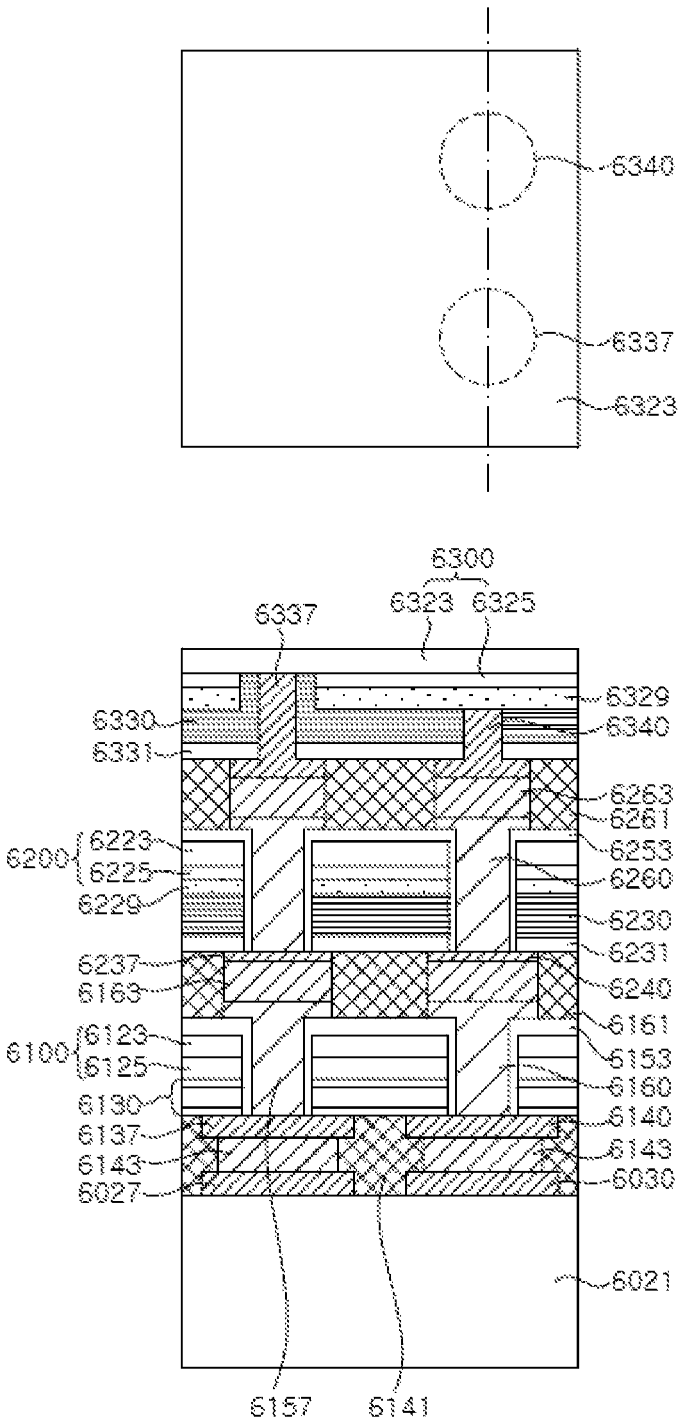

Referring to FIG. 119A, the third LED stack 6300 and the third electrode pads 6337 and 6340 that are described with reference to FIG. 118D, are coupled to the third adhesive layer 6261 by the metal bonding materials 6263 that are described with reference to FIG. 117E. The metal bonding materials 6263 may bond the second connectors 6257 and 6260 and the third electrode pads 6337 and 6340, respectively, and the third adhesive layer 6261 may bond the insulating layer 6331 and the insulating layer 6253. The bonding using the third adhesive layer 6261 and the metal bonding materials 6263 is similar to that described with reference to FIG. 115A, and thus, detailed descriptions thereof are omitted.

The third substrate 6321 is separated from the third LED stack 6300, and the surface of the third LED stack 6300 is exposed. The third substrate 6321 may be separated using a technique such as laser lift-off, chemical lift-off, or others. A surface roughened by surface texturing may be formed on the surface of the exposed third LED stack 6300, that is, the surface of the n-type semiconductor layer 6323.

Although the third adhesive layer 6261 and the metal bonding materials 6263 are described as being formed on the second LED stack 6200 to bond the third LED stack 6300, according to some exemplary embodiments, the third adhesive layer 6261 and the metal bonding materials 6263 may be formed at the third LED stack 6300 side. Further, an adhesive layer may be formed on the second LED stack 6200 and the third LED stack 6300, respectively, and these adhesive layers may be bonded to each other.

Figure 119B:
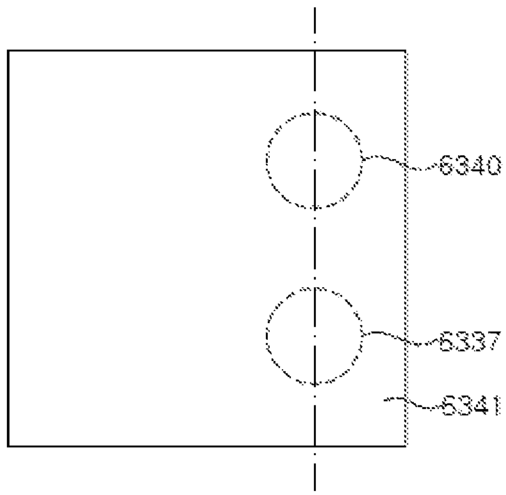
Figure 119B:
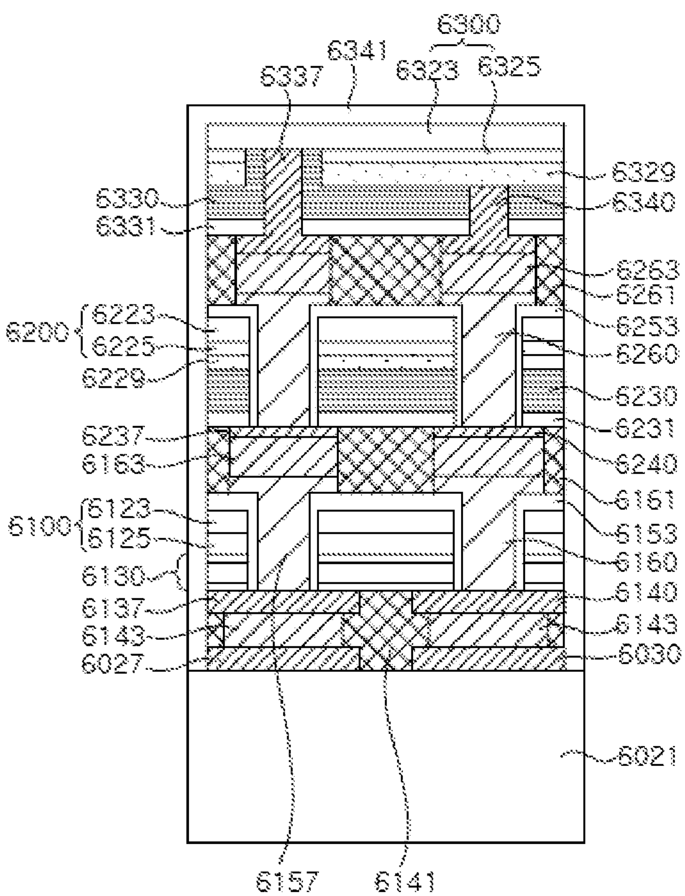

Referring to FIG. 119B, subsequently, regions between adjacent pixels are then etched to separate the pixels, and an insulating layer 6341 may be formed. The insulating layer 6341 may cover a side surface and an upper surface of each pixel. A region between adjacent pixels may be removed to expose the substrate 6021, but the inventive concepts are not limited thereto. For example, the first adhesive layer 6141 may be formed continuously over a plurality of pixel regions without being separated, and the insulating layer 6130 may also be continuous.

Figure 120:
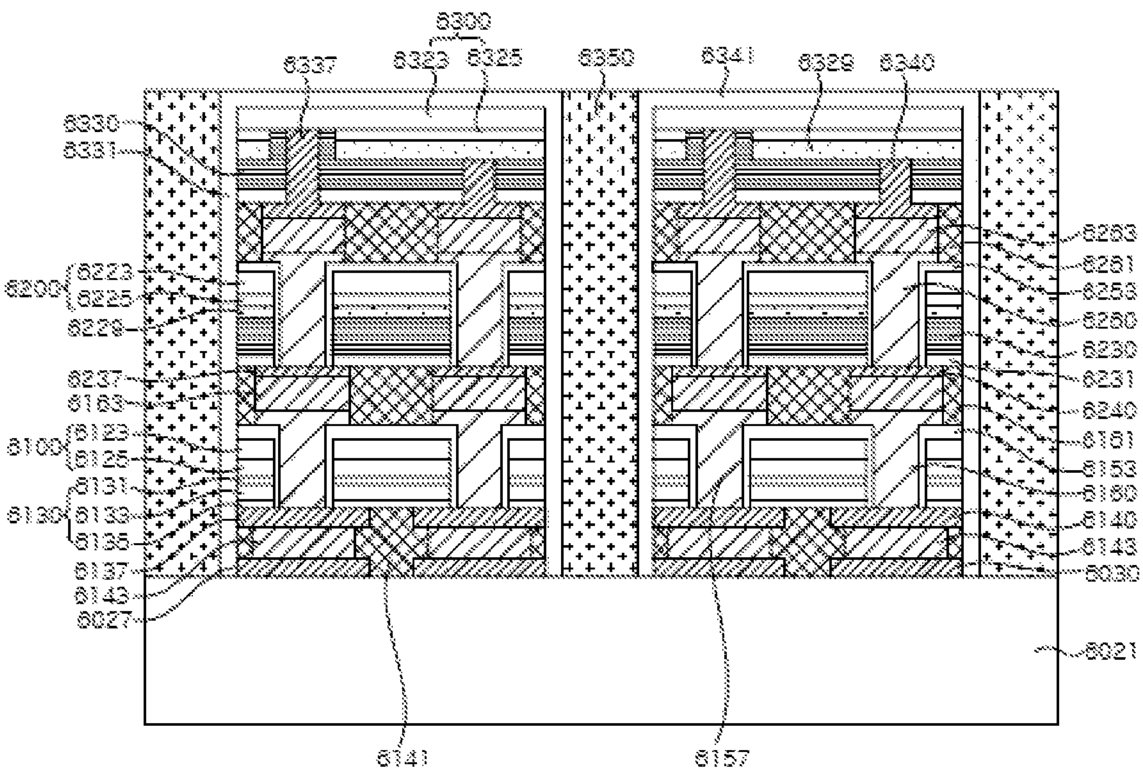

Referring to FIG. 120, subsequently, a barrier 6350 may be formed in a separation region between the pixel regions. The barrier 6350 may be formed of a light reflecting layer or a light absorbing layer, and thus light interference between pixels may be prevented. The light reflecting layer may include, for example, a white PSR, a distributed Bragg reflector, an insulating layer such as $SiO_2$, and a reflective metal layer deposited thereon, or a highly reflective organic layer. For a light blocking layer, black epoxy, for example, may be used.

Thus, a display apparatus according to an exemplary embodiment, in which a plurality of pixels are arranged on the substrate 6021, may be provided. The first to third LED stacks 6100, 6200, and 6300 in each pixel may be independently driven by power input through the electrode pads 6027, 6028, 6029, and 6030.

Figure 121A:
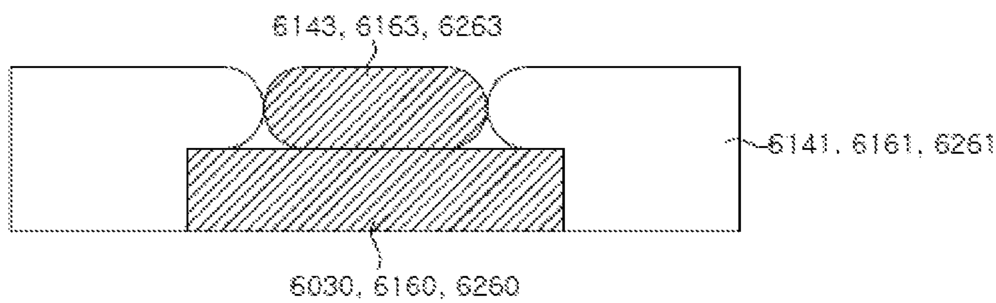
FIGS. 121A, 121B, and 121C are schematic cross-sectional views of a metal bonding material according to exemplary embodiments.
Figure 121B:
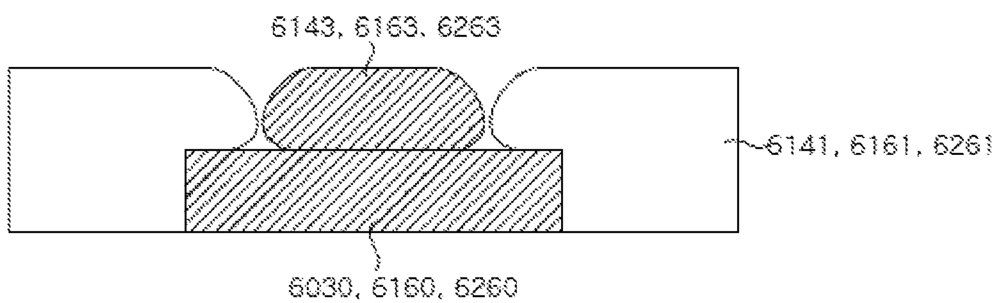
Figure 121C:
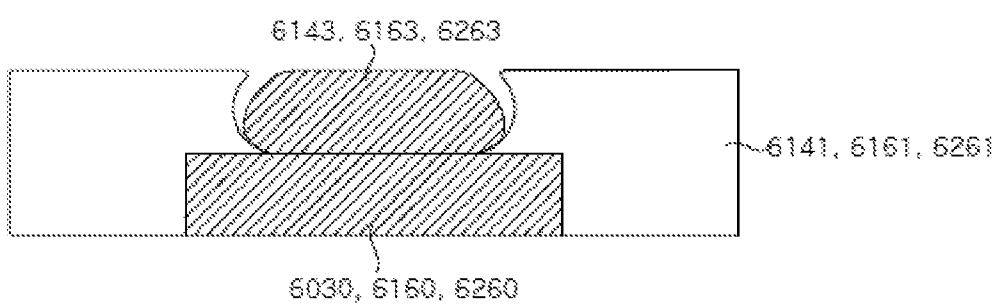

FIGS. 121A, 121B, and 121C are schematic cross-sectional views of the metal bonding materials 6143, 6163, and 6263.

Referring to FIG. 121A, the metal bonding materials 6143, 6163, and 6263 are disposed in the openings in the first to third adhesive layers 6141, 6161, and 6261. A lower surface of the metal bonding materials 6143, 6163, and 6263 is in contact with the electrode pads 6030 or the connector 6160 or 6260, and thus, the metal bonding materials 6143, 6163, and 6263 may have substantially a flat shape depending on an upper surface shape of the electrode pads or connectors. The upper surfaces of the metal bonding materials 6143, 6163, and 6263 may have substantially a flat shape depending on the shape of the electrode pads 6140, 6240, and 6340. A side surface of the metal bonding materials 6143, 6163, and 6263 may have a substantially curved shape. A central portion of the metal bonding materials 6143, 6163, and 6263 may have a convex shape to the outside.

An inner wall of the openings of the adhesive layers 6141, 6161, and 6261 may also have substantially a convex shape inward of the openings, and side surfaces of the metal bonding materials 6143, 6163 and 6263 may be in contact with side surfaces of the adhesive layers 6141, 6161 and 6261. However, if volume of the metal bonding materials 6143, 6163, and 6263 is less than volume of the openings of the adhesive layers 6141, 6161, and 6261, an empty space may be formed in the openings as shown.

Referring to FIG. 121B, the shapes of the metal bonding materials 6143, 6163, and 6263 and the adhesive layers 6141, 6161, and 6261 according to an exemplary embodiment are substantially similar to those described with reference to FIG. 121A, but there is a difference in that a convex portion of the side surface is disposed at a relatively lower position by heating.

Referring to FIG. 121C, the shapes of the metal bonding materials 6143, 6163, and 6263 according to an exemplary embodiment are similar to those described with reference to FIG. 121B, but are different from shapes of inner walls of the openings of the adhesive layers 6141, 6161, and 6261. In particular, the inner wall of the opening may be formed to be concave by the metal bonding material.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A light emitting device for a display, comprising:
- a transparent, first substrate through which light can be transmitted, laterally extending in a first direction, and having a first region and a second region surrounding the first region;
- a first LED sub-unit disposed on the first substrate;
- a second LED sub-unit disposed on the first LED sub-unit;
- a third LED sub-unit disposed on the second LED sub-unit;
- a conductive, second substrate disposed on the third LED sub-unit, with the first, second, and third LED sub-units being interposed between the first substrate and the second substrate;
- a first electrode pad, a second electrode pad, a third electrode pad, and a fourth electrode pad disposed on the second substrate; and
- through-hole vias electrically connecting the second, third, and fourth electrode pads to the first, second, and third LED sub-units, respectively,
- wherein the first electrode pad is electrically connected to the third LED sub-unit through the second substrate without overlapping the through-hole vias,
- wherein each of the first, second, and third LED sub-units is disposed in the first region of the first substrate and does not overlap the second region of the first substrate in a second direction crossing the first direction, and
- wherein the fourth electrode pad overlaps in the second direction a greater number of through-hole vias in the third LED sub-unit than the second or third electrode pad in the third LED sub-unit, and is electrically connected to each of the first, second, and third LED sub-units.

2. The light emitting device of claim 1, wherein:
- the first, second, and third LED sub-units comprise a first LED stack, a second LED stack, and a third LED stack, respectively; and
- the light emitting device comprises a micro LED having a surface area less than about 10,000 square μm.

3. The light emitting device of claim 2, wherein:
- the first LED stack is configured to emit any one of red, green, and blue light;
- the second LED stack is configured to emit a different one of red, green, and blue light from the first LED sub-unit; and
- the third LED stack is configured to emit a different one of red, green, and blue light from the first and second LED sub-units.

4. The light emitting device of claim 1, further comprising a first insulating layer disposed on the second substrate.

5. The light emitting device of claim 4, further comprising an electrode disposed on the second substrate,
- wherein the first insulating layer has at least one opening, and a first portion of the electrode is disposed in the at least one opening of the first insulating layer.

6. The light emitting device of claim 5, wherein a second portion of the electrode is disposed on the first insulating layer.

7. The light emitting device of claim 6, wherein at least one of the first, second, third, and fourth electrode pads partially overlaps the second portion of the electrode.

8. The light emitting device of claim 5, further comprising a second insulating layer disposed on the first insulating layer.

9. The light emitting device of claim 8, wherein:
- the second insulating layer has openings; and
- portions of the first, second, third, and fourth electrode pads are disposed in the openings of the second insulating layer, respectively.

10. The light emitting device of claim 9, wherein each of the openings in the second insulating layer has substantially the same size.

11. The light emitting device of claim 10, wherein the size of an area of the first electrode pad contacting the electrode is different from the size of an area of one of the second, third, and fourth electrode pads contacting a corresponding through-hole via.

12. The light emitting device of claim 10, wherein the size of an area of the first electrode pad contacting the electrode is substantially the same as the size of an area of one of the second, third, and fourth electrode pads contacting a corresponding through-hole via.

13. The light emitting device of claim 8, wherein at least one of the first and second insulating layers cover an outermost side surface of the second substrate and expose an outermost side surface of the first substrate.

14. The light emitting device of claim 8, wherein a portion of the second insulating layer is disposed between the first electrode pad and the electrode.

15. The light emitting device of claim 5, wherein the electrode at least partially overlaps each of the first, second, third, and fourth electrode pads.

16. The light emitting device of claim 1, wherein at least one of the first, second, third, and fourth electrode pads is disposed on a plane different from at least one of the remaining ones of the first, second, third, and fourth electrode pads.

17. The light emitting device of claim 1, wherein the through-hole vias are formed through the second substrate.

18. A light emitting device for a display, comprising:
- a first substrate laterally extending in a first direction, and having a first region and a second region surrounding the first region;
- a first LED sub-unit adjacent to the first substrate;
- a second LED sub-unit adjacent to the first LED sub-unit;
- a third LED sub-unit adjacent to the second LED sub-unit;
- electrode pads disposed on the first substrate; and
- through-hole vias to electrically connect each electrode pad to a respective one of the first, second, and third LED sub-units,
- wherein:
- at least one of the through-hole vias has a substantially continuous side surface that passes through the first substrate, the first LED sub-unit, and the second LED sub-unit;

the first LED sub-unit and the second LED sub-unit are disposed between the first substrate and the third LED sub-unit;

each of the first, second, and third LED sub-units is disposed in the first region of the first substrate and does not overlap the second region of the first substrate in a second direction crossing the first direction; and one of the electrode pads is electrically connected to each of the first, second, and third LED sub-units and overlaps in the second direction a greater number of through-hole vias in the third LED sub-unit than the remaining ones of the electrode pads in the third LED sub-unit.

19. The light emitting device of claim 18, wherein:

each of the first, second, and third LED sub-units includes a first-type semiconductor layer, a second-type semiconductor layer, and an active layer interposed therebetween; and the through-hole vias are spaced apart from each other in the first direction.

* * * * *